US010007178B2

(12) United States Patent
Hatakeyama et al.

(10) Patent No.: US 10,007,178 B2
(45) Date of Patent: Jun. 26, 2018

(54) POSITIVE RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP); Masahiro Fukushima, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days. days.

(21) Appl. No.: 14/803,547

(22) Filed: Jul. 20, 2015

(65) Prior Publication Data
US 2016/0048076 A1   Feb. 18, 2016

(30) Foreign Application Priority Data

Aug. 12, 2014   (JP) ................................ 2014-164387

(51) Int. Cl.
G03F 7/004   (2006.01)
G03F 7/039   (2006.01)
G03F 7/32   (2006.01)

(52) U.S. Cl.
CPC .......... G03F 7/0045 (2013.01); G03F 7/0046 (2013.01); G03F 7/0397 (2013.01); G03F 7/322 (2013.01); G03F 7/325 (2013.01)

(58) Field of Classification Search
None
See application file for complete search history.

(56) References Cited

U.S. PATENT DOCUMENTS

| | | | |
|---|---|---|---|
| 5,879,851 A | 3/1999 | Takahashi et al. | |
| 6,448,420 B1 | 9/2002 | Kinsho et al. | |
| 7,482,108 B2 | 1/2009 | Matsumaru et al. | |
| 7,537,880 B2 | 5/2009 | Harada et al. | |
| 7,598,016 B2 | 10/2009 | Kobayashi et al. | |
| 7,670,751 B2 | 3/2010 | Ohashi et al. | |
| 8,114,571 B2 | 2/2012 | Ohashi et al. | |
| 8,288,077 B2 | 10/2012 | Ichikawa et al. | |
| 2008/0090172 A1 | 4/2008 | Hatakeyama et al. | |
| 2009/0269696 A1* | 10/2009 | Ohsawa | C08F 220/18 430/270.1 |
| 2009/0274978 A1* | 11/2009 | Ohashi | C07J 9/00 430/285.1 |
| 2010/0055608 A1* | 3/2010 | Ohashi | C07D 493/18 430/270.1 |
| 2012/0135350 A1 | 5/2012 | Kobayashi et al. | |
| 2012/0135357 A1* | 5/2012 | Kobayashi | G03F 7/0045 430/326 |
| 2014/0080062 A1* | 3/2014 | Thackeray | G03F 7/0045 430/285.1 |
| 2014/0162188 A1 | 6/2014 | Hatakeyama et al. | |
| 2014/0370441 A1* | 12/2014 | Hatakeyama | G03F 7/32 430/296 |
| 2015/0177615 A1* | 6/2015 | Jain | C08F 224/00 430/285.1 |

FOREIGN PATENT DOCUMENTS

| | | | |
|---|---|---|---|
| JP | 11-52562 A | | 2/1999 |
| JP | 2000-327633 A | | 11/2000 |
| JP | 3429592 B2 | | 7/2003 |
| JP | 2006-45311 A | | 2/2006 |
| JP | 2006-178317 A | | 7/2006 |
| JP | 2008-111103 A | | 5/2008 |
| JP | 2008-122932 A | | 5/2008 |
| JP | 2008-239918 A | | 10/2008 |
| JP | 2009-080474 A | | 4/2009 |
| JP | 2009-269953 A | | 11/2009 |
| JP | 2011-046694 A | | 3/2011 |
| JP | 2012-111861 A | | 6/2012 |
| JP | 2013-80005 | * | 5/2013 |
| JP | 2014-115569 A | | 6/2014 |
| TW | 201234113 A | | 8/2012 |
| WO | WO 2011/115190 A1 | * | 9/2011 |
| WO | WO 2015/022820 A1 | * | 2/2015 |

OTHER PUBLICATIONS

English abstract for WO 2015/022820 A1 (2015).*
Machine-assisted English translation for WO 2011/115190 A1 (2011).*
Machine-assisted English translation of WO 2015/022820 A1 (2015).*
Kishikawa, et al, "Assessment of trade-off between resist resolution and sensitivity for optimization of hyper-NA immersion lithography", Proc. of SPIE, 2007, vol. 6520, pp. 65203L-1-65203L-9.
Hutchinson, "The Shot Noise Impact on Resist Roughness in EUV Lithography", Emerging Lithographic Technologies II, Proceedings of SPIE, Feb. 23-25, 1998, vol. 3331, pp. 531-536.
Brainard, et al., "Shot Noise LER and Quantum Efficiency of EUV Photoresists", Emerging Lithographic Technologies VIII, Proc. of SPIE, 2004, vol. 5374, pp. 74-85.
Office Action dated Mar. 16, 2016, issued in counterpart Taiwanese Patent Application No. 104125866. (4 pages).
Office Action dated Mar. 6, 2018, issued in counterpart to Japanese Application No. 2015-117987, with English translation (4 pages).

* cited by examiner

*Primary Examiner* — Sin J Lee

(74) *Attorney, Agent, or Firm* — Westerman, Hattori, Daniels & Adrian, LLP

(57) ABSTRACT

A positive resist composition is provided comprising a polymer having an acid labile group and an acid generator bound to its backbone, in admixture with an onium salt having a specific cation structure capable of generating sulfonic acid having a molecular weight of at least 540. The composition is effective for suppressing acid diffusion, has high resolution, and forms a pattern of satisfactory profile and minimal edge roughness after exposure and development.

12 Claims, No Drawings

POSITIVE RESIST COMPOSITION AND PATTERNING PROCESS

CROSS-REFERENCE TO RELATED APPLICATION

This non-provisional application claims priority under 35 U.S.C. § 119(a) on Patent Application No. 2014-164387 filed in Japan on Aug. 12, 2014, the entire contents of which are hereby incorporated by reference.

TECHNICAL FIELD

This invention relates to a positive resist composition, and more particularly to a chemically amplified positive resist composition comprising a polymer in combination with a specific acid generator; and a patterning process using the same.

BACKGROUND ART

To meet the demand for higher integration density and operating speed of LSIs, the effort to reduce the pattern rule is in rapid progress. The wide-spreading flash memory market and the demand for increased storage capacities drive forward the miniaturization technology. As the advanced miniaturization technology, the double patterning version of ArF lithography is implemented to manufacture devices of 10 nm order on a mass scale.

The lithography of next generation to the ArF lithography is EUV lithography of wavelength 13.5 nm. For mask writing, the EB lithography is used in the art.

With respect to high-energy radiation of very short wavelength such as EB or EUV, hydrocarbons and similar light elements used in resist materials have little absorption. Then polyhydroxystyrene base resist materials are under consideration.

The exposure system for mask manufacturing made a transition from the laser beam exposure system to the EB exposure system to increase the accuracy of line width. Since a further size reduction became possible by increasing the accelerating voltage of the electron gun in the EB exposure system, the accelerating voltage increased from 10 kV to 30 kV and reached 50 kV in the current mainstream system, with a voltage of 100 kV being under investigation.

As the accelerating voltage increases, a lowering of sensitivity of resist film becomes of concern. As the accelerating voltage increases, the influence of forward scattering in a resist film becomes so reduced that the contrast of electron image writing energy is improved to ameliorate resolution and dimensional control whereas electrons can pass straightforward through the resist film so that the resist film becomes less sensitive. Since the mask exposure tool is designed for exposure by direct continuous writing, a lowering of sensitivity of resist film leads to an undesirably reduced throughput. Due to a need for higher sensitivity, chemically amplified resist compositions are studied.

As the feature size reduces, image blurs due to acid diffusion become a problem. To insure resolution for fine patterns with a size of 45 nm et seq., not only an improvement in dissolution contrast is important as previously reported, but control of acid diffusion is also important as reported in SPIE Vol. 6520 65203L-1 (2007). Since chemically amplified resist compositions are designed such that sensitivity and contrast are enhanced by acid diffusion, an attempt to minimize acid diffusion by reducing the temperature and/or time of post-exposure bake (PEB) fails, resulting in drastic reductions of sensitivity and contrast.

A triangular tradeoff relationship among sensitivity, resolution, and edge roughness has been pointed out. Specifically, a resolution improvement requires to suppress acid diffusion whereas a short acid diffusion distance leads to a loss of sensitivity.

The addition of an acid generator capable of generating a bulky acid is an effective means for suppressing acid diffusion. It was then proposed to incorporate in a polymer an acid generator of an onium salt having a polymerizable olefin. JP-A 2006-045311 discloses a sulfonium salt having polymerizable olefin capable of generating a specific sulfonic acid and a similar iodonium salt. JP-A 2006-178317 discloses a sulfonium salt having sulfonic acid directly attached to the backbone.

In the EUV lithography, a tradeoff relationship between sensitivity and edge roughness has been pointed out. For example, SPIE Vol. 3331 p 531 (1998) describes that sensitivity is in inverse proportion to edge roughness. It is expected that the edge roughness of a resist film is reduced by increasing the exposure dose to reduce shot noise. SPIE Vol. 5374 p 74 (2004) describes a tradeoff between sensitivity and roughness in the EUV lithography in that a resist material containing a more amount of quencher is effective in reducing roughness, but suffers from a decline of sensitivity at the same time. This suggests a need for a new resist material capable of solving the problem.

As the acid generator which can be blended to suppress acid diffusion, an acid generator adapted to generate an acid of giant molecular weight is proposed. For example, there are proposed acid generators capable of generating fluorosulfonic acid having steroid skeleton, acid generators capable of generating fluorinated tetraphenyl borate, and acid generators capable of generating sulfonic acid having rings linked by a plurality of linking groups. See Patent Documents 3 to 6.

CITATION LIST

Patent Document 1: JP-A 2006-045311 (U.S. Pat. No. 7,482,108)
Patent Document 2: JP-A 2006-178317
Patent Document 3: JP-A 2009-080474
Patent Document 4: JP-A 2009-269953
Patent Document 5: JP-A H11-052562
Patent Document 6: JP-A 2011-046694
Non-Patent Document 1: SPIE Vol. 6520 65203L-1 (2007)
Non-Patent Document 2: SPIE Vol. 3331 p 531 (1998)
Non-Patent Document 3: SPIE Vol. 5374 p 74 (2004)

SUMMARY OF INVENTION

An object of the present invention is to provide a positive resist composition, typically chemically amplified positive resist composition comprising a polymer in combination with a specific acid generator, which composition exhibits a high sensitivity, a satisfactory pattern profile after exposure and development, and less line edge roughness (LER, LWR) after development, than the prior art positive resist compositions comprising an acid generator-bound polymer or a polymer in admixture with an acid generator; and a patterning process using the resist composition.

Making extensive investigations in search for a positive resist material capable of meeting the current requirements including high sensitivity, high resolution, and minimal edge roughness, the inventors have found that better results are obtained by blending a polymer having an acid labile group and an acid generator bound to its backbone with an onium salt of specific cation structure capable of generating sulfonic acid having a molecular weight of at least 540 to formulate a chemically amplified positive resist composition. That is, a blend of a PAG-bound polymer with a PAG of bulky structure can form a pattern with minimized edge roughness after development, as compared with both a resist material comprising a PAG-bound polymer alone and a resist material comprising a PAG-free polymer in blend with a PAG of bulky structure.

In a first aspect, the invention provides a positive resist composition comprising a polymer comprising recurring units (a1) and/or (a2) having an acid labile group and recurring units (b1) and/or (b2) of sulfonium salt, represented by the general formula (1), the polymer having a weight average molecular weight of 1,000 to 500,000, and a sulfonium salt and/or iodonium salt having either one of cation structures C1, C2 and C3 represented by the general formula (2), the salt capable of generating an acid having a molecular weight of at least 540.

(1)

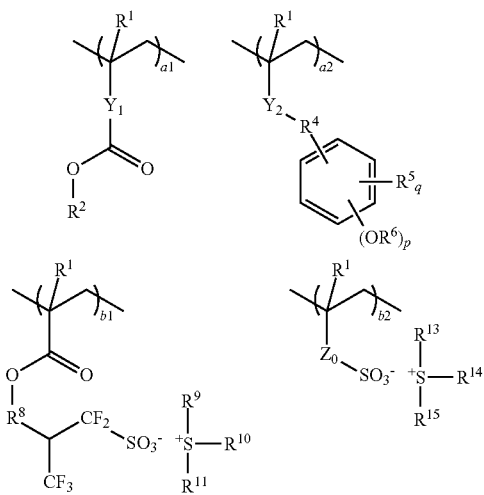

In formula (1), $R^1$, $R^3$, $R^7$, and $R^{12}$ are hydrogen or methyl; $R^9$, $R^{10}$, $R^{11}$, $R^{13}$, $R^{14}$, and $R^{15}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl or thiophenyl group which may contain $C_1$-$C_{10}$ alkyl, alkoxy, alkoxycarbonyl, acyl, acyloxy, halogen, trifluoromethyl, amino, nitro, or cyano moiety; $R^2$ and $R^6$ are an acid labile group; $R^4$ is a single bond, or a straight or branched $C_1$-$C_6$ alkylene group; $R^5$ is hydrogen, fluorine, trifluoromethyl, cyano or straight, branched or cyclic $C_1$-$C_6$ alkyl; p is 1 or 2; q is an integer of 0 to 4; $Y_1$ is a single bond, or a $C_1$-$C_{12}$ linking group having an ester moiety, ether moiety or lactone ring, phenylene group or naphthylene group; $Y_2$ is a single bond, —C(=O)—O— or —C(=O)—NH—; $R^8$ is a single bond or a $C_1$-$C_{12}$ linking group which may contain an ester moiety, ether moiety or lactone ring; $Z_0$ is a single bond, methylene, ethylene, phenylene, fluorinated phenylene, —O—$R^{16}$—, or —C(=O)—$Z_1$—$R^{16}$—; $Z_1$ is oxygen or NH; $R^{16}$ is a straight, branched or cyclic $C_1$-$C_6$ alkylene, alkenylene or phenylene group, which may contain a carbonyl, ester, ether or hydroxyl moiety; $0 \leq a1 < 1.0$, $0 \leq a2 < 1.0$, $0 < a1+a2 < 1.0$, $0 \leq b1 \leq 0.5$, $0 \leq b2 \leq 0.5$, and $0 < b1+b2 \leq 0.5$.

(2)

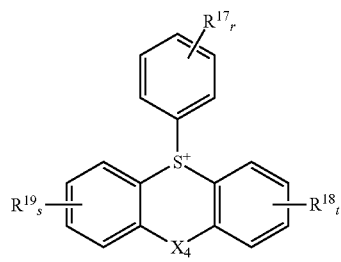

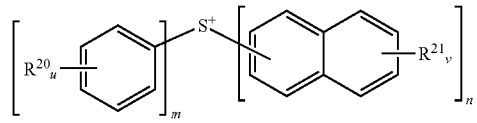

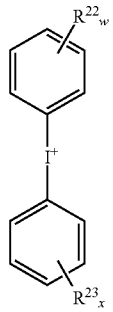

In formula (2), $R^{17}$, $R^{18}$, $R^{19}$, $R^{20}$, $R^{21}$, $R^{22}$ and $R^{23}$ are each independently halogen, trifluoromethyl, cyano, nitro, hydroxyl, $C_1$-$C_{10}$ alkyl, acyl, alkoxy, or alkoxycarbonyl; $X_4$ is a single bond, or a linking group selected from among methylene, ethylene, —O—, —S—, —$NR^{24}$—, —C(=O)—, and —S(=$O_2$)—; $R^{24}$ is hydrogen or $C_1$-$C_4$ alkyl; r, s, t, u, v, w and x are each independently an integer of 0 to 5, m is an integer of 0 to 2, and n is an integer of 1 to 3.

In a preferred embodiment, the salt capable of generating an acid having a molecular weight of at least 540 is PAG1, PAG2 or PAG3 represented by the general formula (3).

(3)

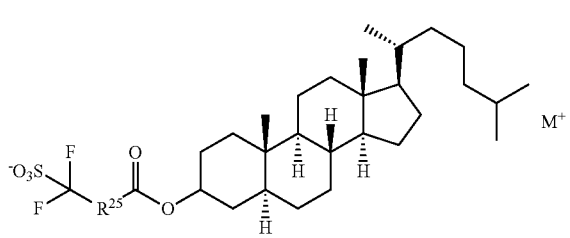

-continued

PAG 2

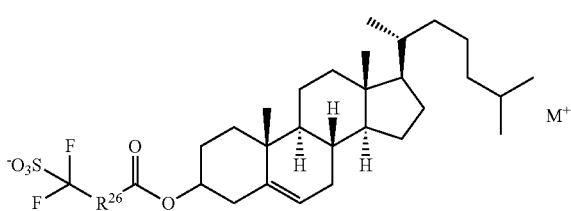

PAG 3

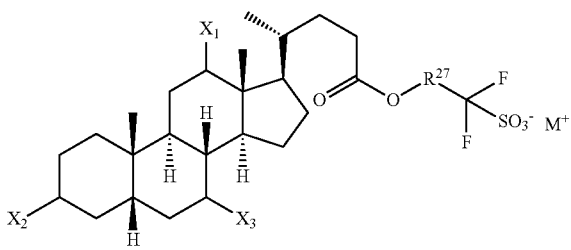

Herein $R^{25}$, $R^{26}$ and $R^{27}$ each are a straight, branched or cyclic $C_1$-$C_{12}$ alkylene group which may contain an ether moiety, ester moiety or fluorine, $X_1$, $X_2$ and $X_3$ each are hydroxyl, alkoxy, acyloxy or carbonyl, and $M^+$ is either one of cations C1, C2 and C3 represented by the general formula (2).

In a preferred embodiment, the polymer further comprises recurring units (c) having an adhesive group selected from the class consisting of hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH.

Typically the resist composition is a chemically amplified positive resist composition. The resist composition may further comprise a basic compound and/or a surfactant as an additive.

In a second aspect, the invention provides a pattern forming process comprising the steps of applying the positive resist composition defined above onto a substrate to form a coating, baking, exposing the coating to high-energy radiation, and developing the exposed coating in a developer.

Typically, the high-energy radiation is g-line, i-line, KrF excimer laser, ArF excimer laser, EB or soft X-ray having a wavelength of 3 to 15 nm.

The positive resist composition, typically chemically amplified positive resist composition may be used not only in the lithography for forming semiconductor circuits, but also in the formation of mask circuit patterns, micromachines, and thin-film magnetic head circuits.

Advantageous Effects of Invention

The positive resist composition has a satisfactory effect of suppressing acid diffusion and a high resolution, and forms a pattern of good profile and minimal edge roughness after exposure and development. The positive resist composition, typically chemically amplified positive resist composition is best suited as a micropatterning material for photomasks by EB lithography or for VLSIs by g-line, i-line, KrF excimer laser, ArF excimer laser, EB or EUV lithography.

DESCRIPTION OF EMBODIMENTS

As used herein, the singular forms "a," "an" and "the" include plural referents unless the context clearly dictates otherwise. "Optional" or "optionally" means that the subsequently described event or circumstances may or may not occur, and that description includes instances where the event or circumstance occurs and instances where it does not. The notation (Cn-Cm) means a group containing from n to m carbon atoms per group.

The acronym "PAG" stands for photoacid generator, "PEB" for post-exposure bake, "LER" for line edge roughness, "LWR" for line width roughness, "EUV" for extreme ultraviolet, and "EB" for electron beam.

One embodiment of the invention is a positive resist composition comprising a polymer comprising recurring units (a1) and/or (a2) having an acid labile group and recurring units (b1) and/or (b2) of sulfonium salt, represented by the general formula (1) as base resin, and a sulfonium salt and/or iodonium salt having a cation structure represented by the general formula (2), the salt capable of generating an acid having a molecular weight of at least 540.

(1)

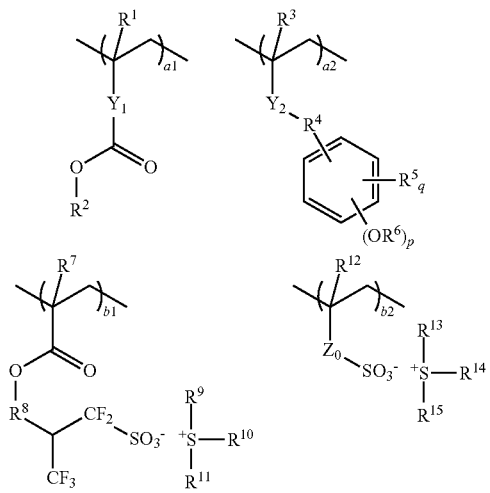

In formula (1), $R^1$, $R^3$, $R^7$, and $R^{12}$ are hydrogen or methyl; $R^9$, $R^{10}$, $R^{11}$, $R^{13}$, $R^{14}$, and $R^{15}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl or thiophenyl group which may contain $C_1$-$C_{10}$ alkyl, alkoxy, alkoxycarbonyl, acyl, acyloxy, halogen, trifluoromethyl, amino, nitro, or cyano moiety; $R^2$ and $R^6$ are an acid labile group; $R^4$ is a single bond, or a straight or branched $C_1$-$C_6$ alkylene group; $R^5$ is hydrogen, fluorine, trifluoromethyl, cyano or straight, branched or cyclic $C_1$-$C_6$ alkyl; p is 1 or 2; q is an integer of 0 to 4; $Y_1$ is a single bond, or a $C_1$-$C_{12}$ linking group having an ester moiety, ether moiety or lactone ring, phenylene group or naphthylene group; $Y_2$ is a single bond, —C(=O)—O— or —C(=O)—NH—; $R^8$ is a single bond or a $C_1$-$C_{12}$ linking group which may contain an ester moiety, ether moiety or lactone ring, $Z_0$ is a single bond, methylene, ethylene, phenylene, fluorinated phenylene, —O—$R^{16}$—, or —C(=O)—$Z_1$—$R^{16}$—; $Z_1$ is oxygen or NH; $R^{16}$ is a straight, branched or cyclic $C_1$-$C_6$ alkylene, alkenylene or phenylene group, which may contain a carbonyl, ester, ether or hydroxyl moiety; 0≤a1<1.0, 0≤a2<1.0, 0<a1+a2<1.0, 0≤b1≤0.5, 0≤b2≤0.5, and 0<b1+b2≤0.5.

(2)

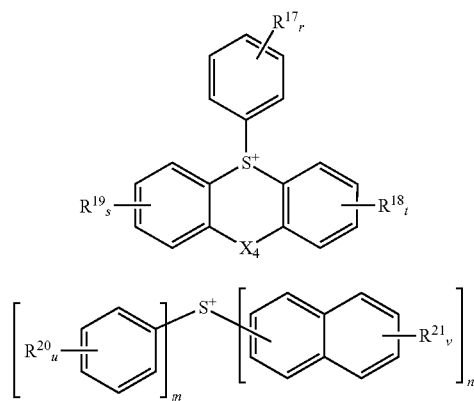

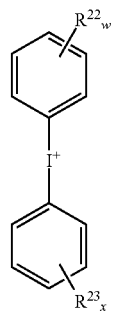

In formula (2), $R^{17}$, $R^{18}$, $R^{19}$, $R^{20}$, $R^{21}$, $R^{22}$ and $R^{25}$ are each independently halogen, trifluoromethyl, cyano, nitro, hydroxyl, $C_1$-$C_{10}$ alkyl, acyl, alkoxy, or alkoxycarbonyl; $X_4$ is a single bond, or a linking group selected from among methylene, ethylene, —O—, —S—, —NR$^{24}$—, —C(=O)—, and —S(=O$_2$)—; $R^{24}$ is hydrogen or $C_1$-$C_4$ alkyl; r, s, t, u, v, w and x are each independently an integer of 0 to 5, m is an integer of 0 to 2, and n is an integer of 1 to 3.

Monomers Ma1 and Ma2 from which the acid labile group-containing recurring units (a1) and (a2) in formula (1) are derived may be represented by the following formulae.

Ma1

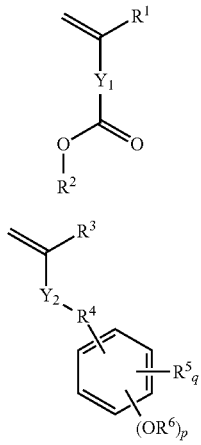

Ma2

Herein $R^1$ to $R^6$, $Y_1$, $Y_2$ and p are as defined above.

Of the groups represented by $Y_1$, the $C_1$-$C_{12}$ linking group having a lactone ring may be exemplified by the following.

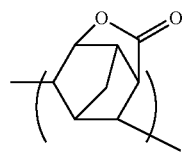

C1

C2

C3

Examples of the monomer Ma1 from which recurring unit (a1) is derived are given below, but not limited thereto.

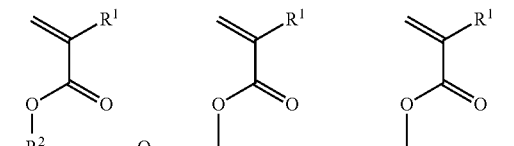

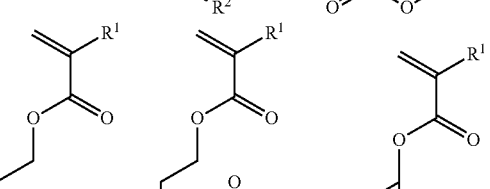

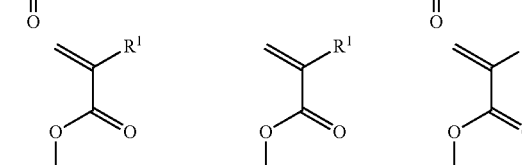

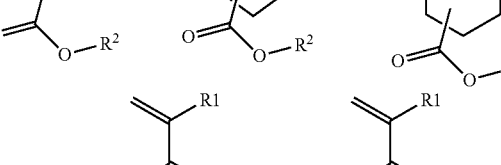

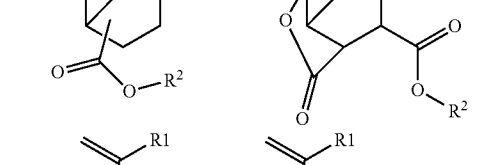

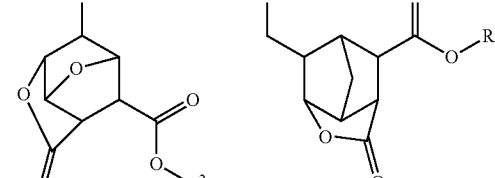

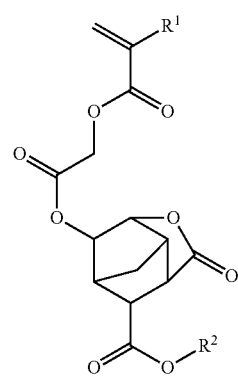
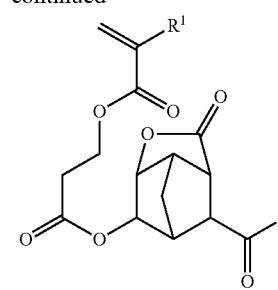
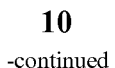
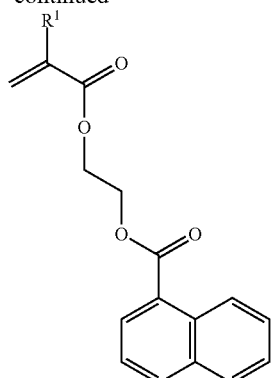
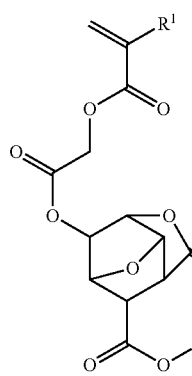
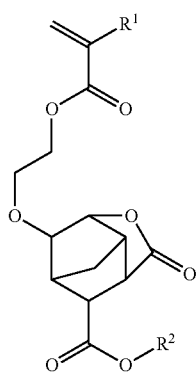
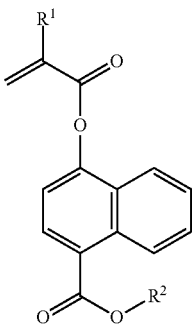
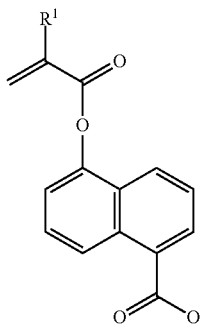
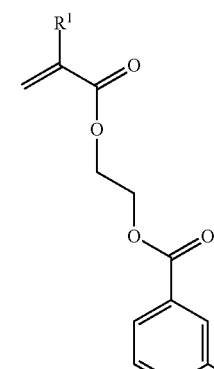
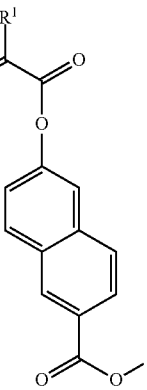
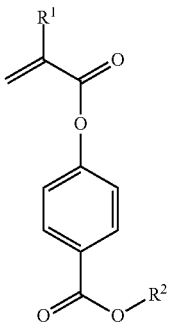
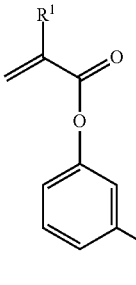
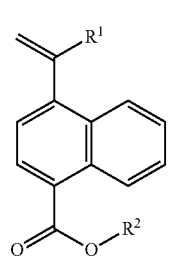
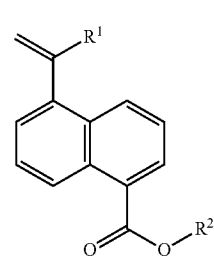
Herein $R^1$ and $R^2$ are as defined above.
Examples of the monomer Mat from which recurring unit (a2) is derived are given below, but not limited thereto.

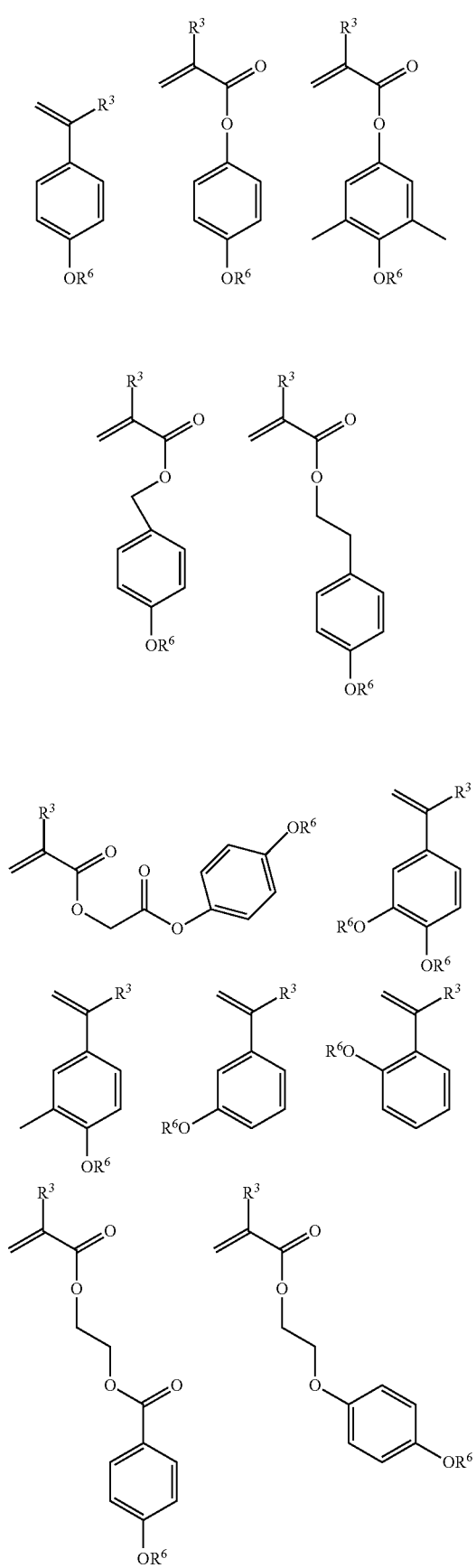
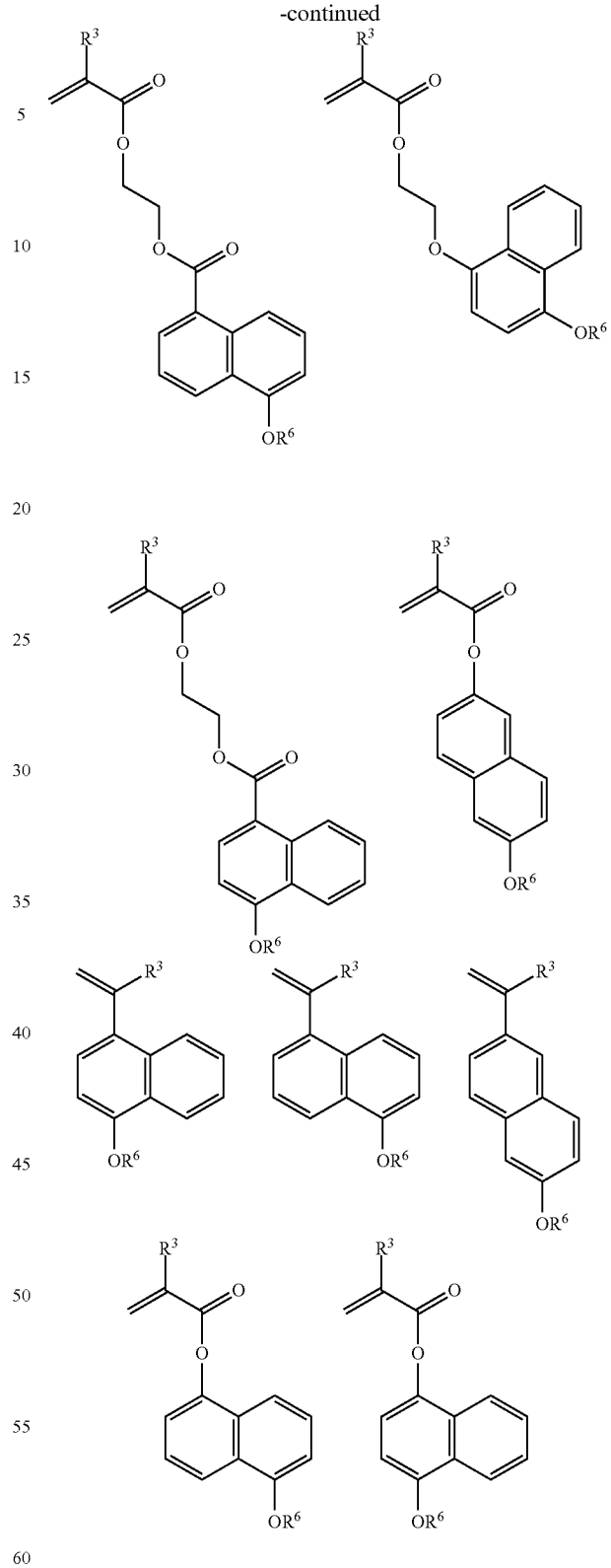
Herein $R^3$ and $R^6$ are as defined above.
The acid labile groups represented by $R^2$ and $R^6$ in formula (1) may be selected from a variety of such groups. The acid labile groups may be the same or different and preferably include substituent groups of the following formulae (A-1) to (A-3).

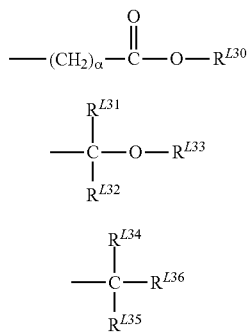

(A-1)

(A-2)

(A-3)

In formula (A-1), $R^{L30}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (A-3). Exemplary tertiary alkyl groups are tert-butyl, tert-amyl, 1,1-diethylpropyl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, and 2-methyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter a is an integer of 0 to 6.

In formula (A-2), $R^{L31}$ and $R^{L32}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L33}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the substituted alkyl groups are shown below.

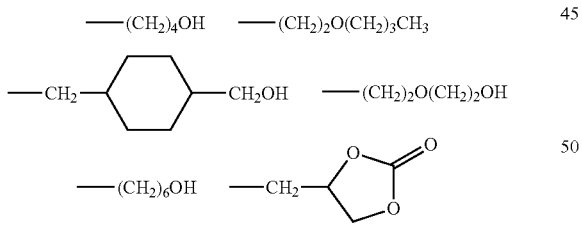

A pair of $R^{L31}$ and $R^{L32}$, $R^{L31}$ and $R^{L33}$, or R and R may bond together to form a ring with the carbon and oxygen atoms to which they are attached. Each of $R^{L31}$, $R^{L32}$ and $R^{L33}$ is a straight or branched alkylene group of 1 to 18 carbon atoms, preferably 1 to 10 carbon atoms when they form a ring, while the ring preferably has 3 to 10 carbon atoms, more preferably 4 to 10 carbon atoms.

Examples of the acid labile groups of formula (A-1) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethyl cyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Also included are substituent groups having the formulae (A-1)-1 to (A-1)-10.

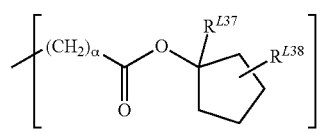

(A-1)-1

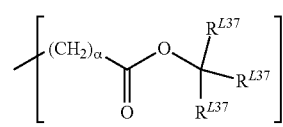

(A-1)-2

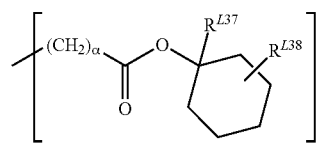

(A-1)-3

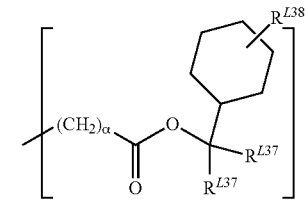

(A-1)-4

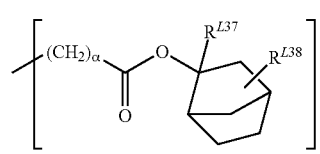

(A-1)-5

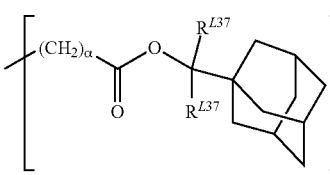

(A-1)-6

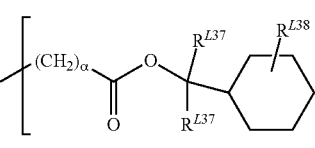

(A-1)-7

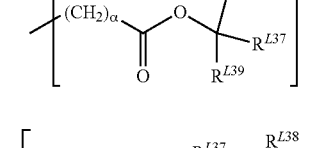

(A-1)-8

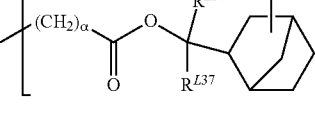

(A-1)-9

(A-1)-10

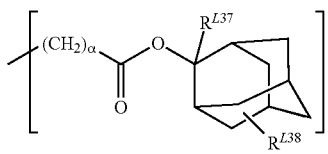

Herein $R^{L37}$ is each independently a straight, branched or cyclic $C_1$-$C_{10}$ alkyl group or $C_6$-$C_{20}$ aryl group, $R^{L38}$ is hydrogen or a straight, branched or cyclic $C_1$-$C_{10}$ alkyl group, $R^{L39}$ is each independently a straight, branched or cyclic $C_2$-$C_{10}$ alkyl group or $C_6$-$C_{20}$ aryl group, and a is as defined above.

Of the acid labile groups of formula (A-2), the straight and branched ones are exemplified by the following groups having formulae (A-2)-1 to (A-2)-69.

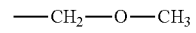 (A-2)-1

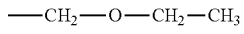 (A-2)-2

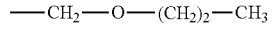 (A-2)-3

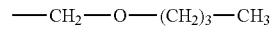 (A-2)-4

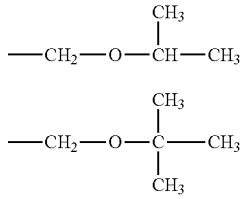 (A-2)-5

(A-2)-6

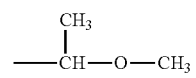 (A-2)-7

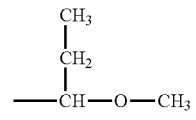 (A-2)-8

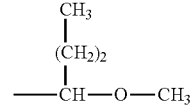 (A-2)-9

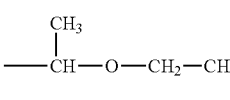 (A-2)-10

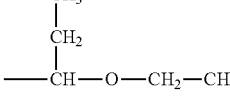 (A-2)-11

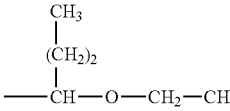 (A-2)-12

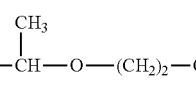 (A-2)-13

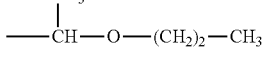

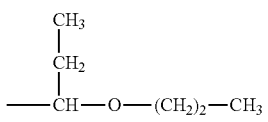 (A-2)-14

(A-2)-15

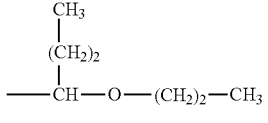 (A-2)-16

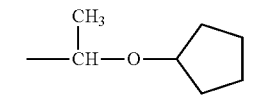 (A-2)-17

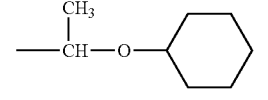 (A-2)-18

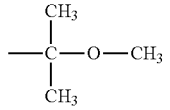 (A-2)-19

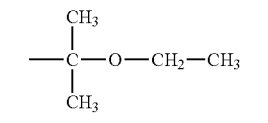 (A-2)-20

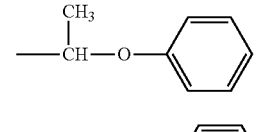 (A-2)-21

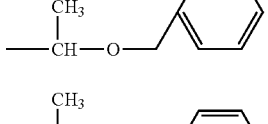 (A-2)-22

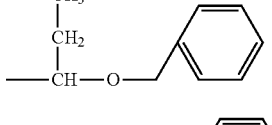 (A-2)-23

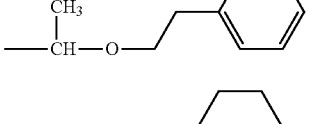 (A-2)-24

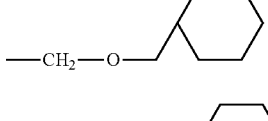 (A-2)-25

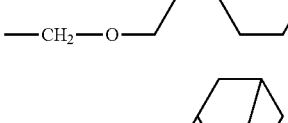 (A-2)-26

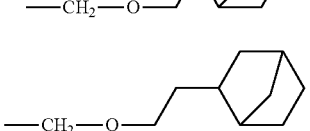 (A-2)-27

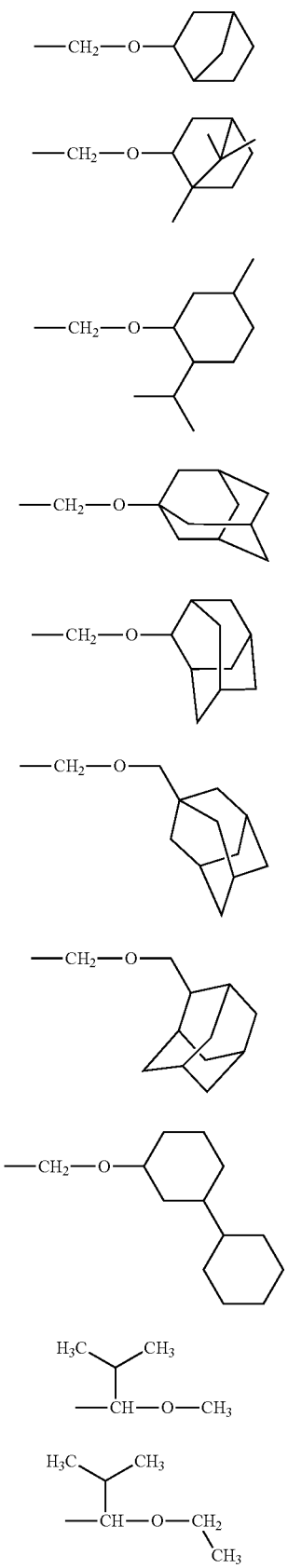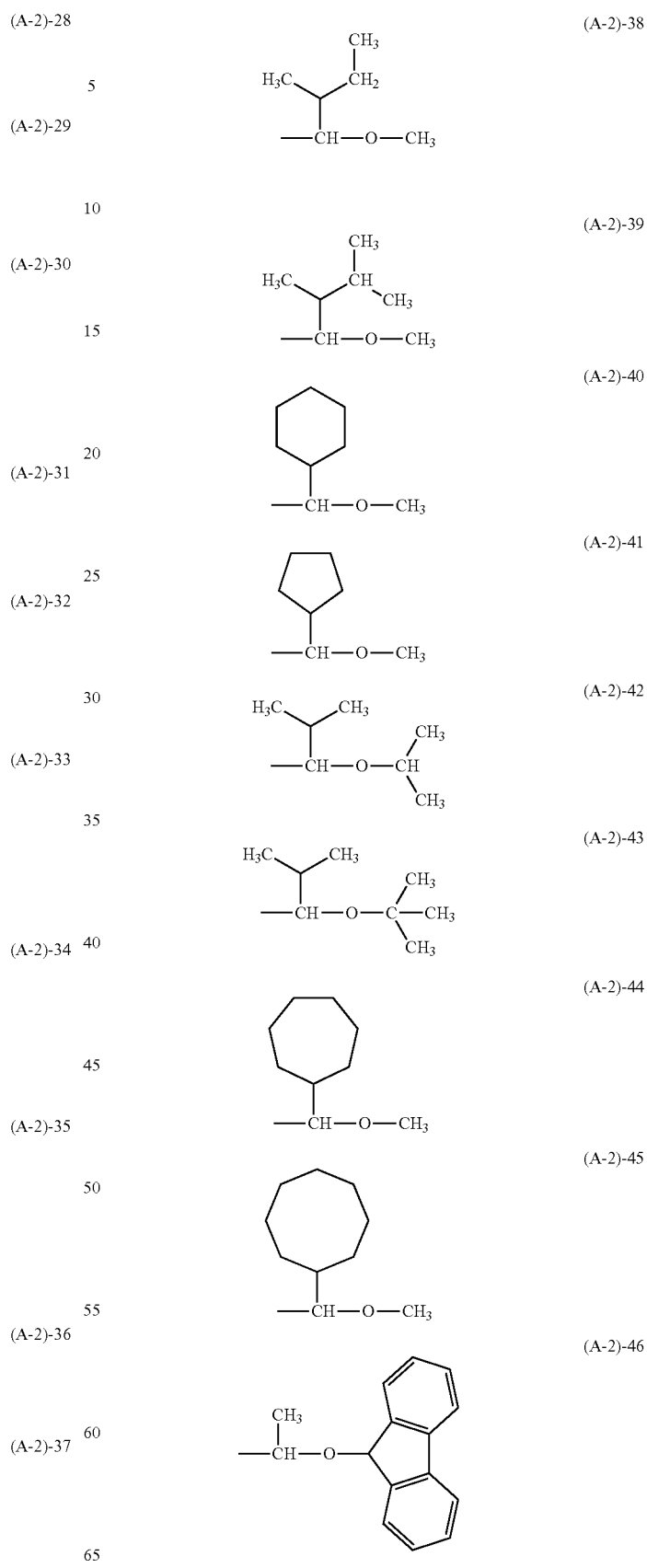

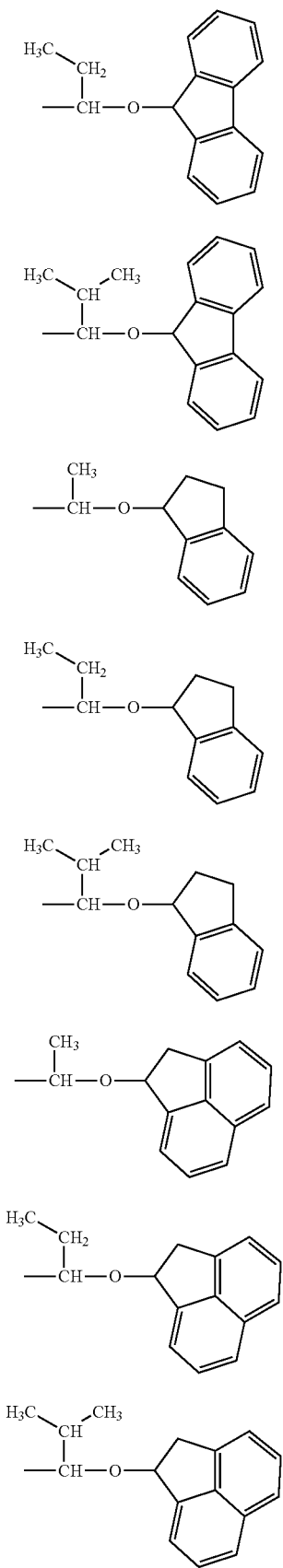
(A-2)-47
(A-2)-48
(A-2)-49
(A-2)-50
(A-2)-51
(A-2)-52
(A-2)-53
(A-2)-54
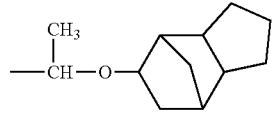
(A-2)-55
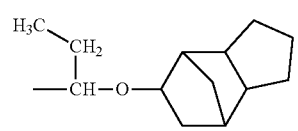
(A-2)-56
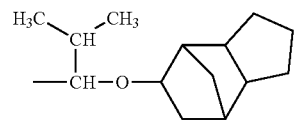
(A-2)-57
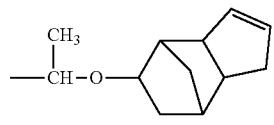
(A-2)-58
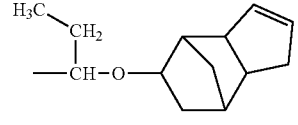
(A-2)-59
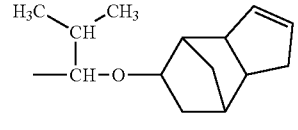
(A-2)-60
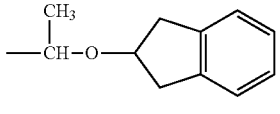
(A-2)-61
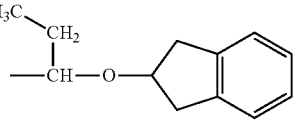
(A-2)-62
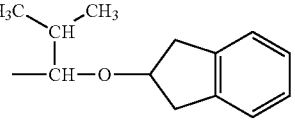
(A-2)-63
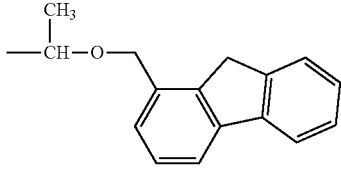
(A-2)-64
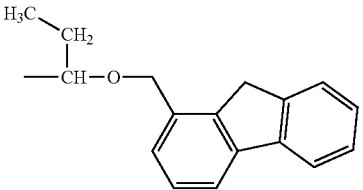
(A-2)-65

(A-2)-66 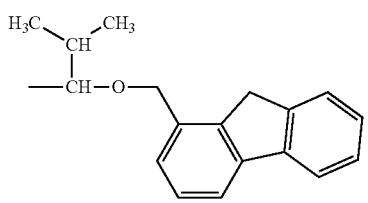

(A-2)-67 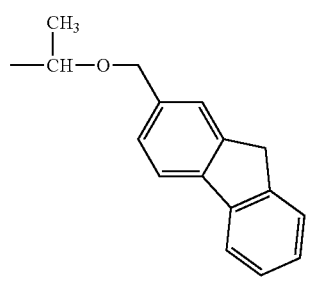

(A-2)-68 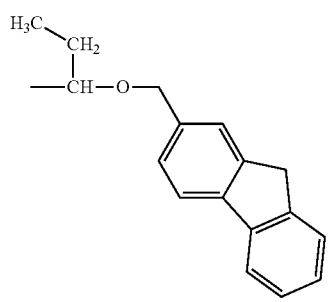

(A-2)-69 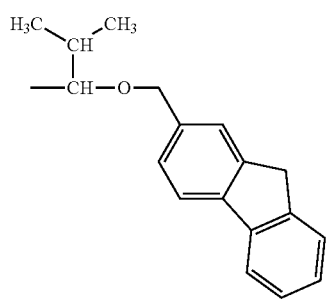

Of the acid labile groups of formula (A-2), the cyclic ones are, for example, tetrahydrofuran-2-yl, 2-methyltetrahydrofuran-2-yl, tetrahydropyran-2-yl, and 2-methyltetrahydropyran-2-yl.

Other examples of acid labile groups include those of the general formula (A-2a) or (A-2b) while the polymer may be crosslinked within the molecule or between molecules with these acid labile groups.

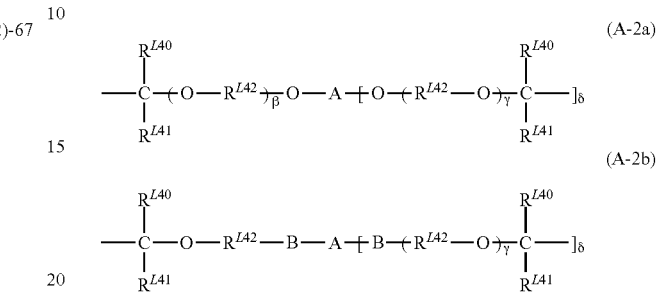

Herein $R^{L40}$ and $R^{L41}$ each are hydrogen or a straight, branched or cyclic $C_1$-$C_8$ alkyl group, or $R^{L40}$ and $R^{L41}$, taken together, may form a ring with the carbon atom to which they are attached, and $R^{L40}$ and $R^{L41}$ are straight or branched $C_1$-$C_8$ alkylene groups when they form a ring. $R^{L42}$ is a straight, branched or cyclic $C_1$-$C_{10}$ alkylene group. Each of β and δ is 0 or an integer of 1 to 10, preferably 0 or an integer of 1 to 5, and γ is an integer of 1 to 7. "A" is a (γ+1)-valent aliphatic or alicyclic saturated hydrocarbon group, aromatic hydrocarbon group or heterocyclic group having 1 to 50 carbon atoms, which may be separated by a heteroatom or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkyltriyl and alkyltetrayl groups, and $C_6$-$C_{30}$ arylene groups, which may be separated by a heteroatom or in which some of the hydrogen atoms attached to carbon atoms may be substituted by hydroxyl, carboxyl, acyl groups or halogen atoms. The subscript γ is preferably an integer of 1 to 3.

The crosslinking acetal groups of formulae (A-2a) and (A-2b) are exemplified by the following formulae (A-2)-70 through (A-2)-77.

(A-2)-70 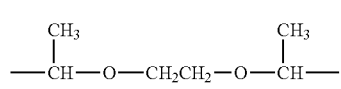

(A-2)-71 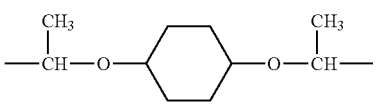

(A-2)-72

(A-2)-73

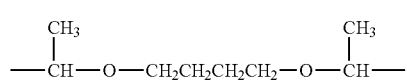

(A-2)-74 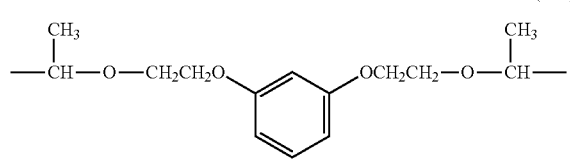

(A-2)-75 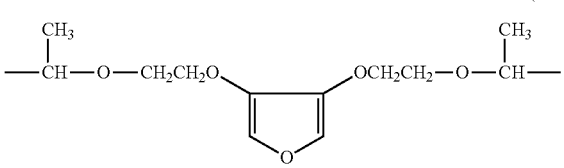

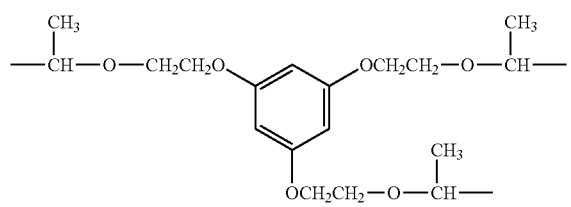
(A-2)-76

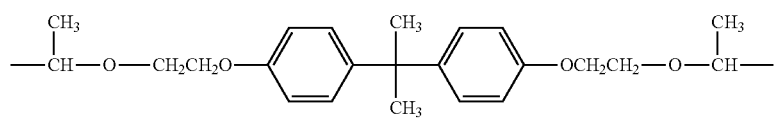
(A-2)-77

In formula (A-3), $R^{L34}$, $R^{L35}$ and $R^{L36}$ each are a monovalent hydrocarbon group, typically a straight, branched or cyclic $C_1$-$C_{20}$ alkyl group or straight, branched or cyclic $C_2$-$C_{20}$ alkenyl group, which may contain a heteroatom such as oxygen, sulfur, nitrogen or fluorine. A pair of $R^{L34}$ and $R^{L35}$, $R^{L34}$ and $R^{L36}$, or $R^{L35}$ and $R^{L36}$ may bond together to form a $C_3$-$C_{20}$ aliphatic ring with the carbon atom to which they are attached.

Exemplary tertiary alkyl groups of formula (A-3) include tert-butyl, triethylcarbyl, 1-ethylnorbornyl, 1-methylcyclohexyl, 1-ethylcyclopentyl, 2-(2-methyl)adamantyl, 2-(2-ethyl)adamantyl, and tert-amyl.

Other exemplary tertiary alkyl groups include those of the following formulae (A-3)-1 to (A-3)-18.

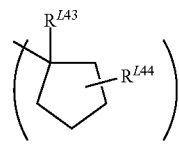
(A-3)-1

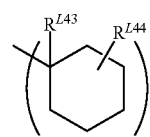
(A-3)-2

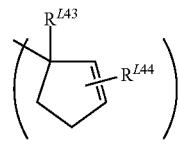
(A-3)-3

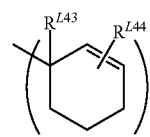
(A-3)-4

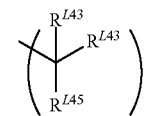
(A-3)-5

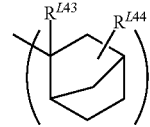
(A-3)-6

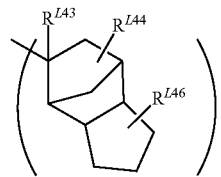
(A-3)-7

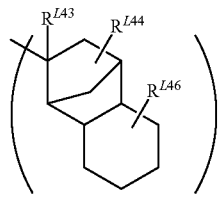
(A-3)-8

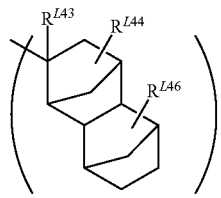
(A-3)-9

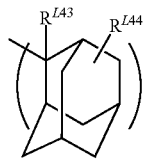
(A-3)-10

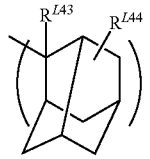
(A-3)-11

-continued (A-3)-12
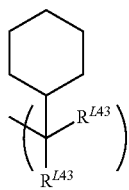

(A-3)-13
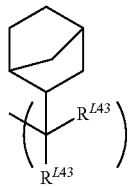

(A-3)-14
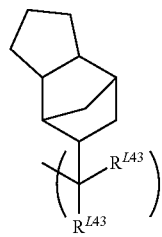

(A-3)-15
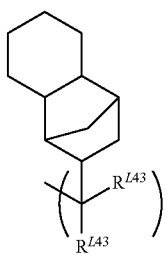

(A-3)-16
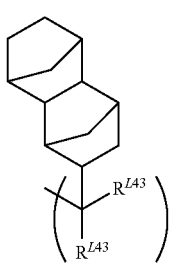

(A-3)-17
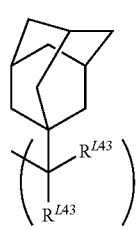

(A-3)-18
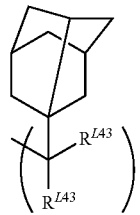

Herein $R^{L43}$ is each independently a straight, branched or cyclic $C_1$-$C_8$ alkyl group or $C_6$-$C_{20}$ aryl group, typically phenyl, $R^{L44}$ and $R^{L46}$ each are hydrogen or a straight, branched or cyclic $C_1$-$C_{20}$ alkyl group, and $R^{L45}$ is a $C_6$-$C_{20}$ aryl group, typically phenyl.

The polymer may be crosslinked within the molecule or between molecules with groups having $R^{L47}$ which is a di- or multi-valent alkylene or arylene group, as shown by the following formulae (A-3)-19 and (A-3)-20.

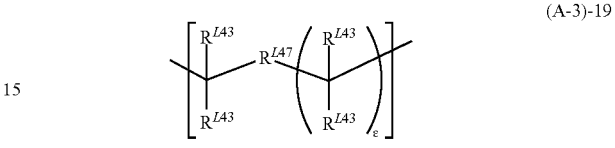
(A-3)-19

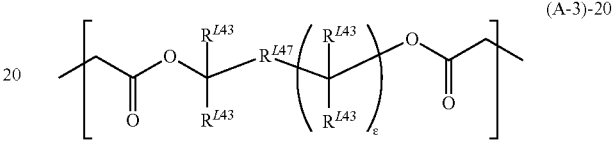
(A-3)-20

Herein $R^{L43}$ is as defined above, $R^{L47}$ is a straight, branched or cyclic $C_1$-$C_{20}$ alkylene group or arylene group, typically phenylene, which may contain a heteroatom such as oxygen, sulfur or nitrogen, and E is an integer of 1 to 3.

Of recurring units having acid labile groups of formula (A-3), recurring units of (meth)acrylate having an exo-form structure represented by the formula (A-3)-21 are preferred.

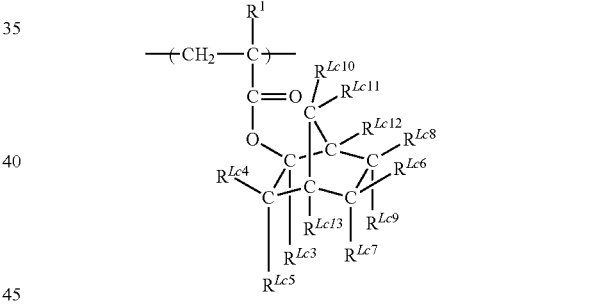
(A-3)-21

Herein, $R^1$ is hydrogen or methyl; $R^{Lc3}$ is a straight, branched or cyclic $C_1$-$C_8$ alkyl group or an optionally substituted $C_6$-$C_{20}$ aryl group; $R^{Lc4}$ to $R^{Lc9}$, $R^{Lc12}$ and $R^{Lc13}$ are each independently hydrogen or a monovalent $C_1$-$C_{15}$ hydrocarbon group which may contain a heteroatom; and $R^{Lc10}$ and $R^{Lc11}$ are hydrogen or a monovalent $C_1$-$C_{15}$ hydrocarbon group which may contain a heteroatom. Alternatively, a pair of $R^{Lc4}$ and $R^{Lc5}$, $R^{Lc6}$ and $R^{Lc8}$, $R^{Lc6}$ and $R^{Lc9}$, $R^{Lc7}$ and $R^{Lc9}$, $R^{Lc7}$ and $R^{Lc13}$, $R^{Lc8}$ and $R^{Lc12}$, $R^{Lc10}$ and $R^{Lc11}$, or $R^{Lc11}$ and $R^{Lc12}$, taken together, may form a ring, and in that event, each ring-forming R is a divalent $C_1$-$C_{15}$ hydrocarbon group which may contain a heteroatom. Also, a pair of $R^{Lc4}$ and $R^{Lc13}$, $R^{Lc10}$ and $R^{Lc13}$, or $R^{Lc6}$ and $R^{Lc8}$ which are attached to vicinal carbon atoms may bond together directly to form a double bond. The formula also represents an enantiomer.

The ester form monomers from which recurring units having an exo-form structure represented by formula (A-3)-21 are derived are described in U.S. Pat. No. 6,448,420 (JP-A 2000-327633). Illustrative non-limiting examples of suitable monomers are given below.

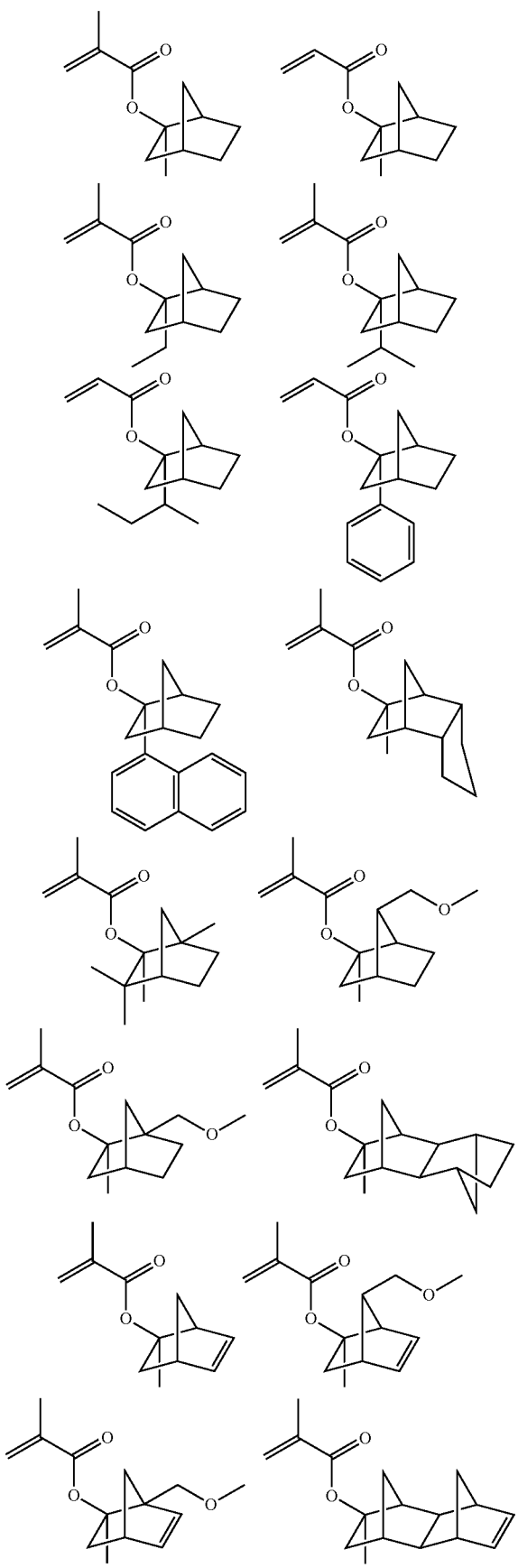

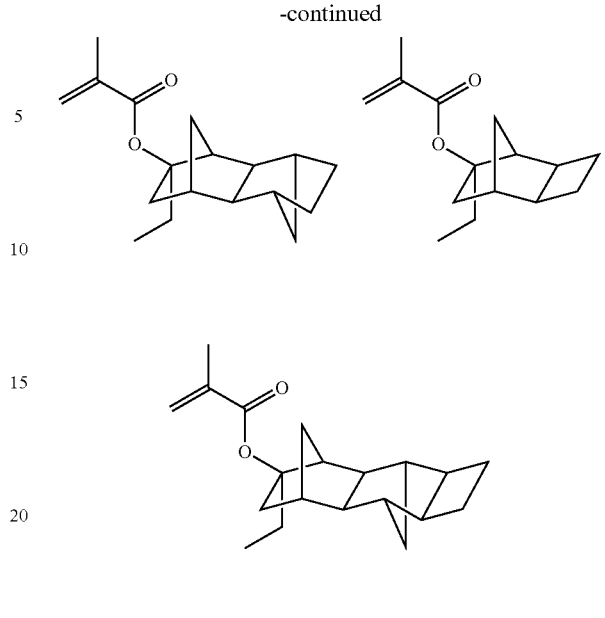

Also included in the recurring units having an acid labile group of formula (A-3) are recurring units of (meth)acrylate having furandiyl, tetrahydrofurandiyl or oxanorbornanediyl group as represented by the following formula (A-3)-22.

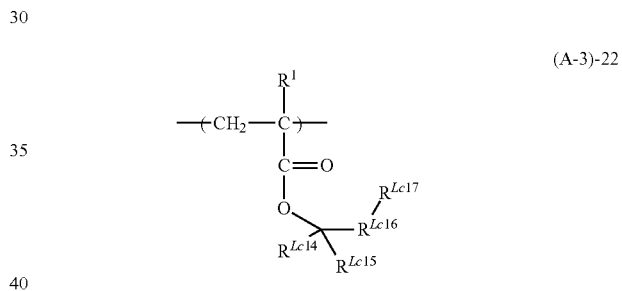

(A-3)-22

Herein, $R^1$ is hydrogen or methyl; $R^{Lc14}$ and $R^{Lc15}$ are each independently a monovalent, straight, branched or cyclic $C_1$-$C_{10}$ hydrocarbon group, or $R^{Lc14}$ and $R^{Lc15}$, taken together, may form an aliphatic hydrocarbon ring with the carbon atom to which they are attached. $R^{Lc16}$ is a divalent group selected from furandiyl, tetrahydrofurandiyl and oxanorbornanediyl. $R^{Lc17}$ is hydrogen or a monovalent, straight, branched or cyclic $C_1$-$C_{10}$ hydrocarbon group which may contain a heteroatom.

Examples of the monomers from which the recurring units substituted with acid labile groups having furandiyl, tetrahydrofurandiyl and oxanorbornanediyl are derived are shown below. Note that Me is methyl and Ac is acetyl.

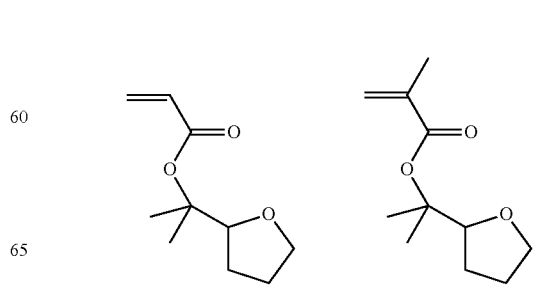

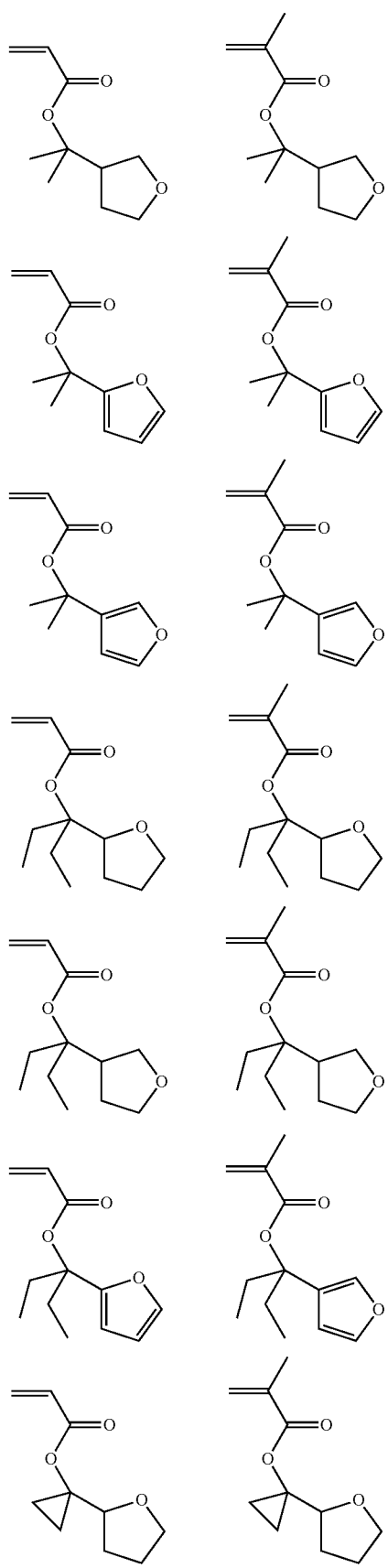
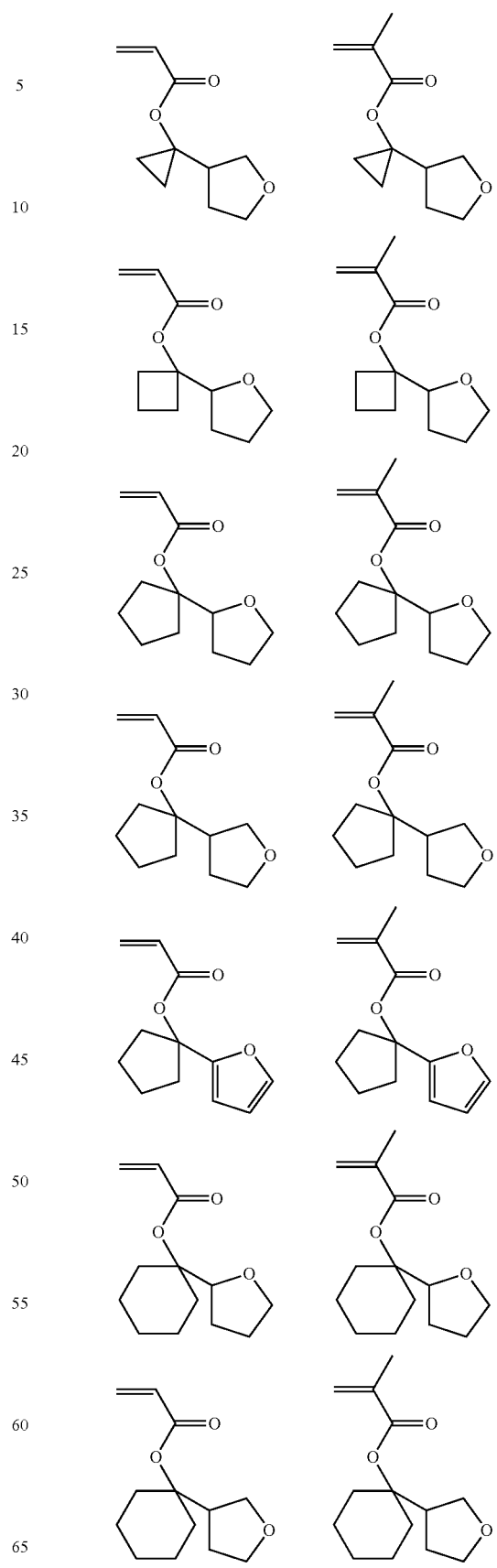

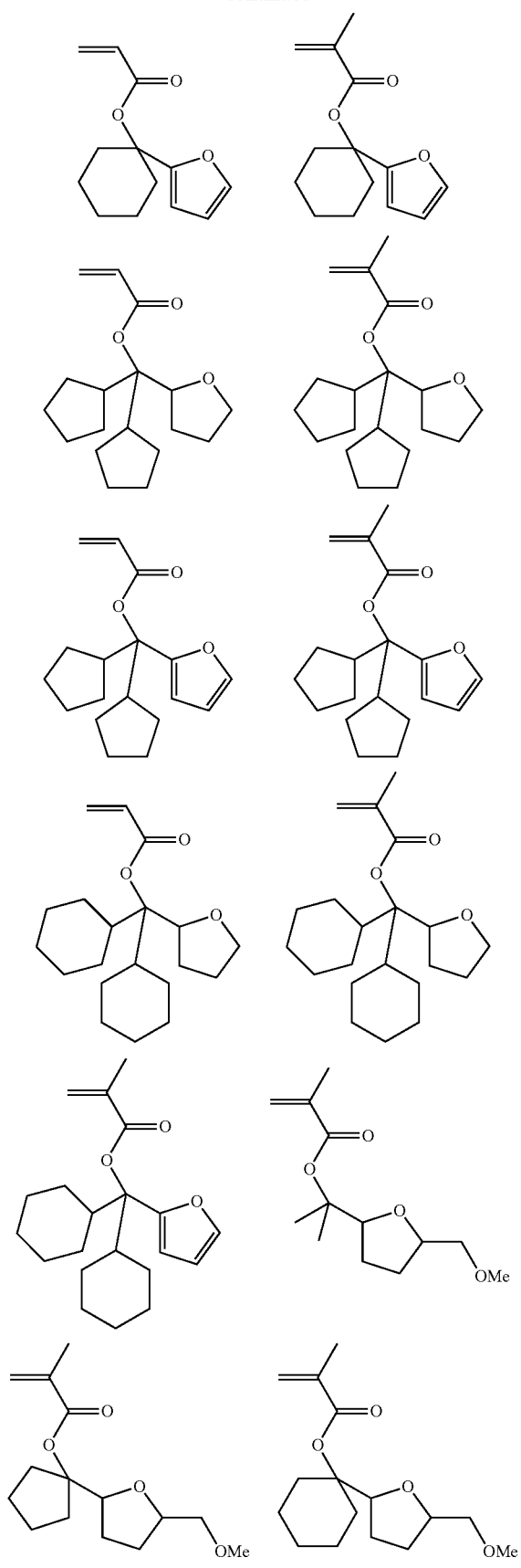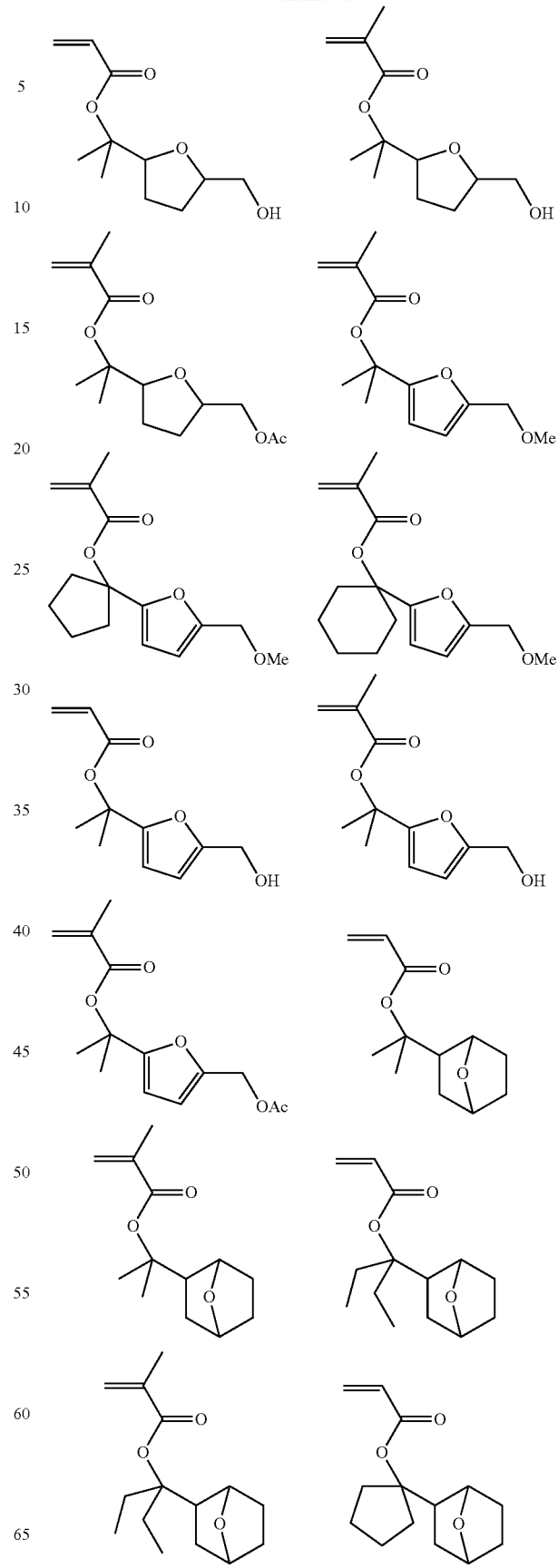

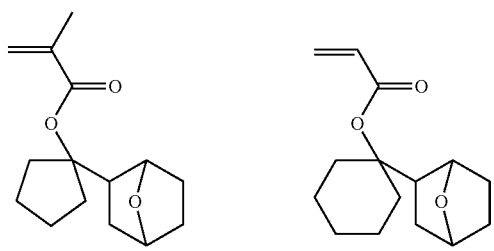
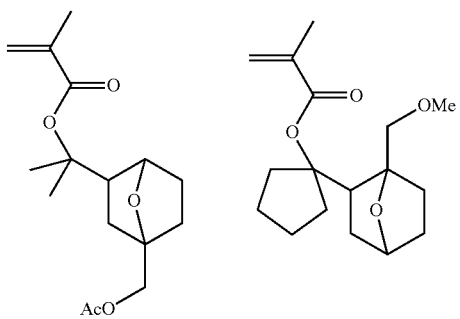
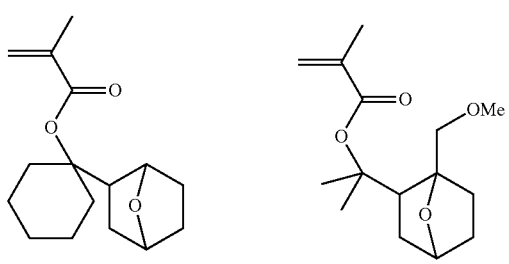
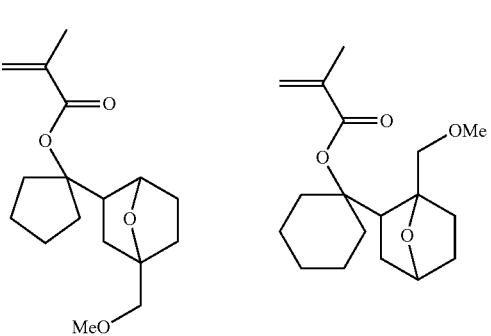
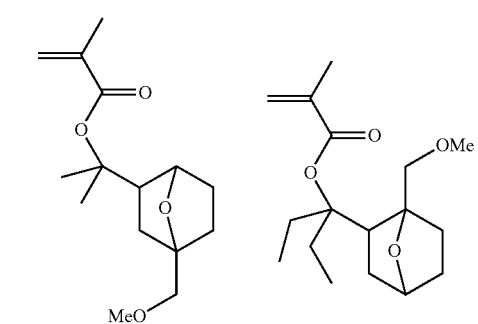
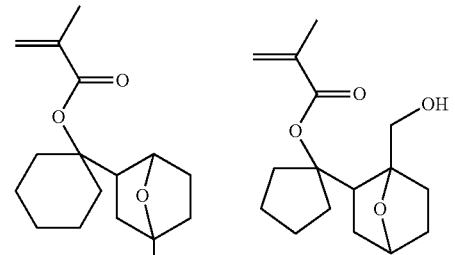
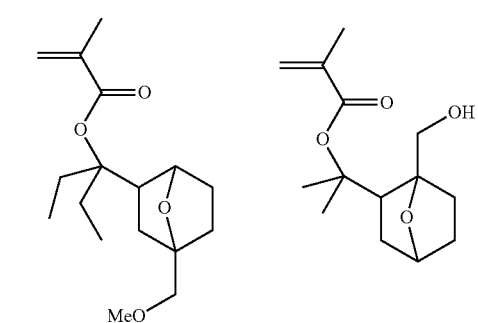
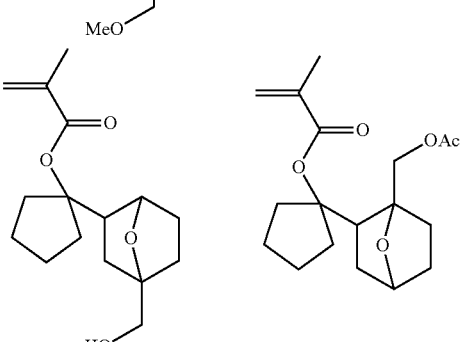
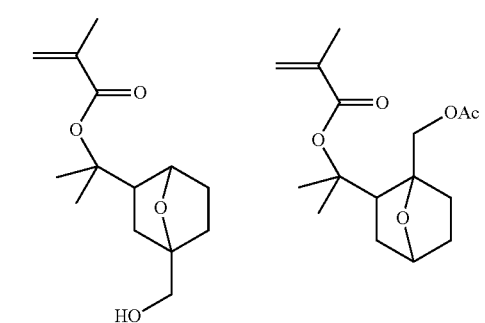
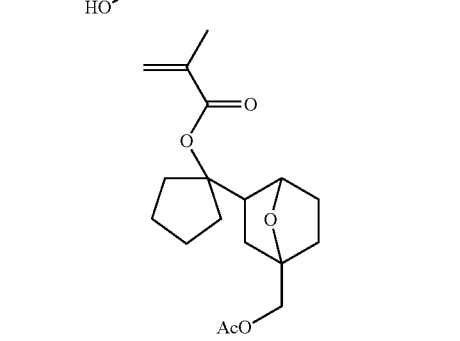
In the recurring unit (a1), the hydrogen atom of the carboxyl group may be substituted by an acid labile group having the general formula (A-3)-23.

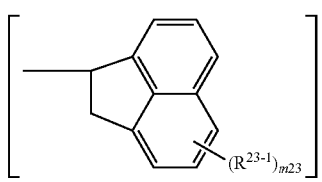

(A-3)-23

Herein $R^{23-1}$ is hydrogen, $C_1$-$C_4$ alkyl, alkoxy, alkanoyl, alkoxycarbonyl, $C_6$-$C_{10}$ aryl, halogen, or cyano group, and m23 is an integer of 1 to 4.

Examples of the monomer having a carboxyl group substituted with an acid labile group of formula (A-3)-23 are given below.

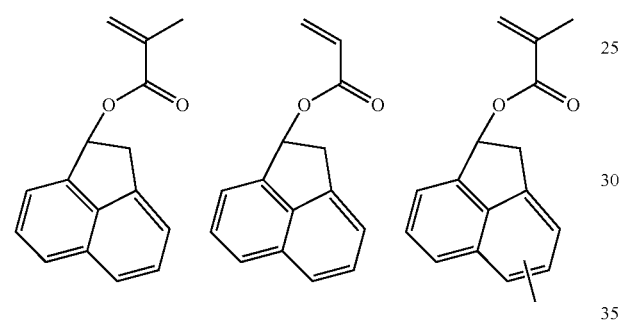

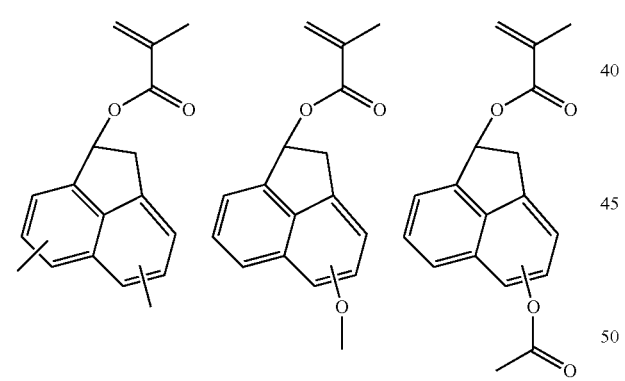

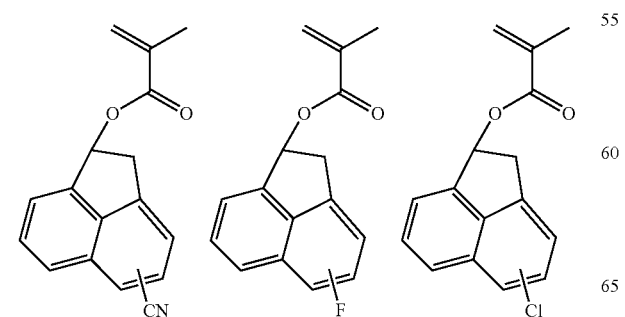

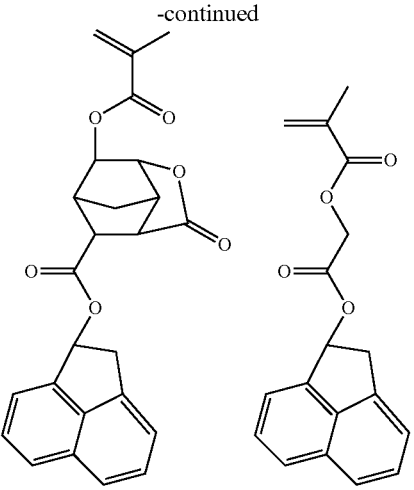

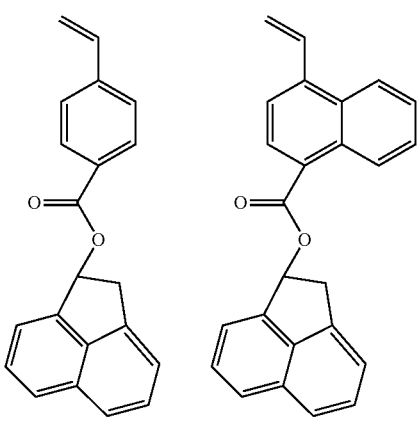

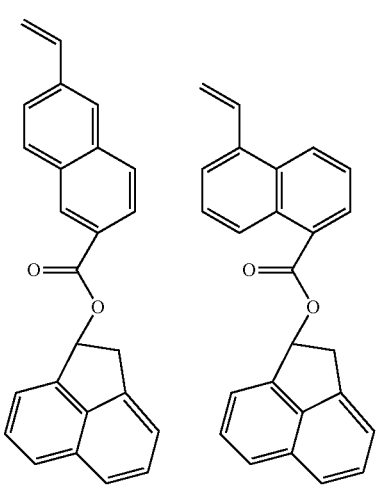

In the recurring unit (a1), the hydrogen atom of the carboxyl group may be substituted by an acid labile group having the general formula (A-3)-24.

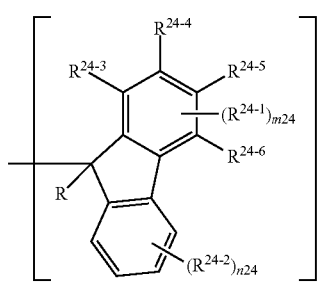

(A-3)-24

Herein $R^{24-1}$ and $R^{24-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is hydrogen, a straight, branched or cyclic $C_1$-$C_{12}$ alkyl group which may contain an oxygen or sulfur atom, $C_2$-$C_{12}$ alkenyl, $C_2$-$C_{12}$ alkynyl, or $C_6$-$C_{10}$ aryl group; $R^{24-3}$, $R^{24-4}$, $R^{24-5}$, and $R^{24-6}$ each are hydrogen, or a pair of $R^{24-3}$ and $R^{24-4}$, $R^{24-4}$ and $R^{24-5}$, or $R^{24-5}$ and $R^{24-6}$ may bond together to form a benzene ring; m24 and n24 each are an integer of 1 to 4.

Examples of the monomer having a carboxyl group substituted with an acid labile group of formula (A-3)-24 are given below.

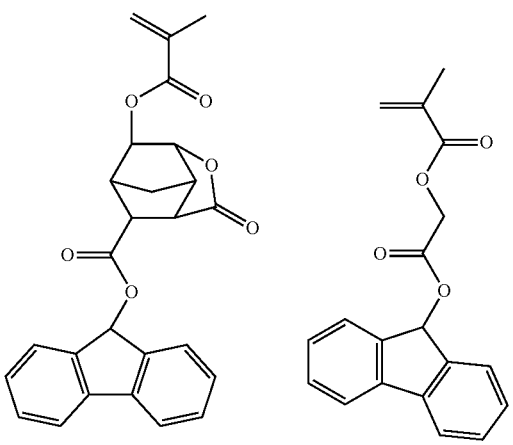

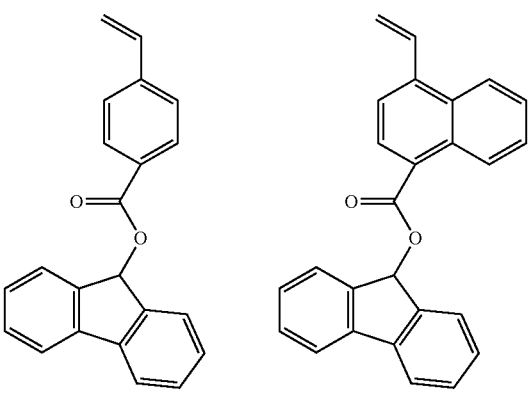

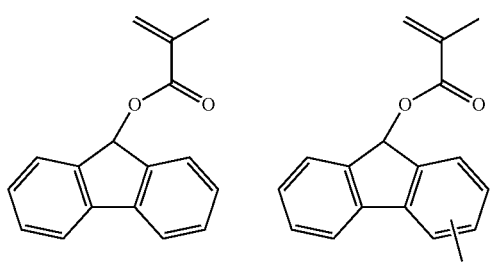

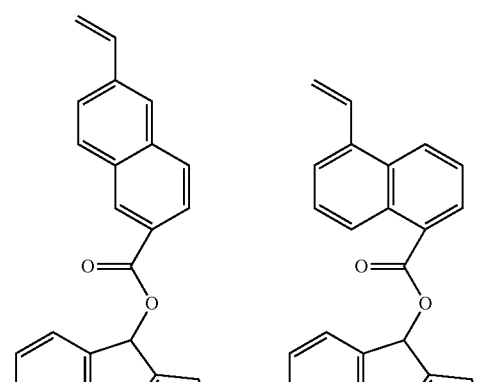

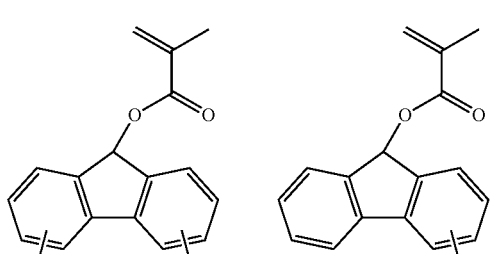

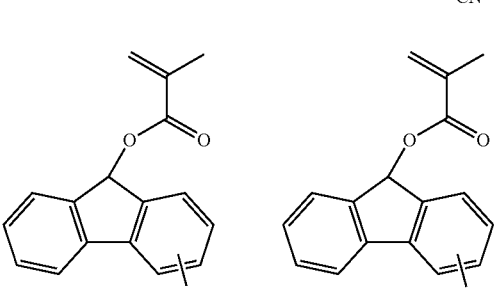

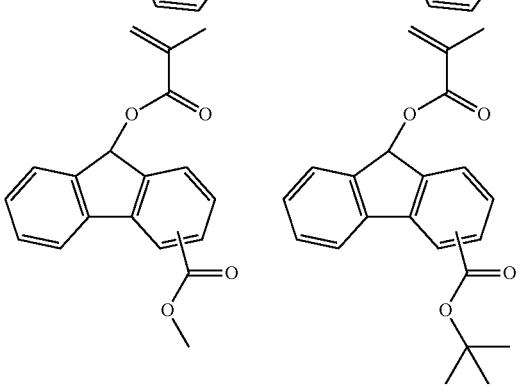

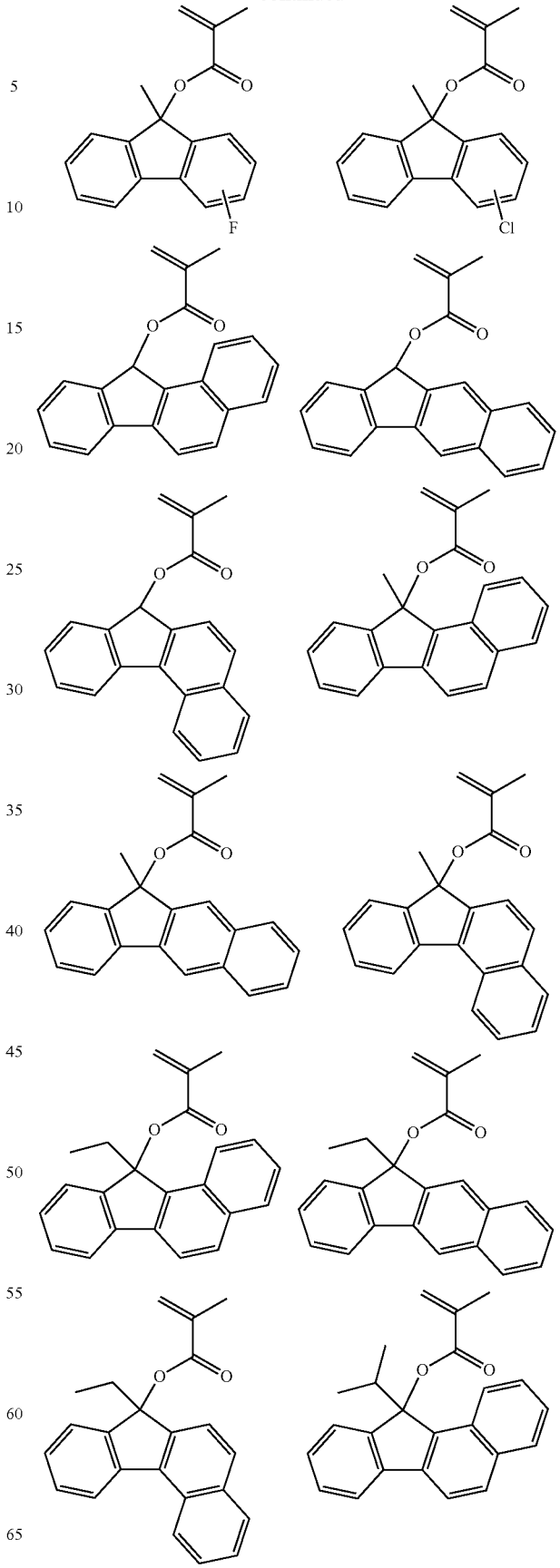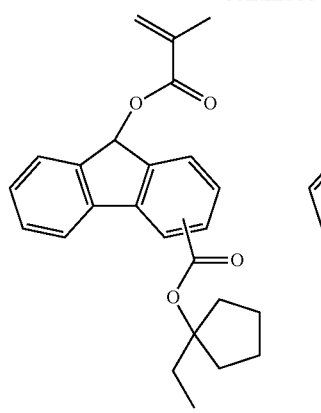

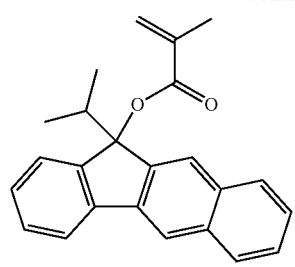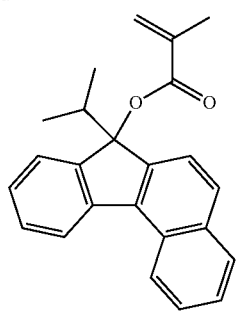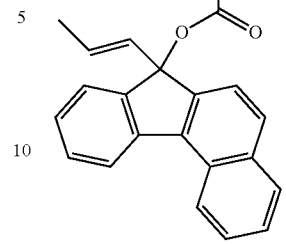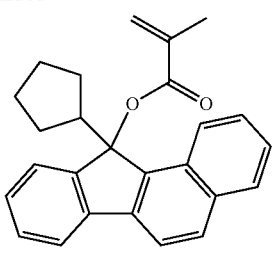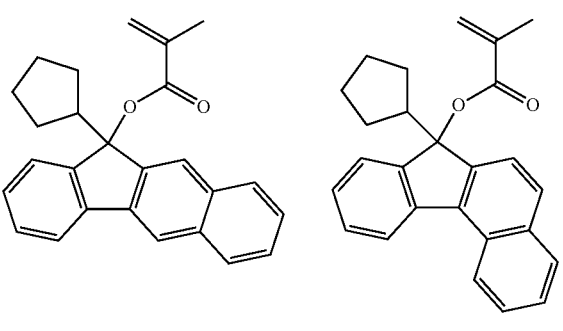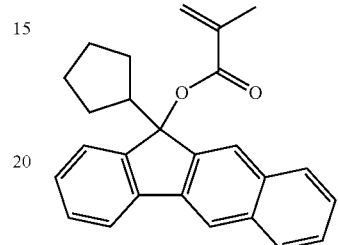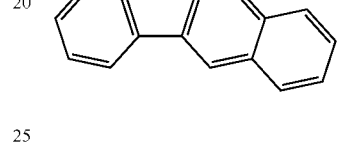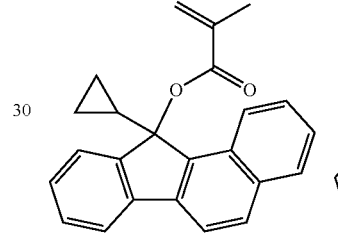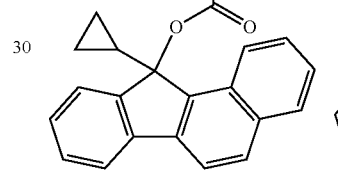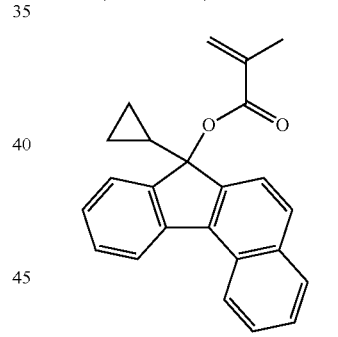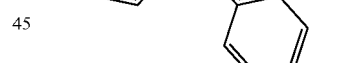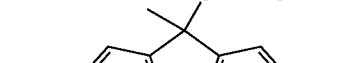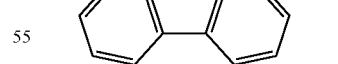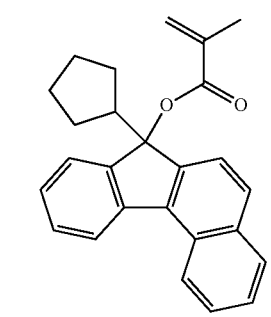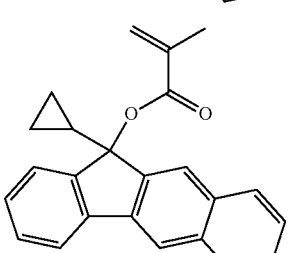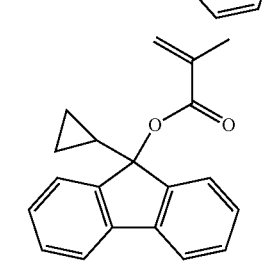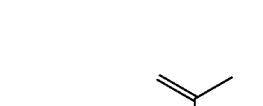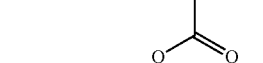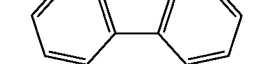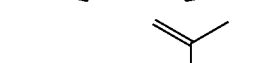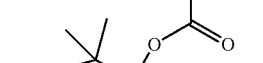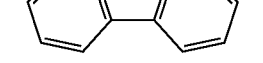

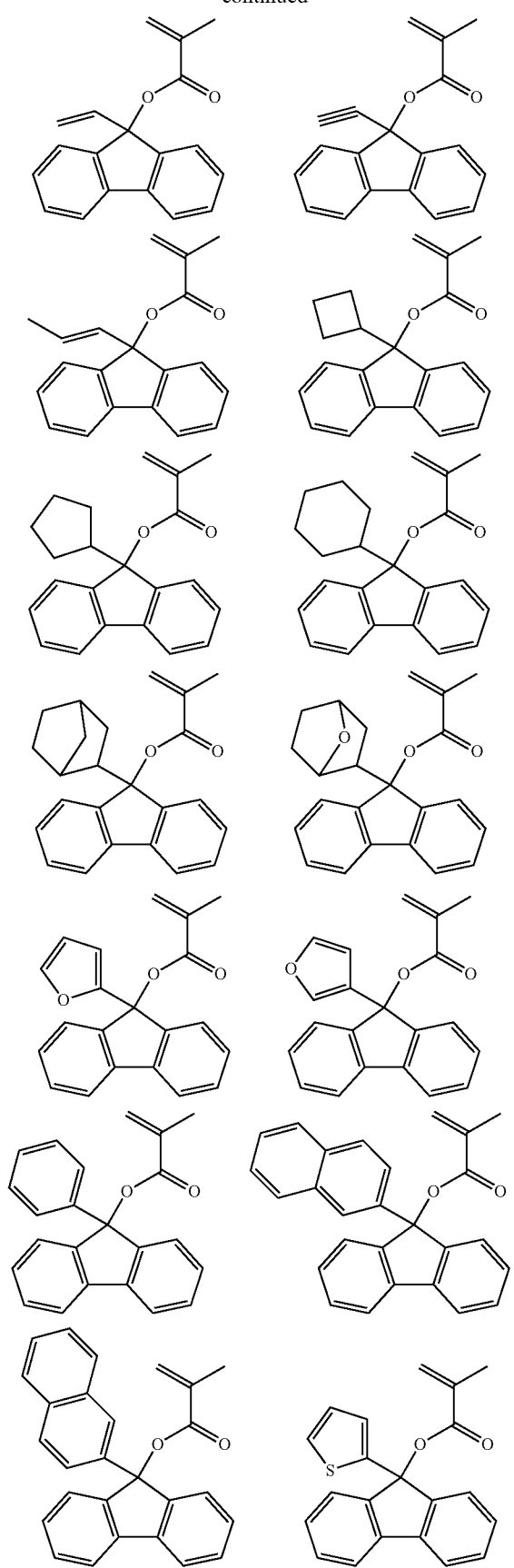
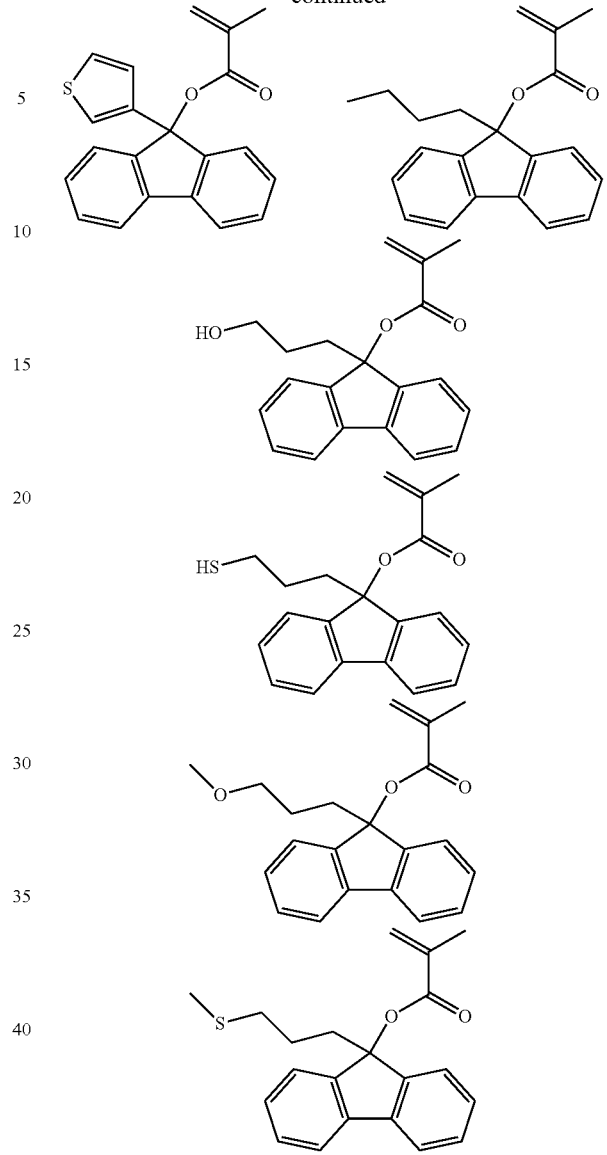
In the recurring unit (a1), the hydrogen atom of the carboxyl group may be substituted by an acid labile group having the general formula (A-3)-25.
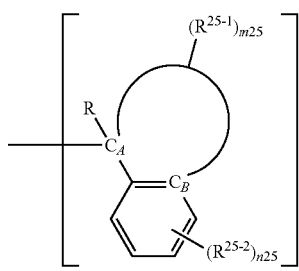
Herein $R^{25-1}$ is each independently hydrogen or a straight, branched or cyclic $C_1$-$C_6$ alkyl group, and in case m25 is 2 or more, $R^{25-1}$ may bond together to form a non-aromatic ring of 2 to 8 carbon atoms; the circle denotes a link between carbons $C_A$ and $C_B$, selected from among ethylene, propylene, butylene and pentylene; $R^{25-1}$ is not hydrogen when the circle denotes ethylene or propylene; $R^{25-2}$ is $C_1$-$C_4$ alkyl, alkoxy, alkanoyl, alkoxycarbonyl, hydroxyl, nitro, $C_6$-$C_{10}$ aryl, halogen, or cyano group; R is as defined above; m25 and n25 each are an integer of 1 to 4.

Examples of the monomer having a carboxyl group substituted with an acid labile group of formula (A-3)-25 are given below.

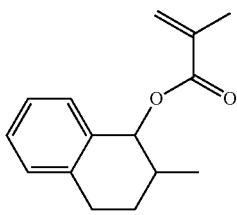
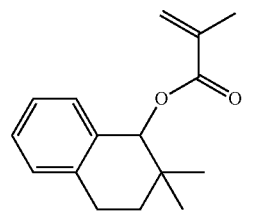

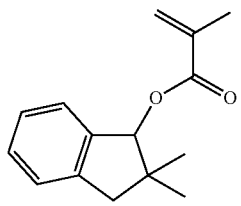
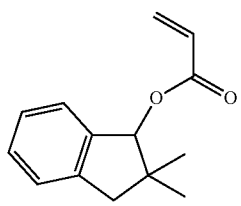
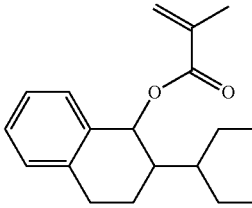
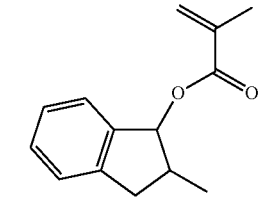

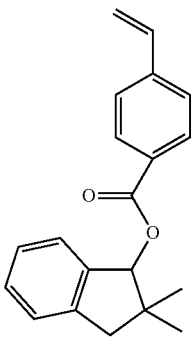
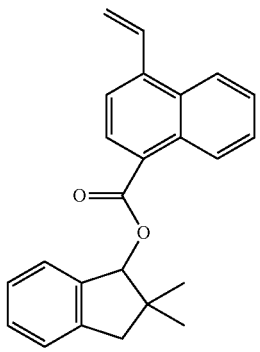
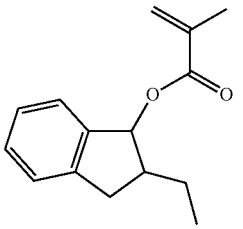
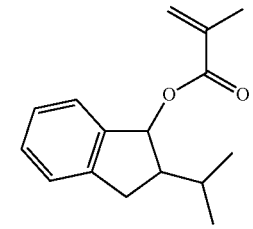

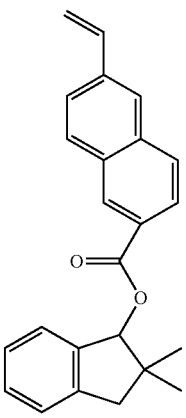
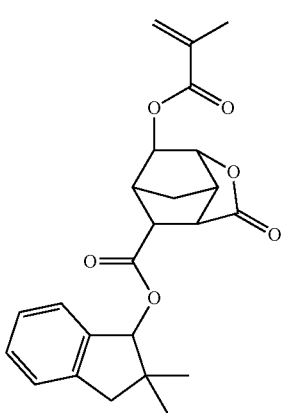
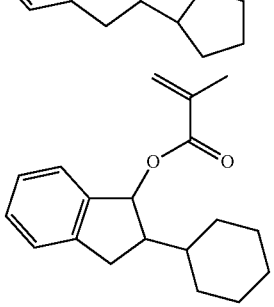
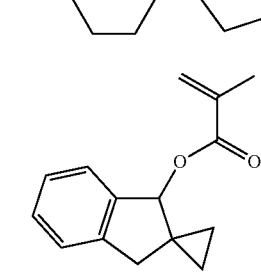

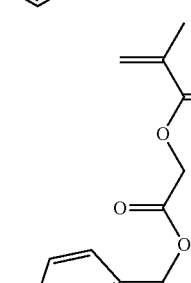
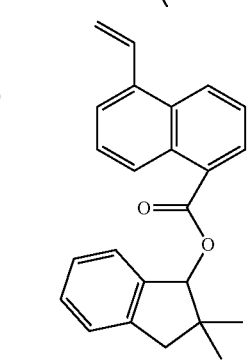
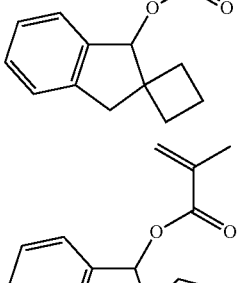
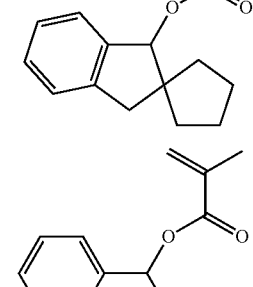

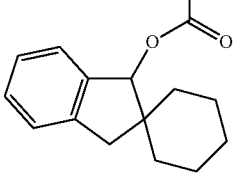
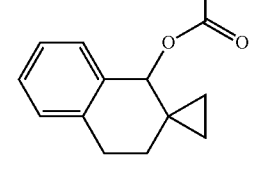

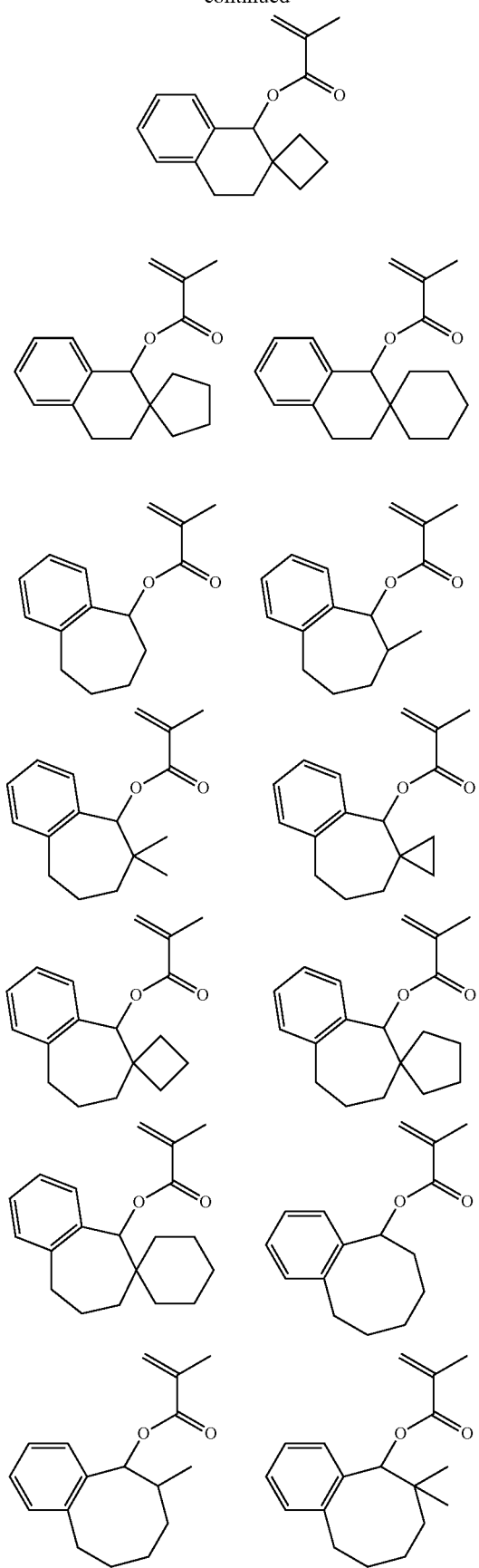
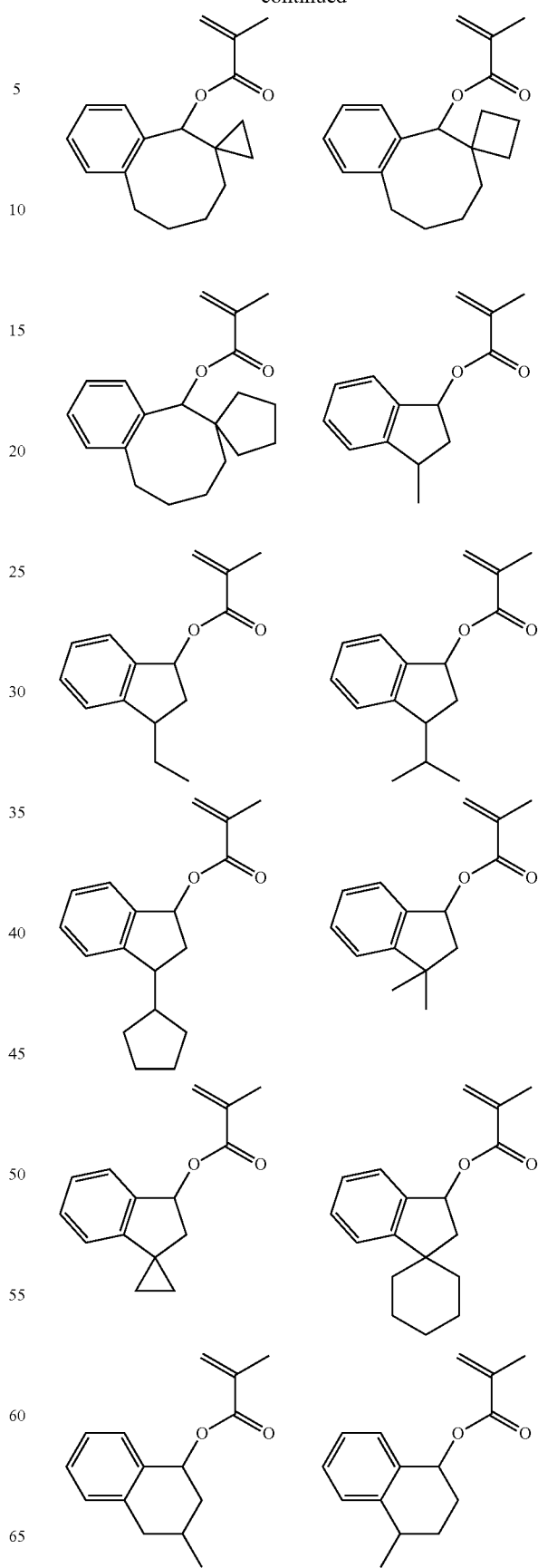

-continued
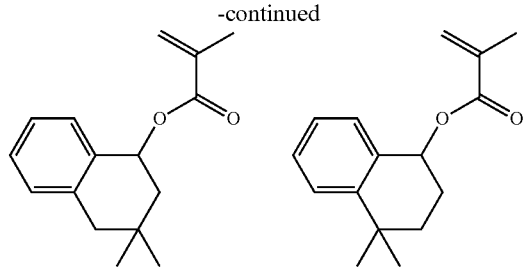
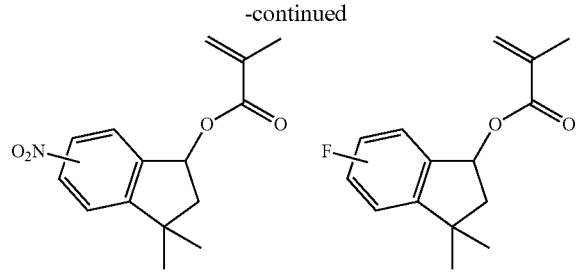
-continued
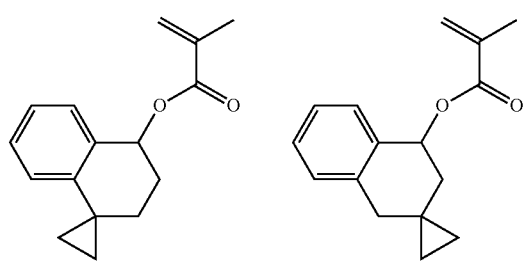
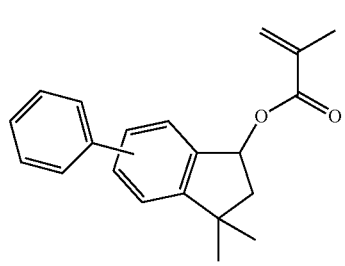
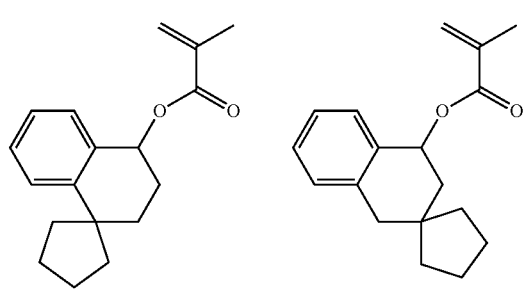
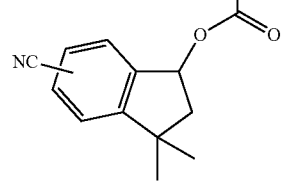
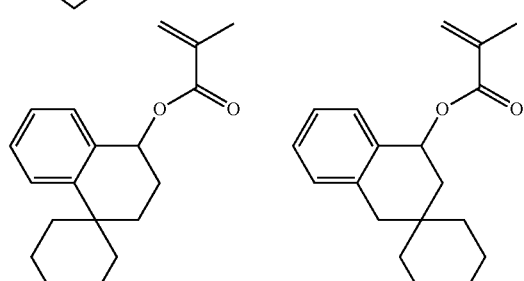
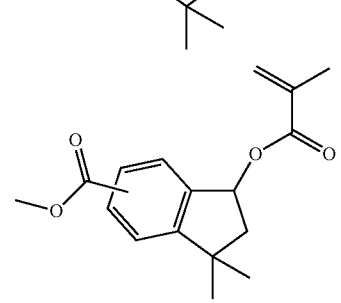
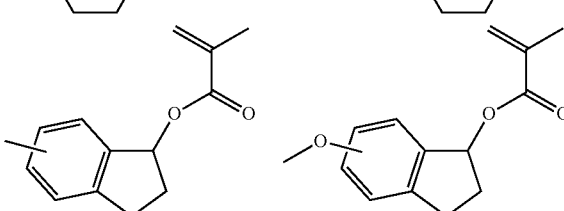
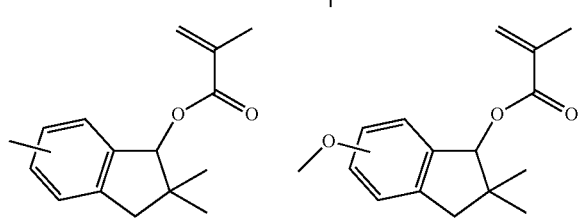
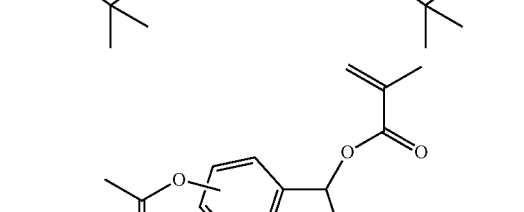
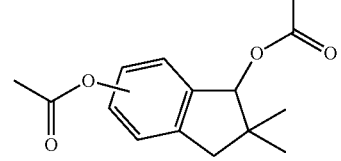
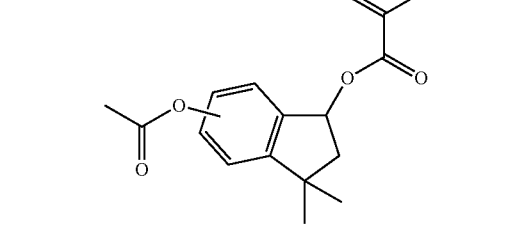
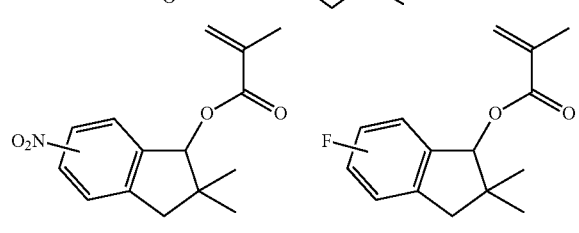

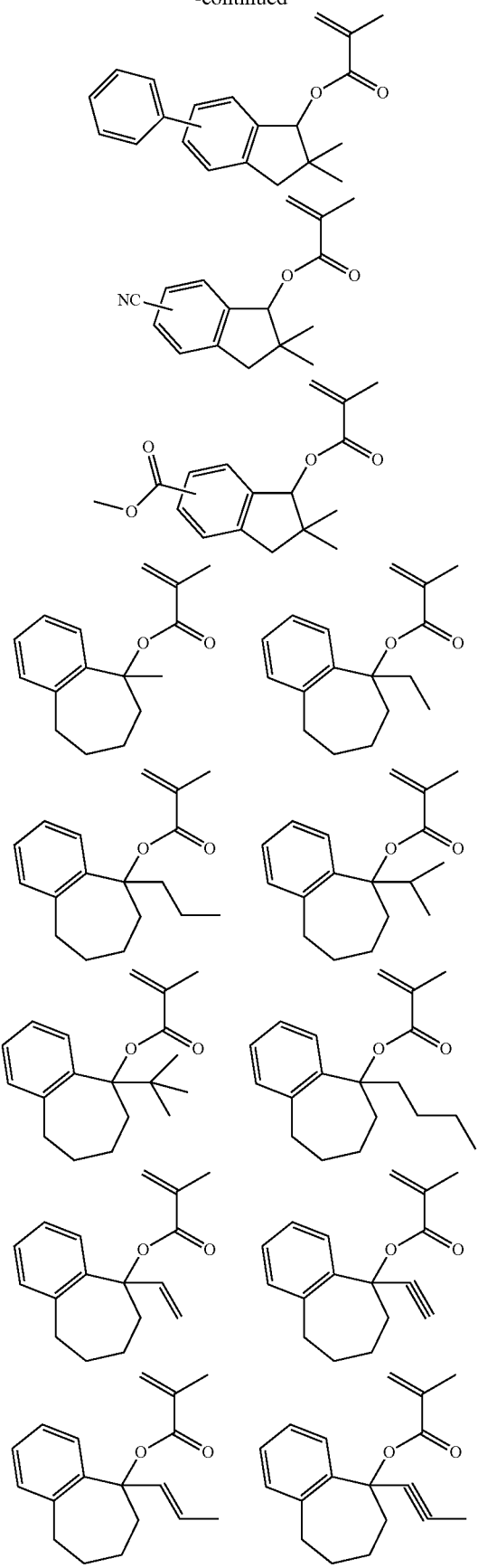
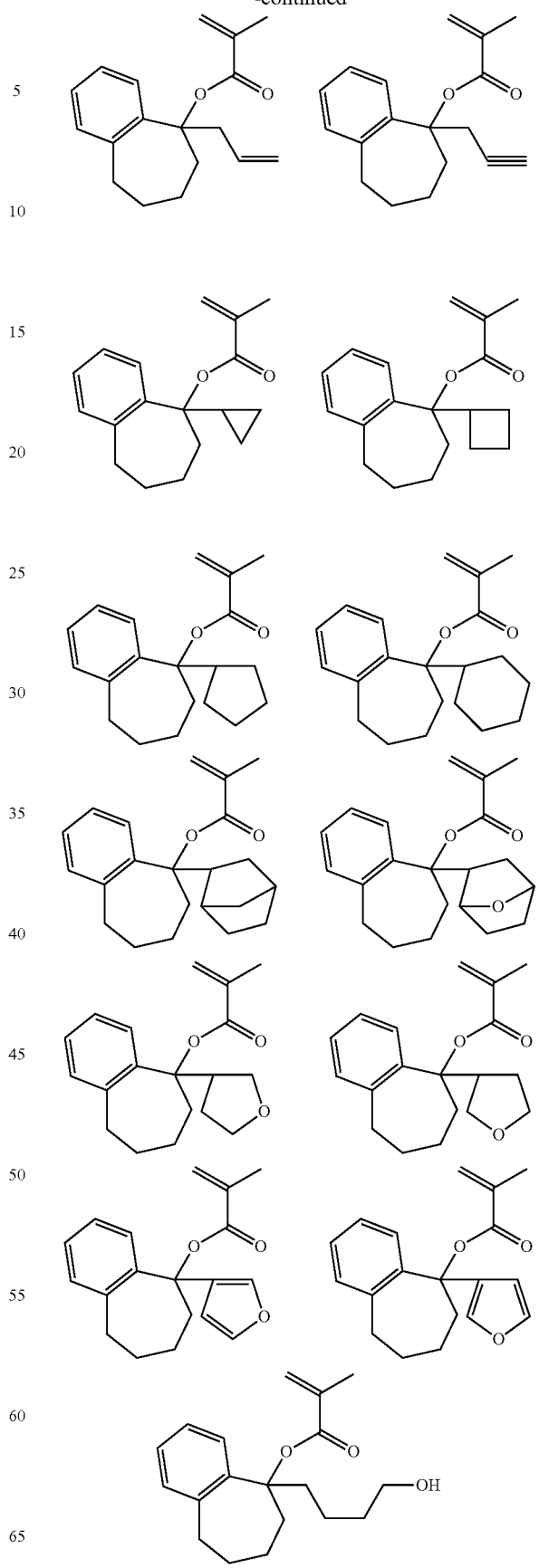

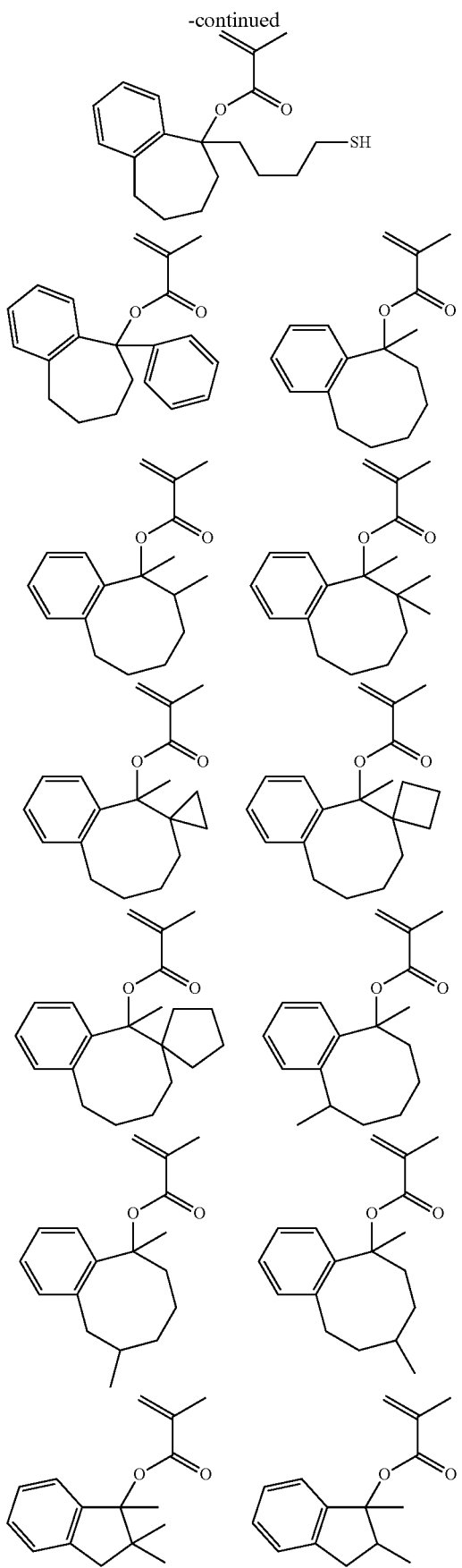
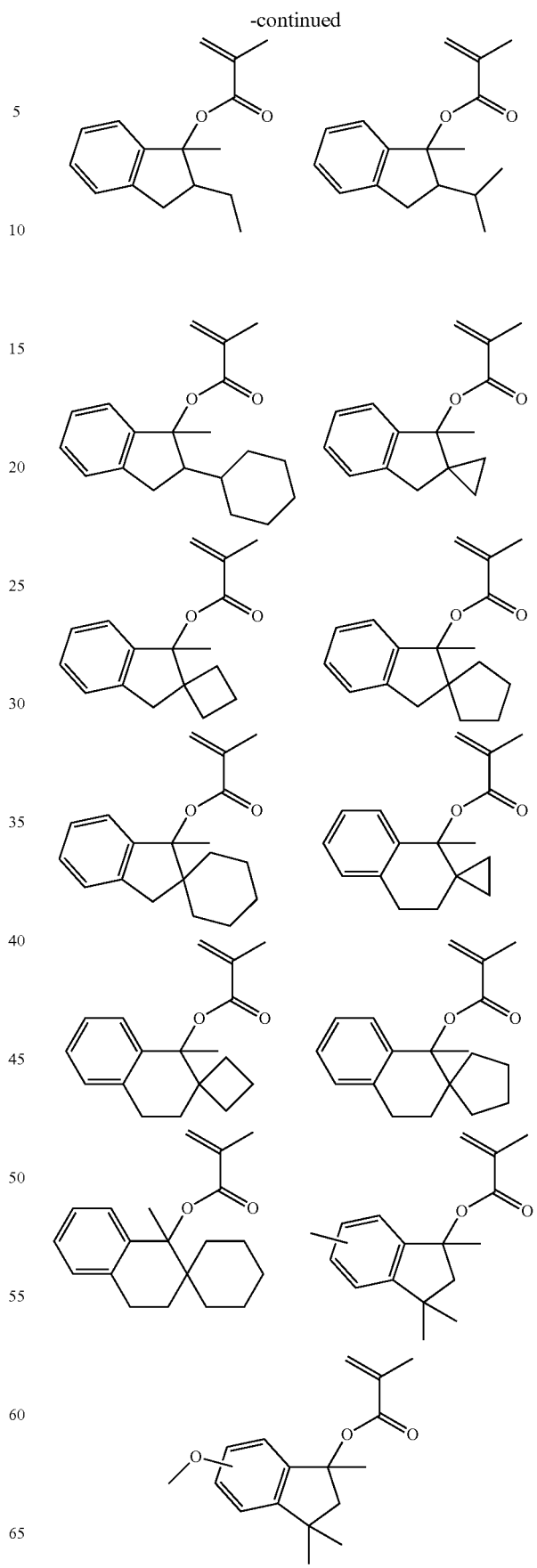

-continued

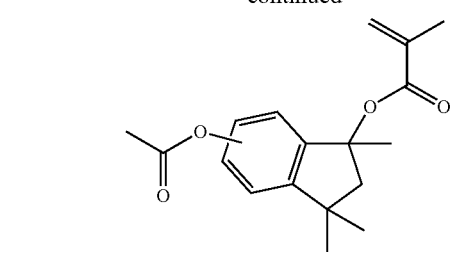
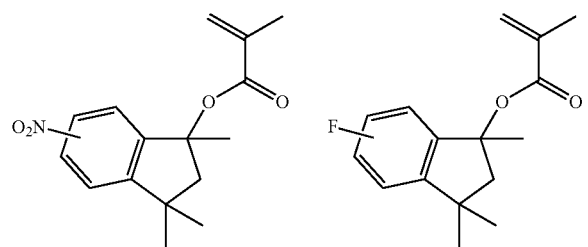
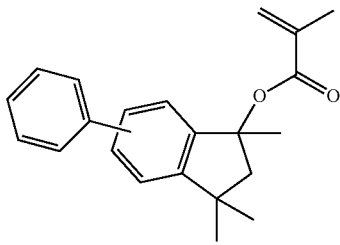
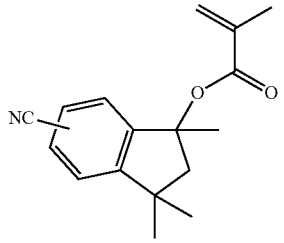
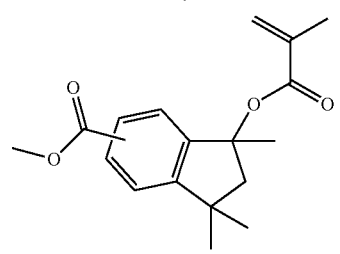
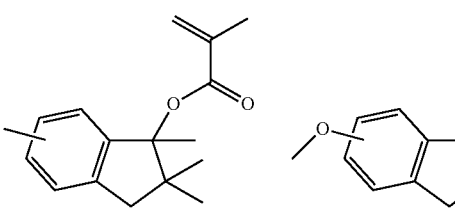
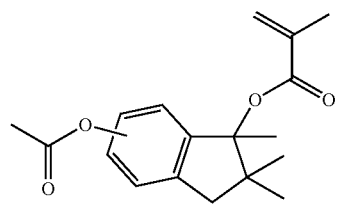

-continued

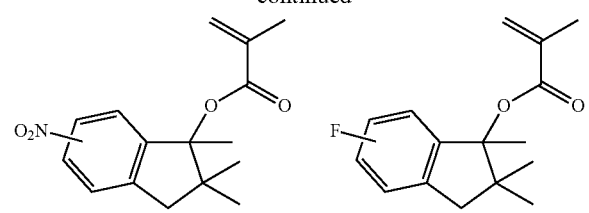
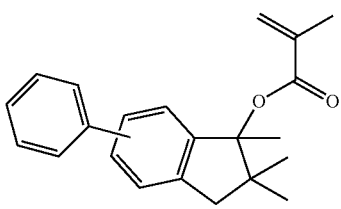
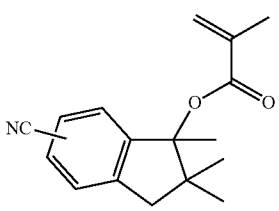
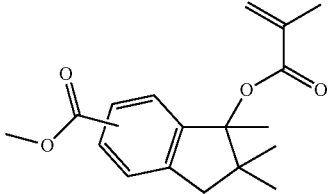

In the recurring unit (a1), the hydrogen atom of the carboxyl group may be substituted by an acid labile group having the general formula (A-3)-26.

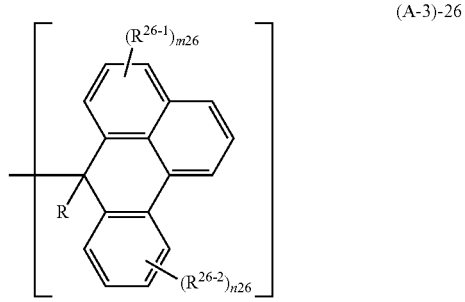

(A-3)-26

Herein $R^{26-1}$ and $R^{26-2}$ each are hydrogen, $C_1$-$C_4$ alkyl, alkoxy, alkanoyl, alkoxycarbonyl, hydroxyl, nitro, $C_6$-$C_{10}$ aryl, halogen, or cyano group; R is as defined above; and m26 and n26 each are an integer of 1 to 4.

Examples of the monomer having a carboxyl group substituted with an acid labile group of formula (A-3)-26 are given below.

-continued
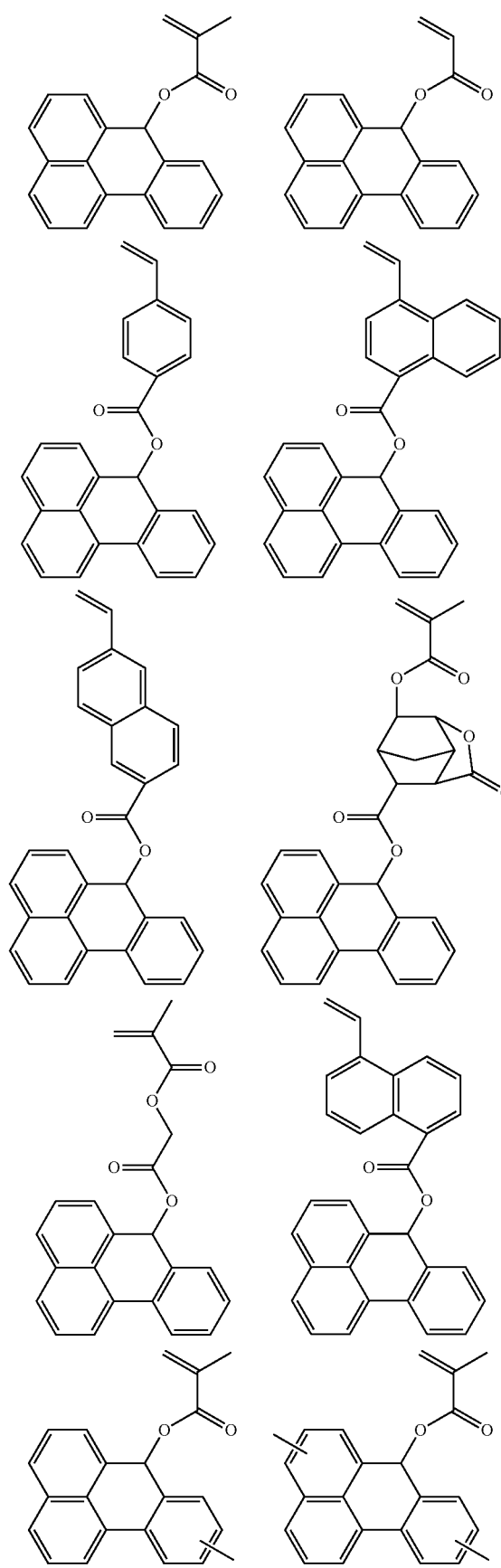
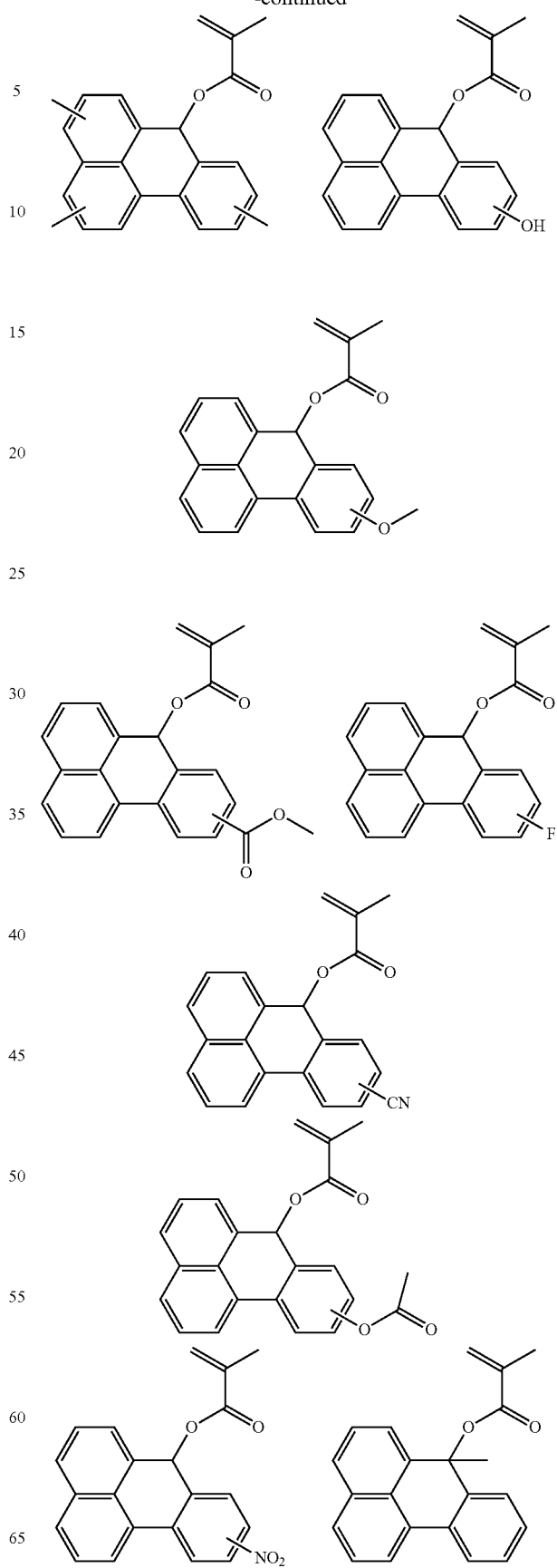

-continued
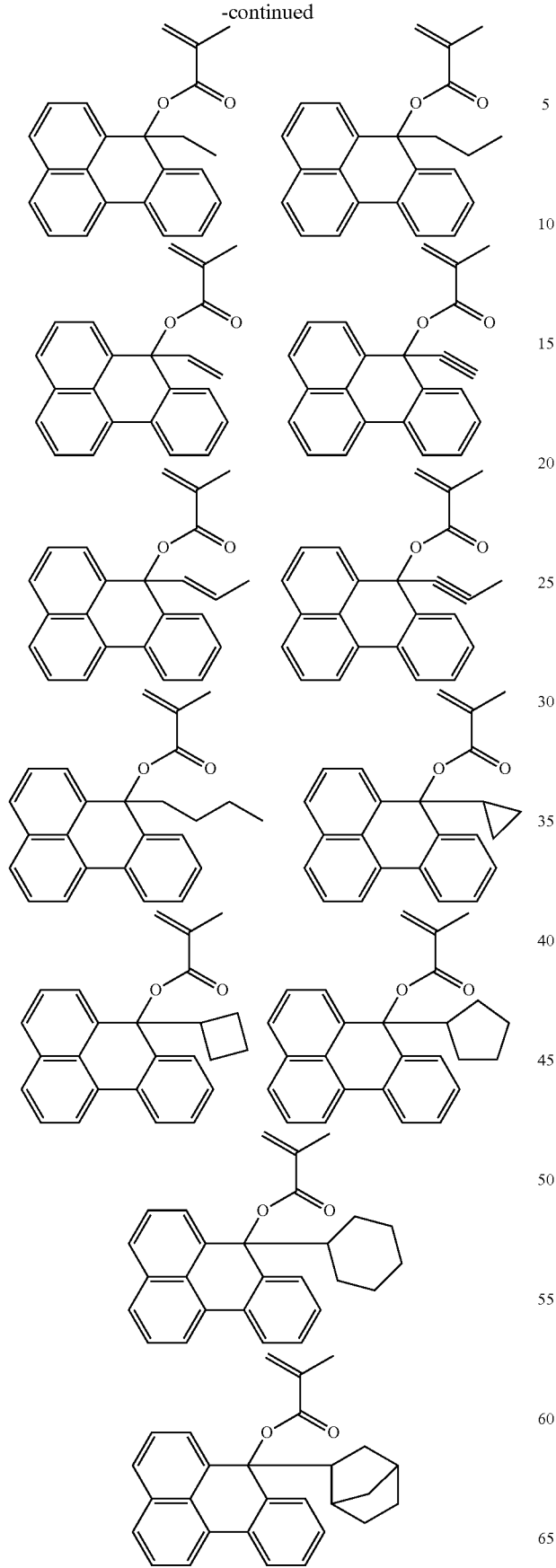
-continued
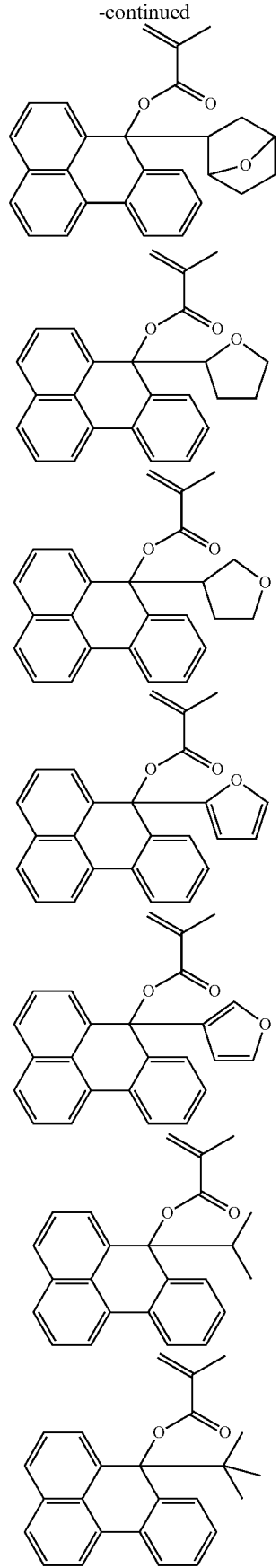

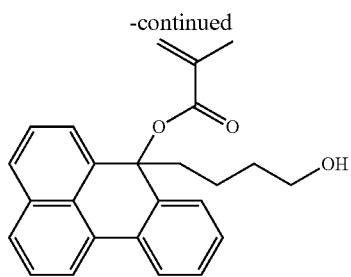
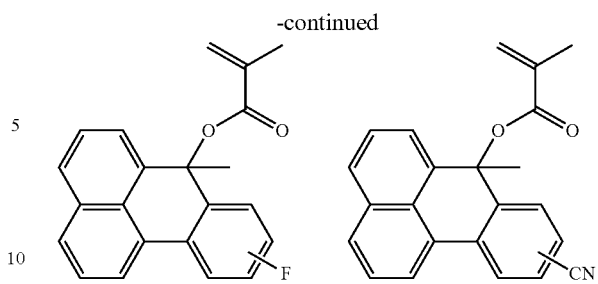
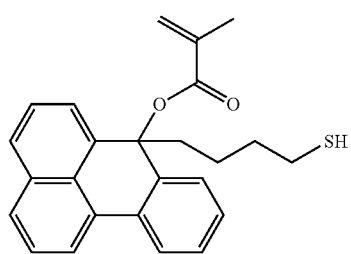
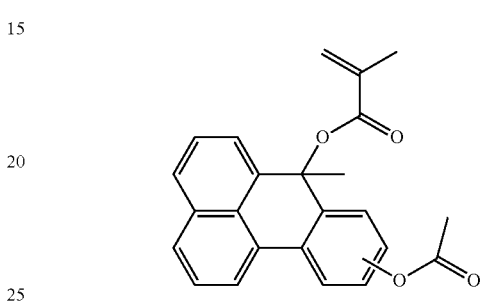
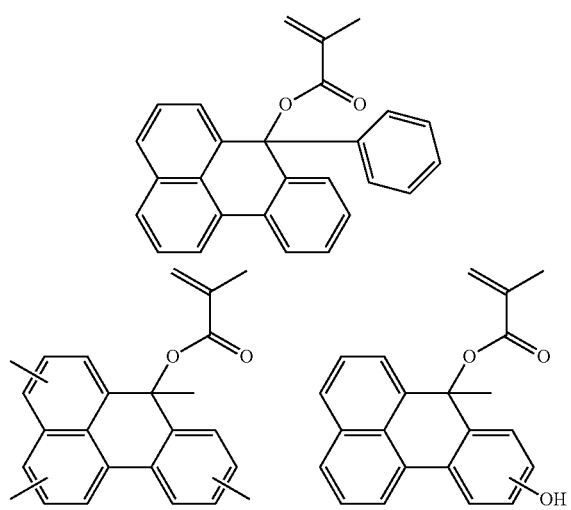
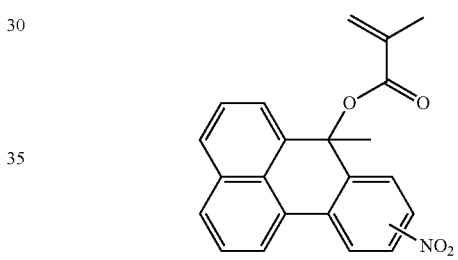
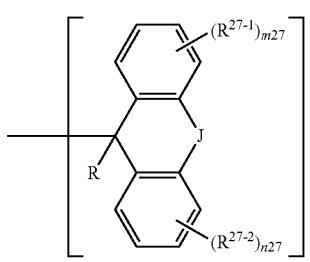
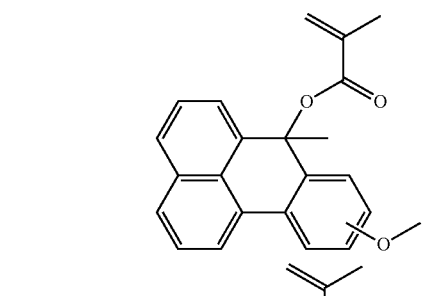
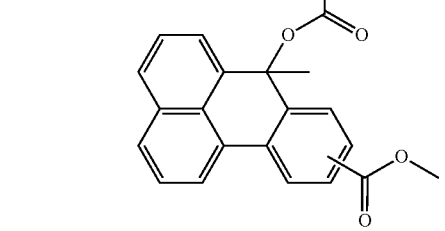

In the recurring unit (a1), the hydrogen atom of the carboxyl group may be substituted by an acid labile group having the general formula (A-3)-27.

$$\left[ \begin{array}{c} (R^{27\text{-}1})_{m27} \\ \\ R \\ (R^{27\text{-}2})_{n27} \end{array} \right] \quad \text{(A-3)-27}$$

Herein $R^{27\text{-}1}$ and $R^{27\text{-}2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; J is methylene, ethylene, vinylene or —$CH_2$—S—; and m27 and n27 each are an integer of 1 to 4.

Examples of the monomer having a carboxyl group substituted with an acid labile group of formula (A-3)-27 are given below.

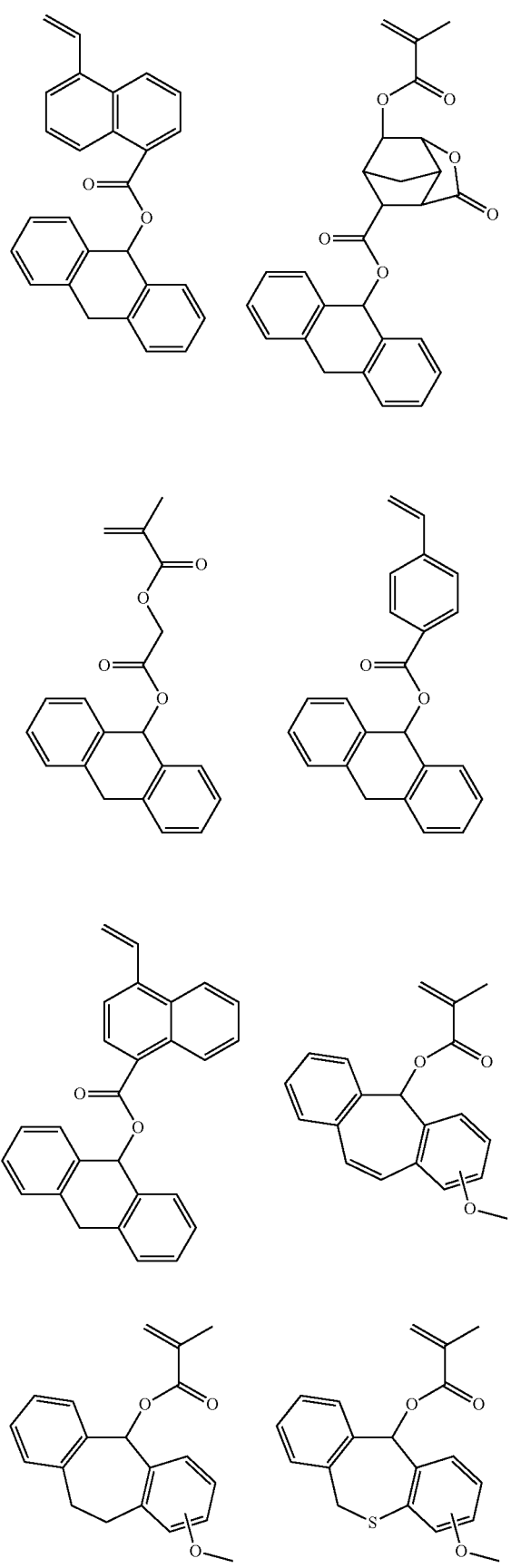
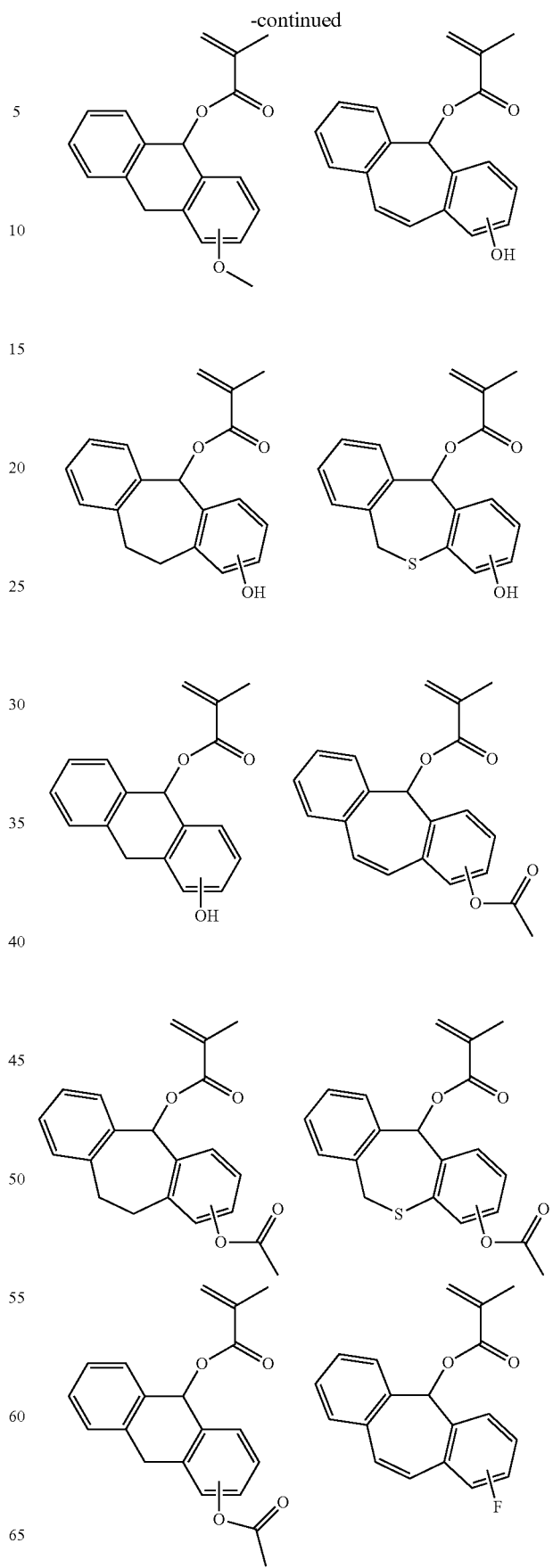

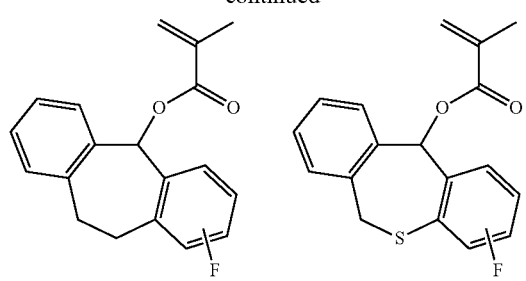
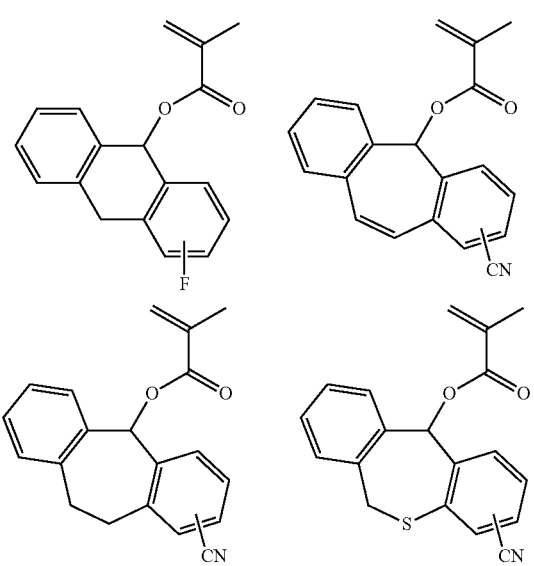
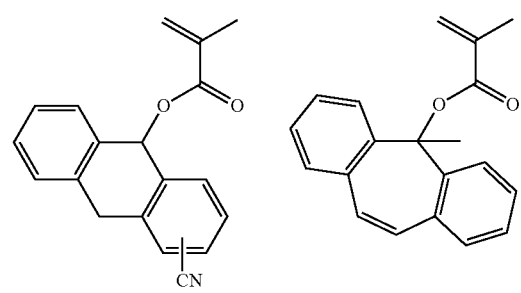
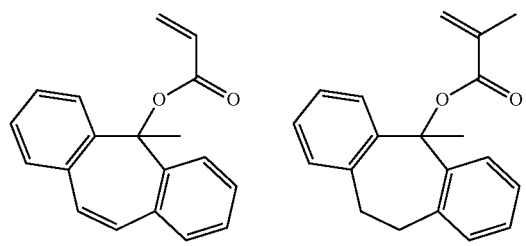
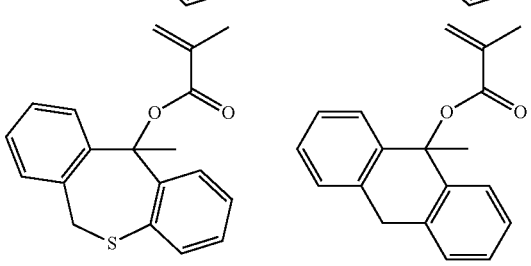
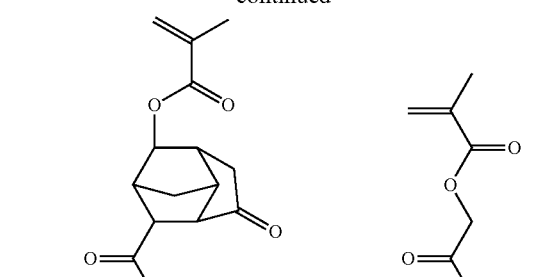
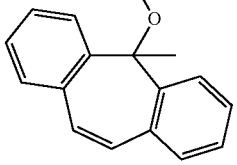
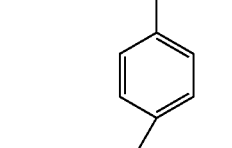
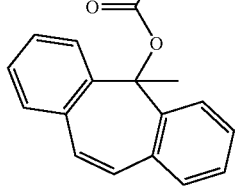
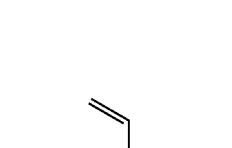
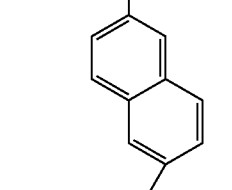
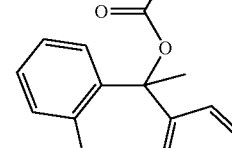
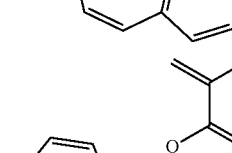
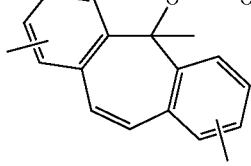

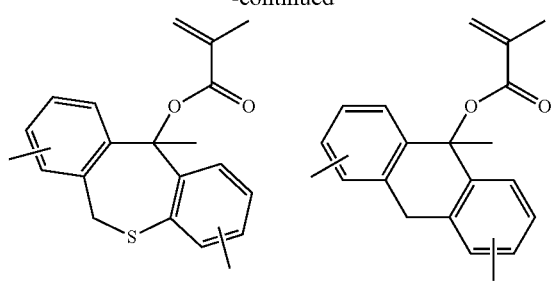
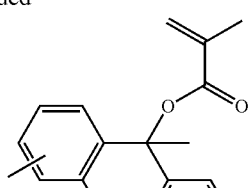
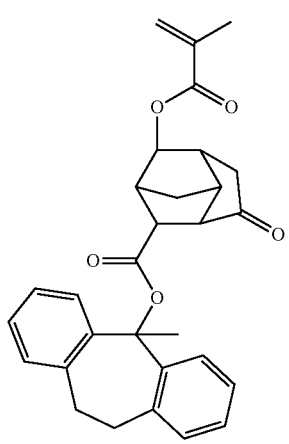
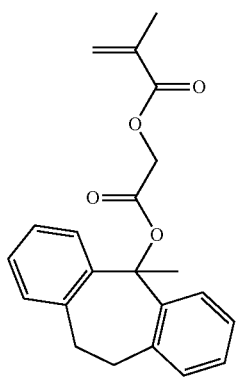
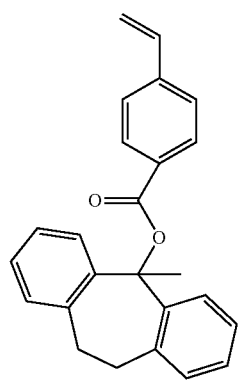
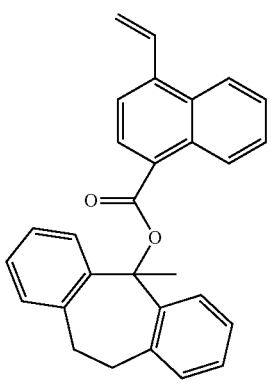
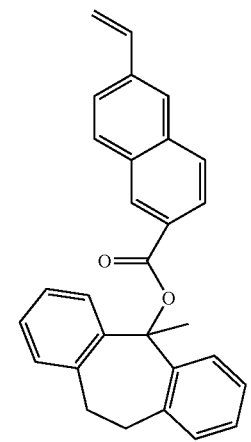
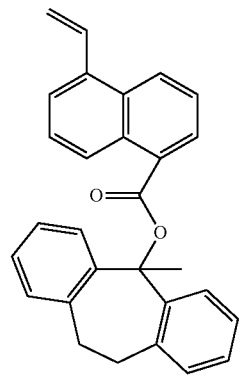
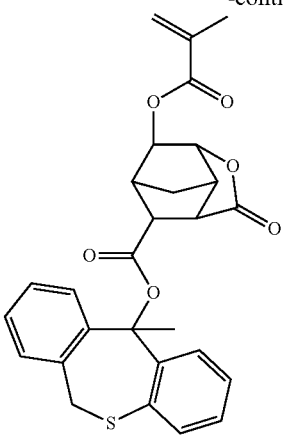
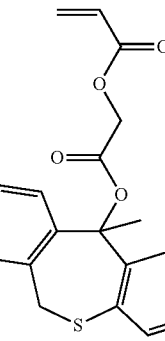
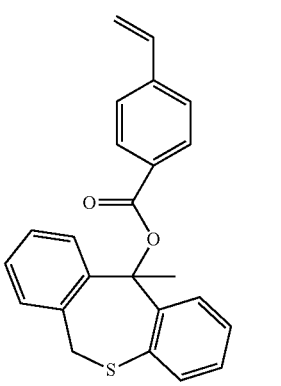
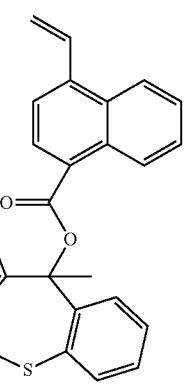
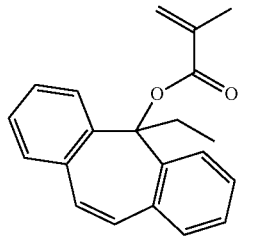
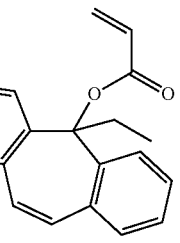
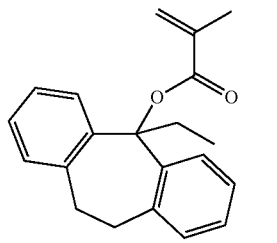
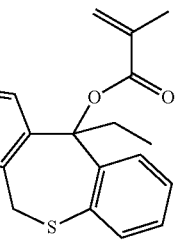
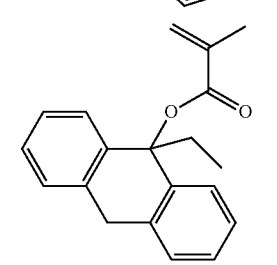
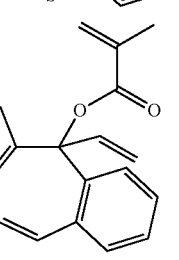

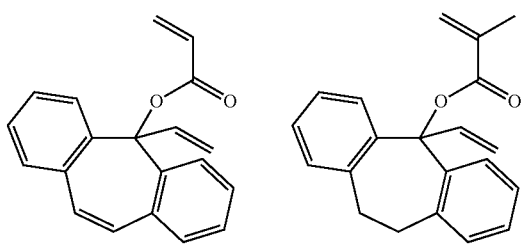
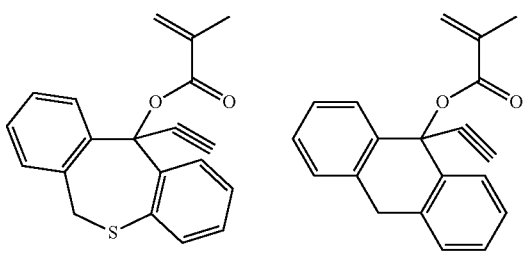
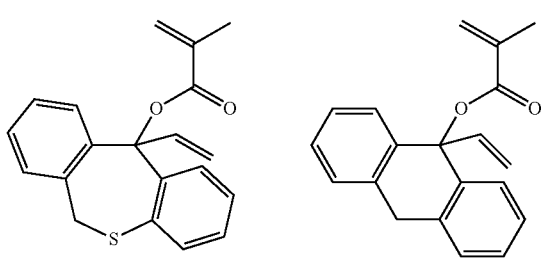

In the recurring unit (a1), the hydrogen atom of the carboxyl group may be substituted by an acid labile group having the general formula (A-3)-28.

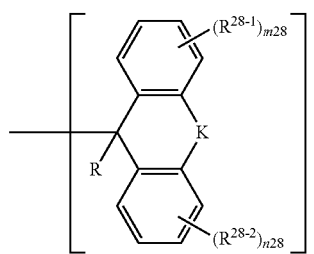

(A-3)-28

Herein $R^{28-1}$ and $R^{28-2}$ each are hydrogen, $C_1$-$C_4$ alkyl, alkoxy, alkanoyl, alkoxycarbonyl, hydroxyl, $C_6$-$C_{10}$ aryl, halogen, or cyano group; R is as defined above; K is carbonyl, ether, sulfide, —S(=O)— or —S(=O)$_2$—; and m28 and n28 each are an integer of 1 to 4.

Examples of the monomer having a carboxyl group substituted with an acid labile group of formula (A-3)-28 are given below.

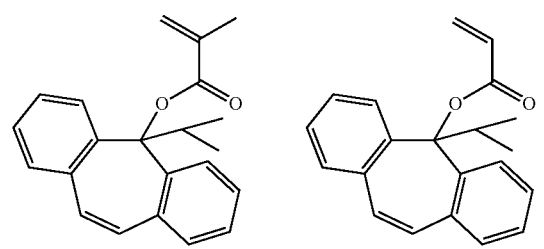
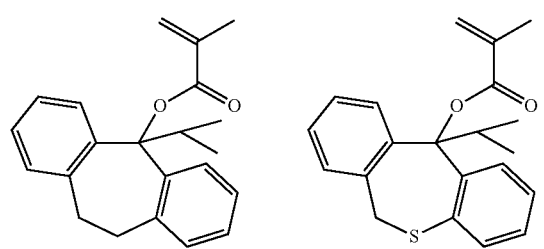
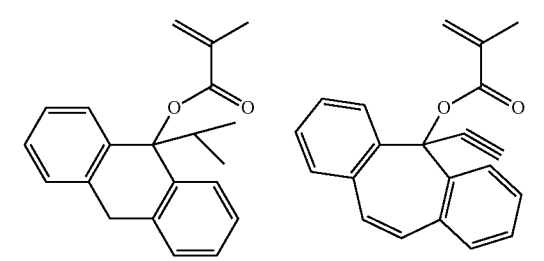
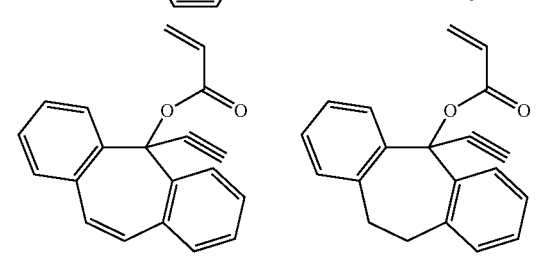
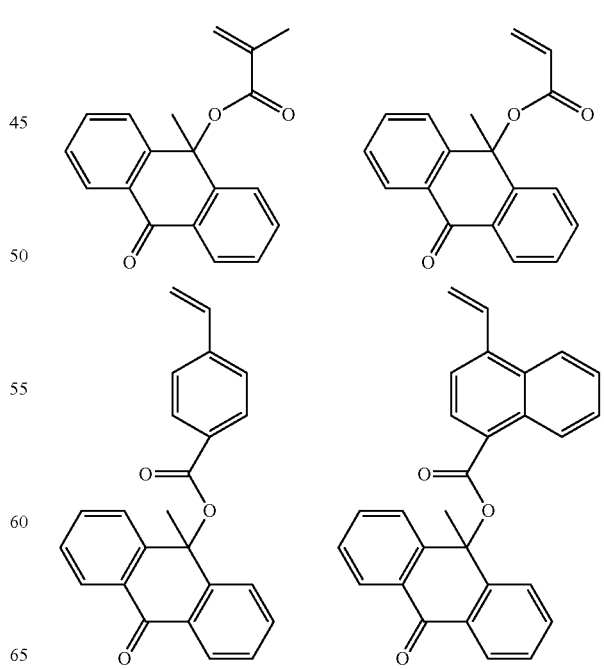

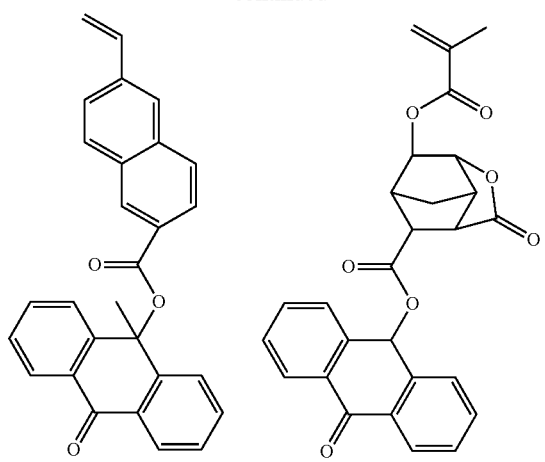
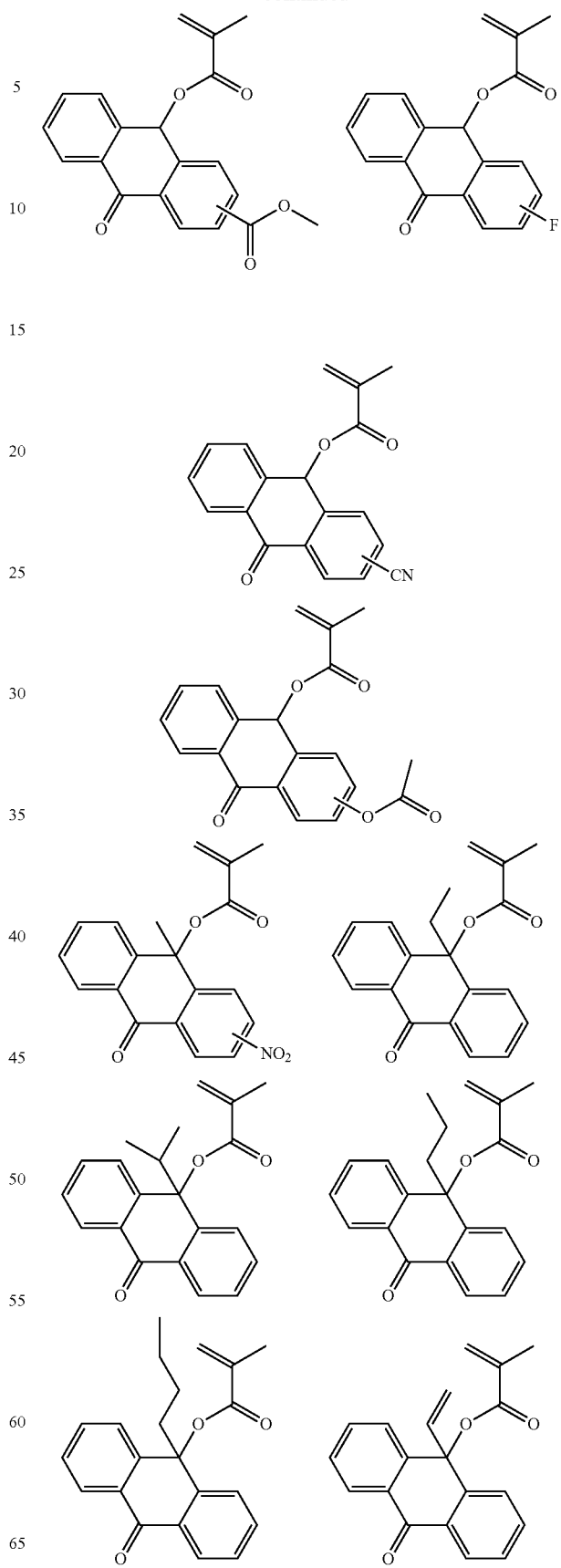

-continued
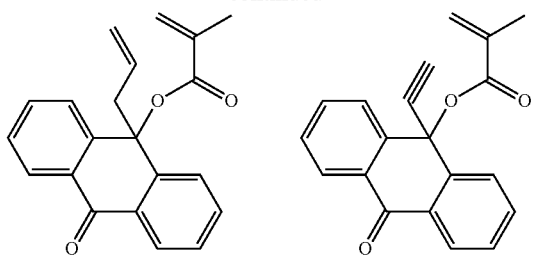
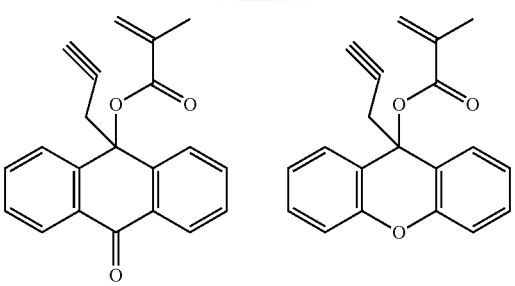
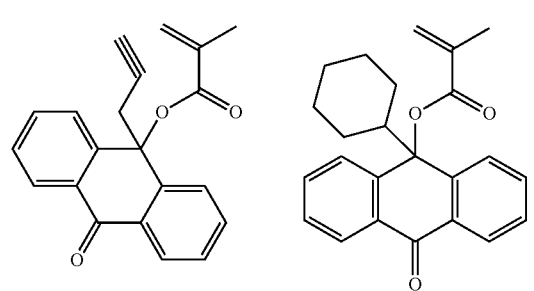
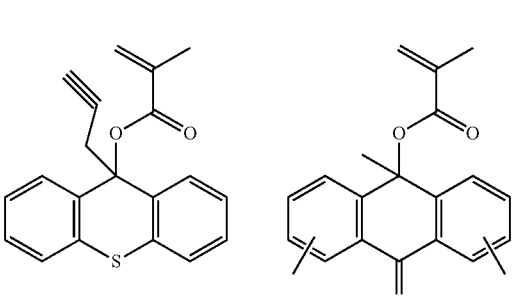
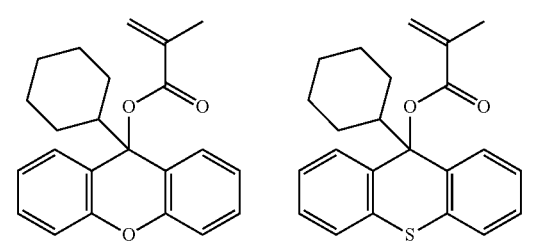
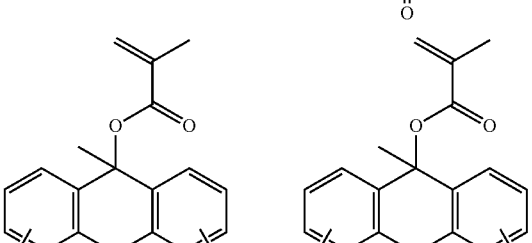
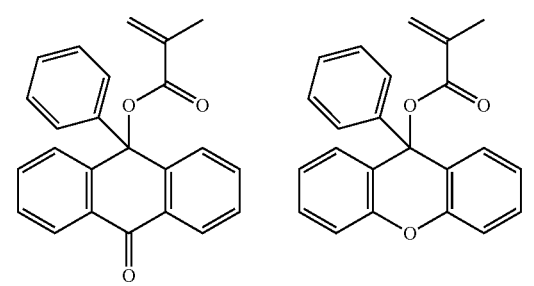
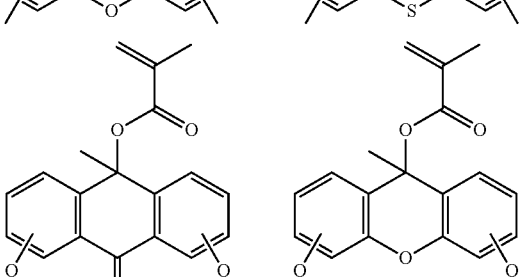
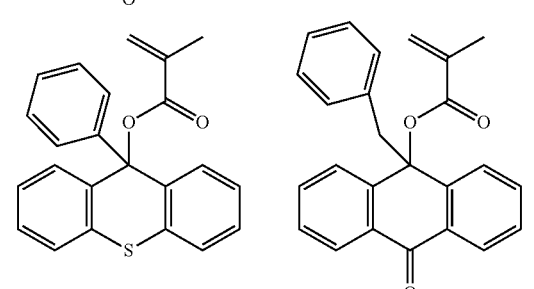
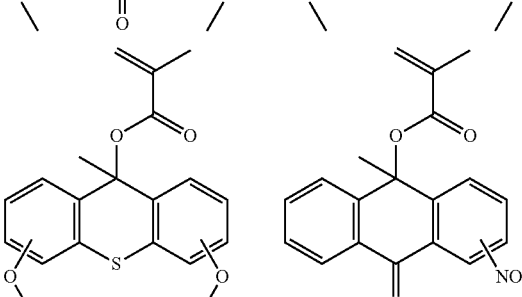
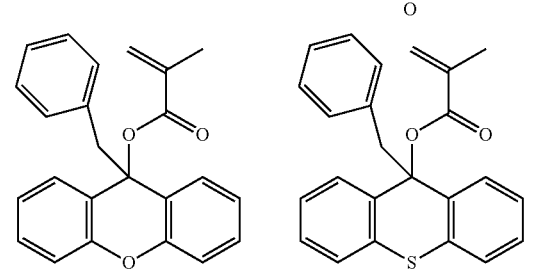
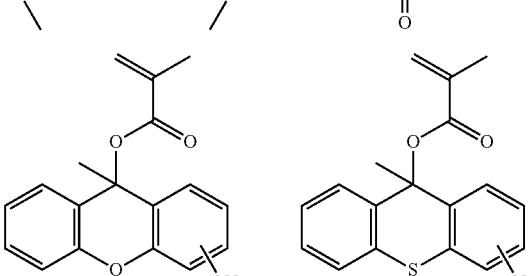

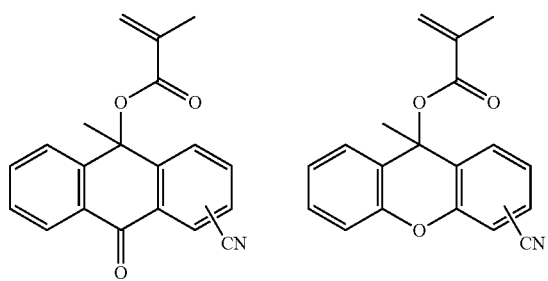
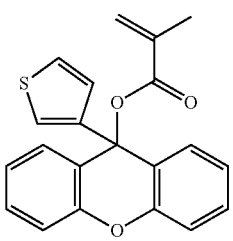
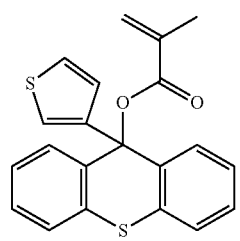
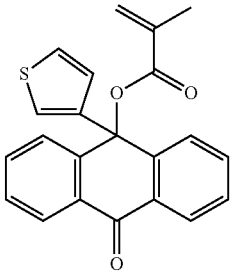
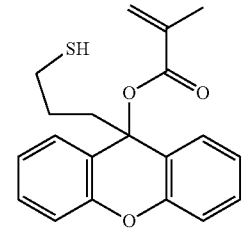
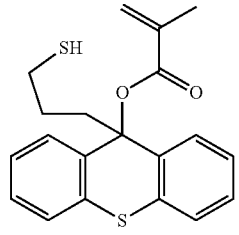
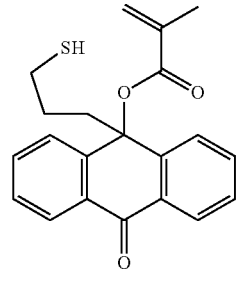
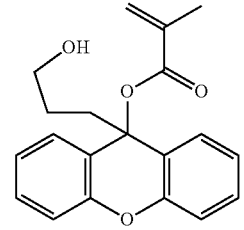
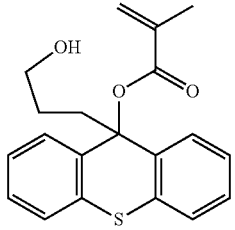
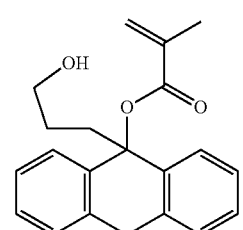
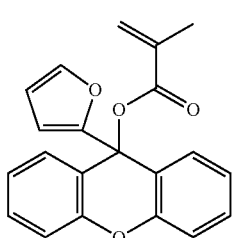
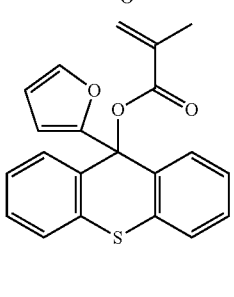

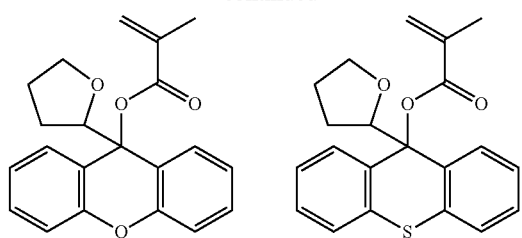
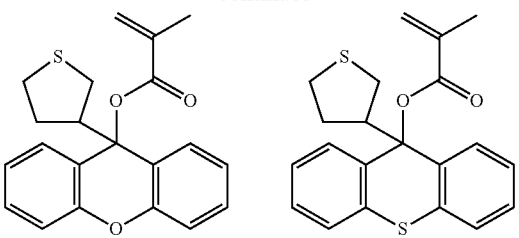
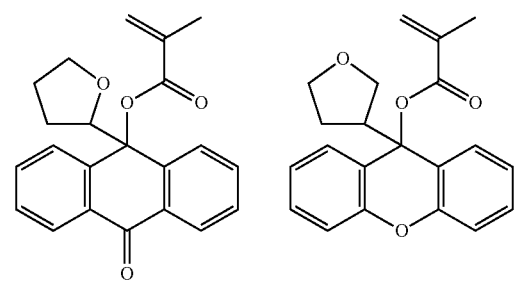
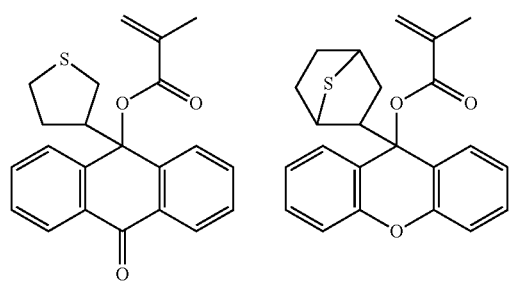
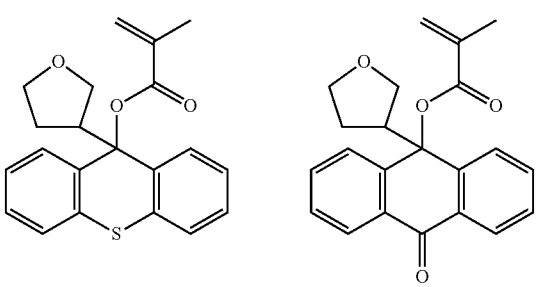
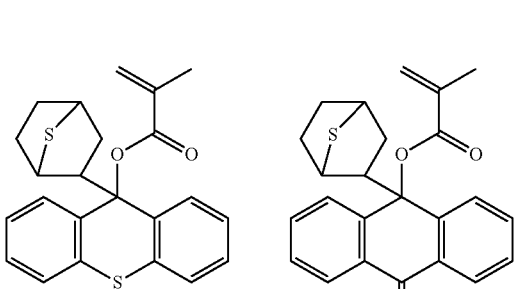
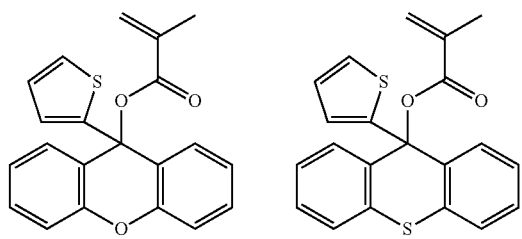
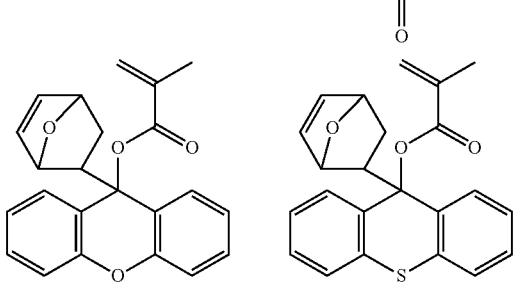
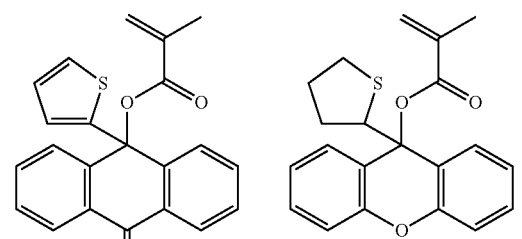
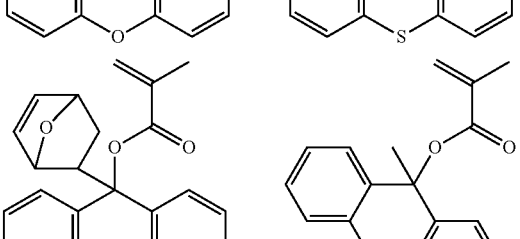
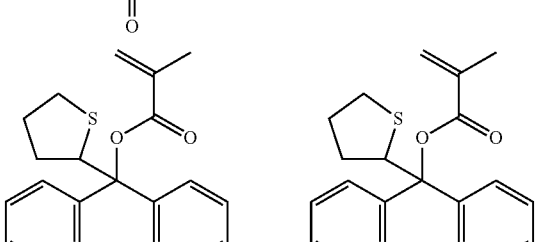
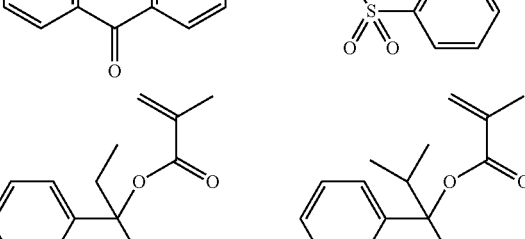

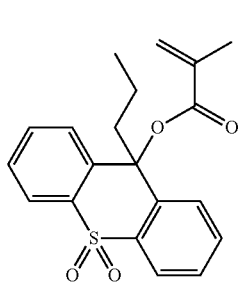 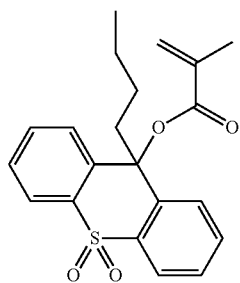 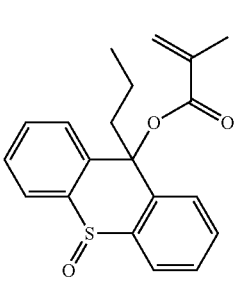 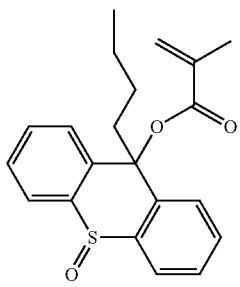
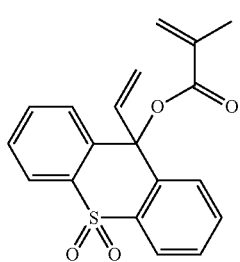 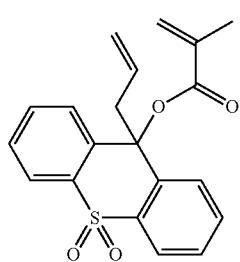 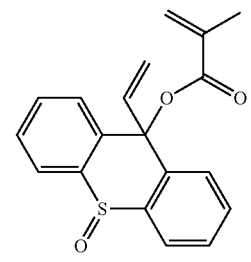 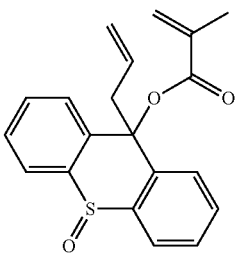
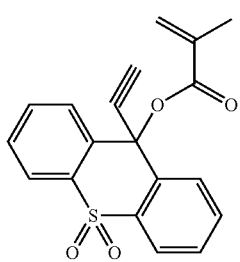 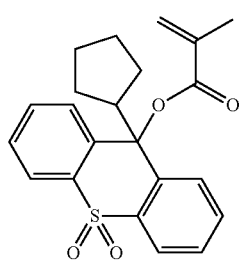 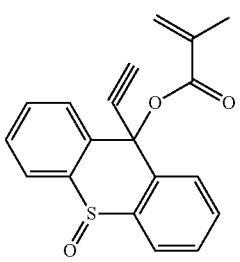 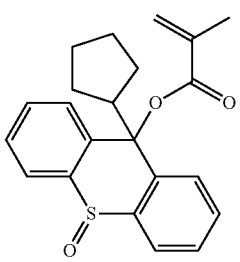
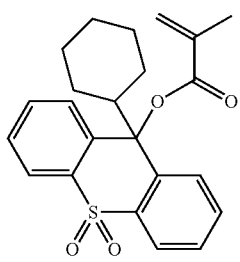 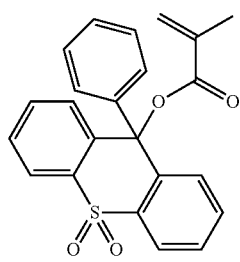 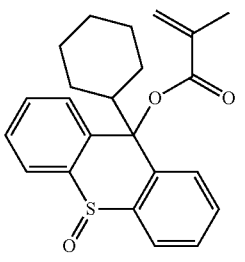 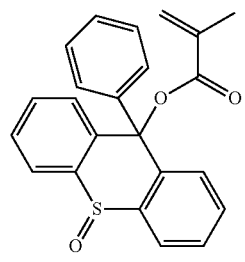
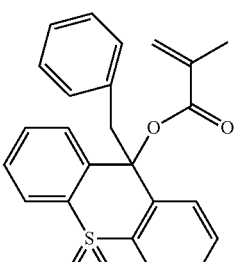 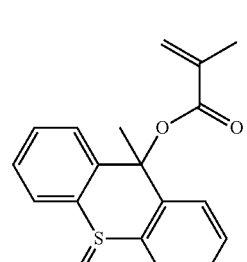 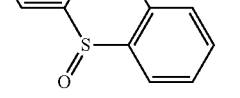
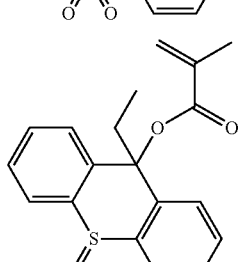 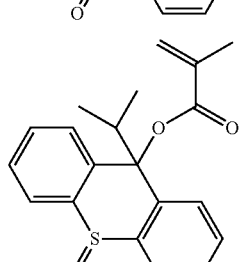 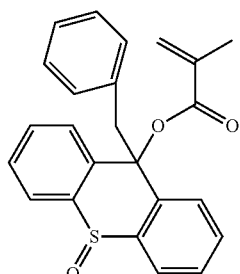 
Also included are fluorinated acid labile groups which are shown below.

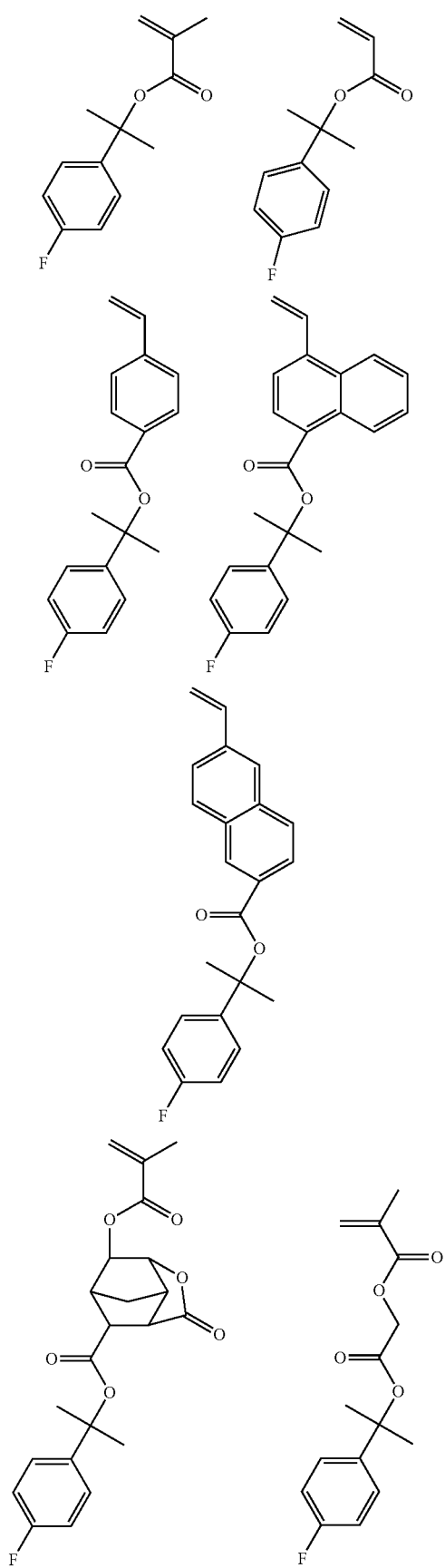

-continued
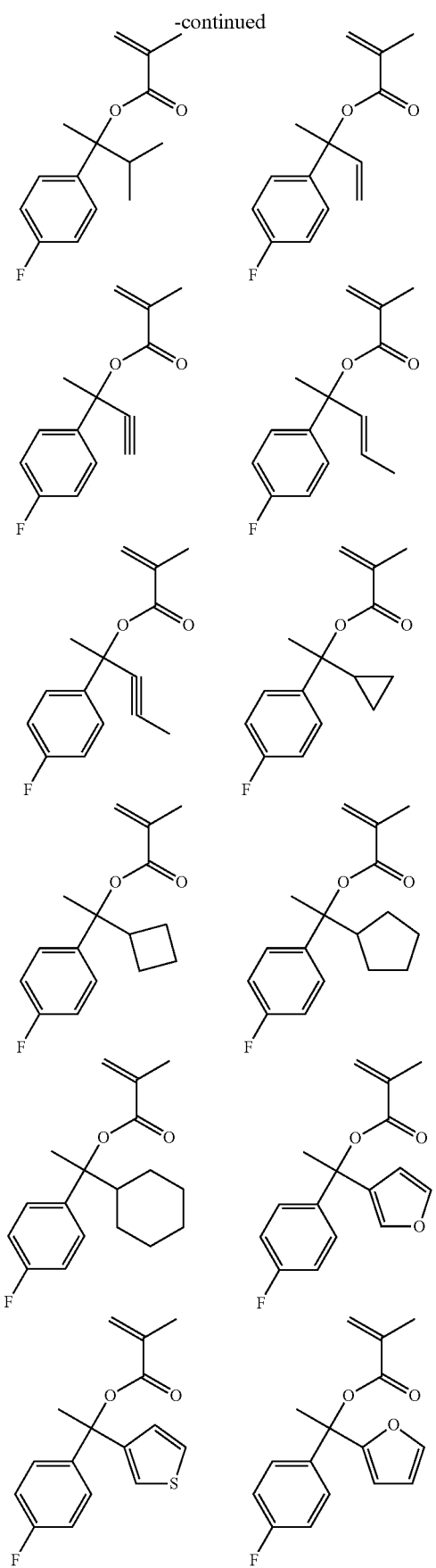
-continued
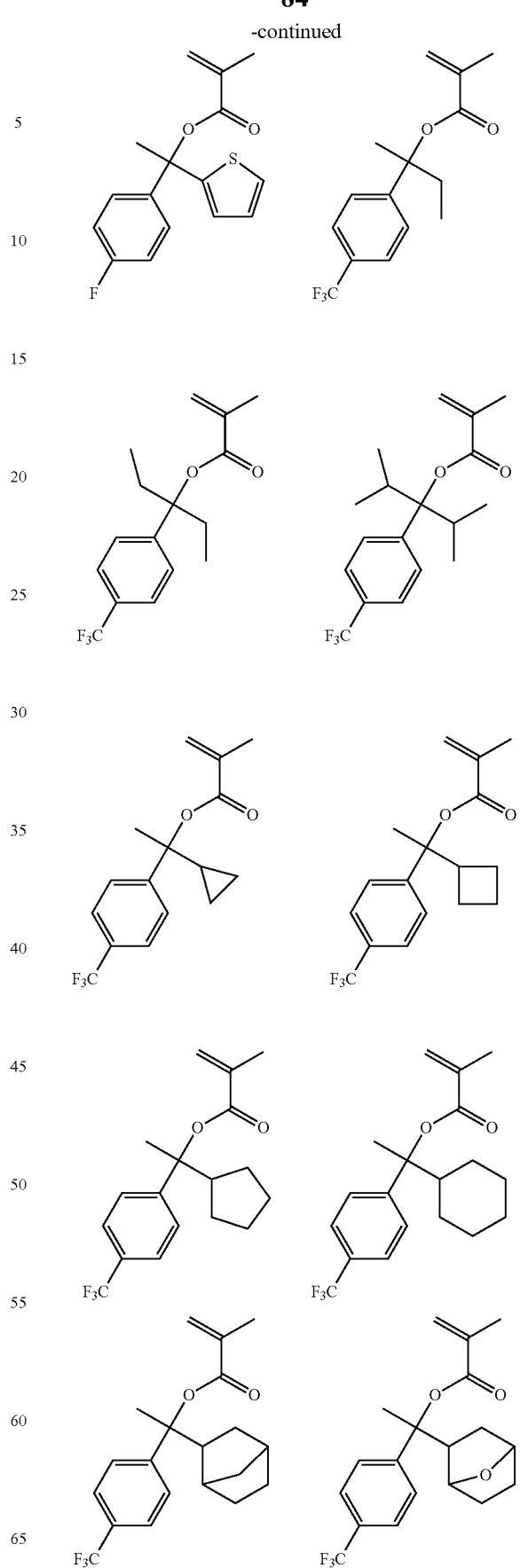

-continued
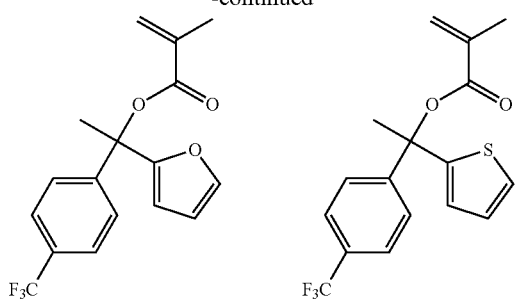
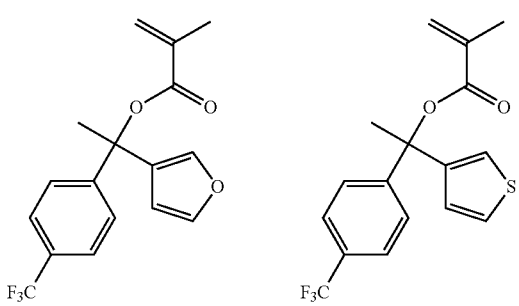
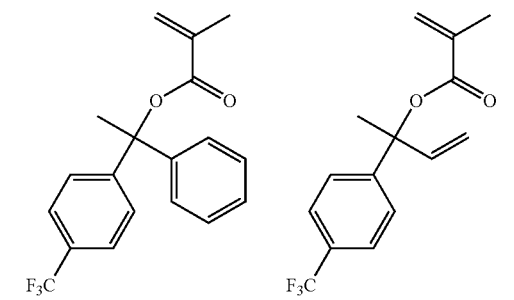
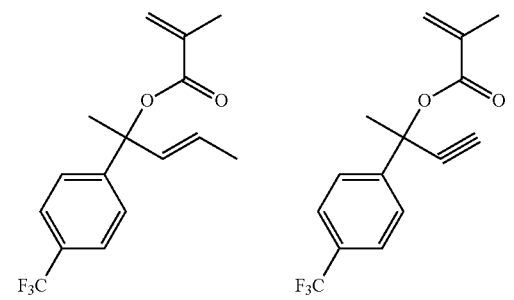
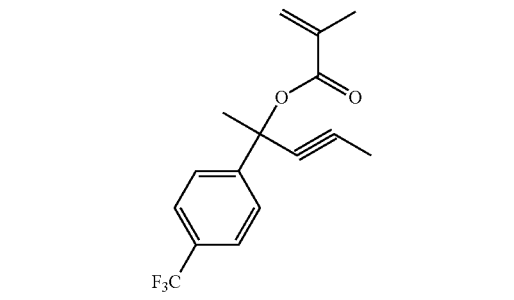
Monomers Mb1 and Mb2 from which the recurring units (b1) and (b2) of sulfonium salt in formula (1) are derived may be represented by the following formulae.
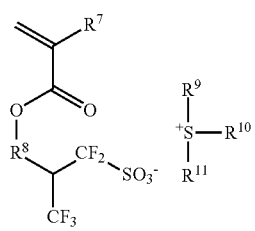
Mb1
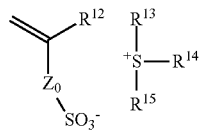
Mb2
Herein $R^7$ to $R^{15}$, and $Z_0$ are as defined above.
Examples of the monomer Mb1 from which recurring unit (b1) of sulfonium salt is derived are given below, but not limited thereto.
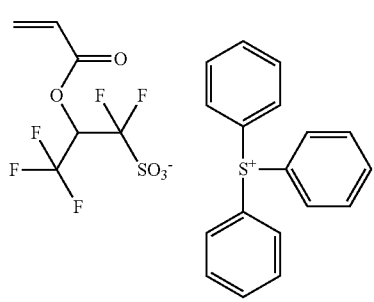
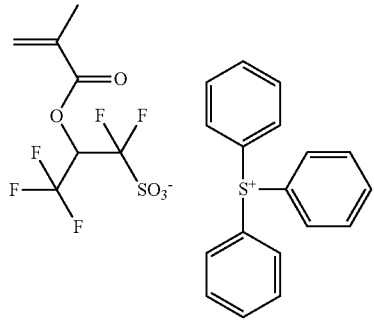
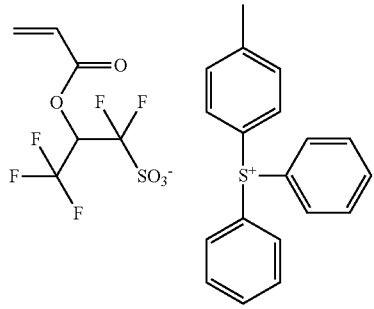

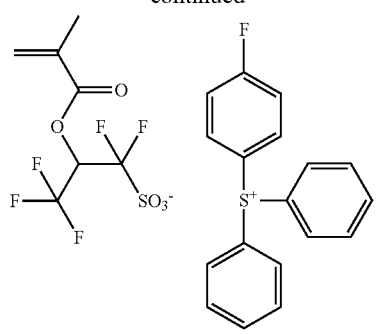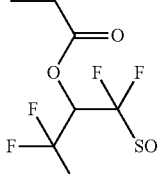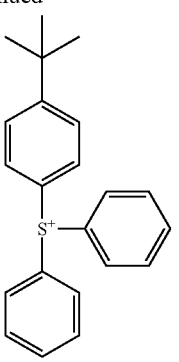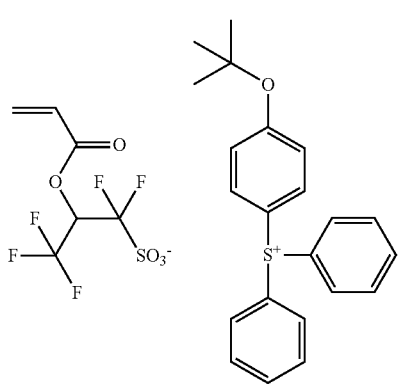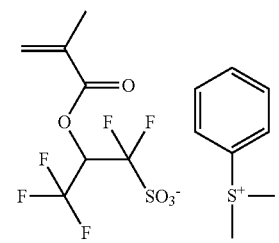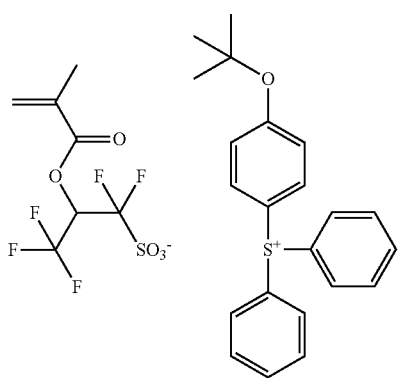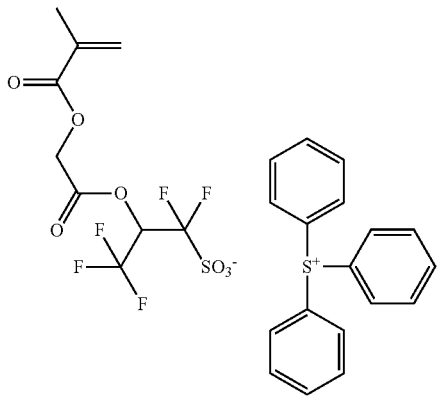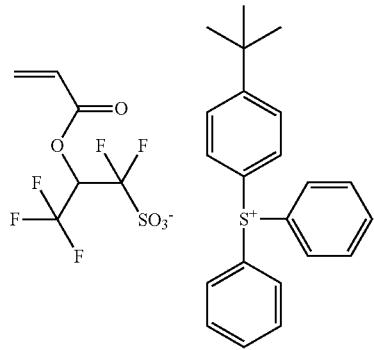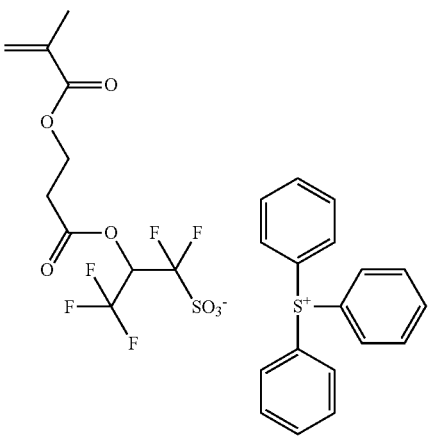

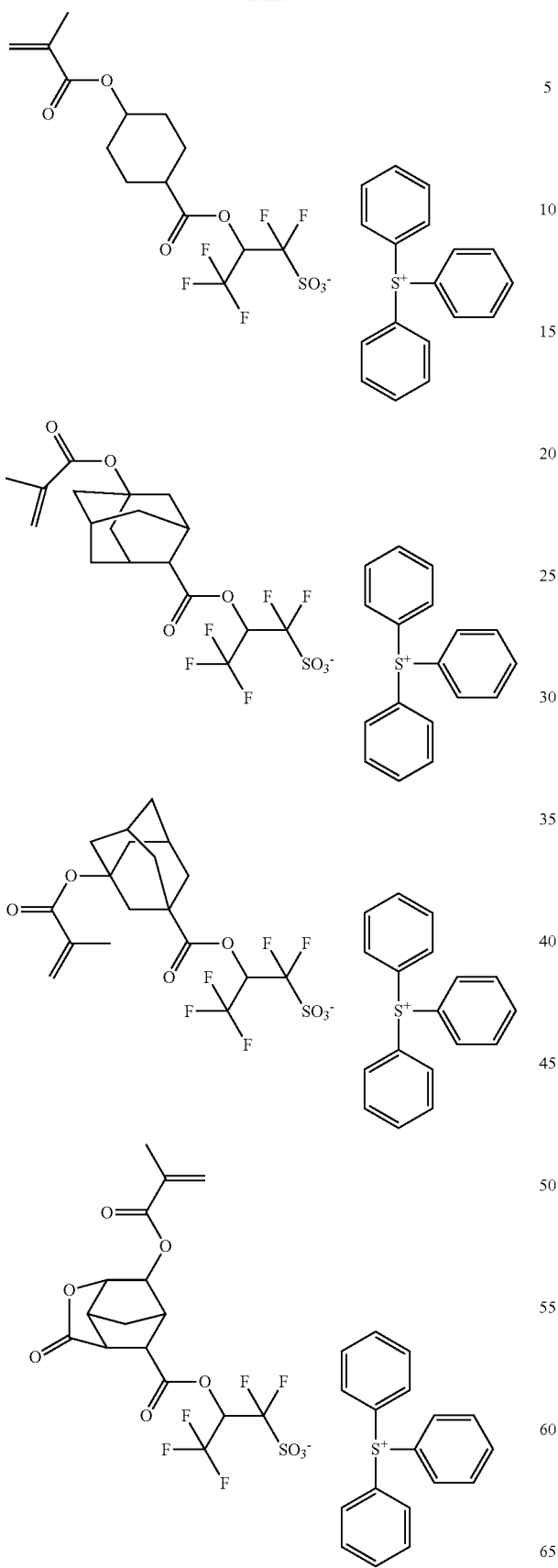
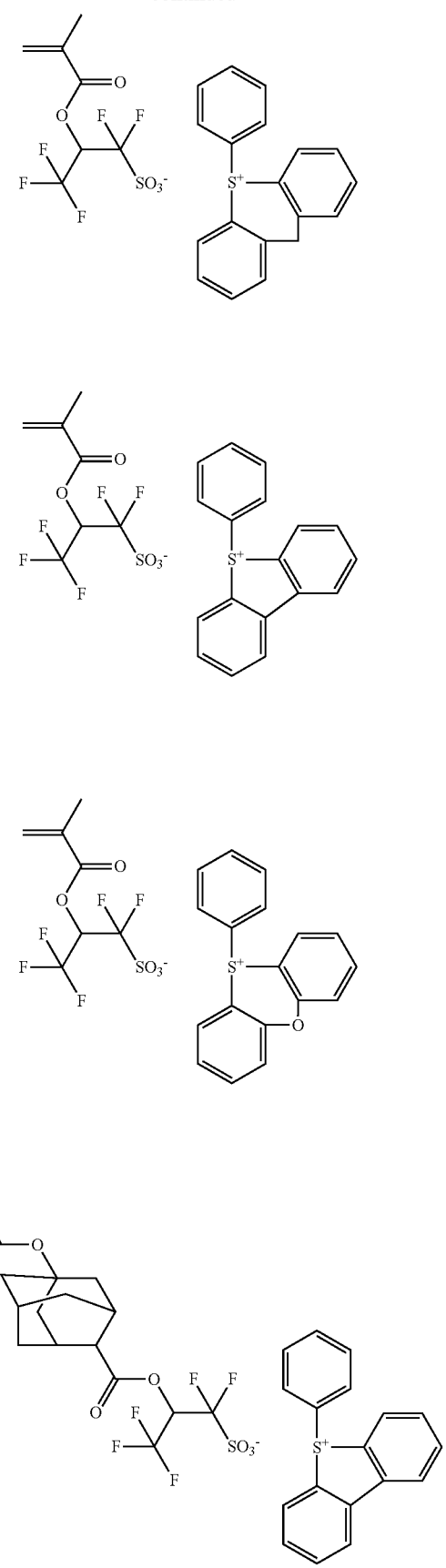

91
-continued
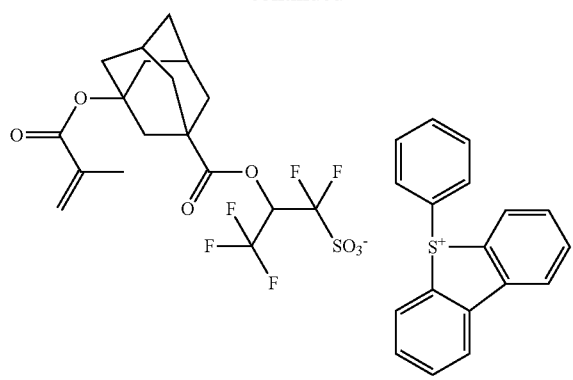
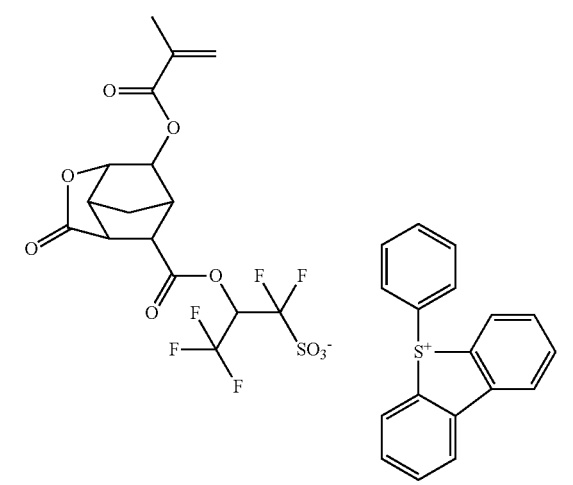
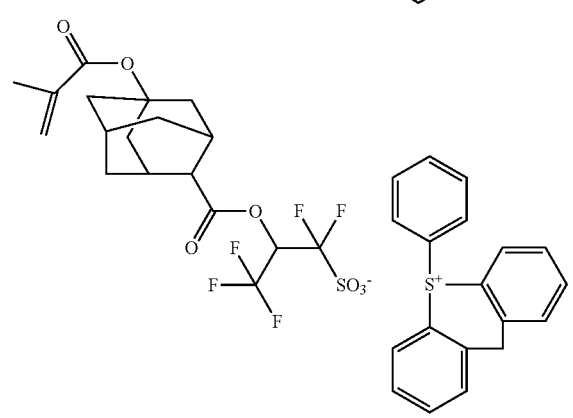
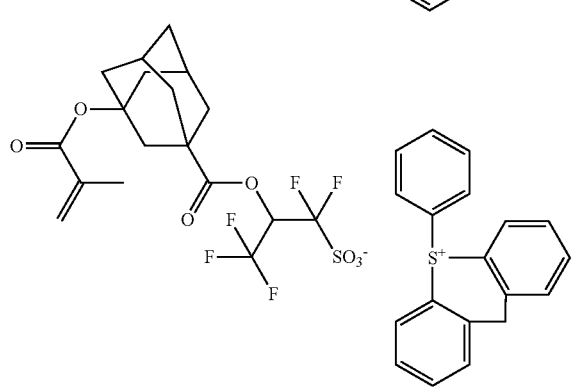
92
-continued
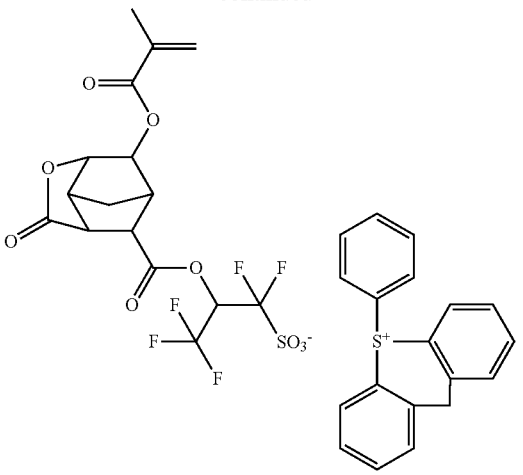
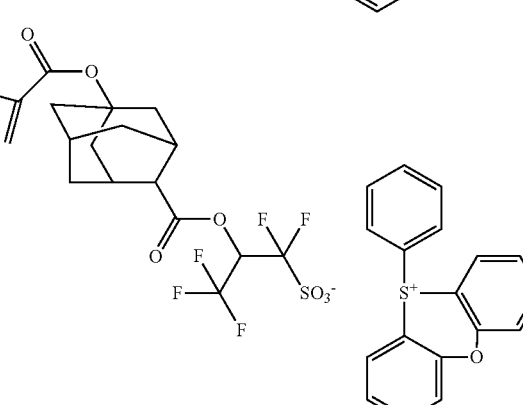
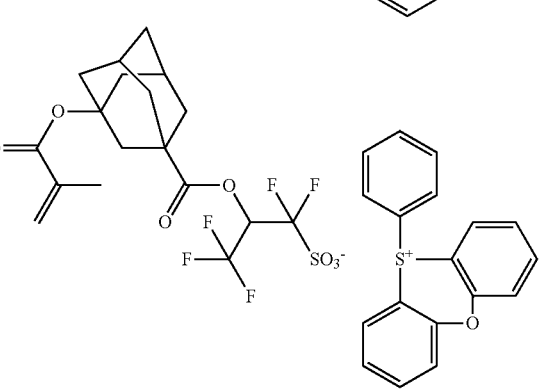

93
-continued
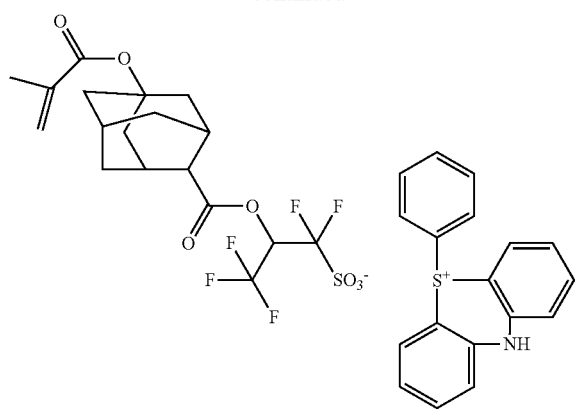
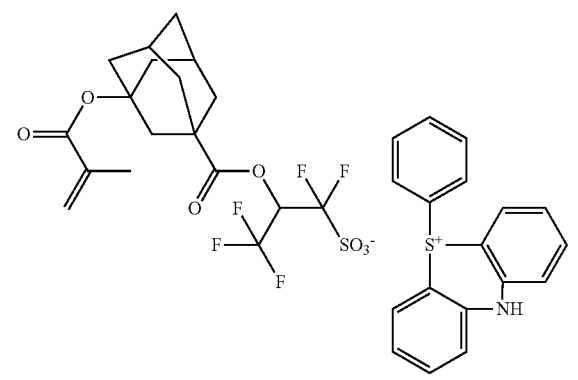
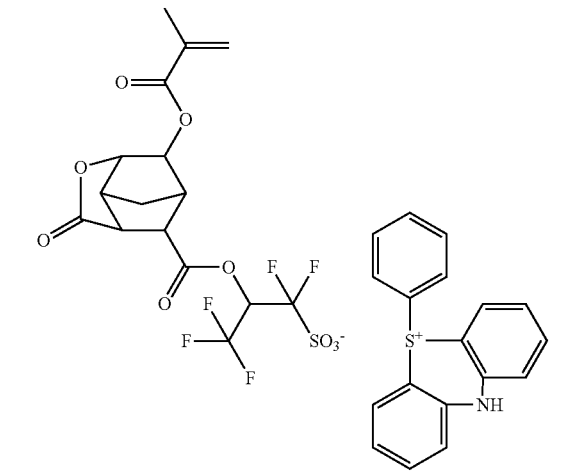
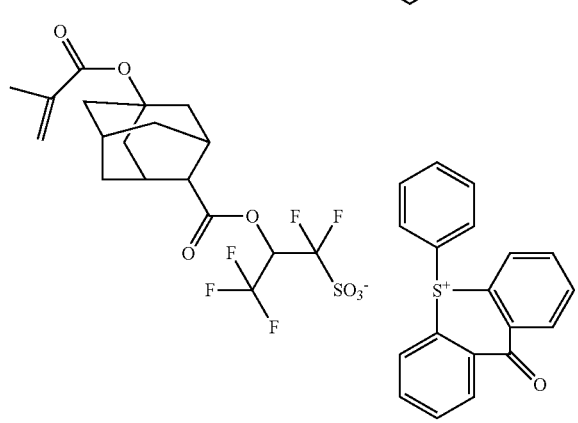
94
-continued
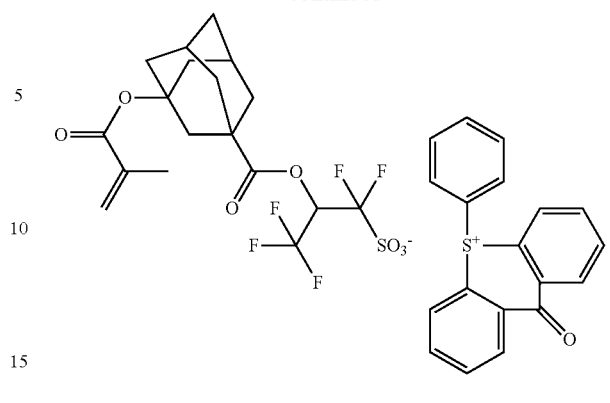
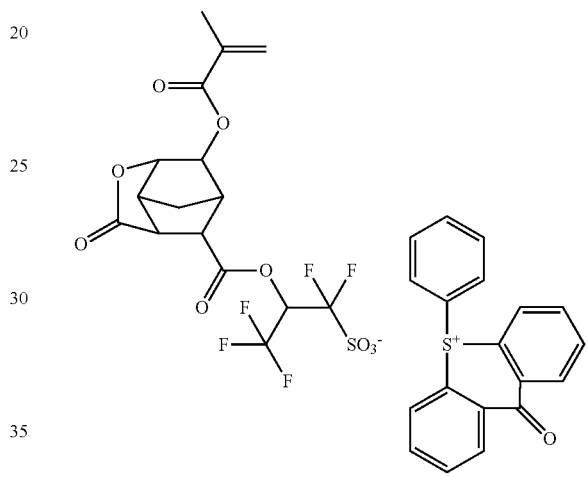
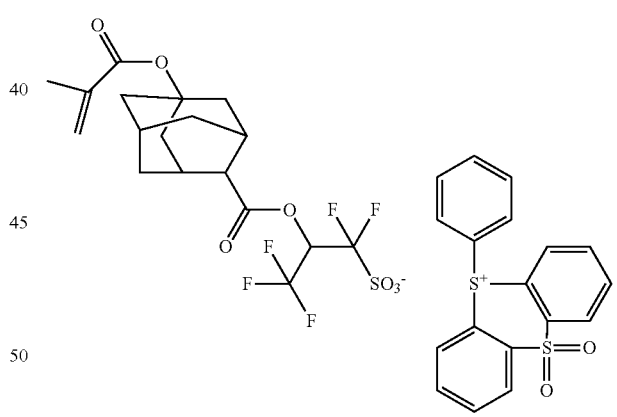
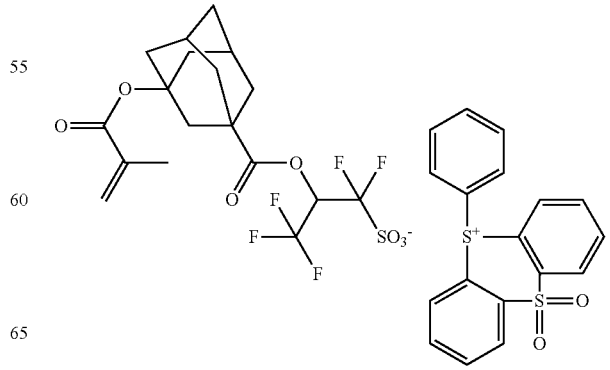

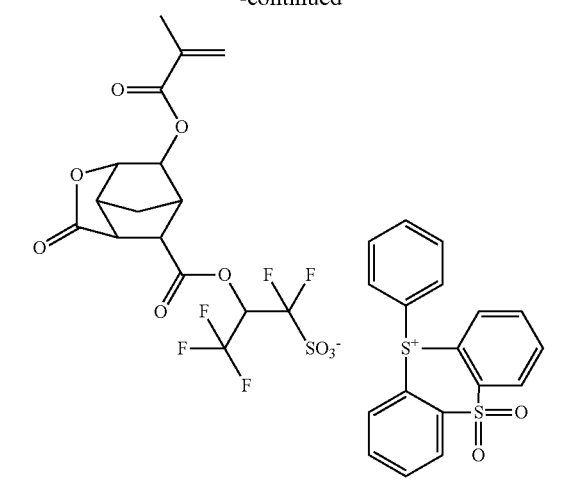
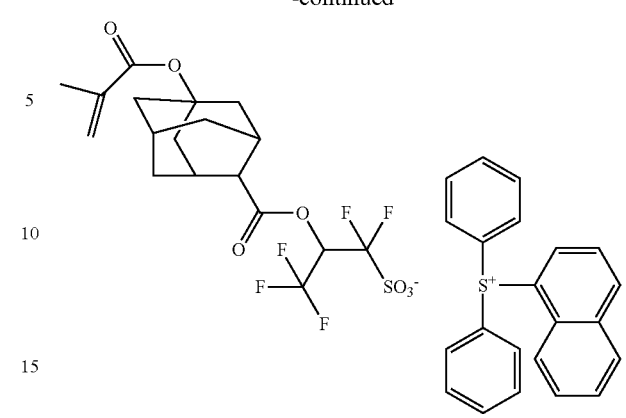
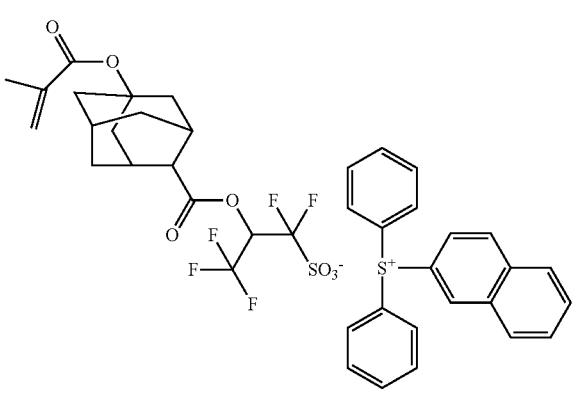
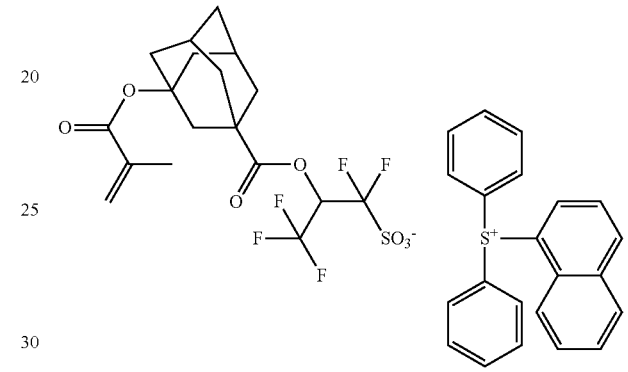
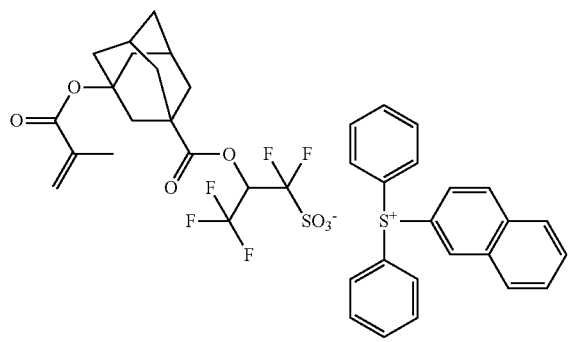
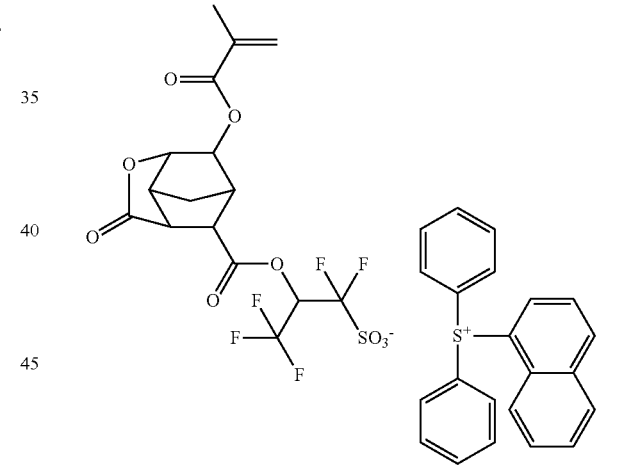
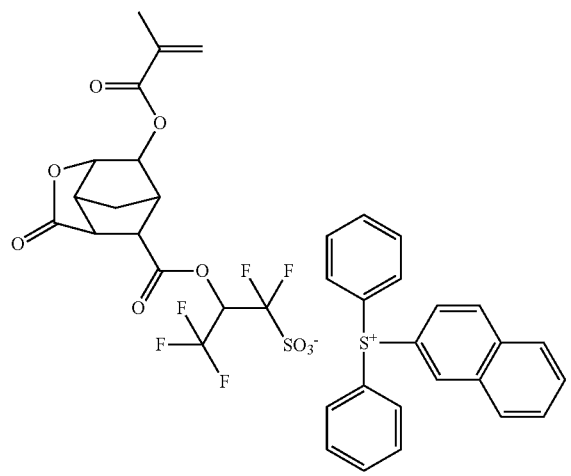
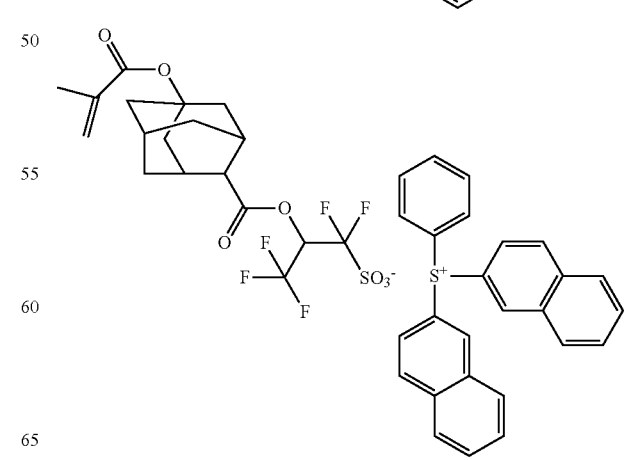

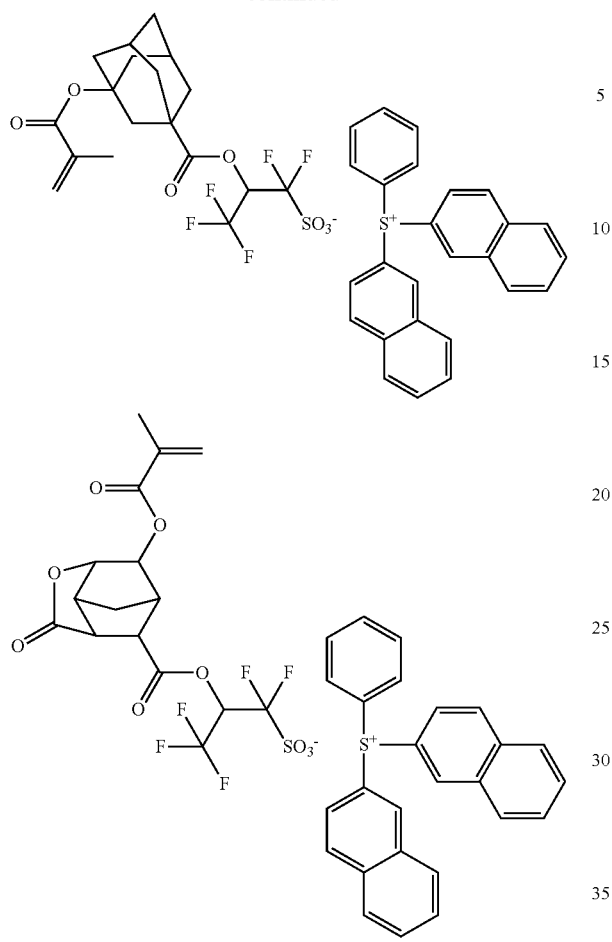
Examples of the monomer Mb2 from which recurring unit (b2) of sulfonium salt is derived are given below, but not limited thereto.
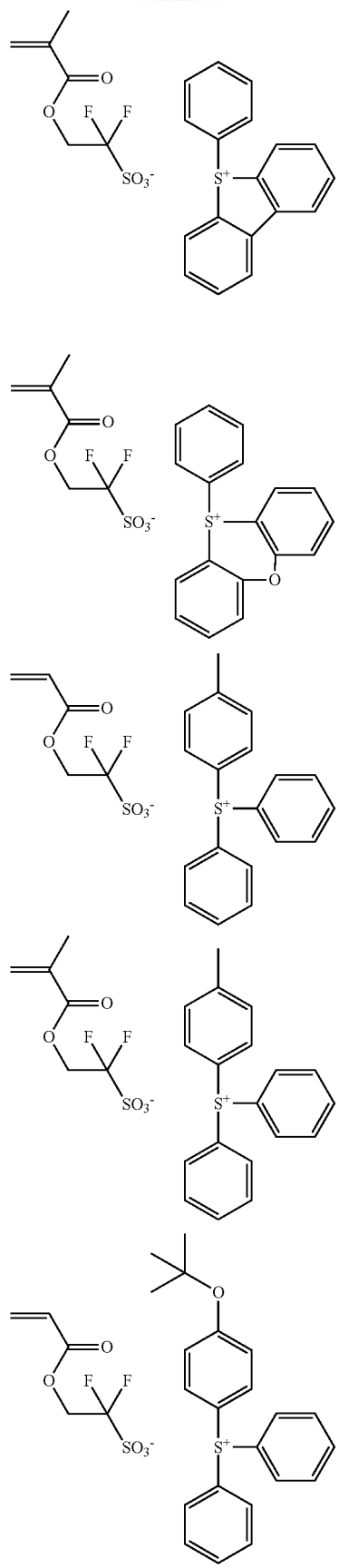

-continued
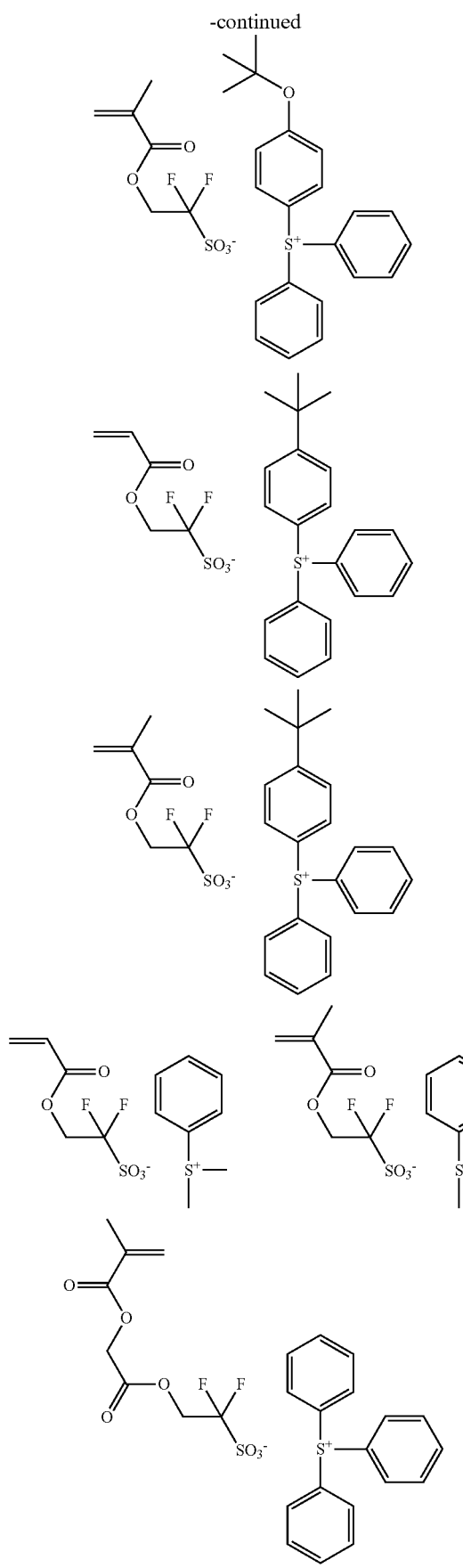
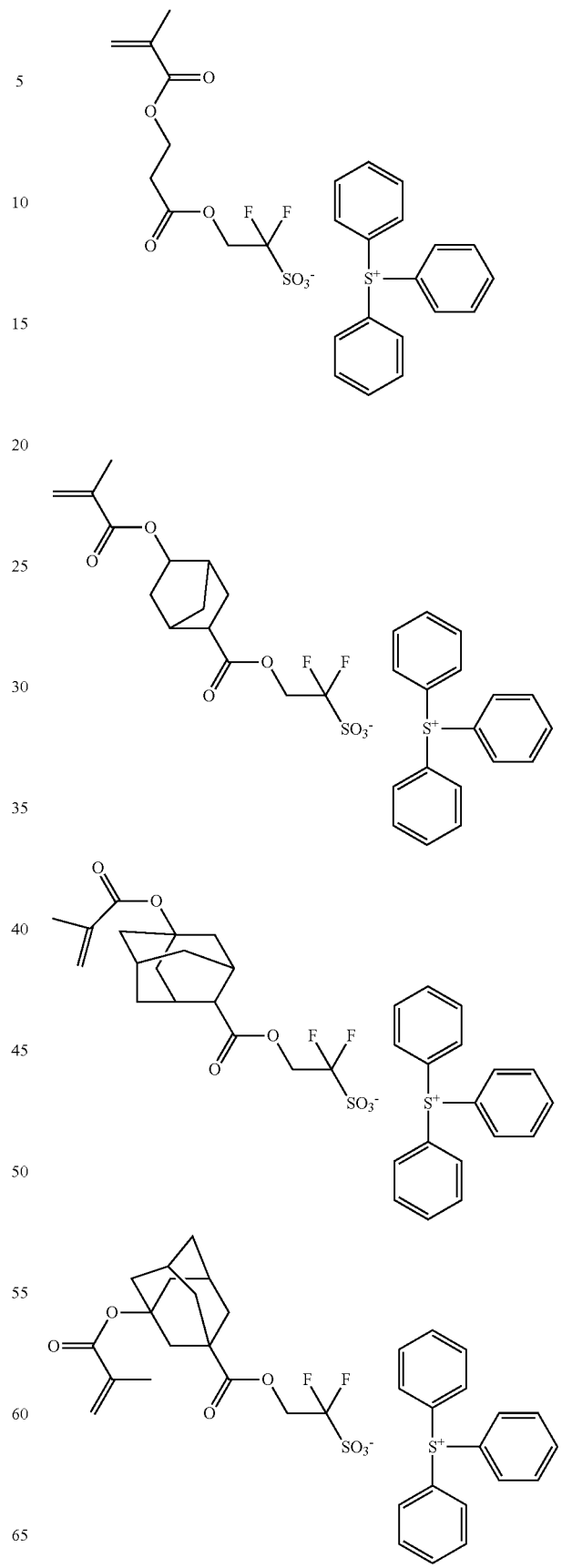

101
-continued
102
-continued
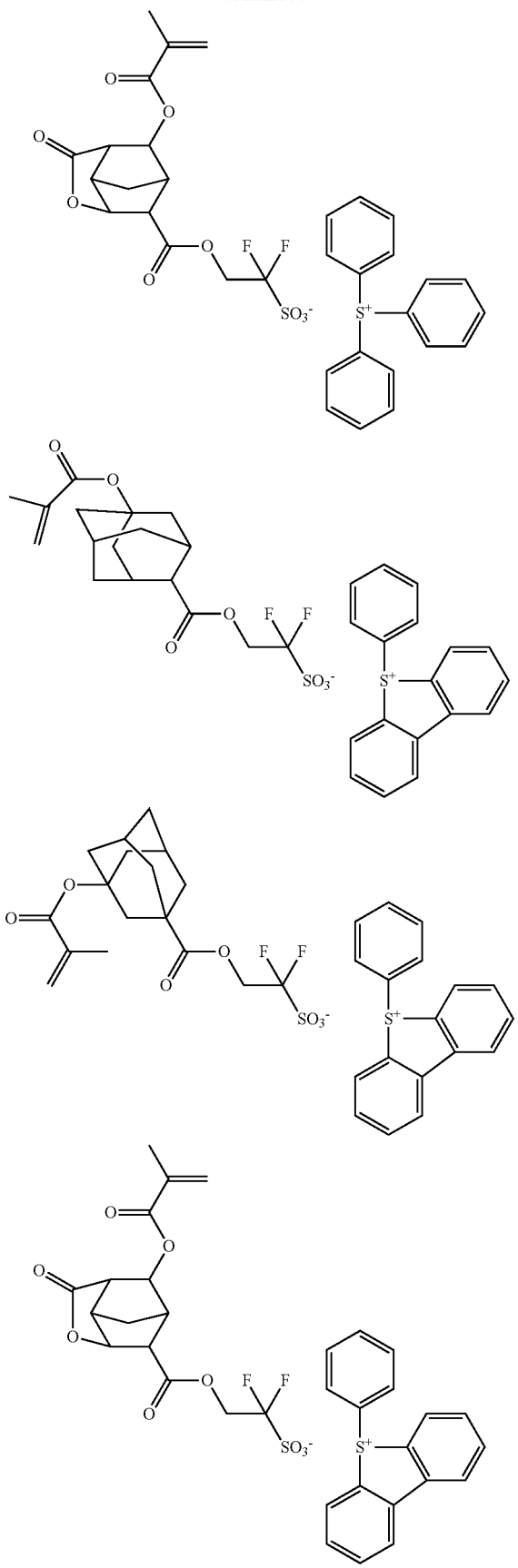
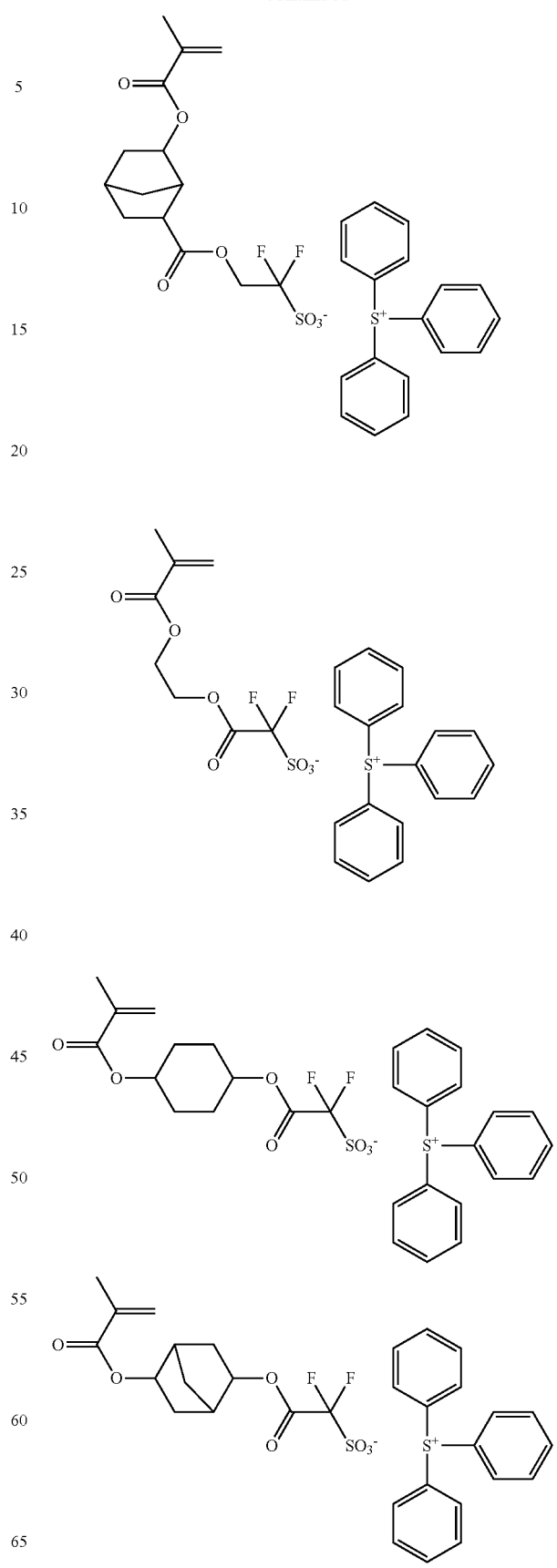

-continued
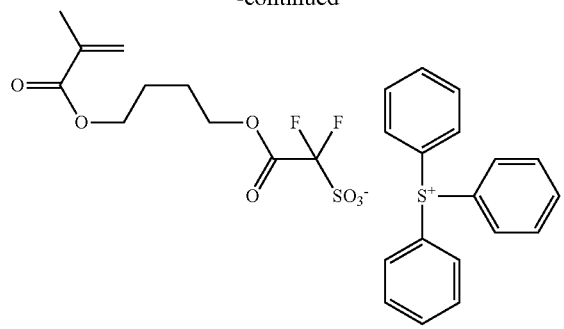
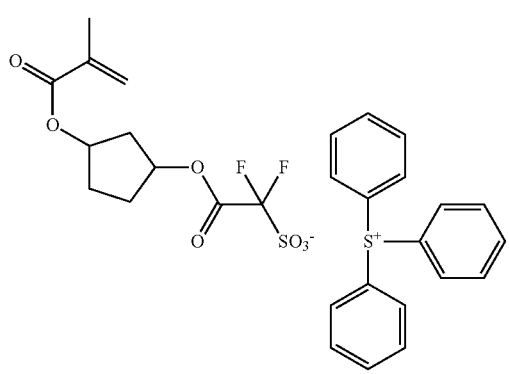
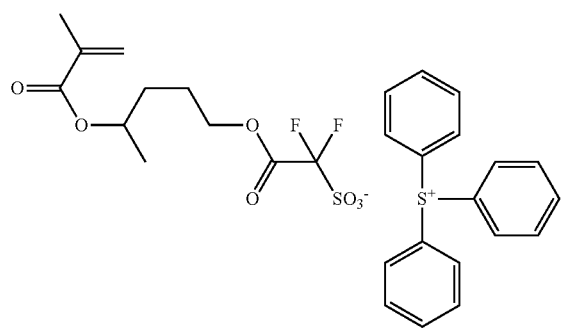
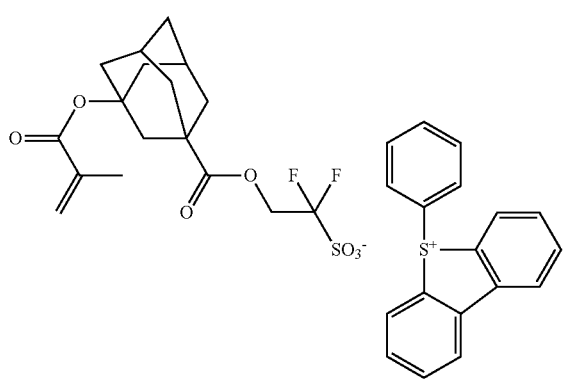
-continued
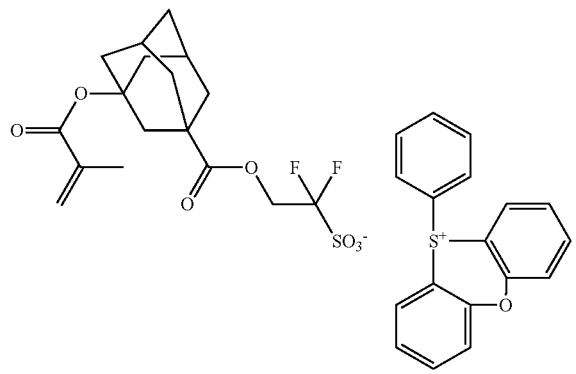
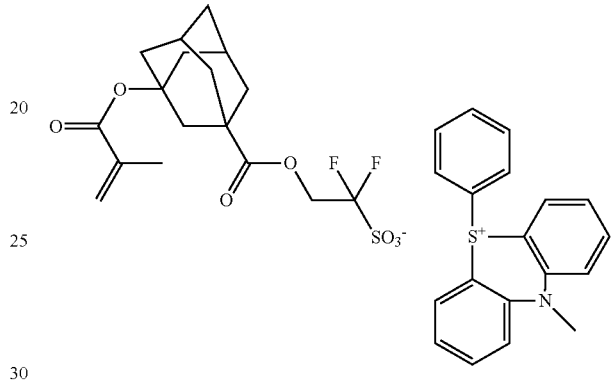
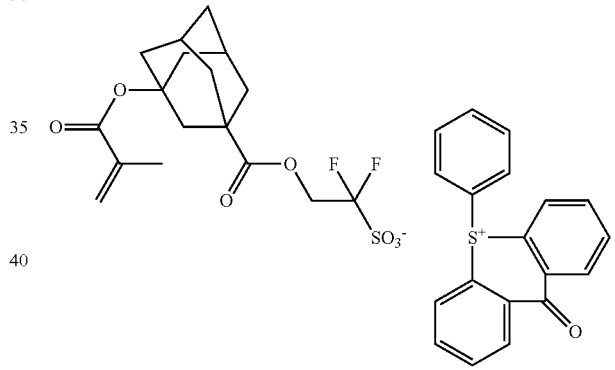
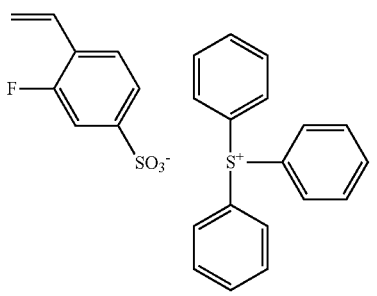
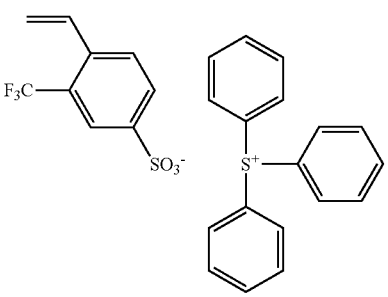

105
-continued
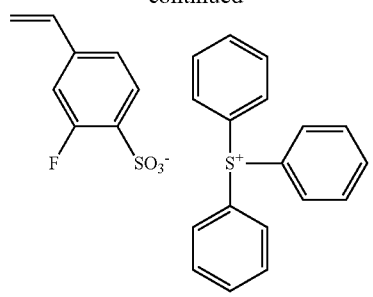
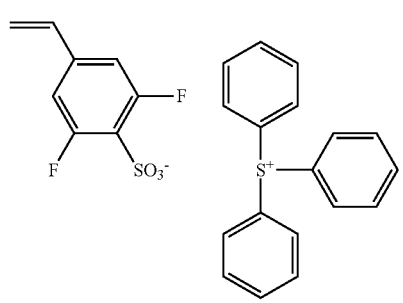
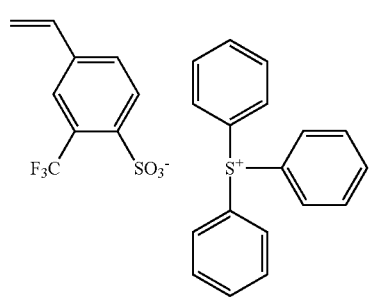
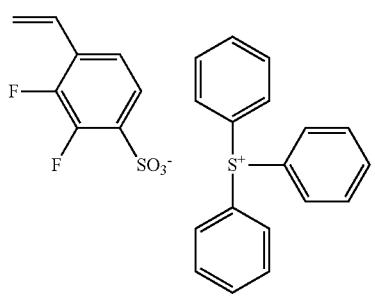
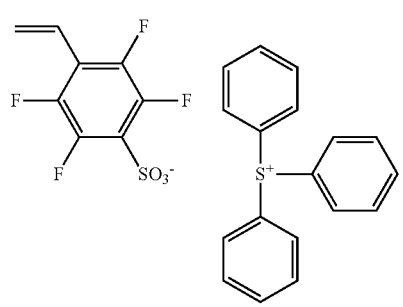
106
-continued
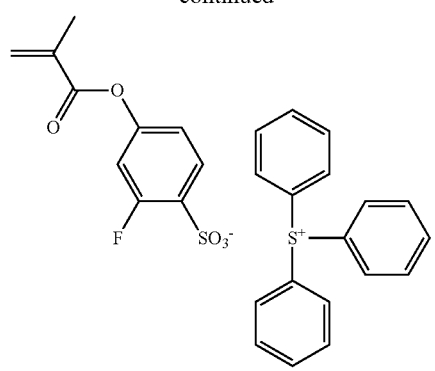
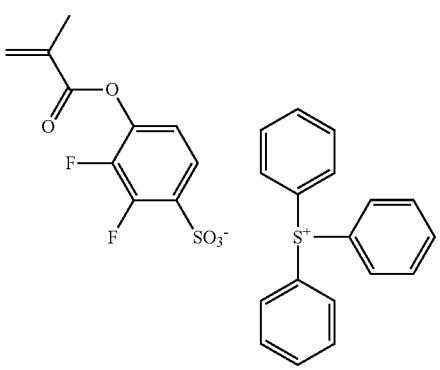
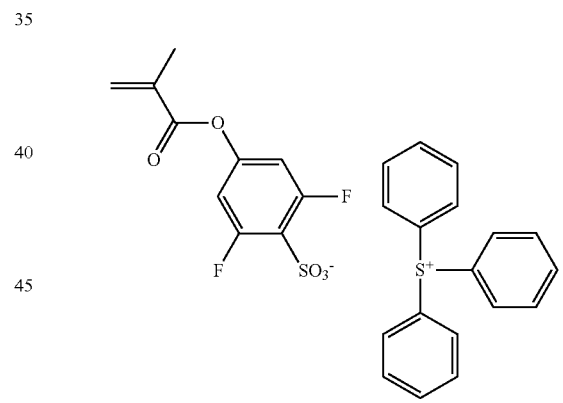
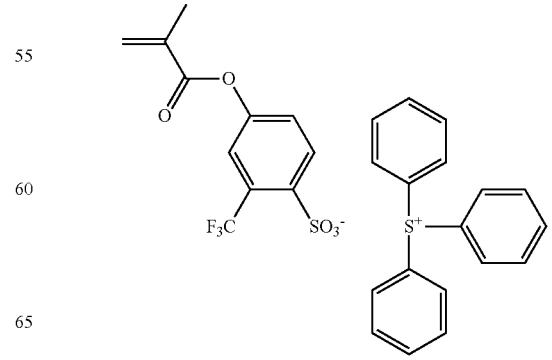

107
-continued
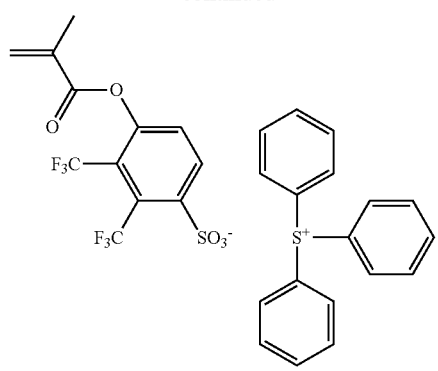
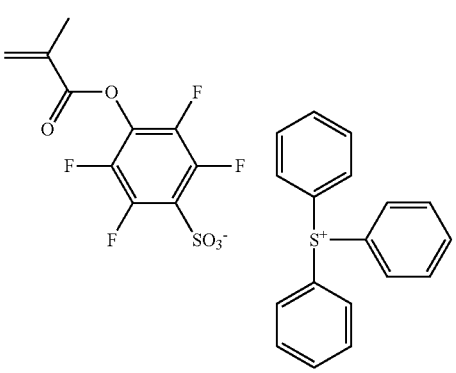
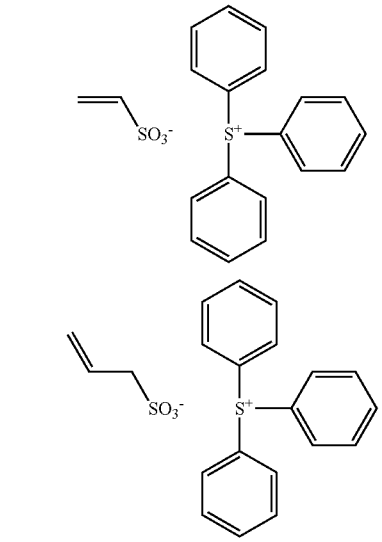
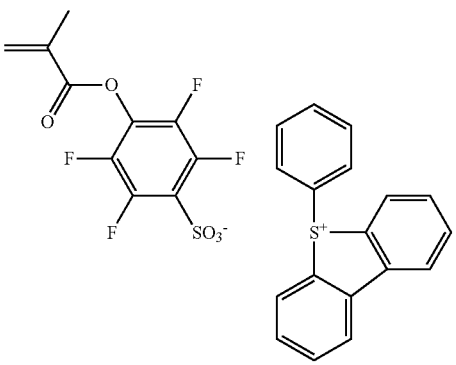
108
-continued
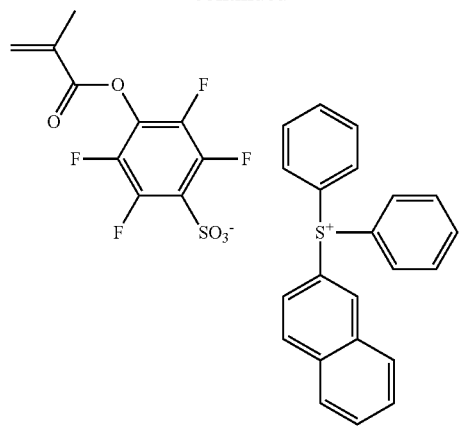
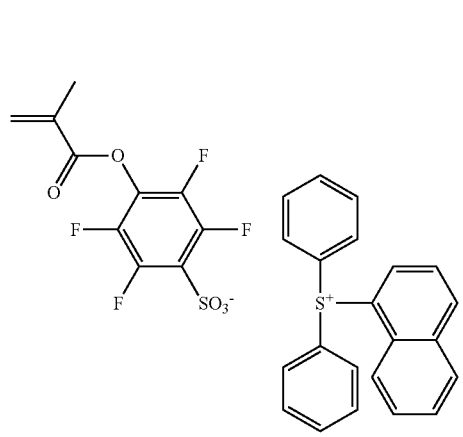
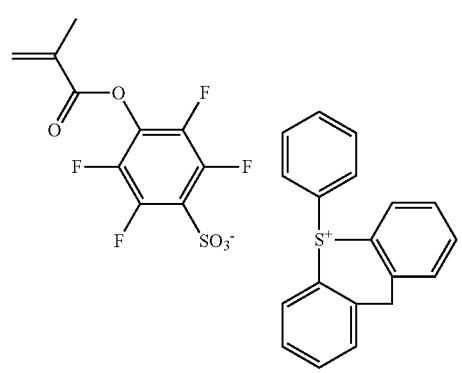
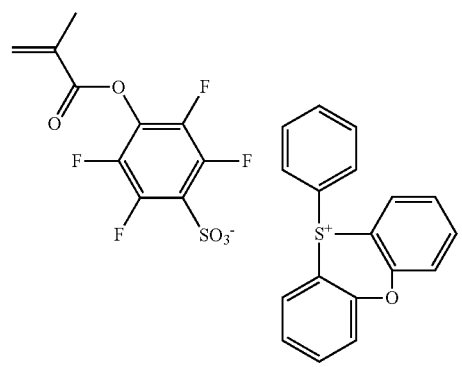

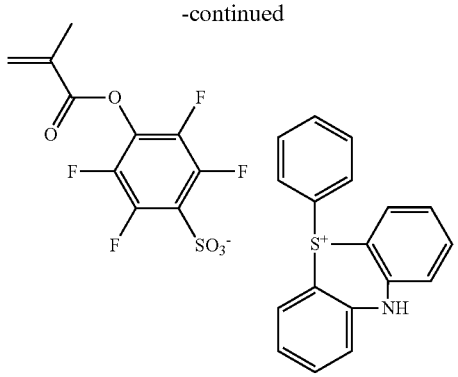

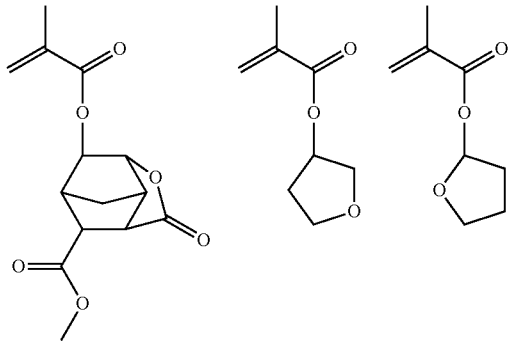

In a more preferred embodiment, the polymer as the base resin may further comprise recurring units (c) having an adhesive group as copolymerized with the recurring units (a1) having a carboxyl group whose hydrogen is substituted by an acid labile group and/or the recurring units (a2) having a phenolic hydroxyl group whose hydrogen is substituted by an acid labile group, and the recurring units (b1) and/or (b2) of sulfonium salt, as represented by formula (1). The adhesive group is selected from among hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH; and c is a number in the range: $0<c\leq0.9$ and $0.2\leq a1+a2+b1+b2+c\leq1.0$. The polymer has a weight average molecular weight in the range of 1,000 to 500,000.

Shown below are examples of the monomer from which the recurring units (c) having an adhesive group selected from among hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH are derived.

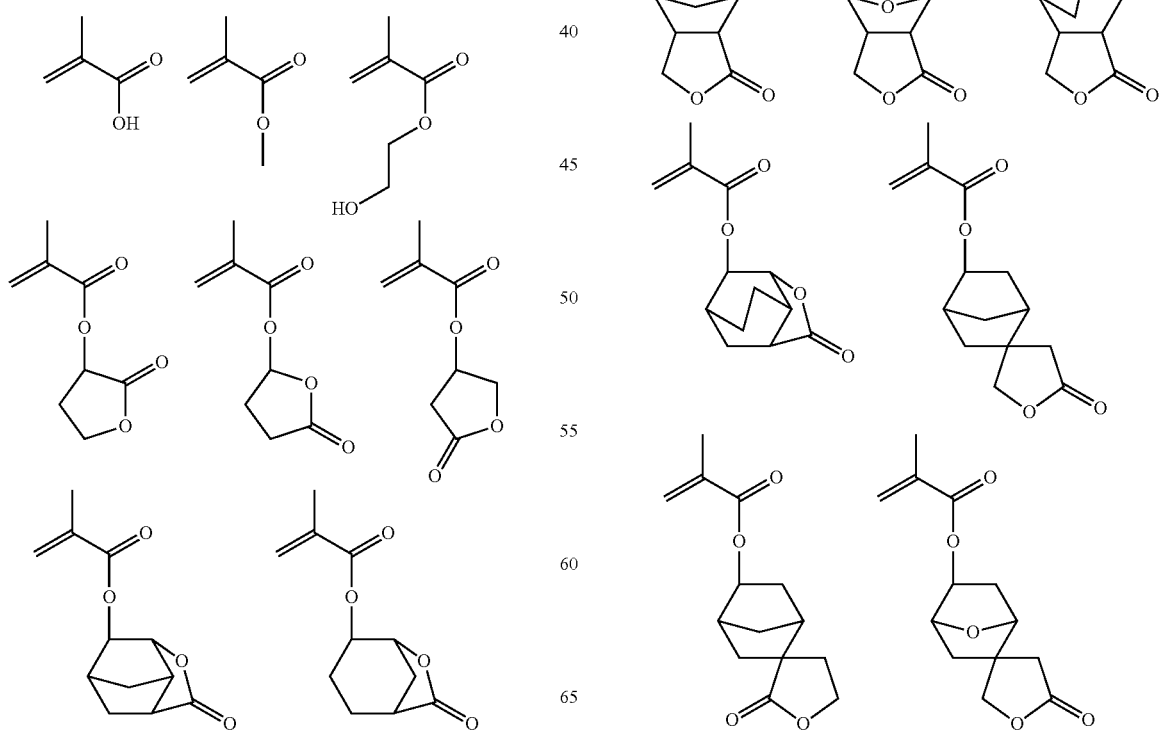

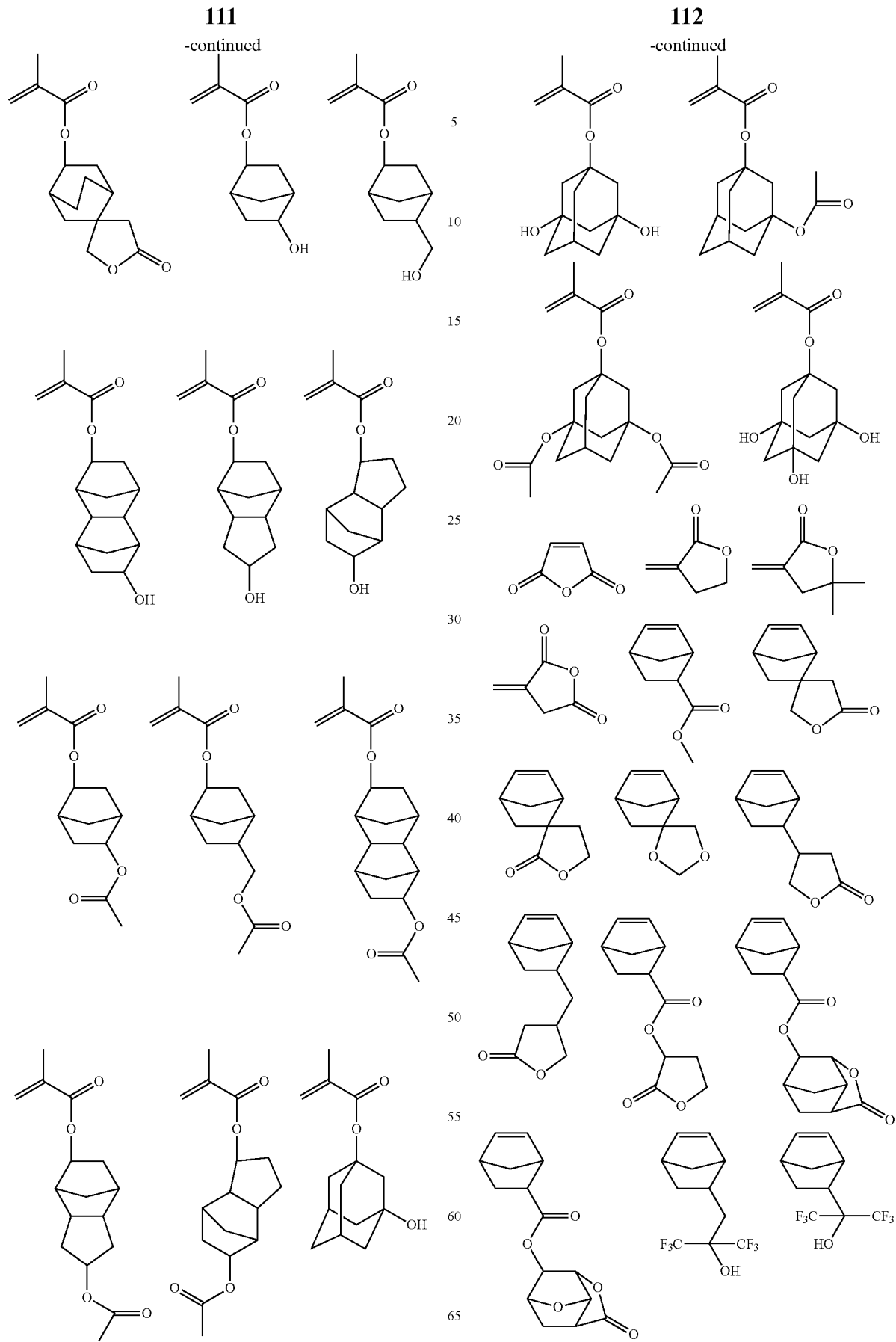

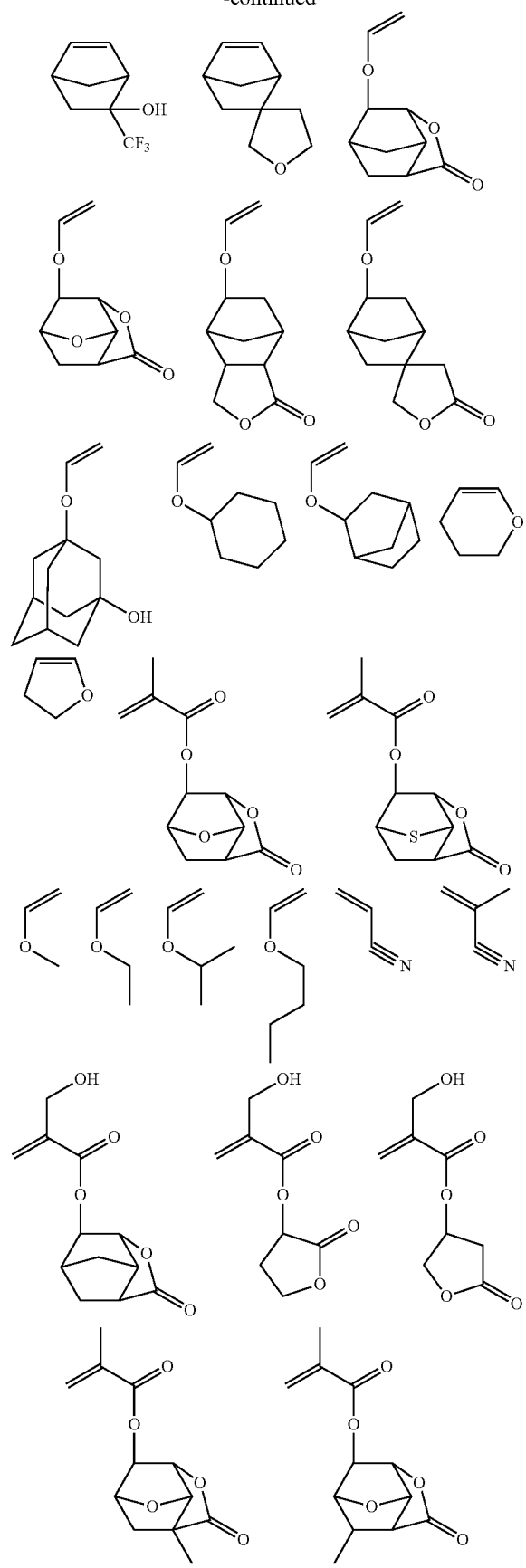
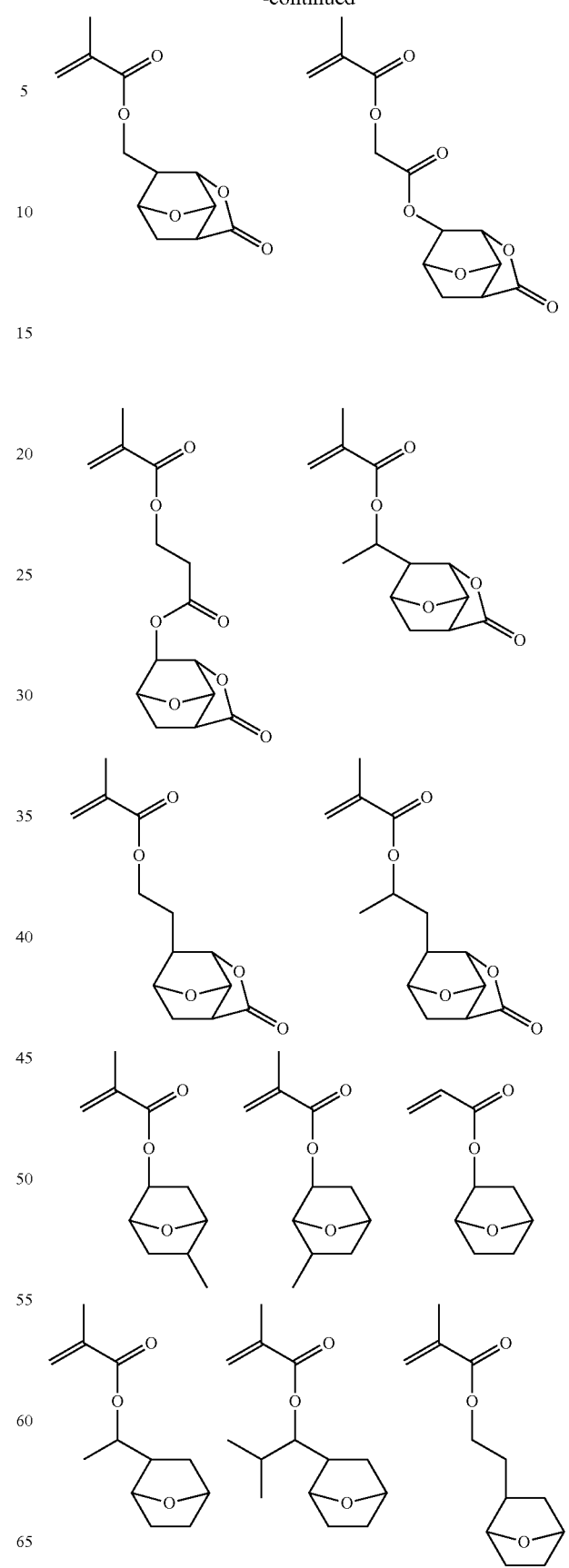

-continued
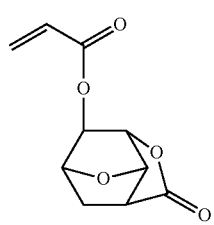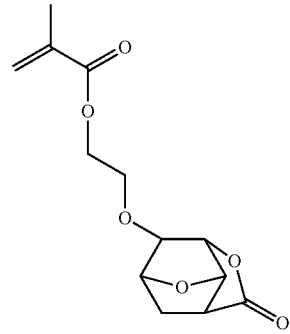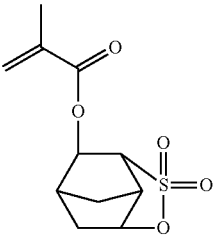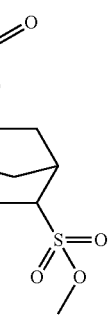
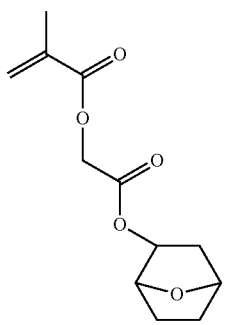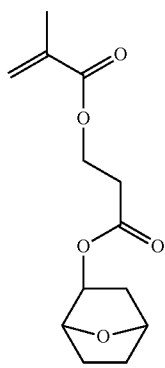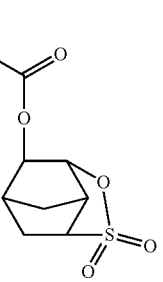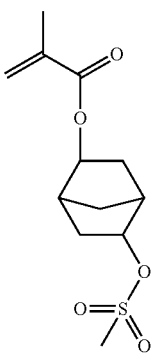
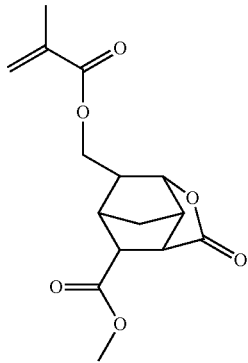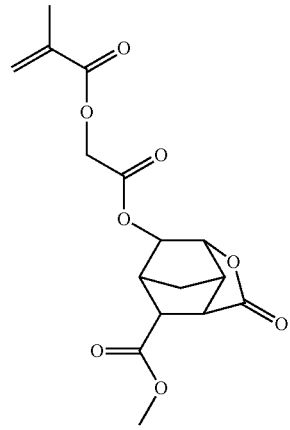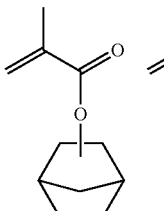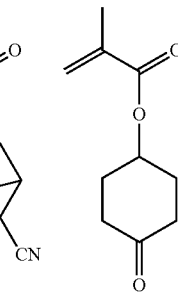
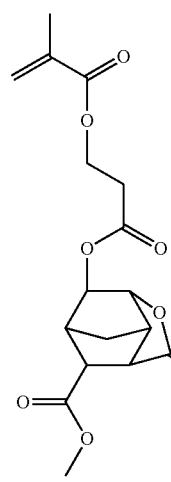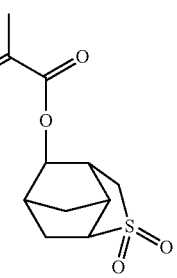

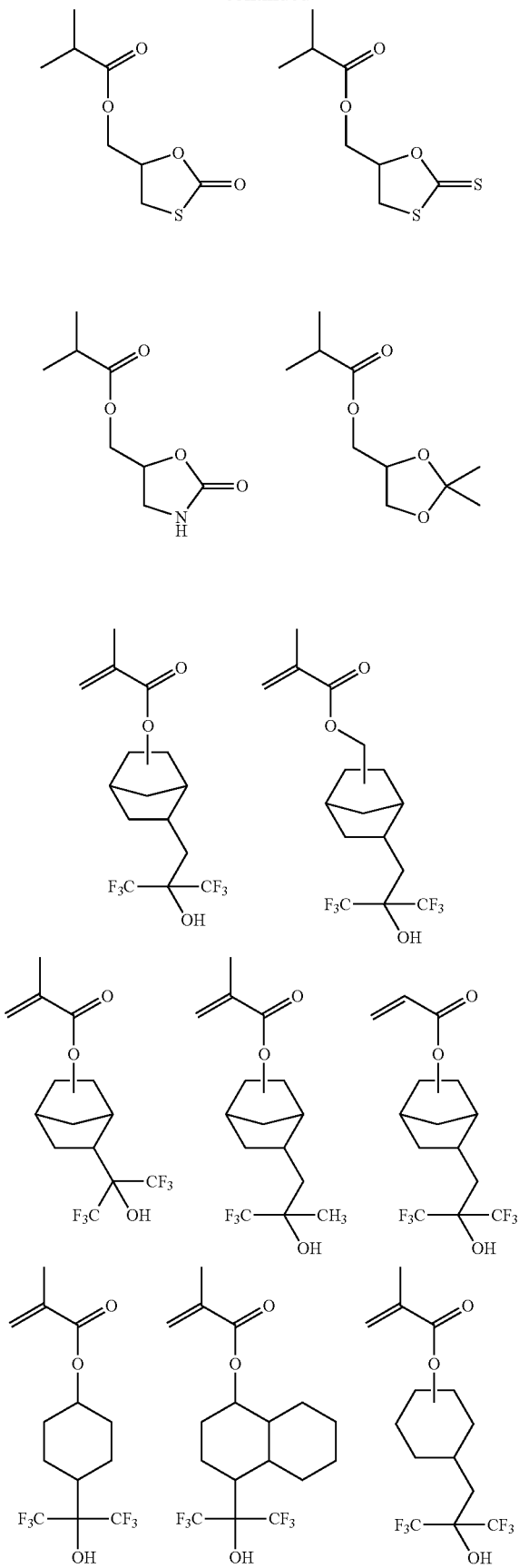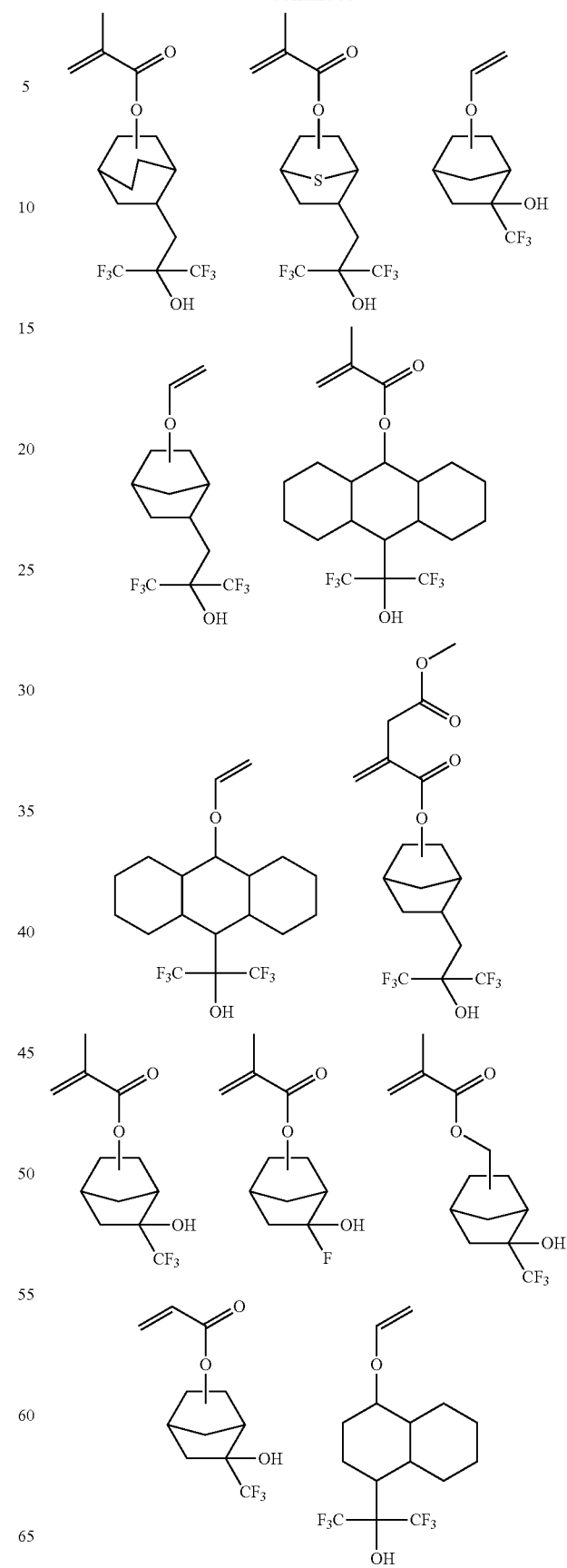

119
-continued
120
-continued
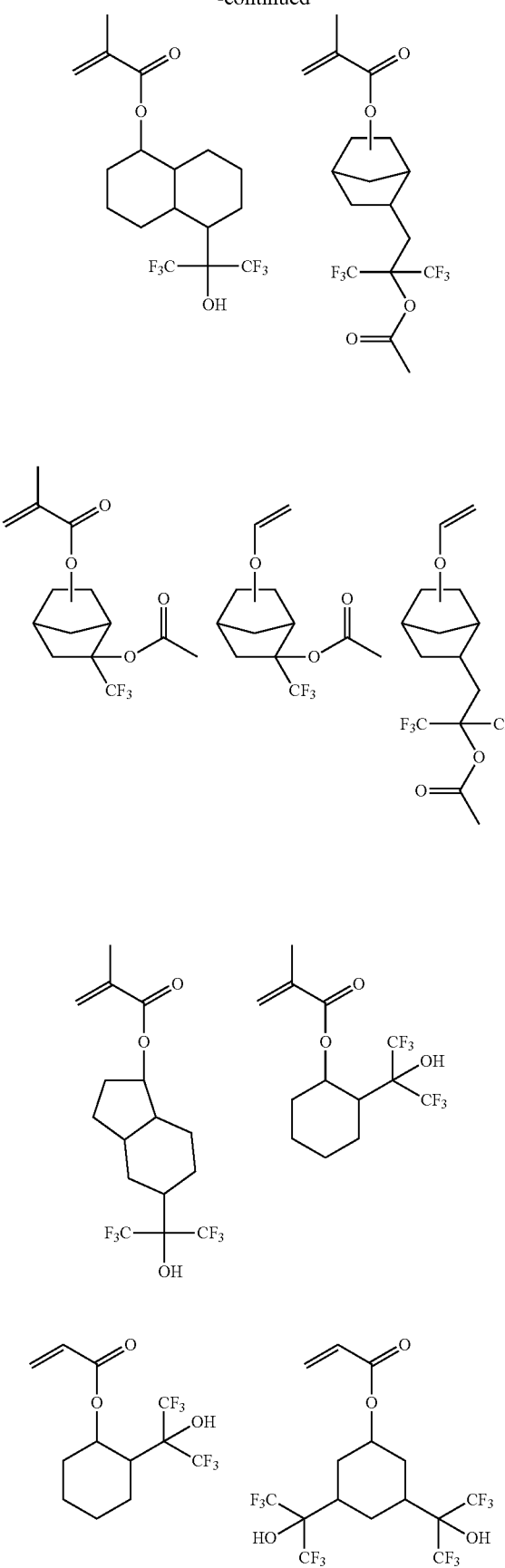
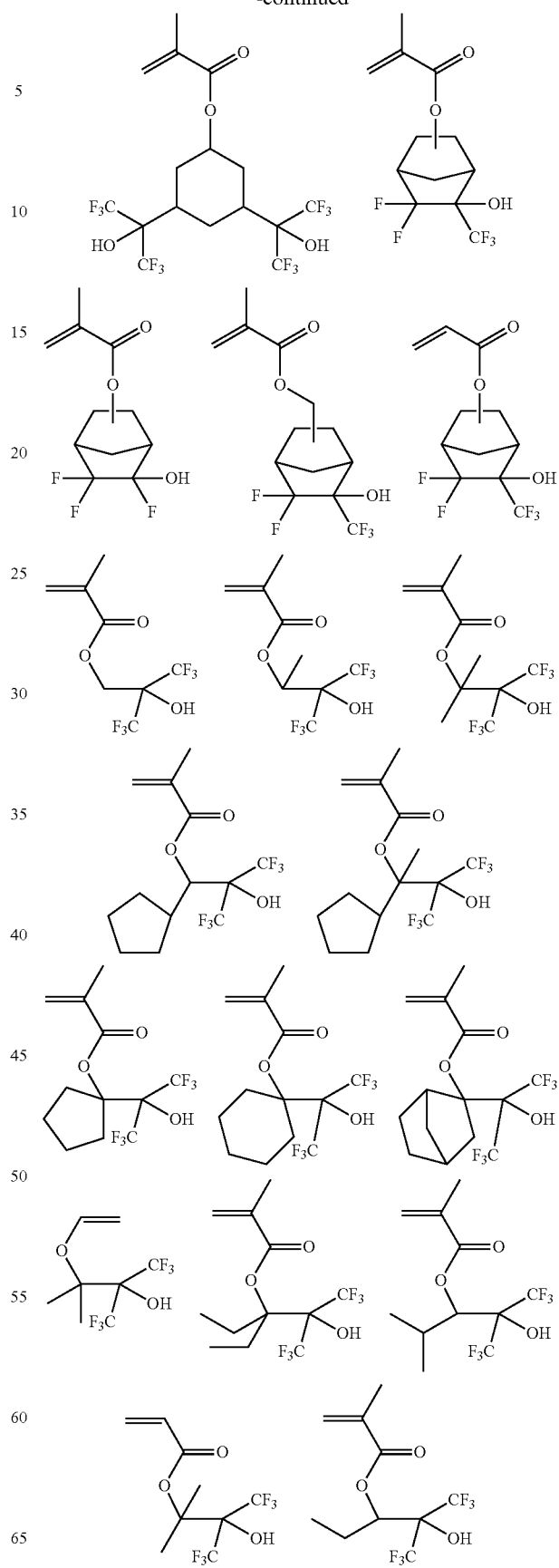

121
-continued
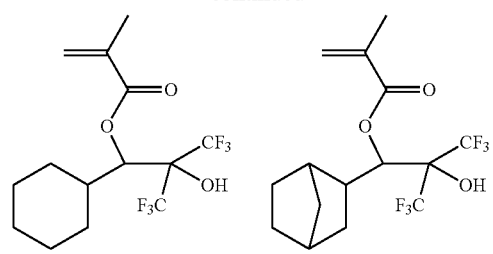
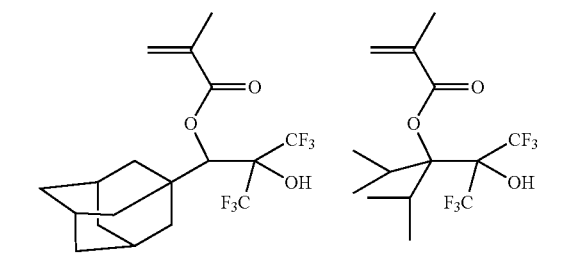
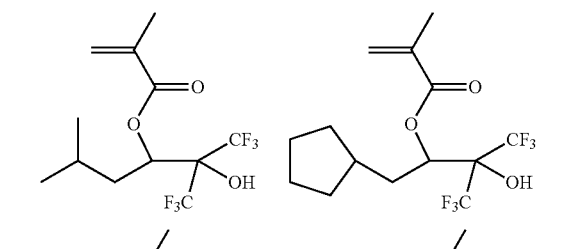
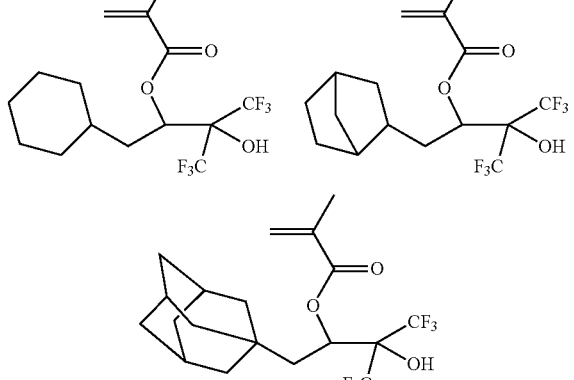
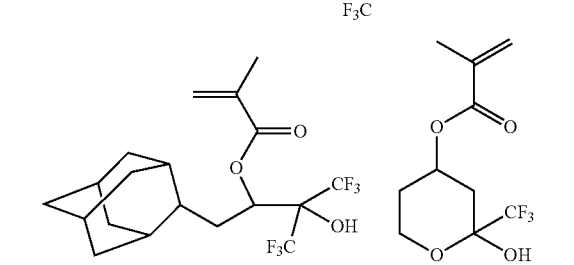
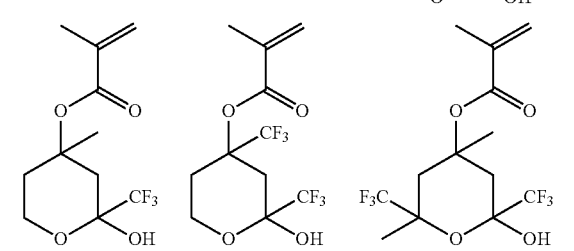
122
-continued
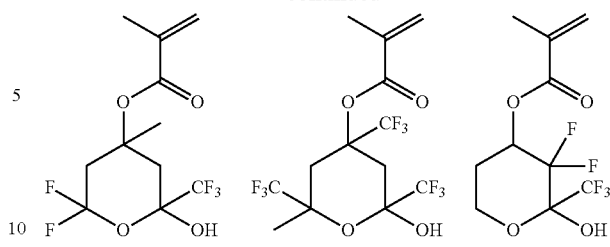
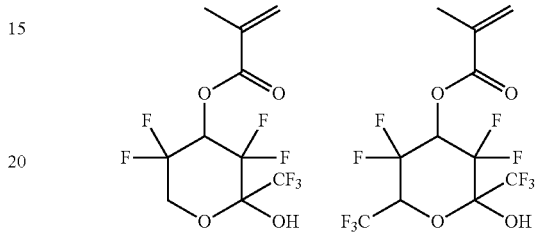
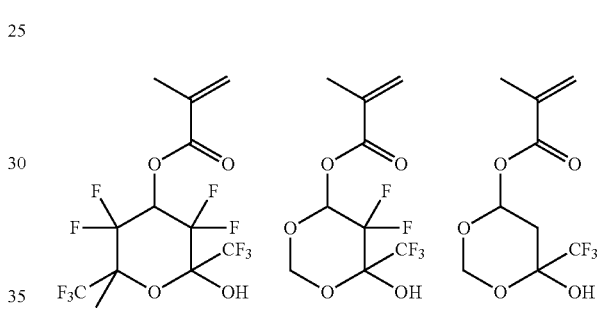
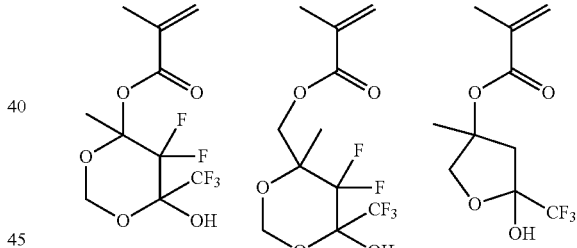
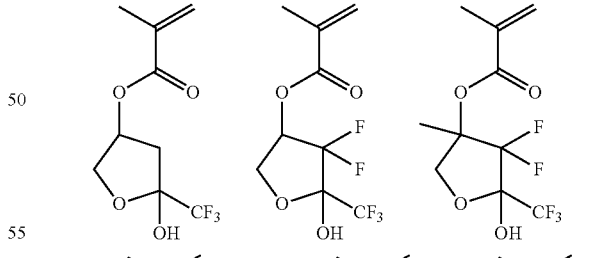
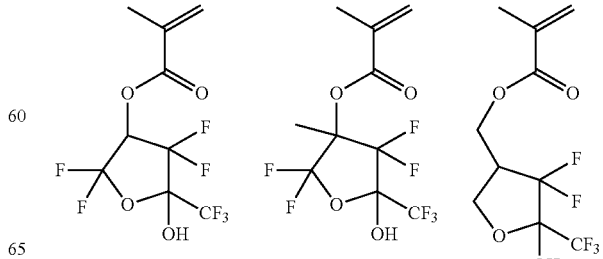

123
-continued
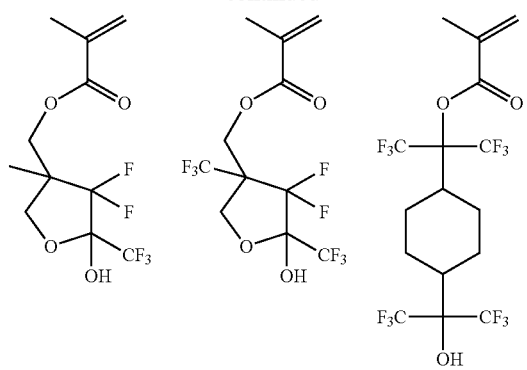
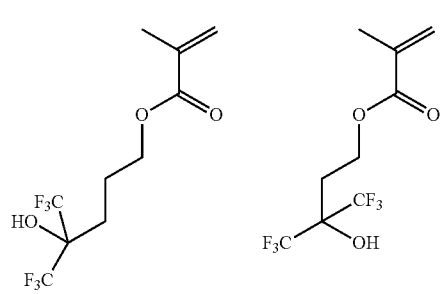
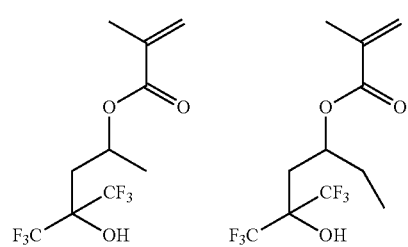
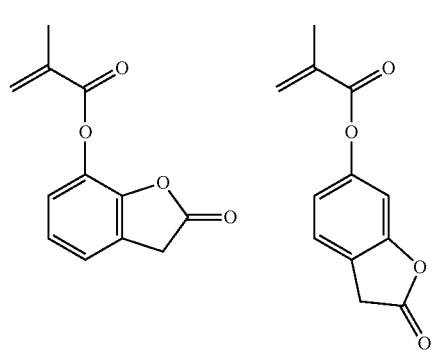
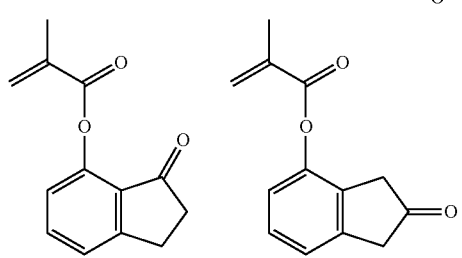
124
-continued
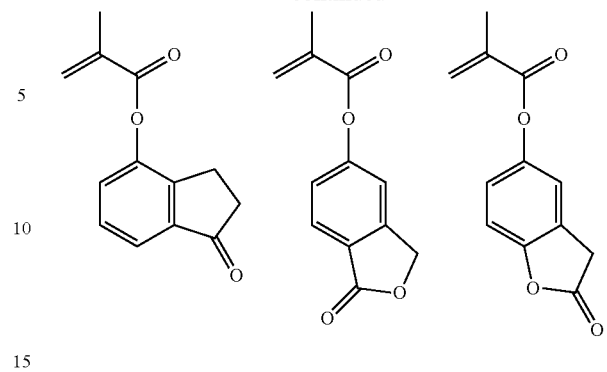
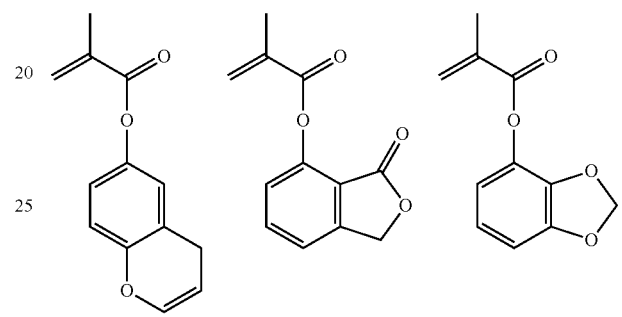
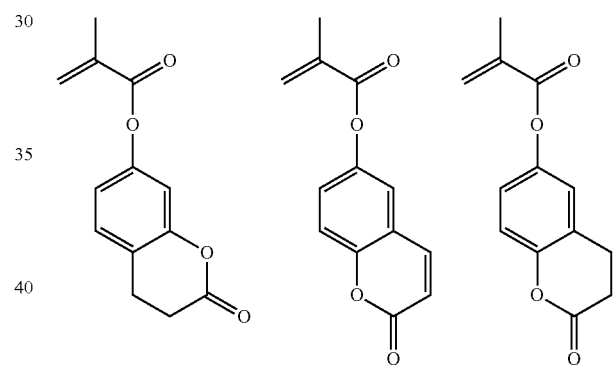
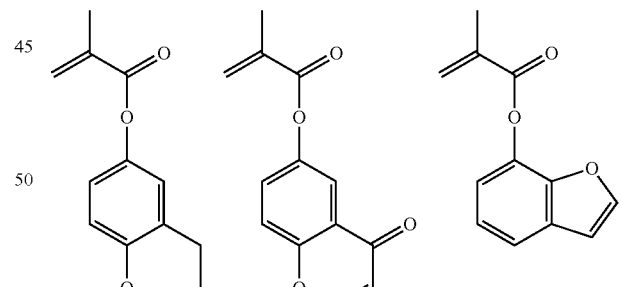
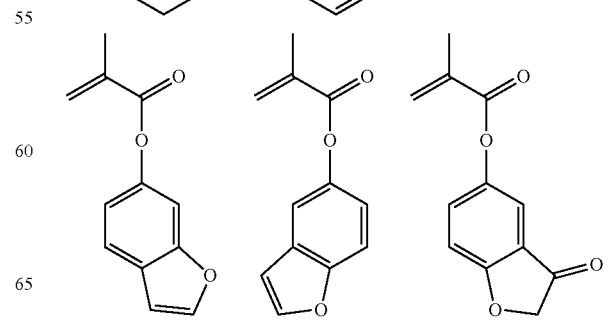

125
-continued
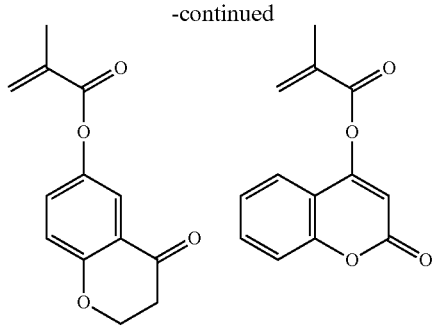
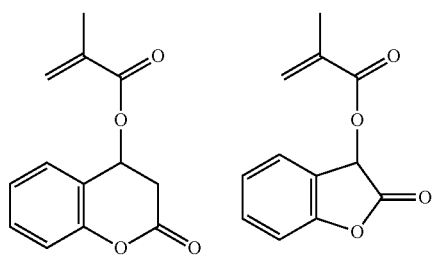
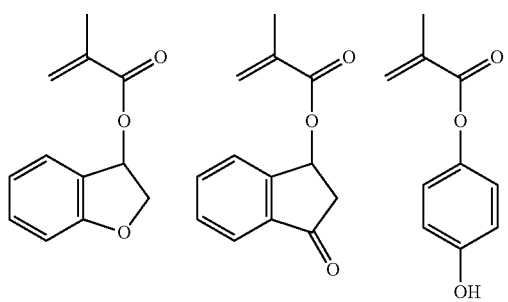
126
-continued
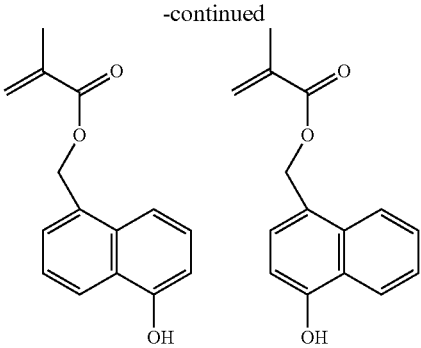
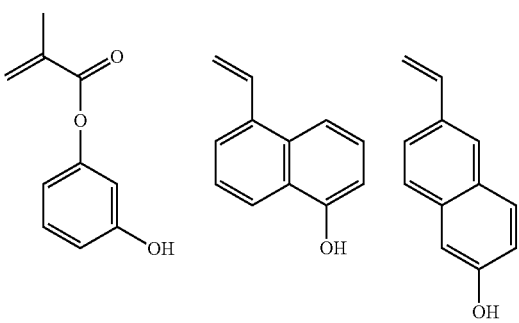
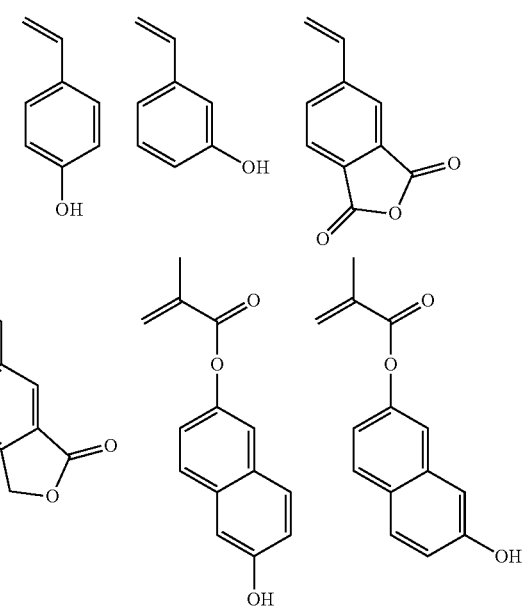
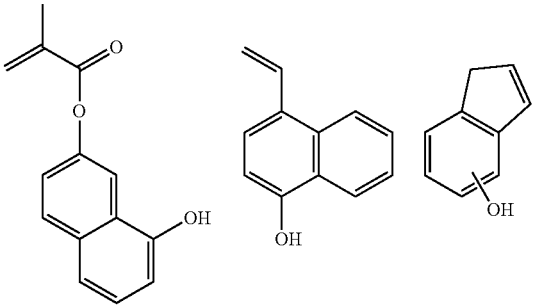

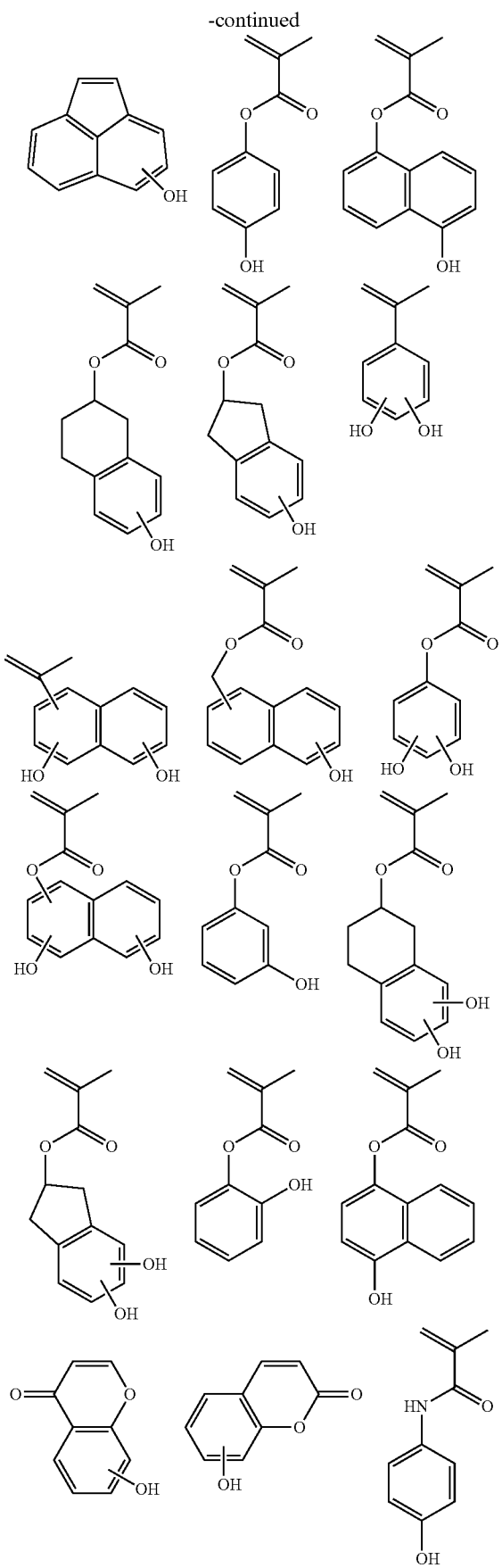

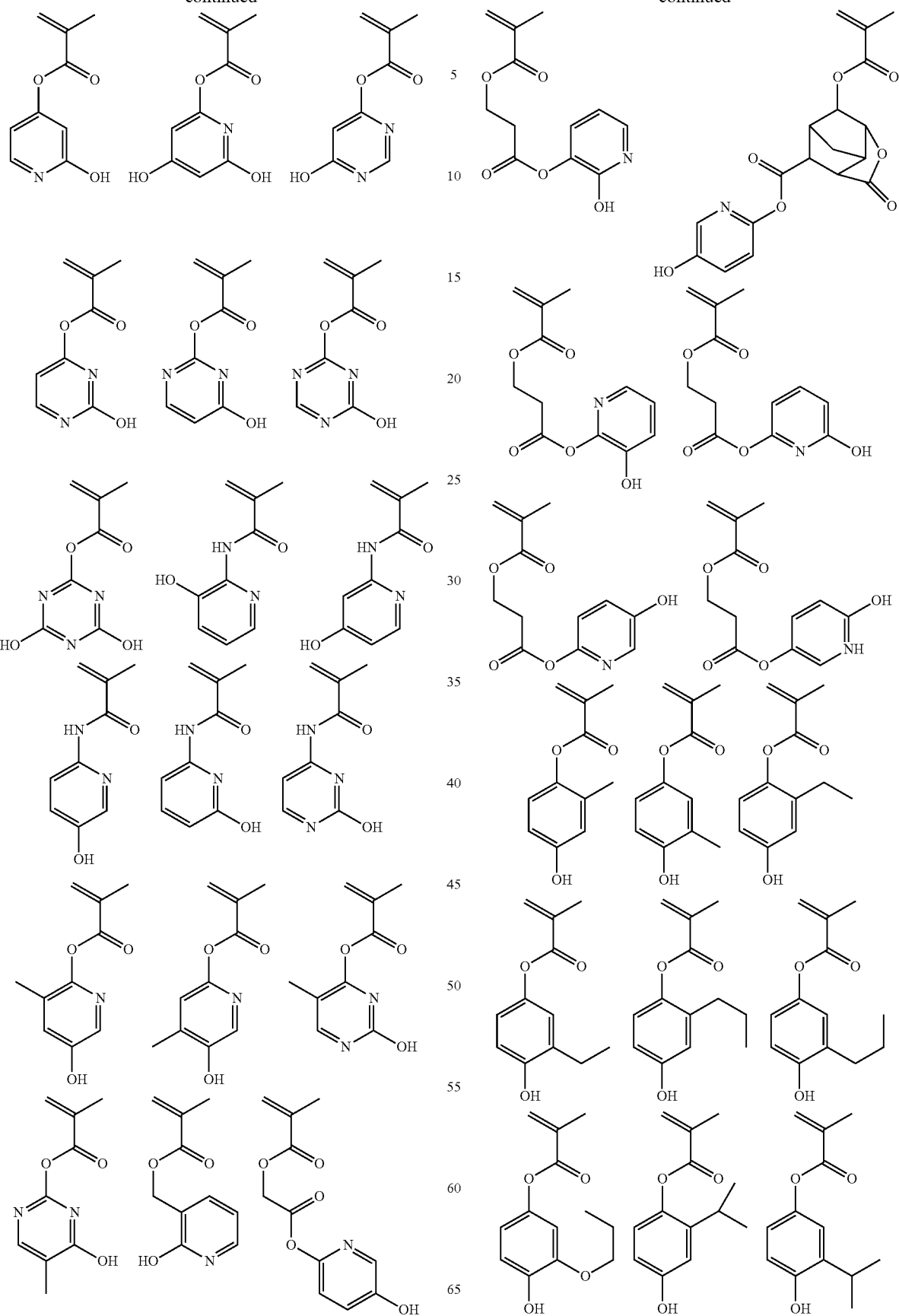

131
-continued
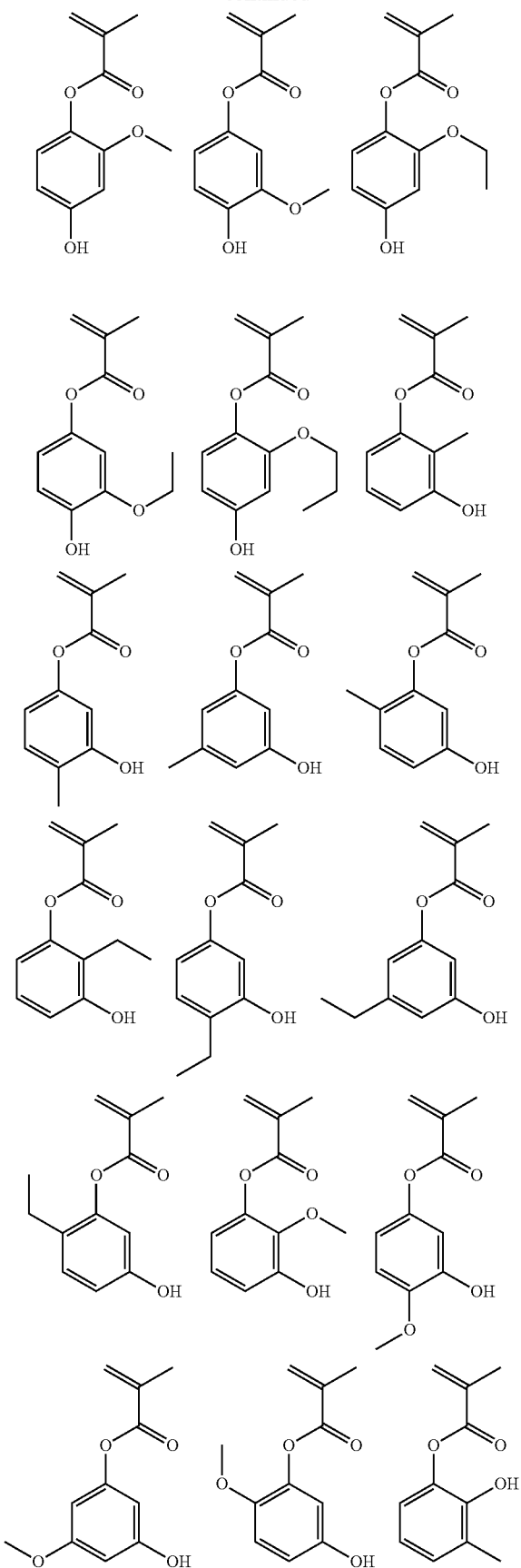
132
-continued
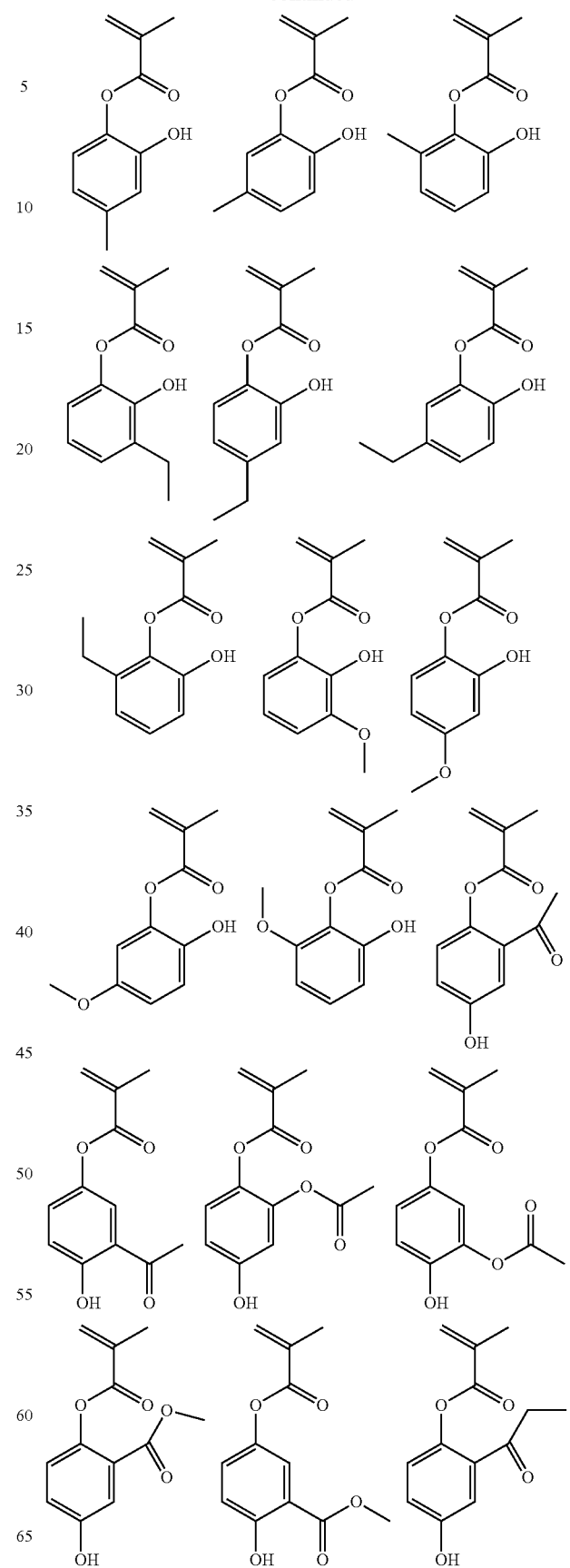

133 -continued
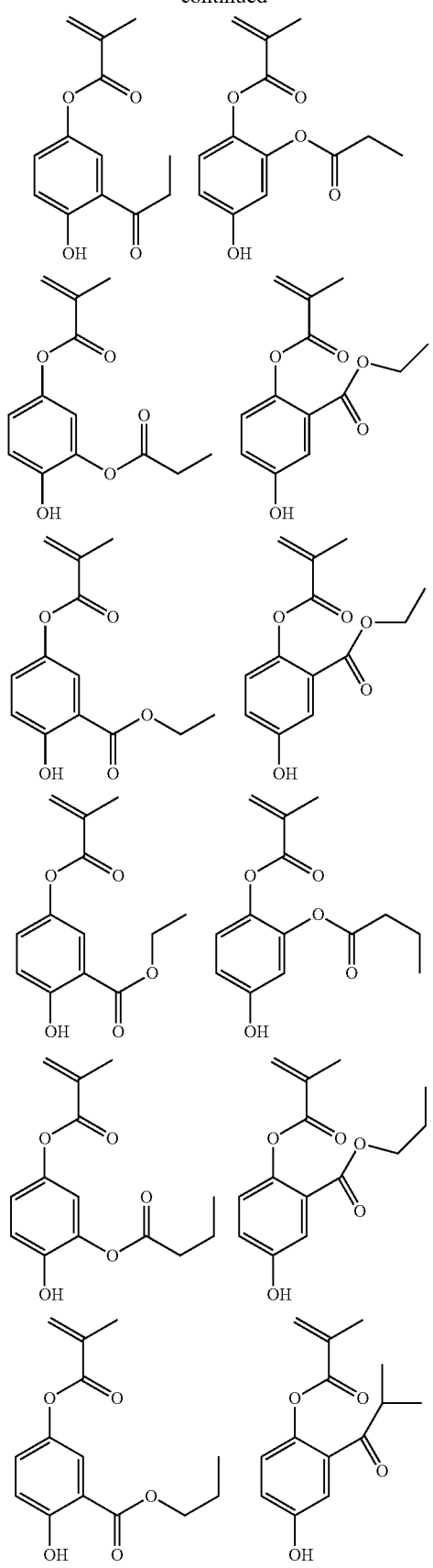
134 -continued
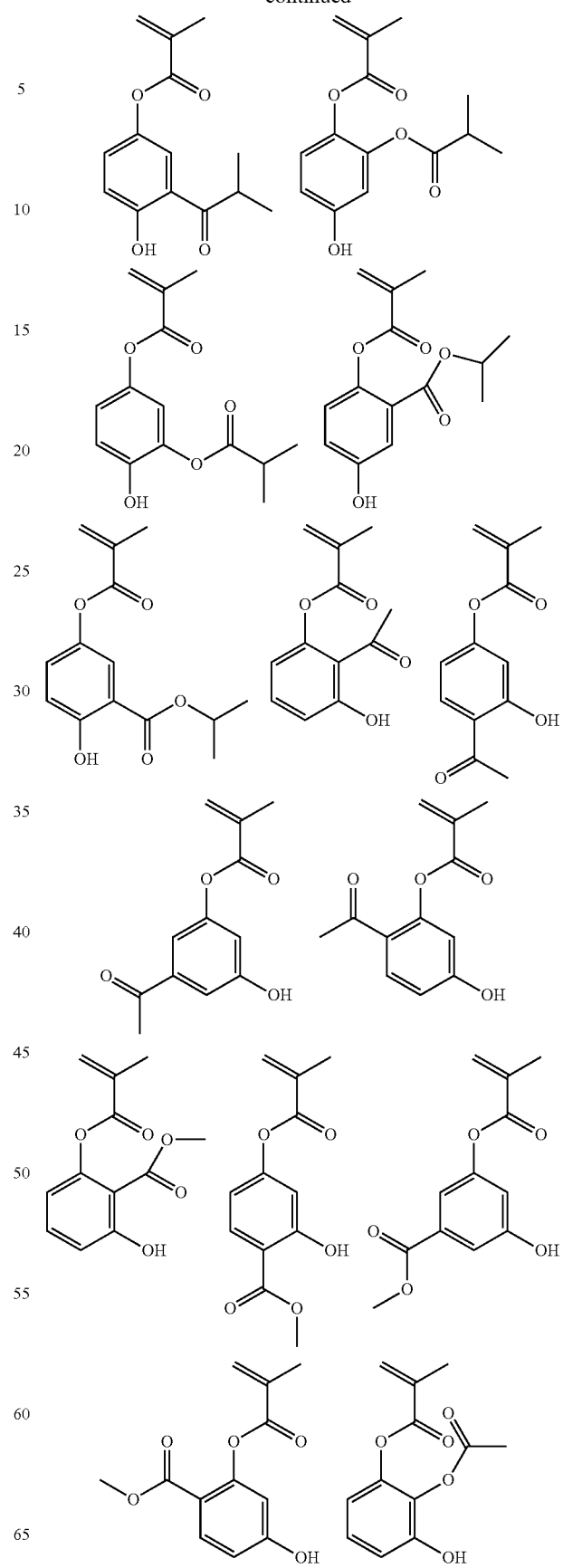

135
-continued
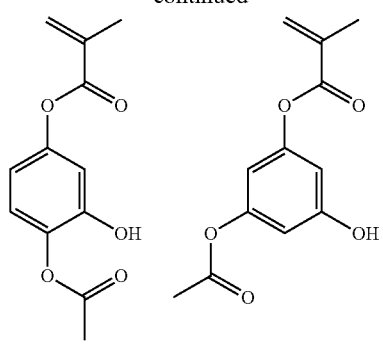
136
-continued
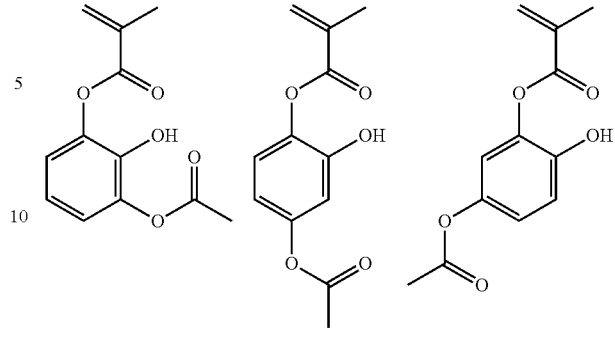
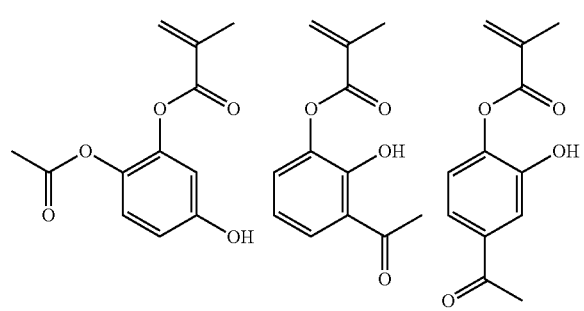
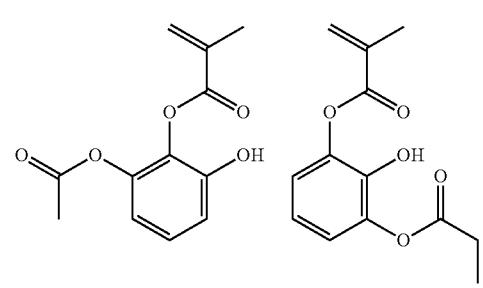
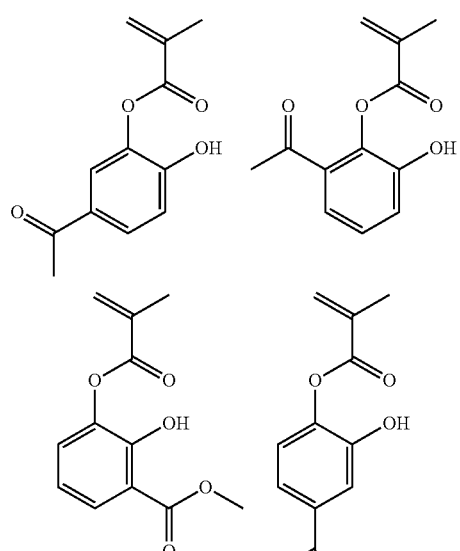
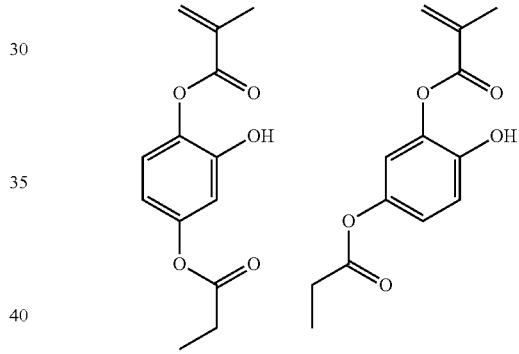
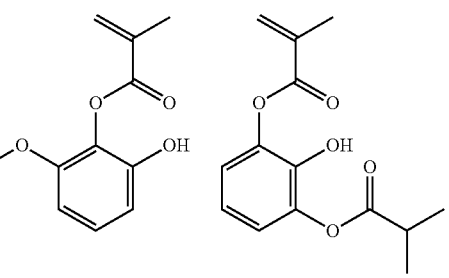
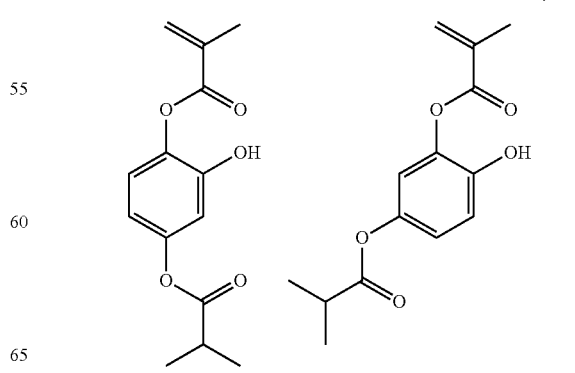

137
-continued
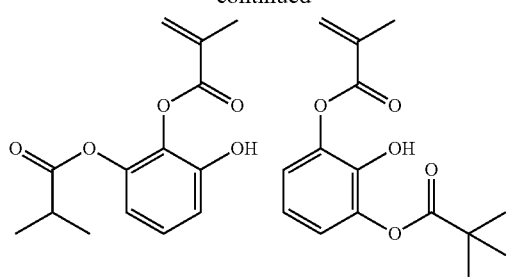
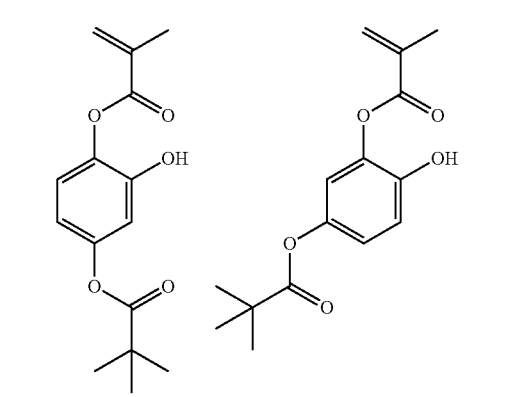
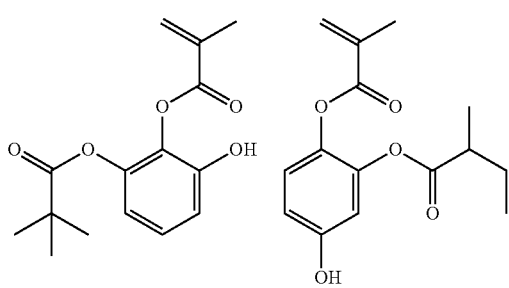
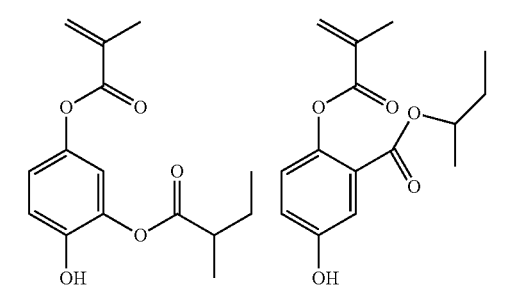
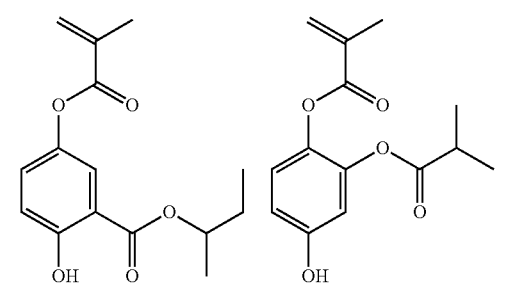
138
-continued
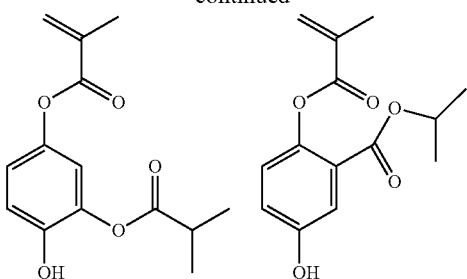
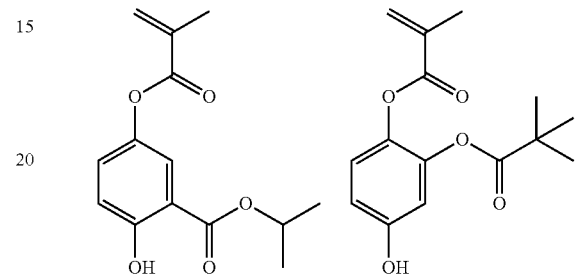
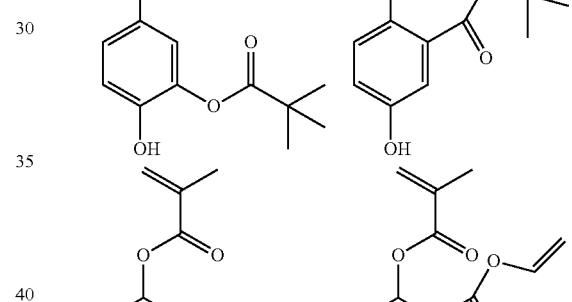
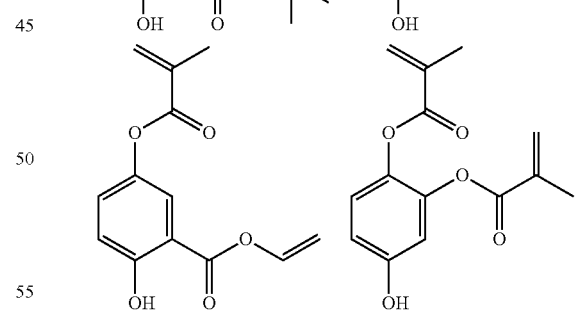
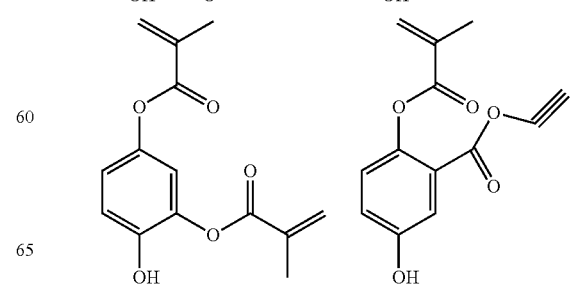

139
-continued
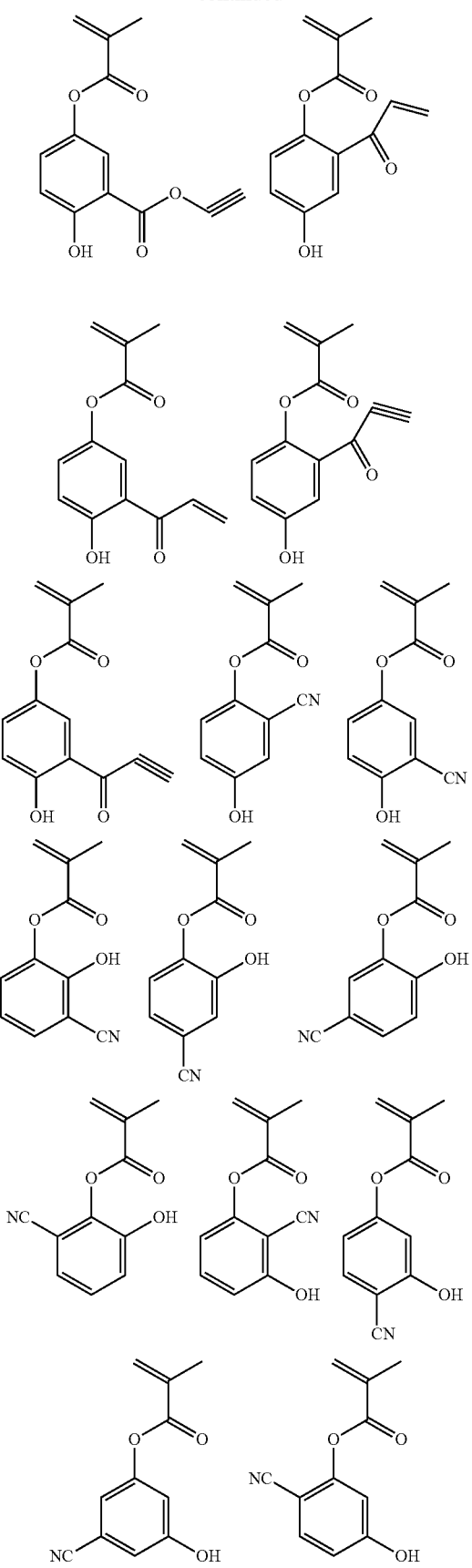
140
-continued
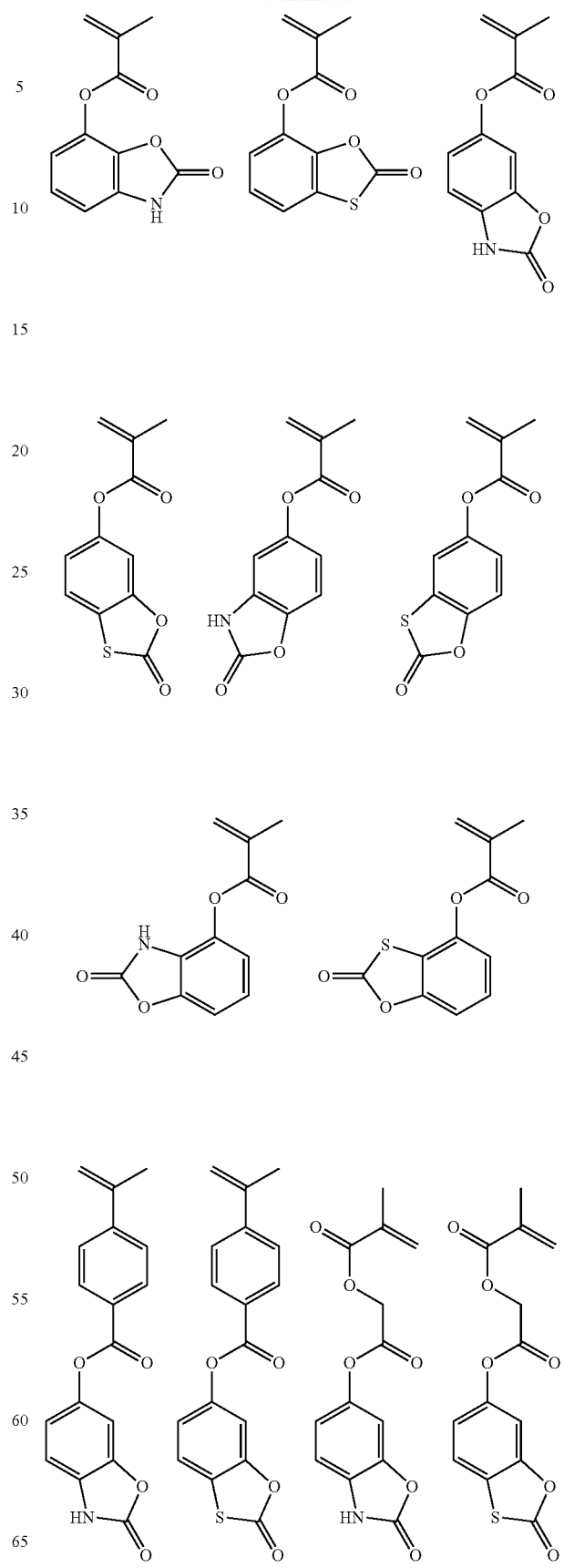

-continued

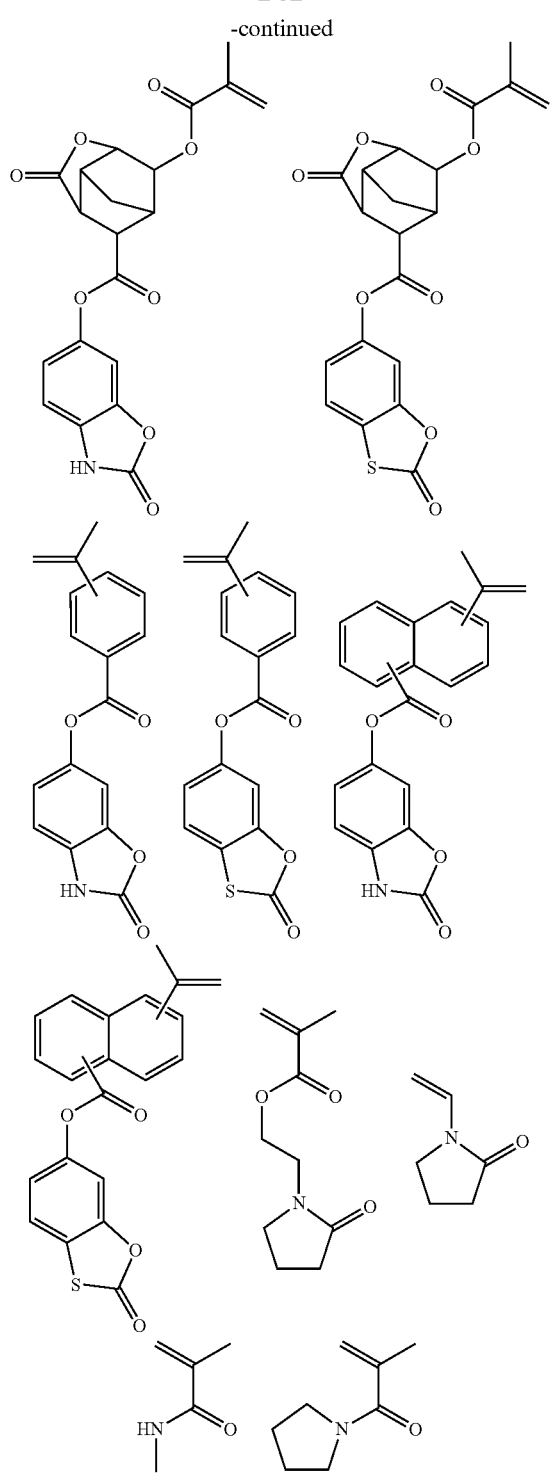

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

The polymer may have further copolymerized therein recurring units (d) of any type selected from indene units (d1), acenaphthylene units (d2), chromone units (d3), coumarin units (d4), and norbornadiene units (d5) as represented by the general formula (4).

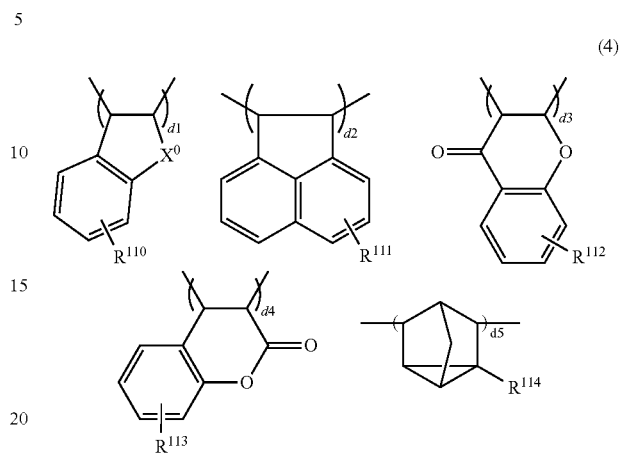

(4)

Herein $R^{110}$ to $R^{114}$ each are hydrogen, $C_1$-$C_{30}$ alkyl, partially or entirely halo-substituted alkyl, hydroxyl, alkoxy, alkanoyl, alkoxycarbonyl, $C_6$-$C_{10}$ aryl, halogen, or 1,1,1,3,3,3-hexafluoro-2-propanol group; $X^0$ is methylene, oxygen or sulfur atom; d1 to d5 are numbers in the range: $0 \le d1 \le 0.5$, $0 \le d2 \le 0.5$, $0 \le d3 \le 0.5$, $0 \le d4 \le 0.5$, $0 \le d5 \le 0.5$, and $0 < d1+d2+d3+d4+d5 \le 0.5$.

Besides the recurring units (a) to (d), additional recurring units (e) may be copolymerized in the polymer. Exemplary are recurring units derived from styrene, vinylnaphthalene, vinylanthracene, vinylpyrene, methyleneindane, and the like.

The polymer defined herein may be synthesized by any desired methods, for example, by dissolving suitable monomers selected from the monomers to form the recurring units (a) to (e) in an organic solvent, adding a radical polymerization initiator thereto, and effecting heat polymerization. Examples of the organic solvent which can be used for polymerization include toluene, benzene, tetrahydrofuran, diethyl ether, dioxane, cyclohexane, cyclopentane, methyl ethyl ketone, and γ-butyrolactone. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis as mentioned above, for thereby converting the polymer product to polyhydroxystyrene or hydroxypolyvinylnaphthalene. For alkaline hydrolysis, a base such as aqueous ammonia or triethylamine may be used. The reaction temperature is −20° C. to 100° C., preferably 0° C. to 60° C., and the reaction time is 0.2 to 100 hours, preferably 0.5 to 20 hours.

In the (co)polymer, recurring units (a) to (c) may be incorporated in the following molar fraction:
$0 \le a1 < 1.0$, $0 \le a2 < 1.0$, $0 < a1+a2 < 1.0$, $0 \le b1 \le 0.5$, $0 \le b2 \le 0.5$, $0 < b1+b2 \le 0.5$, and $0 < c \le 0.9$;

preferably 0≤a1<0.8, 0≤a2<0.8, 0.1≤a1+a2≤0.8, 0<b1≤0.4, 0≤b2≤0.4, 0.01≤b1+b2≤0.5, and 0.1≤c≤0.89;
more preferably 0≤a1<0.7, 0≤a2<0.7, 0.15≤a1+a2<0.7, 0≤b1≤0.35, 0≤b2≤0.35, 0.02≤b1+b2≤0.4, and 0.15≤c≤0.83;
even more preferably 0≤a1<0.7, 0≤a2<0.7, 0.15≤a1+a2≤0.7, 0<b1≤0.3, 0≤b2≤0.3, 0.03≤b1+b2≤0.35, and 0.2≤c≤0.82.

Where recurring units (d) and (e) are incorporated, their molar fraction is: 0≤d1≤0.5, 0≤d2≤0.5, 0<d3<0.5, 0≤d4≤0.5, and 0≤d5≤0.5; preferably 0≤d1≤0.4, 0≤d2≤0.4, 0≤d3≤0.4, 0≤d4≤0.4, and 0≤d5≤0.4; more preferably 0≤d1≤0.3, 0≤d2≤0.3, 0≤d3<0.3, 0<d4≤0.3, and 0≤d5≤0.3; and
0≤e≤0.5, preferably 0≤e≤0.4, more preferably 0≤e≤0.3. It is preferred that a1+a2+b1+b2+c+d1+d2+d3+d4+d5+e=1.

The polymer serving as the base resin in the positive resist composition should have a weight average molecular weight (Mw) in the range of 1,000 to 500,000, and preferably 2,000 to 30,000, as measured by gel permeation chromatography (GPC) versus polystyrene standards using tetrahydrofuran as a solvent. With too low a Mw, the resist composition becomes less heat resistant. A polymer with too high a Mw loses alkaline solubility and gives rise to a footing phenomenon after pattern formation.

If a multi-component polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable as well as a blend of an inventive polymer and a polymer free of recurring units (a1) and (a2).

The resist composition of the invention is characterized in that an acid generator of onium salt type represented by the following general formula (2) is added to the polymer comprising recurring units of formula (1). The acid generator of onium salt type has either one of cation structures C1, C2 and C3 represented by the general formula (2) and is capable of generating an acid having a molecular weight of at least 540.

(2)

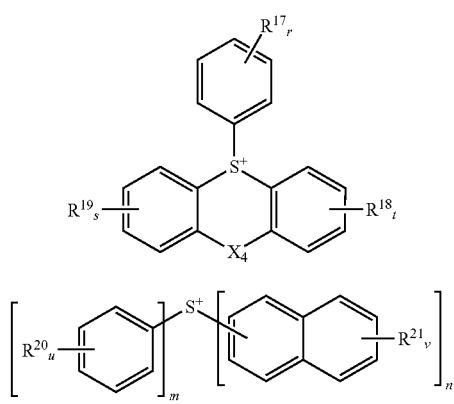

C1

C2

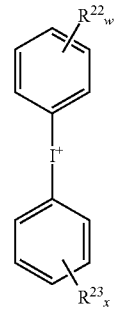

C3

In formula (2), $R^{17}$, $R^{18}$, $R^{19}$, $R^{20}$, $R^{21}$, $R^{22}$ and $R^{23}$ are each independently halogen, trifluoromethyl, cyano, nitro, hydroxyl, $C_1$-$C_{10}$ alkyl, acyl, alkoxy, or alkoxycarbonyl; $X_4$ is a single bond, or a linking group selected from among methylene, ethylene, —O—, —S—, —$NR^{24}$—, —C(=O)—, and —S(=$O_2$)—; $R^{24}$ is hydrogen or $C_1$-$C_4$ alkyl; r, s, t, u, v, w and x are each independently an integer of 0 to 5, m is an integer of 0 to 2, and n is an integer of 1 to 3.

In a preferred embodiment, the acid generator capable of generating an acid having a molecular weight of at least 540 is selected from PAG1, PAG2 and PAG3 represented by the general formula (3).

(3)

PAG 1

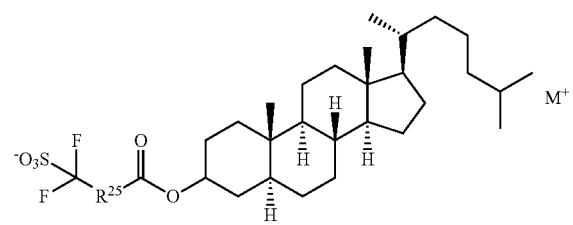

PAG 2

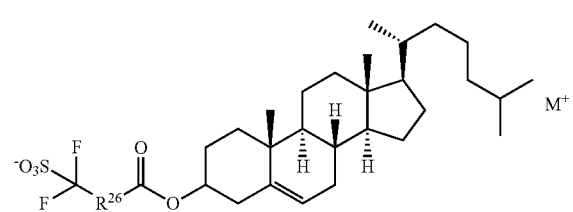

PAG 3

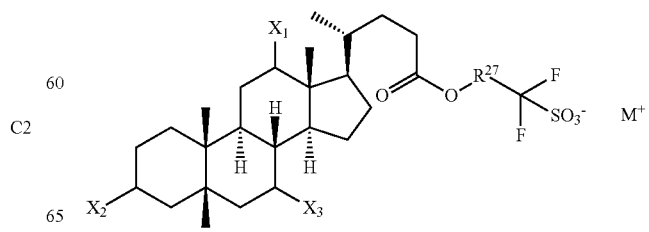

Herein $R^{25}$, $R^{26}$ and $R^{27}$ each are a straight, branched or cyclic $C_1$-$C_{12}$ alkylene group which may contain an ether moiety, ester moiety or fluorine, $X_1$, $X_2$ and $X_3$ each are hydroxyl, alkoxy, acyloxy or carbonyl, and $M^+$ is either one of cations C1, C2 and C3 represented by the general formula (2).

Illustrative, non-limiting examples of the acid generators PAG1, PAG2 and PAG3 are given below.

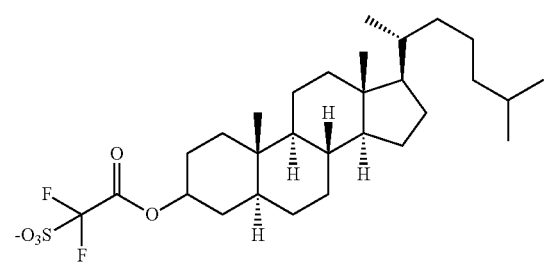
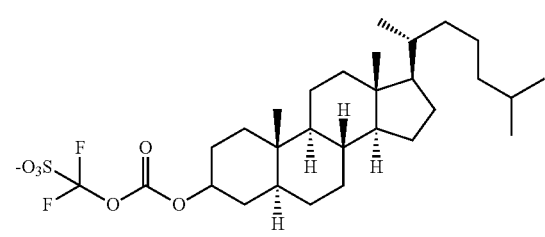
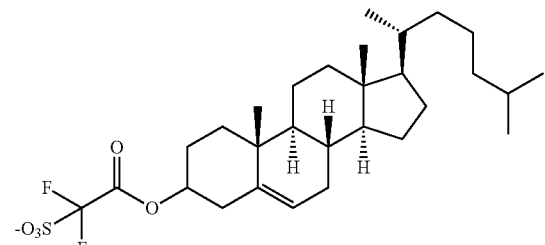
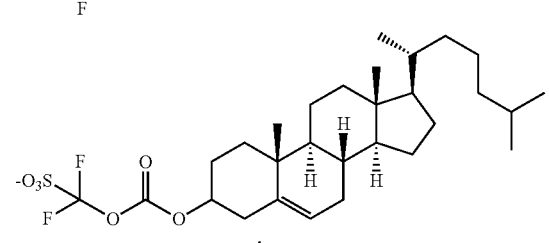
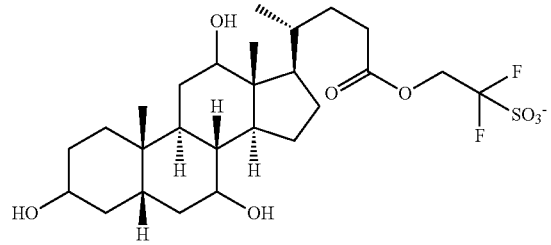
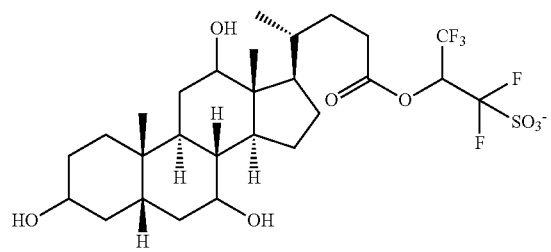
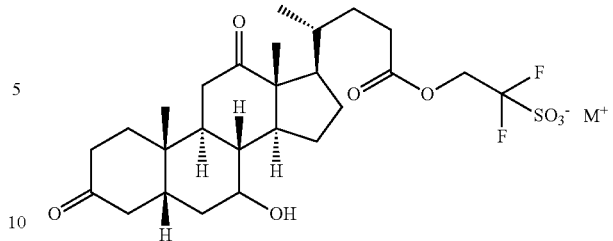

-continued

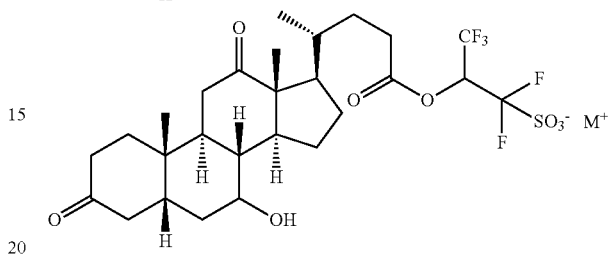
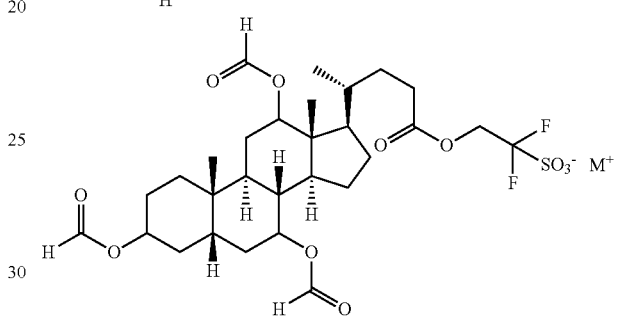
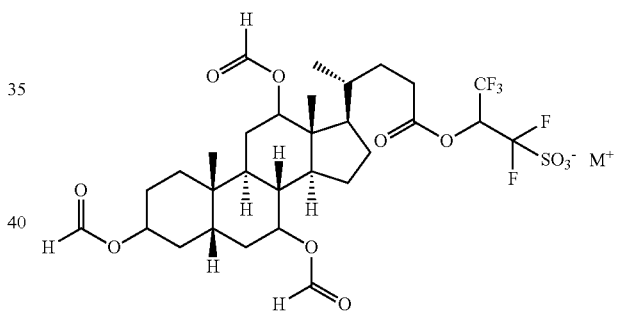
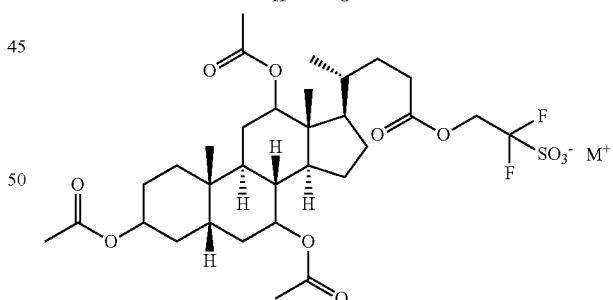
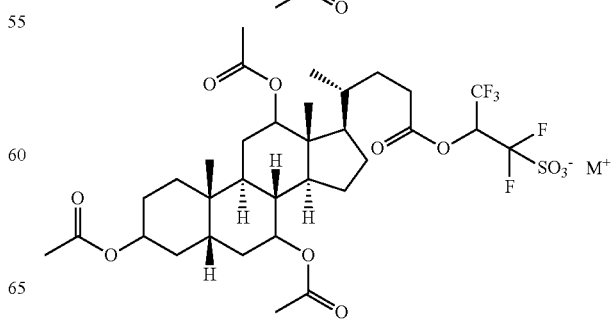

147
-continued
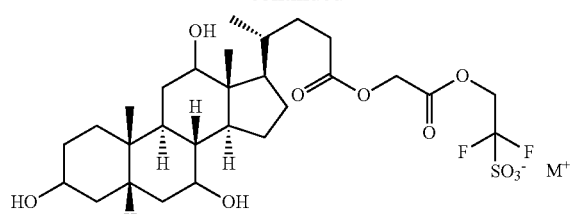
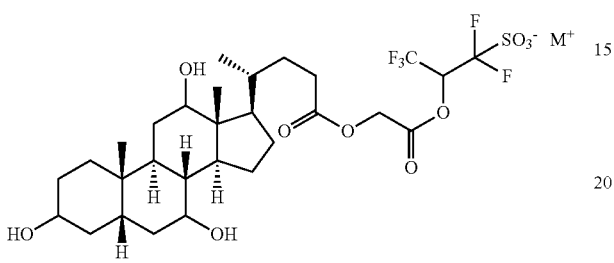
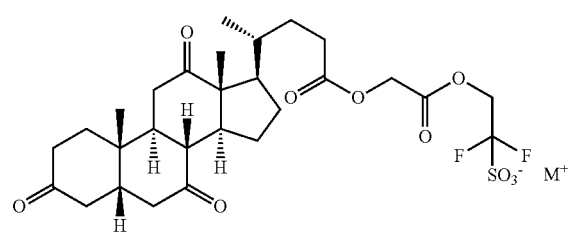
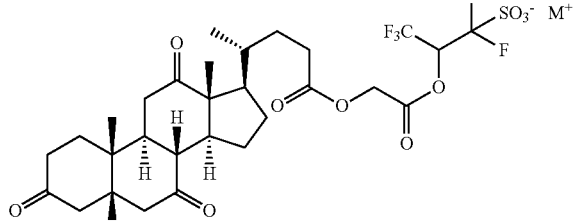
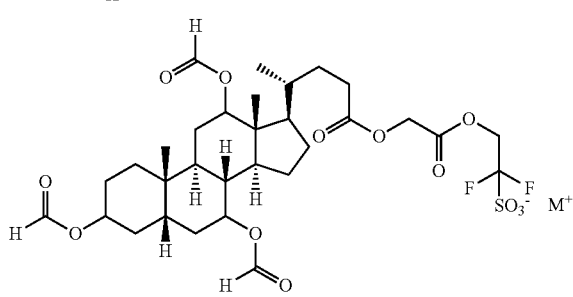
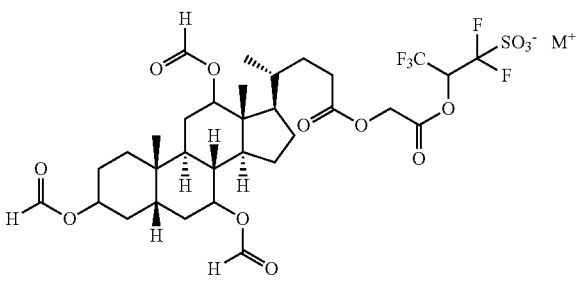
148
-continued
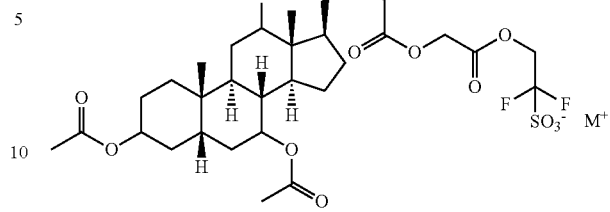
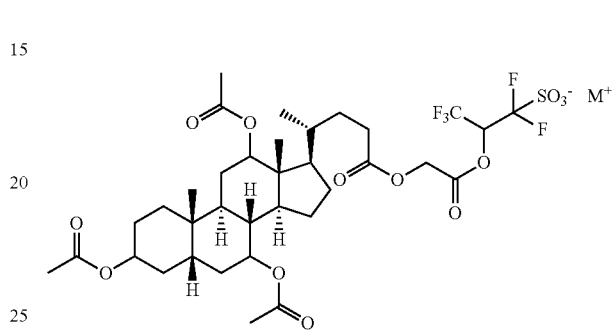
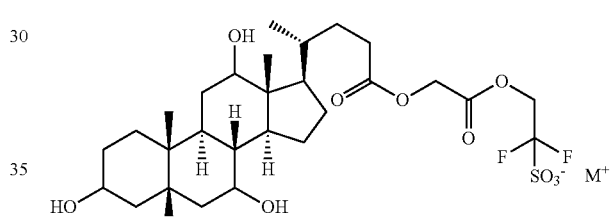
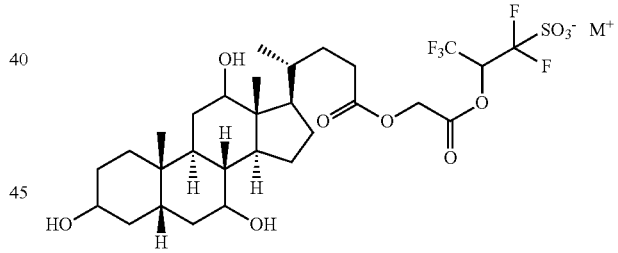
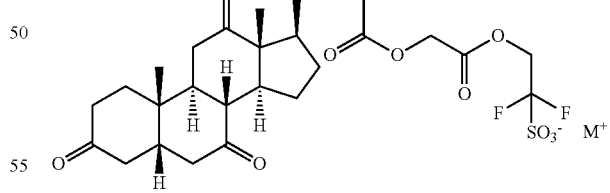
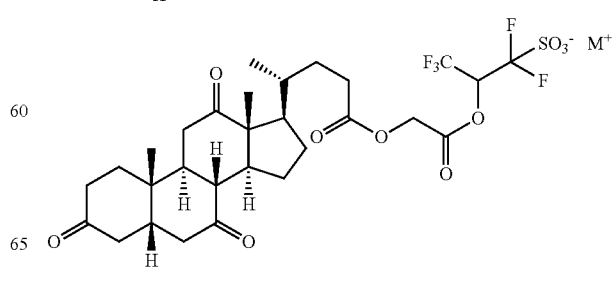

149
-continued
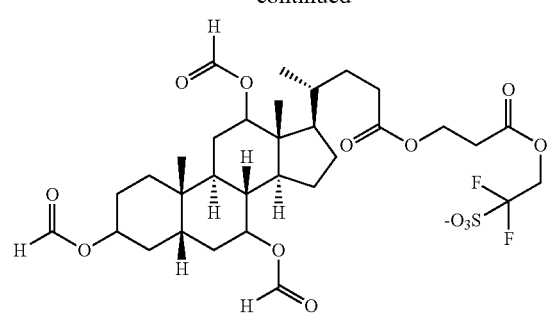
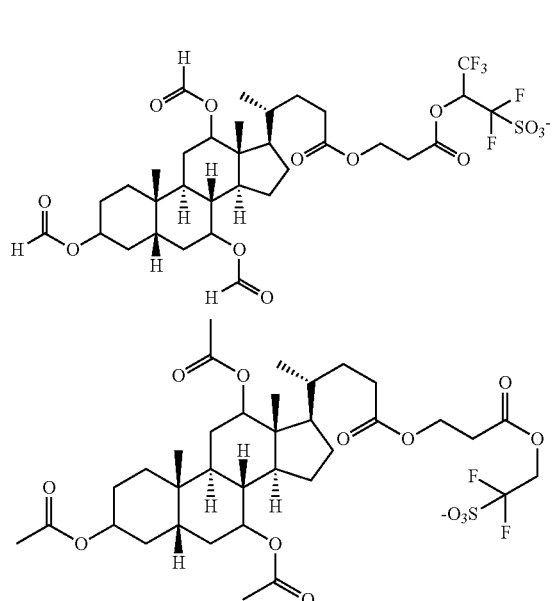
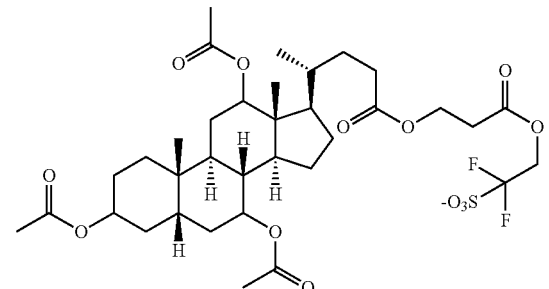
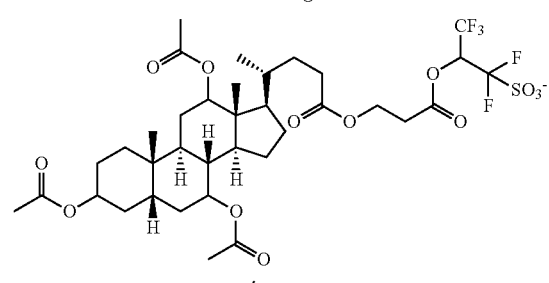
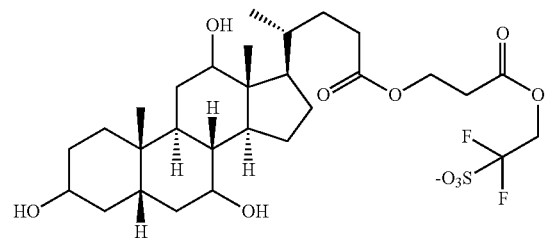
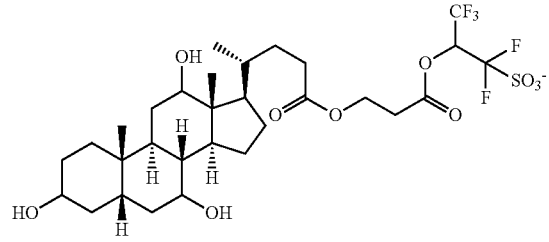
150
-continued
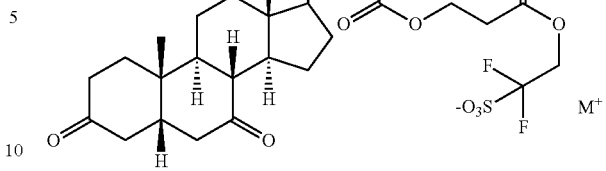
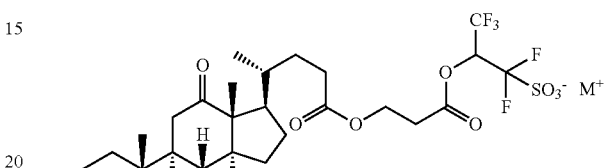
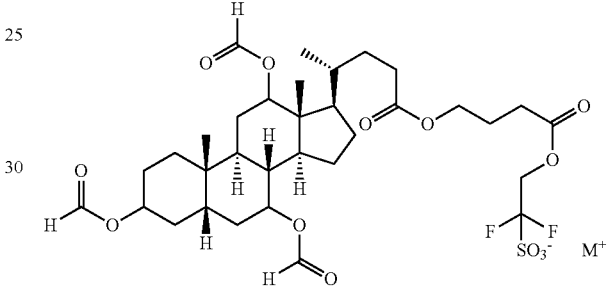
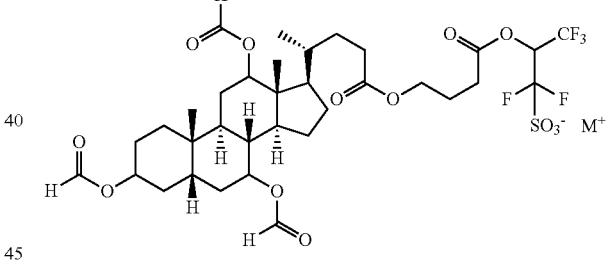
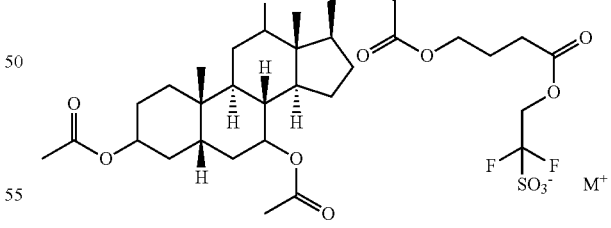
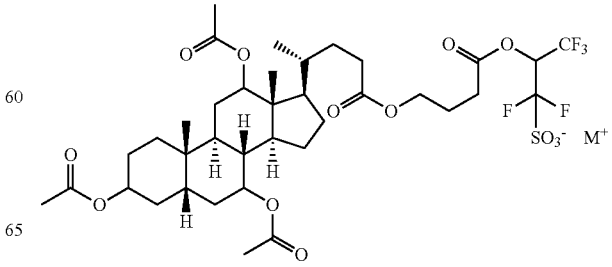

151
-continued
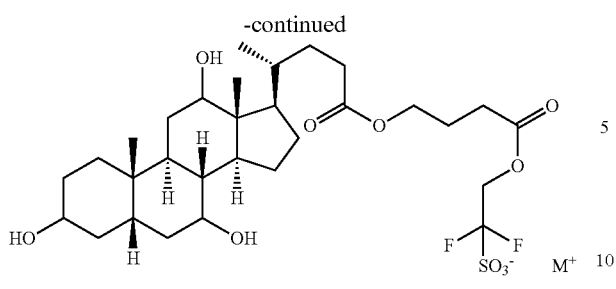
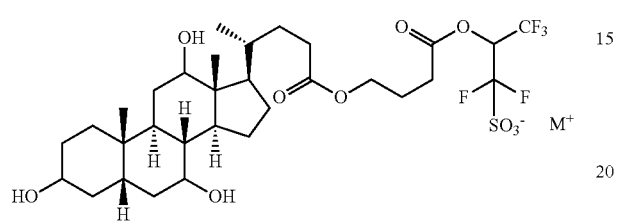
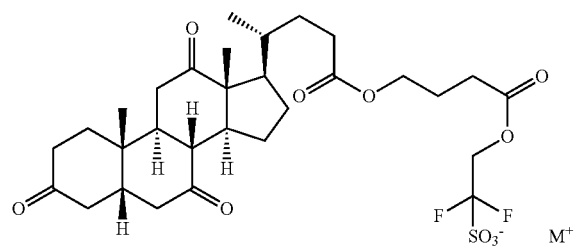
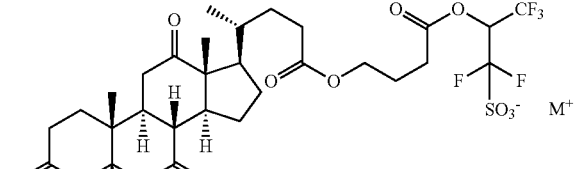
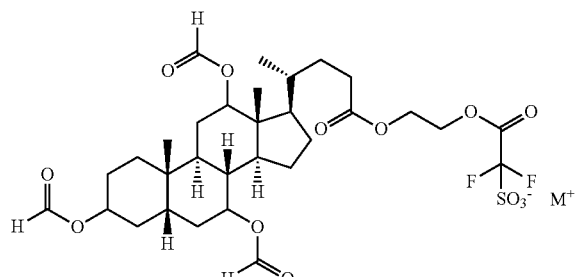
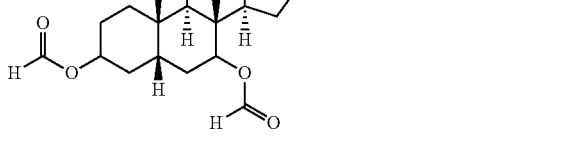
152
-continued
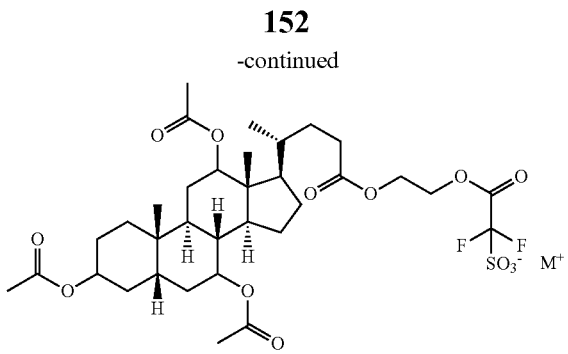
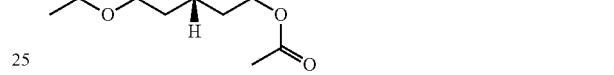
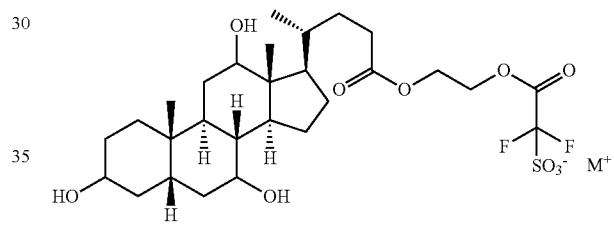
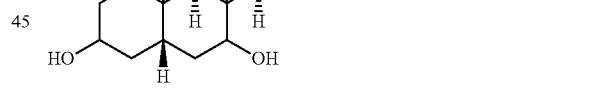
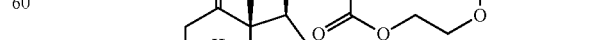

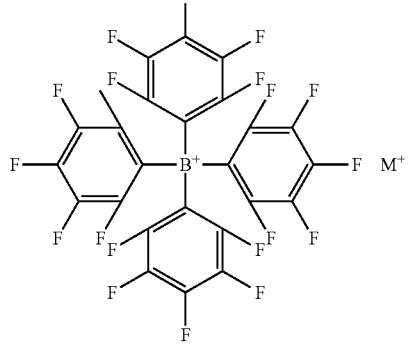
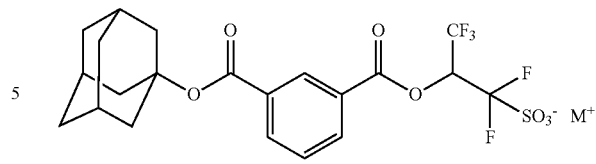
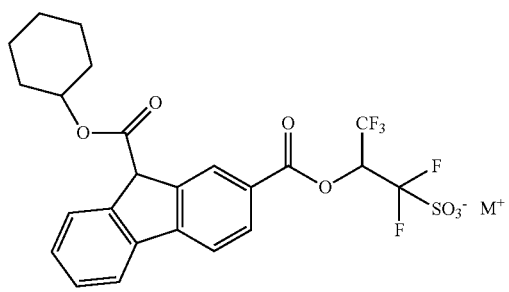
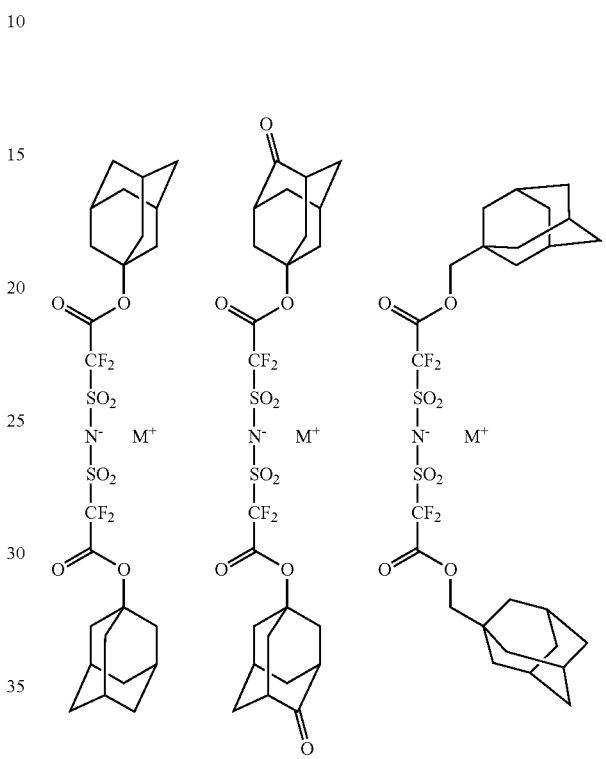
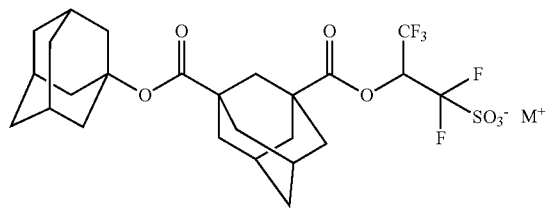
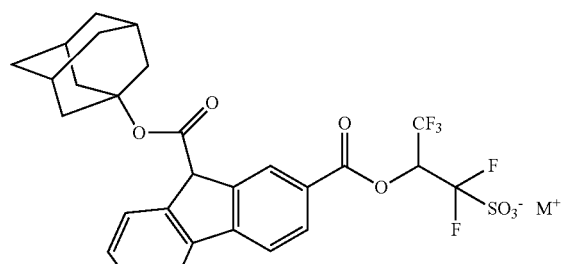
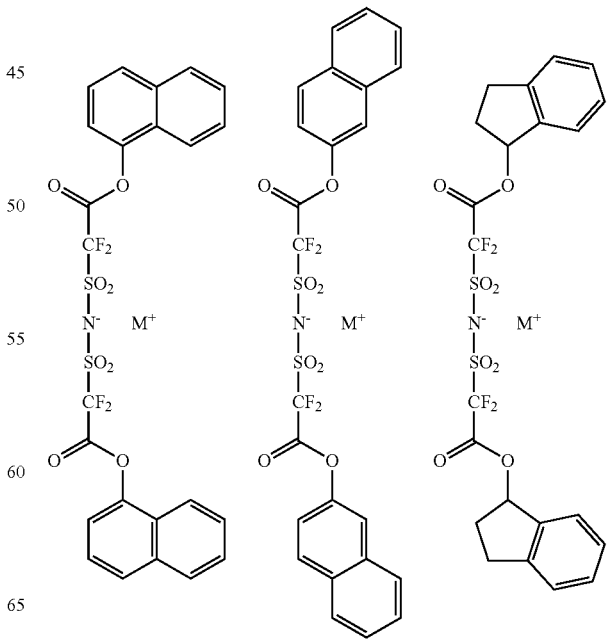
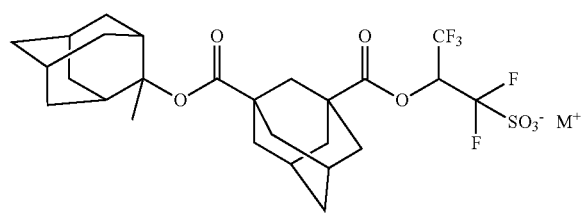

155
-continued
156
-continued
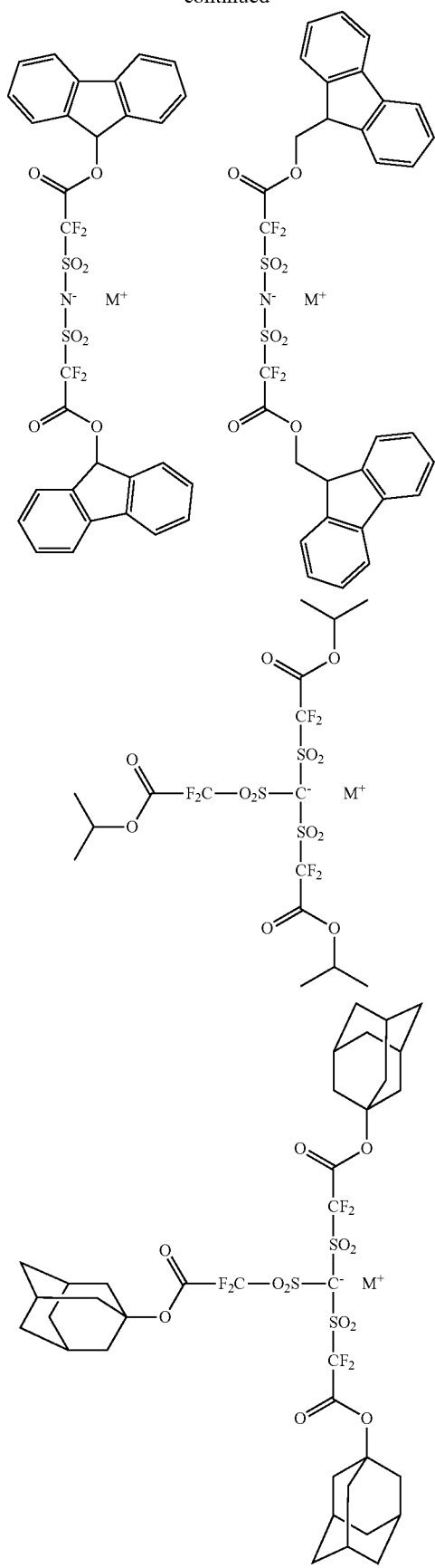
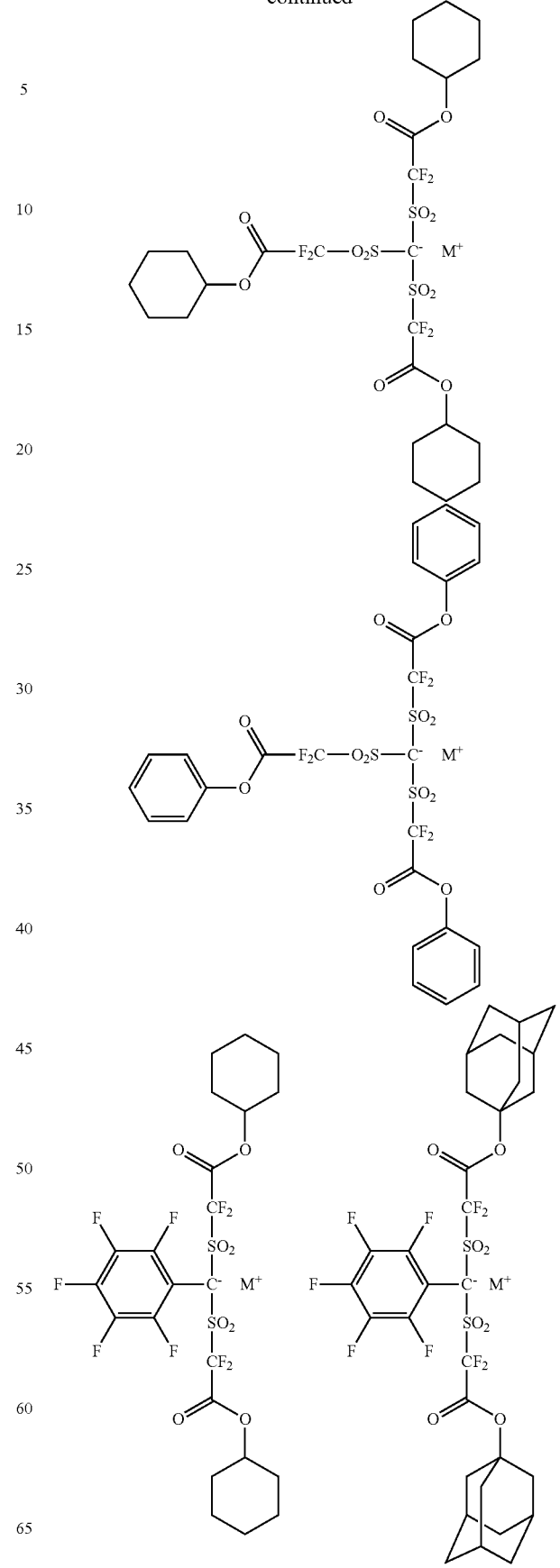

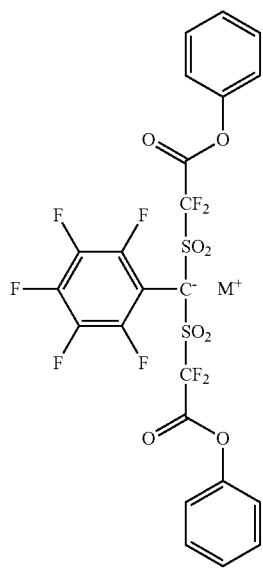
The cation moiety M⁺ is represented by the structure C1, C2 or C3 in formula (2) while illustrative examples thereof are given below.
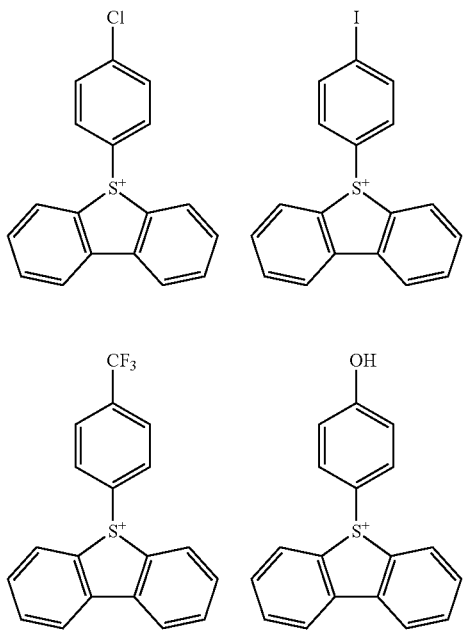
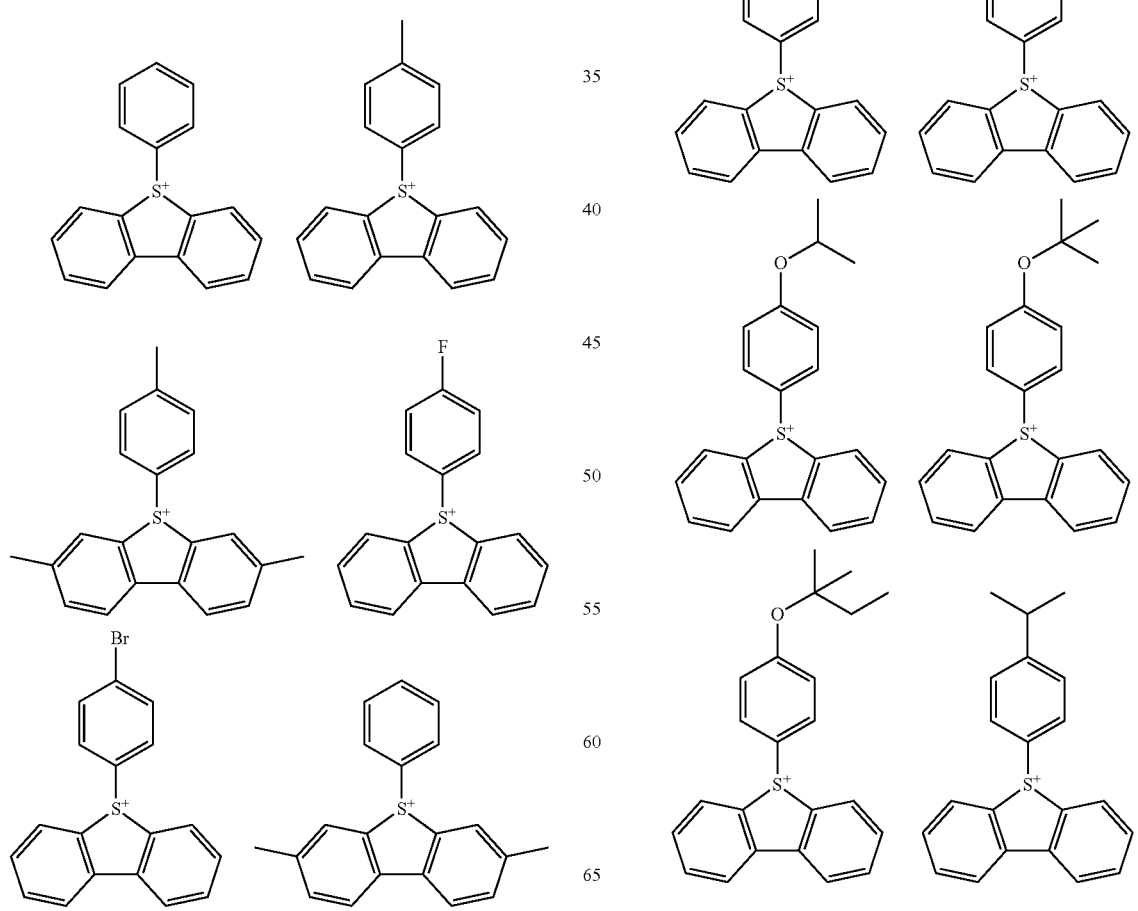

159
-continued
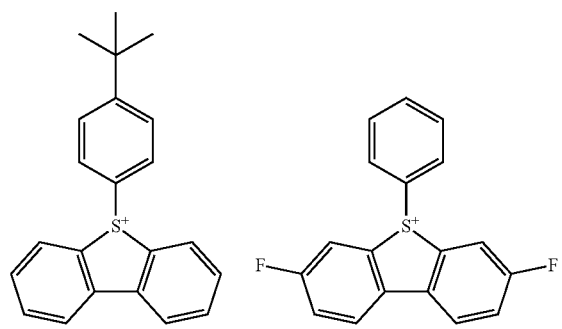
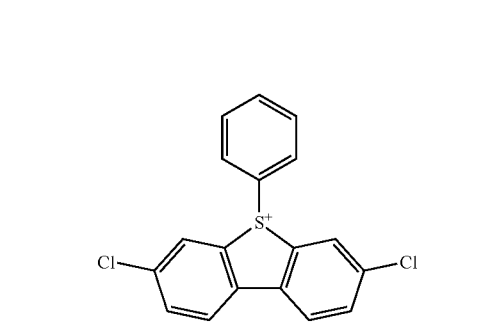
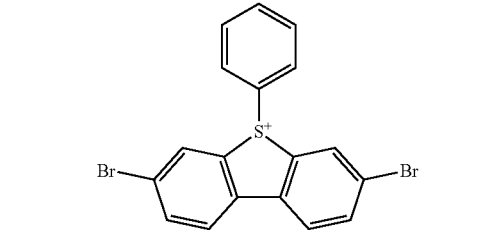
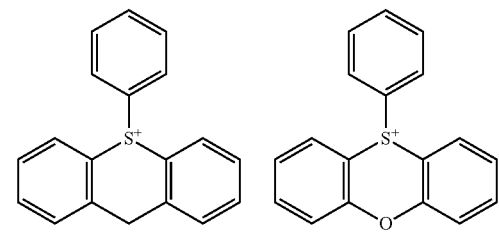
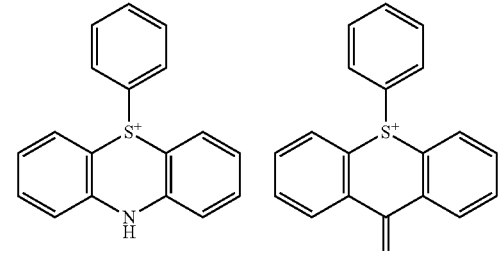
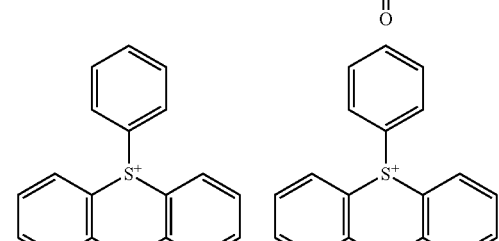
160
-continued
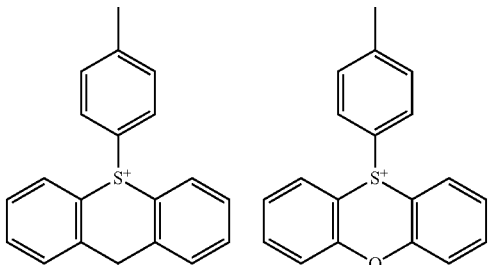
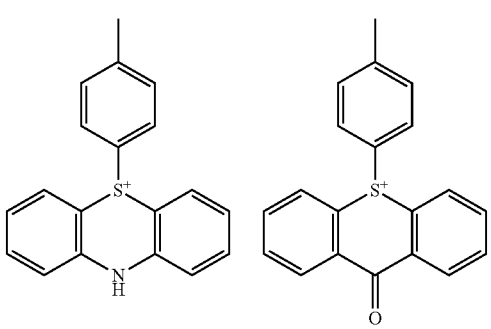
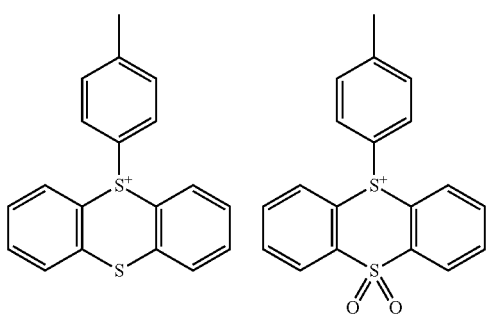
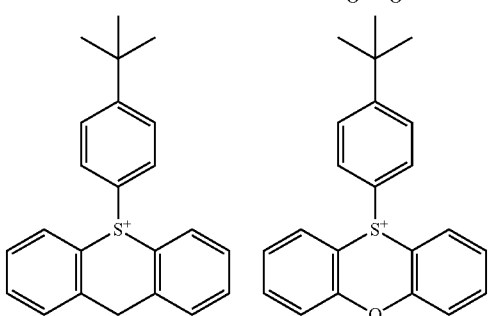
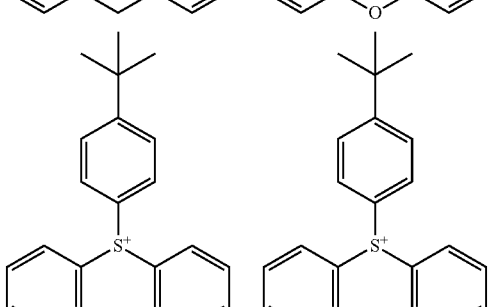

161
-continued
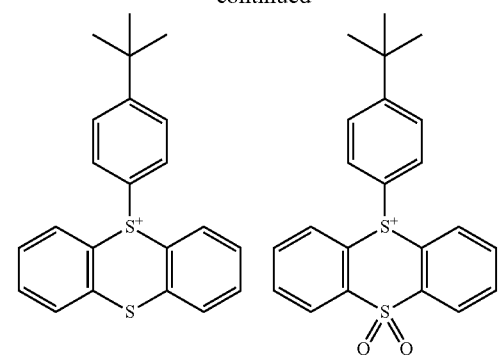
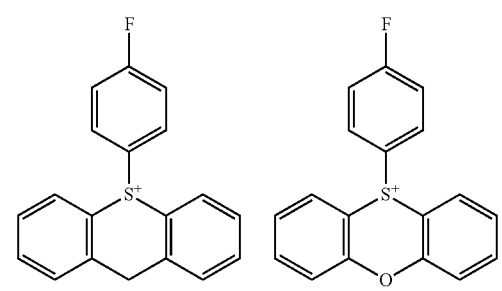
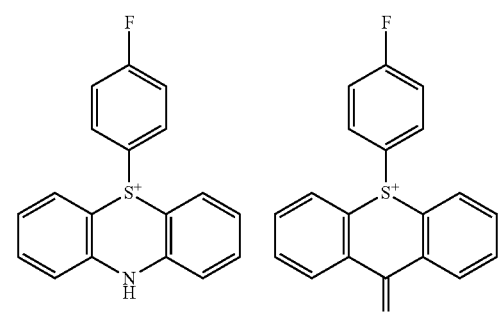
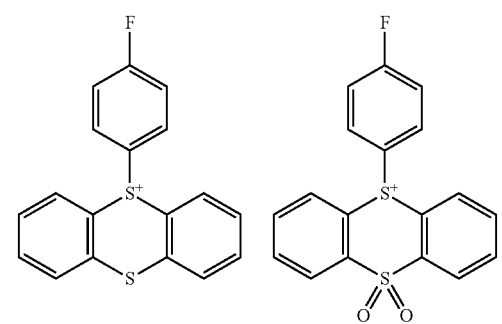
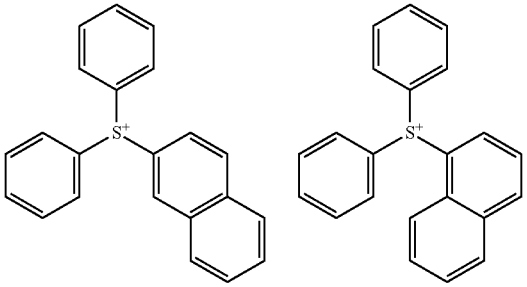
162
-continued
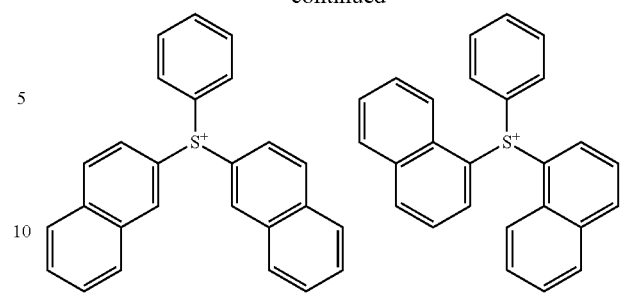
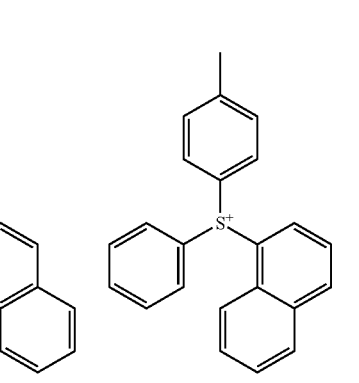
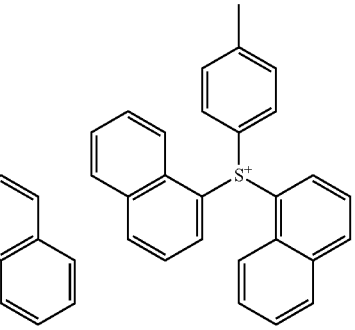
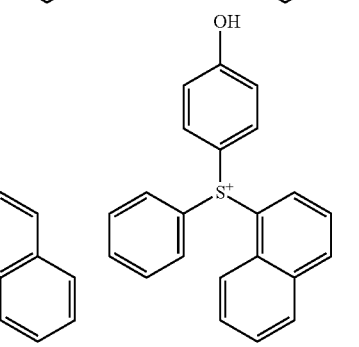
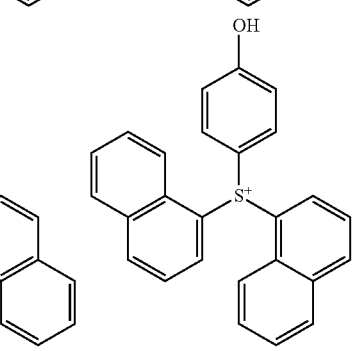

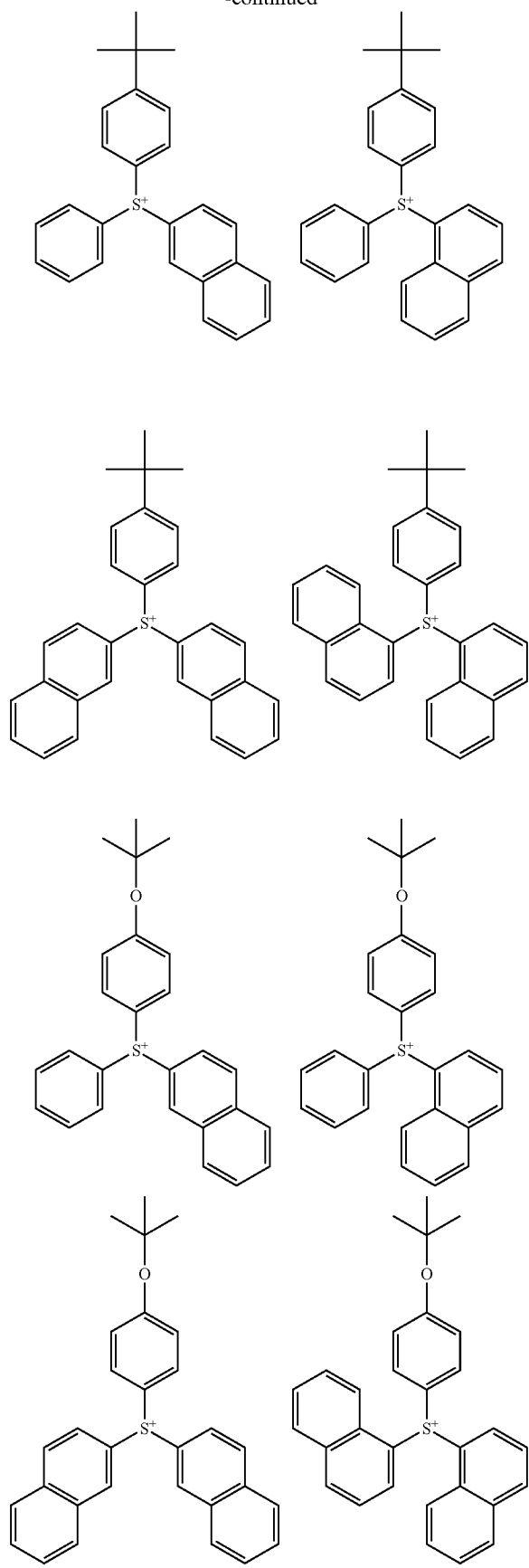

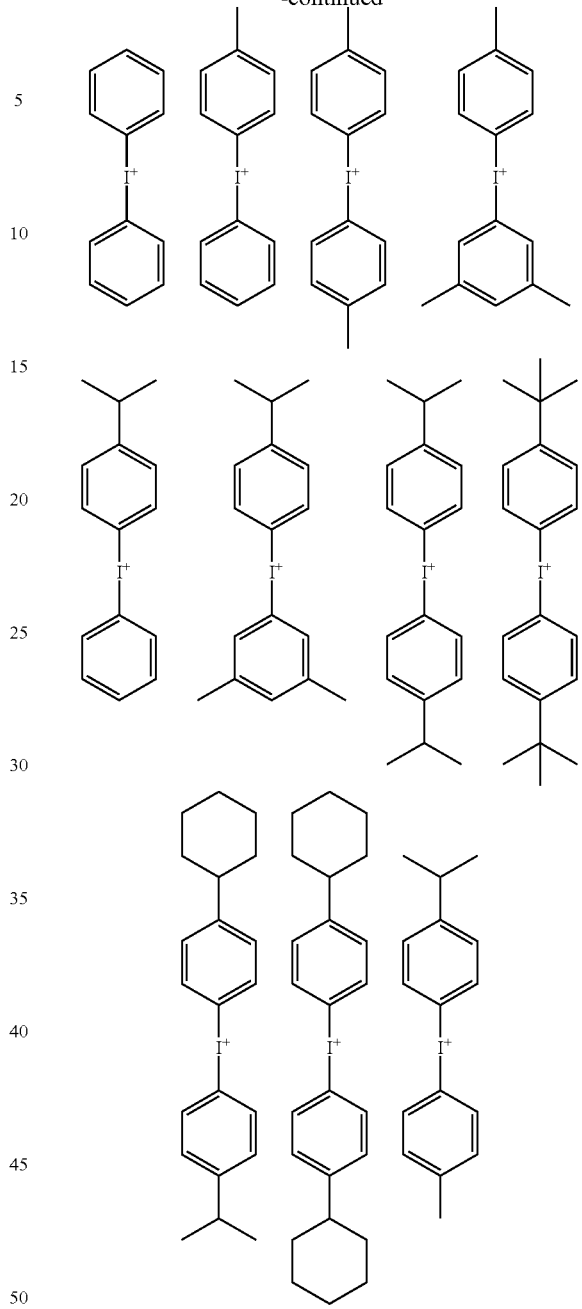

As mentioned above, the resist composition is characterized in that a polymer comprising both acid labile group-substituted recurring units and recurring units having an acid generator bound to the backbone is blended with a sulfonium or iodonium salt having a specific cation structure and capable of generating an acid having a molecular weight of at least 540.

The desired resolution performance is not available when the polymer comprising both acid labile group-substituted recurring units and recurring units having an acid generator bound to the backbone is used alone, or when a polymer comprising acid labile group-substituted recurring units, but not recurring units having an acid generator bound to the backbone is blended with a sulfonium or iodonium salt having a specific cation structure and capable of generating an acid having a molecular weight of at least 540, or when the polymer comprising both acid labile group-substituted recurring units and recurring units having an acid generator bound to the backbone is blended with a sulfonium or iodonium salt having a specific cation structure and capable of generating an acid having a molecular weight of less than 540, or when the polymer comprising both acid labile group-substituted recurring units and recurring units having an acid generator bound to the backbone is blended with a sulfonium or iodonium salt having a cation structure other than formula (2) and capable of generating an acid having a molecular weight of at least 540.

In the resist composition, the polymer comprising both acid labile group-substituted recurring units and recurring units having an acid generator bound to the backbone is blended with the sulfonium or iodonium salt having a specific cation structure and capable of generating an acid having a molecular weight of at least 540 in such a ratio that 5 to 100 parts by weight, preferably 8 to 50 parts by weight of the acid generator is present per 100 parts by weight of the polymer.

To the positive resist composition, an organic solvent, basic compound, dissolution regulator, surfactant, and acetylene alcohol may be added. Addition of a basic compound may be effective in suppressing the diffusion rate of acid in the resist film, achieving a further improvement in resolution. Addition of a surfactant may improve or control the coating characteristics of the resist composition.

Examples of the organic solvent used herein are described in JP-A 2008-111103, paragraphs [0144] to [0145] (U.S. Pat. No. 7,537,880). Exemplary basic compounds are described in JP-A 2008-111103, paragraphs [0146] to [0164]. Exemplary surfactants are described in JP-A 2008-111103, paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. Also useful are quenchers of polymer type as described in JP-A 2008-239918. The polymeric quencher segregates at the resist surface after coating and thus enhances the rectangularity of resist pattern. When a protective film is applied, the polymeric quencher is also effective for preventing a film thickness loss of resist pattern or rounding of pattern top.

These additives may be added in amounts commonly used in the art. For example, an appropriate amount of the organic solvent used is 500 to 10,000 parts, especially 600 to 8,000 parts. The dissolution regulator may be blended in an amount of 0 to 100 parts, preferably 0 to 80 parts, the basic compound in an amount of 0 to 10 parts, preferably 0 to 8 parts, and the surfactant in an amount of 0 to 5 parts, preferably 0 to 3 parts. All amounts are expressed in parts by weight relative to 100 parts by weight of the base resin.

Process

The positive resist composition, typically chemically amplified positive resist composition comprising the polymer comprising acid labile group units and acid generator units represented by formula (1), the acid generator of formula (2), an organic solvent, and a basic compound is used in the fabrication of various integrated circuits. Pattern formation using the resist composition may be performed by well-known lithography processes. The process generally involves coating, prebake, exposure, PEB, and development. If necessary, any additional steps may be added.

The resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, or MoSi) by a suitable coating technique such as spin coating, roll coating, flow coating, dip coating, spray coating or doctor coating. The coating is prebaked on a hot plate at a temperature of 60 to 150° C. for 10 seconds to 30 minutes, preferably 80 to 120° C. for 30 seconds to 20 minutes. The resulting resist film is generally 0.1 to 2.0 µm thick.

If desired, a protective film may be formed on the resist film. The protective film is preferably formed of an alkaline developer-soluble composition so that both formation of a resist pattern and stripping of the protective film may be achieved during development. The protective film has the functions of restraining outgassing from the resist film, filtering or cutting off out-of-band (OOB) light having a wavelength of 140 to 300 nm emitted by the EUV laser (other than 13.5 nm), and preventing the resist film from assuming T-top profile or from losing its thickness under environmental impacts.

The resist film is then exposed to a desired pattern of high-energy radiation such as UV, deep-UV, EB, x-ray, excimer laser light, γ-ray, synchrotron radiation or EUV (soft x-ray), directly or through a mask. The exposure dose is preferably about 1 to 200 $mJ/cm^2$, more preferably about 10 to 100 $mJ/cm^2$, or 0.1 to 100 $\mu C/cm^2$, more preferably 0.5 to 50 $\mu C/cm^2$. The resist film is further baked (PEB) on a hot plate at 60 to 150° C. for 10 seconds to 30 minutes, preferably 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle or spray techniques. Suitable developers are 0.1 to 10 wt %, preferably 2 to 5 wt % aqueous solutions of tetramethylammonium hydroxide (TMAH), tetraethylammonium hydroxide (TEAH), tetrapropylammonium hydroxide (TPAH) and tetrabutylammonium hydroxide (TBAH). The resist film in the exposed area is dissolved in the developer whereas the resist film in the unexposed area is not dissolved. In this way, the desired positive pattern is formed on the substrate. It is appreciated that the resist composition of the invention is best suited for micro-patterning using such high-energy radiation as EB, EUV (soft x-ray), x-ray, γ-ray and synchrotron radiation among others.

Although TMAH aqueous solution is generally used as the developer, TEAH, TPAH and TBAH having a longer alkyl chain are effective in inhibiting the resist film from being swollen during development and thus preventing pattern collapse. JP 3429592 describes an example using an aqueous TBAH solution for the development of a polymer comprising recurring units having an alicyclic structure such as adamantane methacrylate and recurring units having an acid labile group such as tert-butyl methacrylate, the polymer being water repellent due to the absence of hydrophilic groups.

The TMAH developer is most often used as 2.38 wt % aqueous solution, which corresponds to 0.26N. The TEAH, TPAH, and TBAH aqueous solutions should preferably have an equivalent normality. The concentration of TEAH, TPAH, and TBAH that corresponds to 0.26N is 3.84 wt %, 5.31 wt %, and 6.78 wt %, respectively.

When a pattern with a line size of 32 nm or less is resolved by the EB and EUV lithography, there arises a phenomenon that lines become wavy, lines merge together, and merged lines collapse. It is believed that this phenomenon occurs because lines are swollen in the developer and the thus expanded lines merge together. Since the swollen lines containing liquid developer are as soft as sponge, they readily collapse under the stress of rinsing. For this reason, the developer using a long-chain alkyl developing agent is effective for preventing film swell and hence, pattern collapse.

In another embodiment, a negative pattern can be formed from the resist composition by organic solvent development. The developer used to this end is at least one solvent selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenoate, methyl crotonate, ethyl crotonate, methyl propionate, ethyl propionate, ethyl 3-ethoxypropionate, methyl lactate, ethyl lactate, propyl lactate, butyl lactate, isobutyl lactate, amyl lactate, isoamyl lactate, methyl 2-hydroxyisobutyrate, ethyl 2-hydroxyisobutyrate, methyl benzoate, ethyl benzoate, benzyl acetate, methyl phenylacetate, benzyl formate, phenylethyl formate, methyl 3-phenylpropionate, benzyl propionate, ethyl phenylacetate, and 2-phenylethyl acetate.

At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable alcohols of 3 to 10 carbon atoms include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-sec-butyl ether, di-n-pentyl ether, diisopentyl ether, di-sec-pentyl ether, di-tert-amyl ether, and di-n-hexyl ether. Suitable aromatic solvents include toluene, xylene, ethylbenzene, isopropylbenzene, tert-butylbenzene, and mesitylene. The solvents may be used alone or in admixture.

EXAMPLE

Examples and Comparative Examples are given below for further illustrating the invention, but they should not be construed as limiting the invention thereto. All parts (pbw) are by weight.

Examples and Comparative Examples

EUV Lithography

Positive resist compositions were prepared by dissolving a resist polymer obtained from conventional radical polymerization, an acid generator, a quencher and a surfactant in a solvent in accordance with the recipe shown in Table 1, and filtering through a filter having a pore size of 0.2 μm. The components used herein are identified below.

On a silicon substrate with a diameter of 12 inches, a silicon-containing SOG film (SHB-A940 by Shin-Etsu Chemical Co., Ltd.) was coated to a thickness of 35 nm. The resist composition was coated thereon and prebaked on a hot plate at 105° C. for 60 seconds to form a resist film of 45 nm thick. EUV exposure was performed under conditions: quadrupole illumination, NA 0.3 and σ 0.36/0.93. The resist film was baked (PEB) at the temperature shown in Table 2 for 30 seconds, developed in a 2.38 wt % TMAH aqueous solution for 30 seconds, rinsed with deionized water, and spin dried, yielding a positive pattern. The dose at which a 24-nm line-and-space pattern was formed was reported as sensitivity. Edge roughness (LWR) was observed under SEM. The results are shown in Table 2.

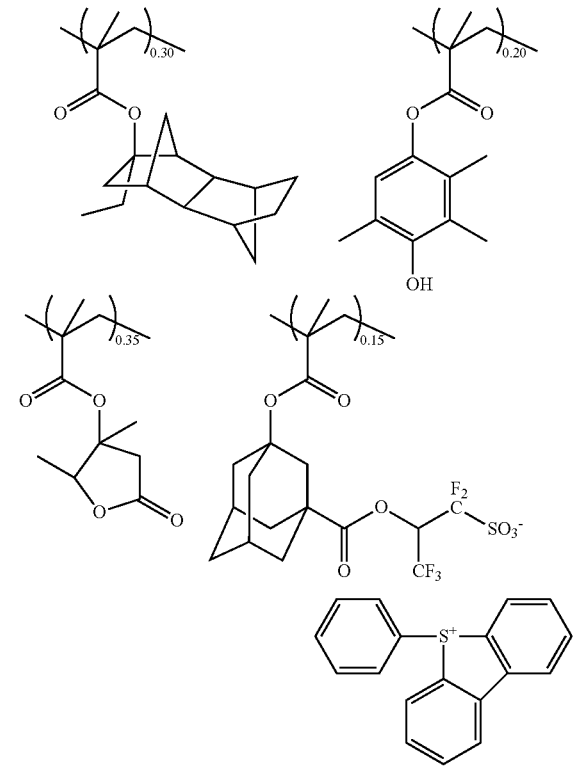

Resist Polymer 1

Mw = 8,700
Mw/Mn = 1.69

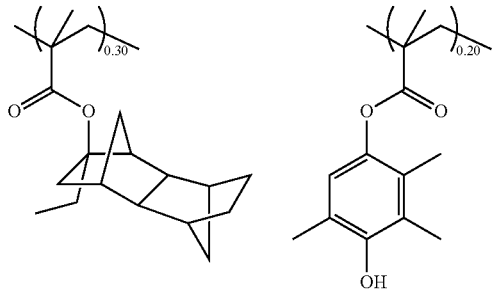

Resist Polymer 2

-continued
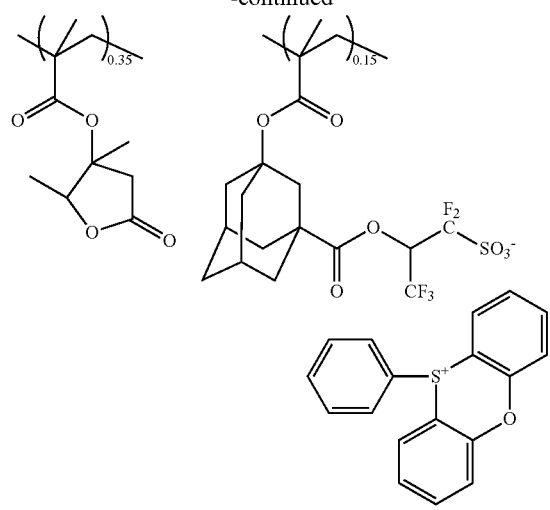
Mw = 8,900
Mw/Mn = 1.72
Resist Polymer 3
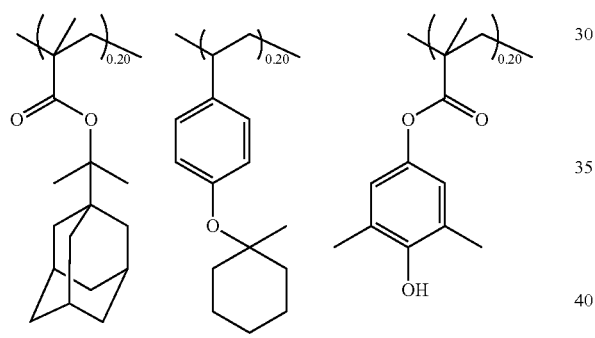
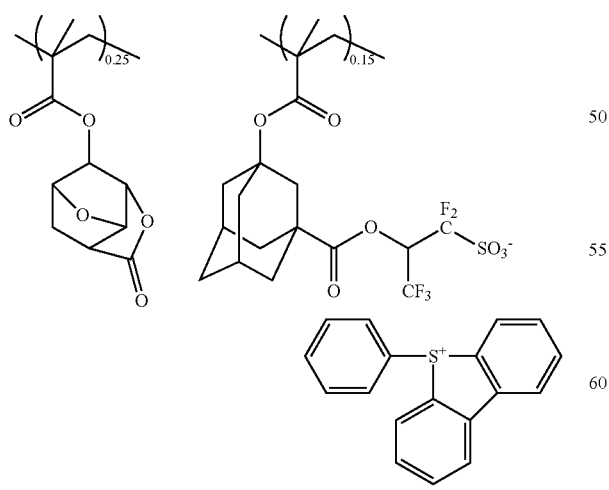
Mw = 9,300
Mw/Mn = 1.69
-continued
Resist Polymer 4
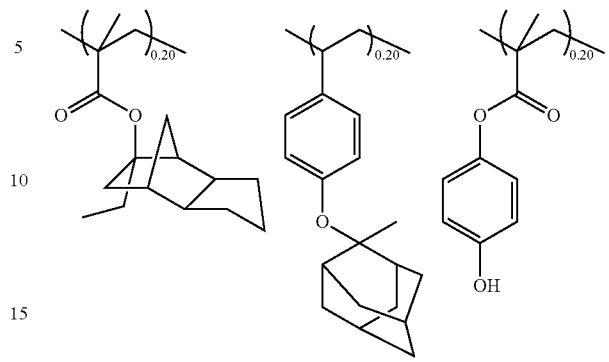
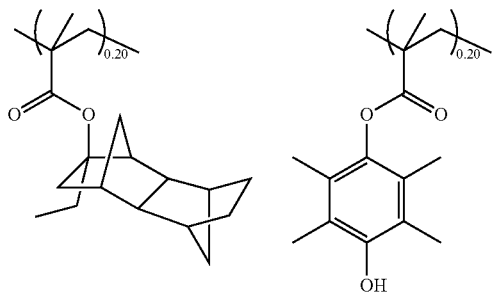
Mw = 8,200
Mw/Mn = 1.79
Resist Polymer 5

-continued
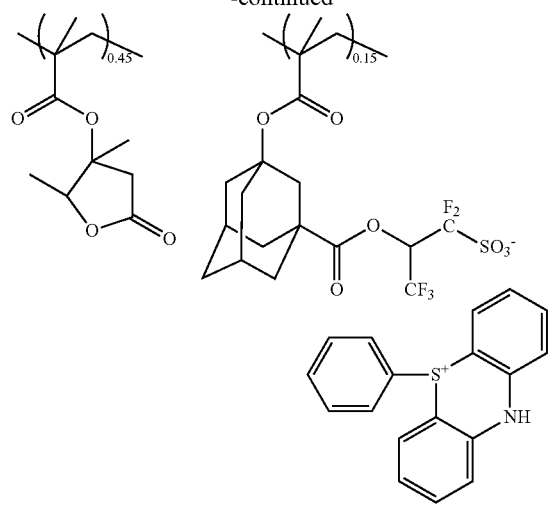
Mw = 8,700
Mw/Mn = 1.69
-continued
Resist Polymer 7
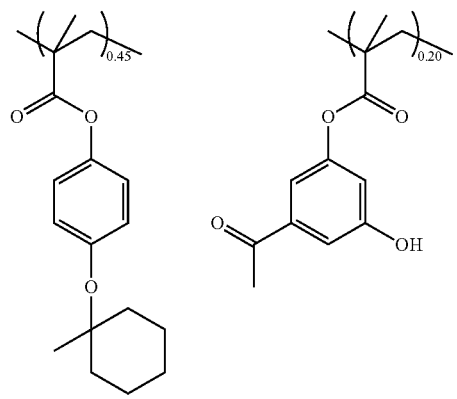
Resist Polymer 6
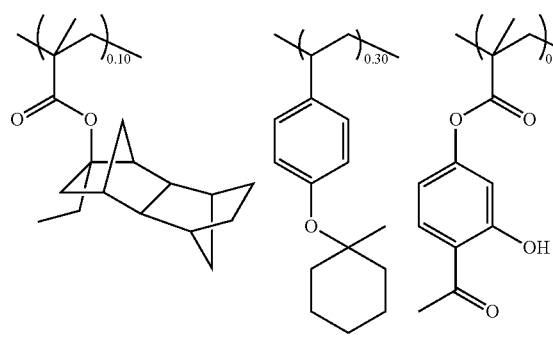
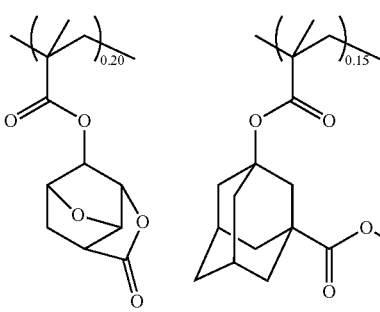
Mw = 9,300
Mw/Mn = 1.67
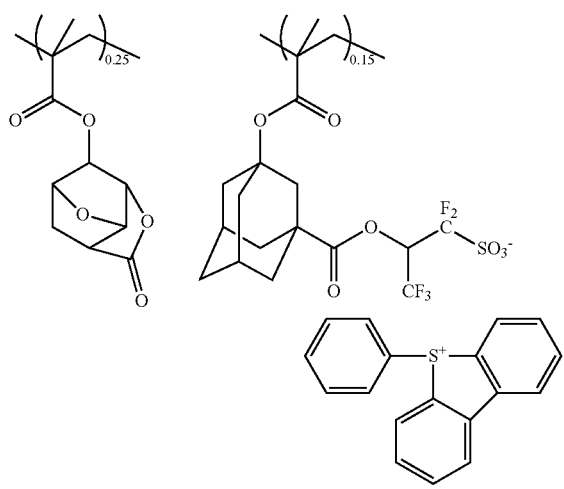
Mw = 9,100
Mw/Mn = 1.61
Comparative Resist Polymer 1
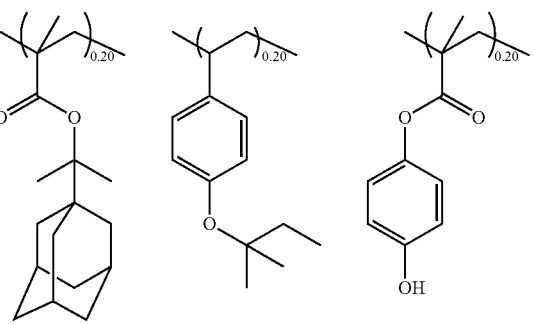

173
-continued
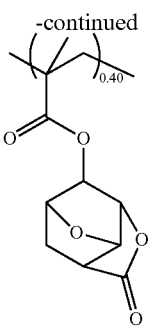
Mw = 8,200
Mw/Mn = 1.79
PAG 11
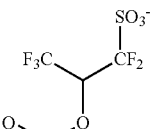
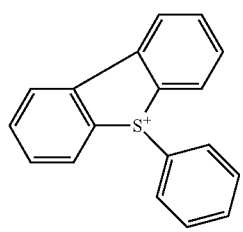
PAG 12
174
-continued
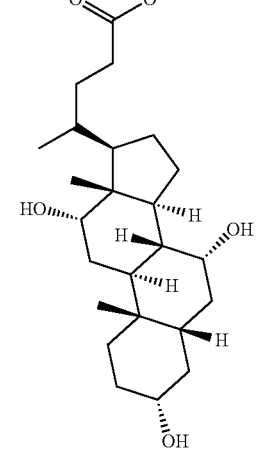
PAG 13
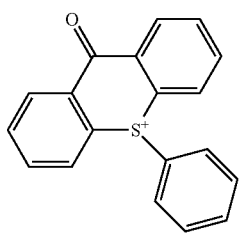
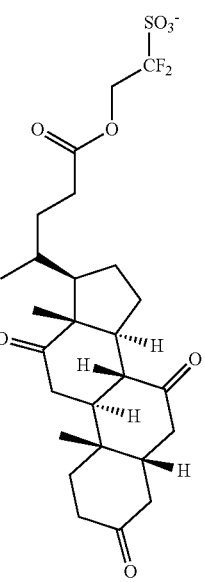
PAG 14
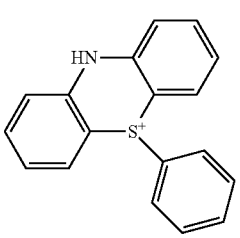

175
-continued
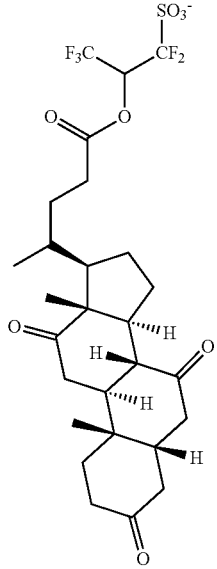
PAG 15
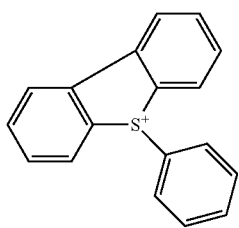
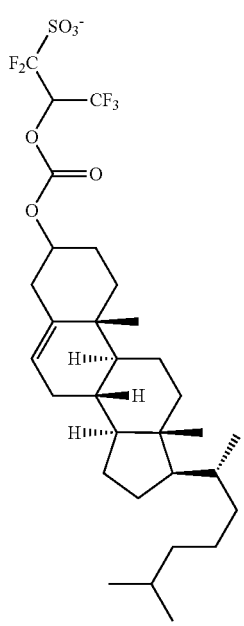
PAG 16
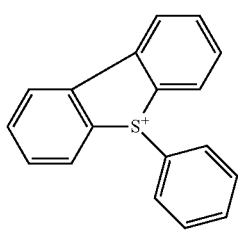
176
-continued
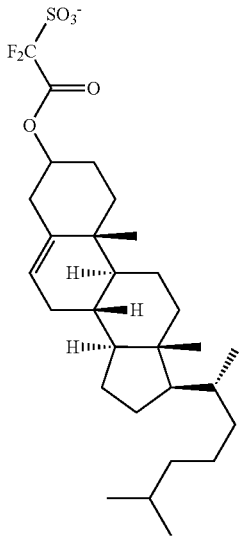
PAG 17
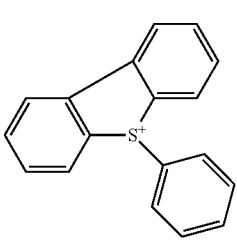
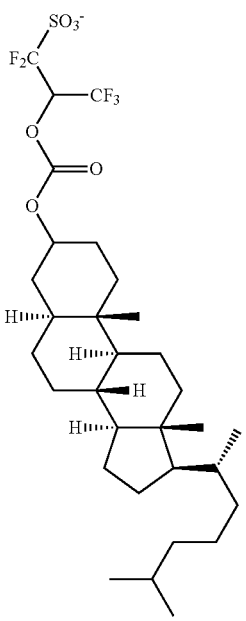
PAG 18
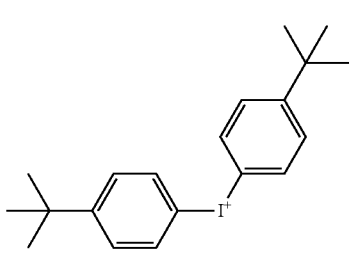

177
-continued
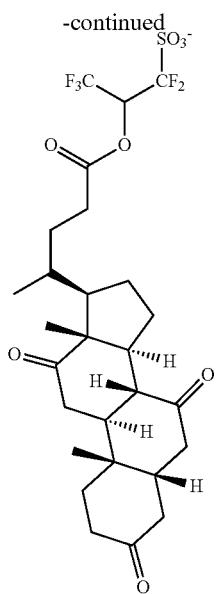
PAG 19
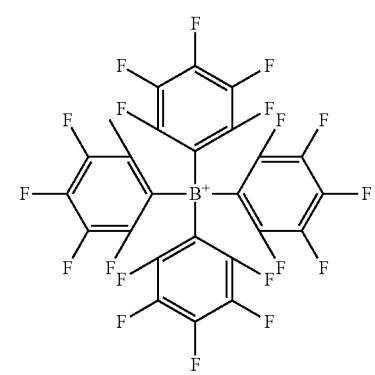
PAG 20
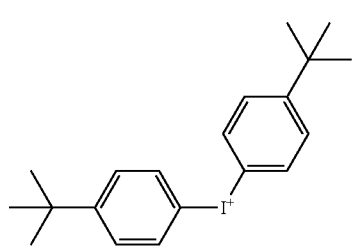
178
-continued
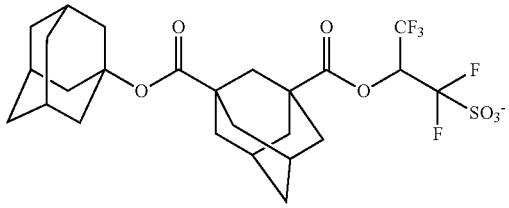
PAG 21
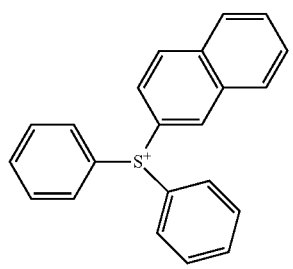
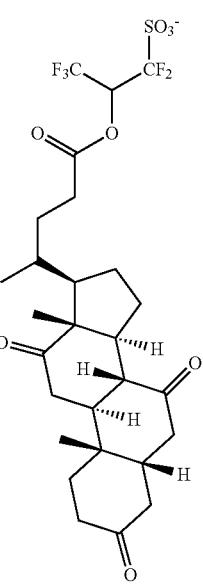
Comparative PAG 1
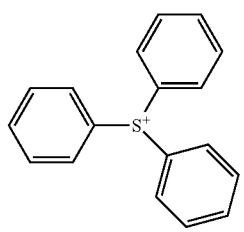

179                                          180
-continued                                   -continued

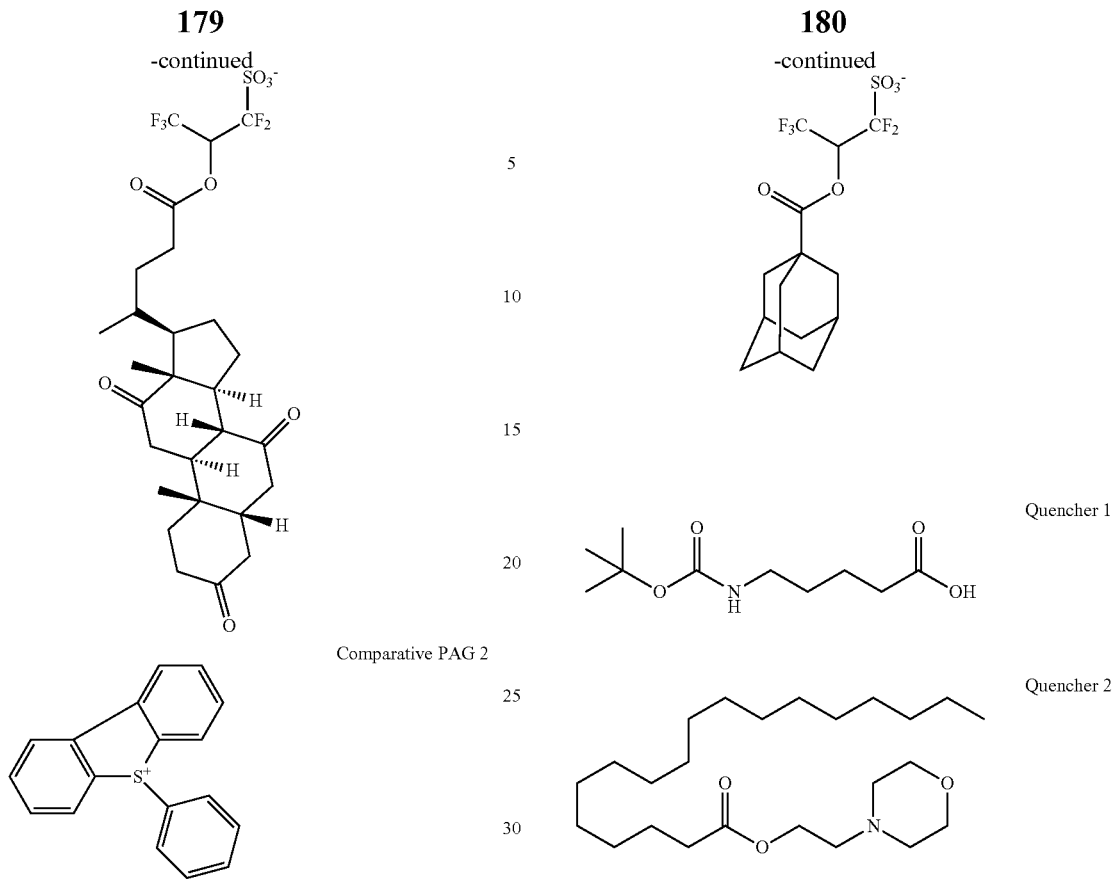

TABLE 1

|  |  | Polymer (pbw) | PAG (pbw) | Quencher (pbw) | Surfactant (pbw) | Solvent (pbw) |
|---|---|---|---|---|---|---|
| Resist | 1 | Resist Polymer 1 (100) | PAG 11 (15) | Quencher 1 (0.6) | FC-4430 (0.001) | PGMEA(2,000) PGME(500) cyclohexanone(3,000) |
|  | 2 | Resist Polymer 2 (100) | PAG 12 (15) | Quencher 1 (0.6) | FC-4430 (0.001) | PGMEA(2,000) PGME(500) cyclohexanone(3,000) |
|  | 3 | Resist Polymer 3 (100) | PAG 13 (15) | Quencher 1 (0.6) | FC-4430 (0.001) | PGMEA(2,000) PGME(500) cyclohexanone(3,000) |
|  | 4 | Resist Polymer 4 (100) | PAG 11 (15) | Quencher 1 (0.6) | FC-4430 (0.001) | PGMEA(2,000) PGME(500) cyclohexanone(3,000) |
|  | 5 | Resist Polymer 5 (100) | PAG 11 (15) | Quencher 1 (0.6) | FC-4430 (0.001) | PGMEA(2,000) PGME(500) cyclohexanone(3,000) |
|  | 6 | Resist Polymer 1 (100) | PAG 14 (15) | Quencher 1 (0.6) | FC-4430 (0.001) | PGMEA(2,000) PGME(500) cyclohexanone(3,000) |
|  | 7 | Resist Polymer 1 (100) | PAG 15 (15) | Quencher 1 (0.6) | FC-4430 (0.001) | PGMEA(2,000) PGME(500) cyclohexanone(3,000) |
|  | 8 | Resist Polymer 1 (100) | PAG 16 (14) | Quencher 1 (0.6) | FC-4430 (0.001) | PGMEA(2,000) PGME(500) cyclohexanone(3,000) |
|  | 9 | Resist Polymer 1 (100) | PAG 17 (18) | Quencher 2 (1.0) | FC-4430 (0.001) | PGMEA(2,000) PGME(500) cyclohexanone(3,000) |
|  | 10 | Resist Polymer 1 (100) | PAG 18 (20) | Quencher 1 (0.6) | FC-4430 (0.001) | PGMEA(2,000) PGME(500) cyclohexanone(3,000) |
|  | 11 | Resist Polymer 1 (100) | PAG 19 (17) | Quencher 1 (0.6) | FC-4430 (0.001) | PGMEA(2,000) PGME(500) cyclohexanone(3,000) |

TABLE 1-continued

| | | Polymer (pbw) | PAG (pbw) | Quencher (pbw) | Surfactant (pbw) | Solvent (pbw) |
|---|---|---|---|---|---|---|
| | 12 | Resist Polymer 1 (100) | PAG 20 (10) | Quencher 1 (0.6) | FC-4430 (0.001) | PGMEA(2,000) PGME(500) cyclohexanone(3,000) |
| | 13 | Resist Polymer 1 (100) | PAG 21 (15) | Quencher 2 (1.0) | FC-4430 (0.001) | PGMEA(2,000) PGME(500) cyclohexanone(3,000) |
| | 14 | Resist Polymer 6 (100) | PAG 21 (15) | Quencher 2 (1.0) | FC-4430 (0.001) | PGMEA(2,000) PGME(500) cyclohexanone(3,000) |
| | 15 | Resist Polymer 7 (100) | PAG 21 (15) | Quencher 2 (1.0) | FC-4430 (0.001) | PGMEA(2,000) PGME(500) cyclohexanone(3,000) |
| Comparative Resist | 1 | Comparative Resist Polymer 1 (100) | PAG 11 (40) | Quencher 2 (1.0) | FC-4430 (0.001) | PGMEA(4,000) cyclohexanone(1,000) |
| | 2 | Resist Polymer 1 (100) | — | Quencher 2 (1.0) | FC-4430 (0.001) | PGMEA(2,000) PGME(500) cyclohexanone(3,000) |
| | 3 | Resist Polymer 1 (100) | Comparative PAG 1 (15) | Quencher 2 (1.0) | FC-4430 (0.001) | PGMEA(2,000) PGME(500) cyclohexanone(3,000) |
| | 4 | Resist Polymer 1 (100) | Comparative PAG 2 (15) | Quencher 2 (1.0) | FC-4430 (0.001) | PGMEA(2,000) PGME(500) cyclohexanone(3,000) |

PGMEA: propylene glycol monomethyl ether acetate
PGME: propylene glycol monomethyl ether
FC-4430: fluorochemical surfactant by 3M-Sumitomo Co., Ltd.

TABLE 2

| | | PEB temperature (° C.) | Sensitivity (mJ/cm$^2$) | LWR (nm) |
|---|---|---|---|---|
| Resist | 1 | 80 | 26 | 3.1 |
| | 2 | 80 | 28 | 2.8 |
| | 3 | 90 | 31 | 3.3 |
| | 4 | 90 | 35 | 3.5 |
| | 5 | 95 | 38 | 3.6 |
| | 6 | 80 | 28 | 3.5 |
| | 7 | 80 | 25 | 3.2 |
| | 8 | 80 | 31 | 3.2 |
| | 9 | 80 | 29 | 3.6 |
| | 10 | 80 | 33 | 2.7 |
| | 11 | 80 | 28 | 3.6 |
| | 12 | 80 | 33 | 3.7 |
| | 13 | 80 | 32 | 3.7 |
| | 14 | 75 | 36 | 3.2 |
| | 15 | 75 | 38 | 3.1 |
| Comparative Resist | 1 | 90 | 26 | 5.6 |
| | 2 | 85 | 24 | 4.2 |
| | 3 | 80 | 24 | 5.0 |
| | 4 | 80 | 20 | 6.0 |

It is evident from Tables 1 and 2 that resist compositions comprising a polymer comprising acid labile group-substituted recurring units and acid generator-bound recurring units and an onium salt of specific cation structure capable of generating an acid having a molecular weight of at least 540 are improved in edge roughness.

Japanese Patent Application No. 2014-164387 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist composition comprising
a polymer comprising recurring units (a1) and/or (a2) having an acid labile group and recurring units (b1) and/or (b2) of sulfonium salt, represented by the general formula (1), the polymer having a weight average molecular weight of 1,000 to 500,000, and
a sulfonium salt and/or iodonium salt having either one of cation structures C1, C2 and C3 represented by the general formula (2), the salt capable of generating an acid having a molecular weight of at least 540,

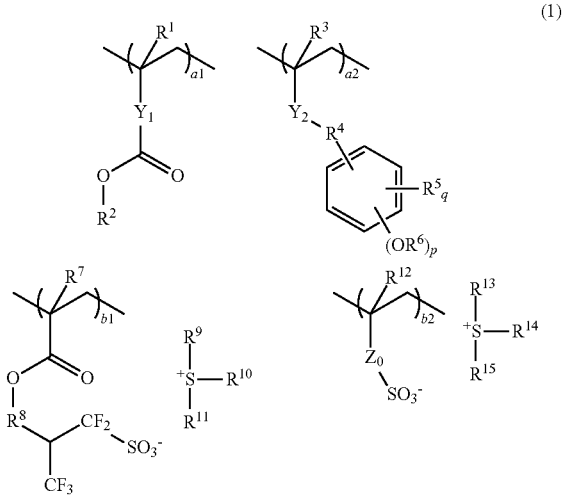

wherein $R^1$, $R^3$, $R^7$, and $R^{12}$ are hydrogen or methyl, $R^9$, $R^{10}$, $R^{11}$, $R^{13}$, $R^{14}$ and $R^{15}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl or thiophenyl group which may contain $C_1$-$C_{10}$ alkyl, alkoxy, alkoxycarbonyl, acyl, acyloxy, halogen, trifluoromethyl, amino, nitro, or cyano moiety, $R^2$ and $R^6$ are an acid labile group, $R^4$ is a single bond, or a straight or branched $C_1$-$C_6$ alkylene group, $R^5$ is hydrogen, fluorine, trifluoromethyl, cyano or straight, branched or cyclic $C_1$-$C_6$ alkyl, p is 1 or 2, q is an integer of 0 to 4, $Y_1$ is a single bond, or a $C_1$-$C_{12}$ linking group having an ester moiety, ether moiety or lactone ring, phenylene group or naphthylene group, $Y_2$ is a single bond, —C(=O)—O— or —C(=O)—NH—, $R^8$ is a single bond or a $C_1$-$C_{12}$ linking group which may contain an ester moiety, ether moiety or lactone ring, $Z_0$ is a single bond, phenylene, fluorinated phenylene, —O—$R^{16}$—, or —C(=O)—$Z_1$—$R^{16}$—, $Z_1$ is NH, $R^{16}$ is a straight, branched or cyclic $C_1$-$C_6$ alkylene, alkenylene or phenylene group, which may contain a carbonyl, ester, ether or hydroxyl moiety, $0 \leq a1 < 1.0$, $0 \leq a2 < 1.0$, $0 < a1+a2 < 1.0$, $0 \leq b1 \leq 0.5$, $0 \leq b2 \leq 0.5$, and $0 < b1+b2 \leq 0.5$, (2)

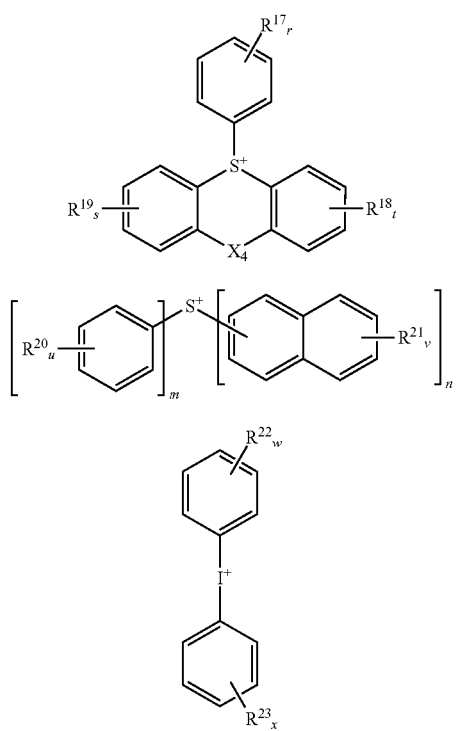

wherein $R^{17}$ is a halogen trifluoromethyl, cyano, nitro, hydroxyl, $C_1$-$C_{10}$ alkyl, acyl, or alkoxycarbonyl, $R^{18}$, $R^{19}$, $R^{20}$, $R^{21}$, $R^{22}$ and $R^{23}$ are each independently halogen, trifluoromethyl, cyano, nitro, hydroxyl, $C_1$-$C_{10}$ alkyl, acyl, alkoxy, or alkoxycarbonyl, $X_4$ is a single bond, or a linking group selected from among methylene, ethylene, —O—, —S—, —$NR^{24}$—, —C(=O)—, and —S(=O2)-, $R^{24}$ is hydrogen or $C_1$-$C_4$ alkyl, r, s, t, u, v, w and x are each independently an integer of 0 to 5, m is an integer of 0 to 2, n is an integer of 1 to 3, wherein the salt capable of generating an acid having a molecular weight of at least 540 is selected from PAG1, PAG2 and PAG3 represented by the general formula (3):

(3)

PAG 1

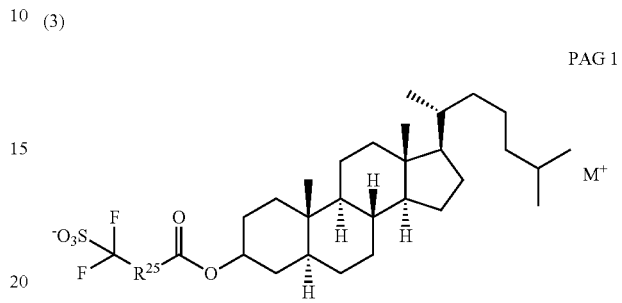

PAG 2

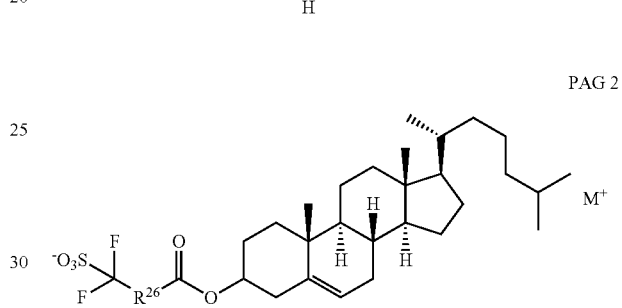

PAG 3

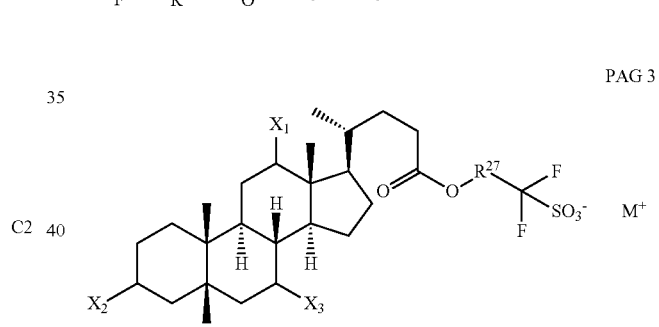

wherein $R^{25}$, $R^{26}$ and $R^{27}$ each are a straight, branched or cyclic $C_1$-$C_{12}$ alkylene group which may contain an ether moiety, ester moiety or fluorine, $X_1$, $X_2$ and $X_3$ each are hydroxyl, alkoxy, or acyloxy, and $M^+$ is either one of cations C1, C2 and C3 represented by the general formula (2).

2. The resist composition of claim 1 wherein the polymer further comprises recurring units (c) having an adhesive group selected from the class consisting of hydroxyl, carboxyl, lactone ring, carbonate, thiocarbonate, carbonyl, cyclic acetal, ether, ester, sulfonic acid ester, cyano, amide, and —O—C(=O)-G- wherein G is sulfur or NH.

3. The resist composition of claim 1 which is a chemically amplified positive resist composition.

4. The resist composition of claim 3, further comprising a basic compound and/or a surfactant as an additive.

5. A pattern forming process comprising the steps of applying the positive resist composition of claim 1 onto a substrate to form a coating, baking, exposing the coating to high-energy radiation, and developing the exposed coating in a developer.

6. The process of claim 5 wherein the high-energy radiation is g-line, i-line, KrF excimer laser, ArF excimer laser, electron beam or soft X-ray having a wavelength of 3 to 15 nm.

7. A positive resist composition comprising
a polymer comprising recurring units (a1) and/or (a2) having an acid labile group and recurring units (b1) and/or (b2) of sulfonium salt, represented by the general formula (1), the polymer having a weight average molecular weight of 1,000 to 500,000, and
a sulfonium salt and/or iodonium salt having either one of cation structures C1, C2 and C3 represented by the general formula (2), the salt capable of generating an acid having a molecular weight of at least 540, (1)

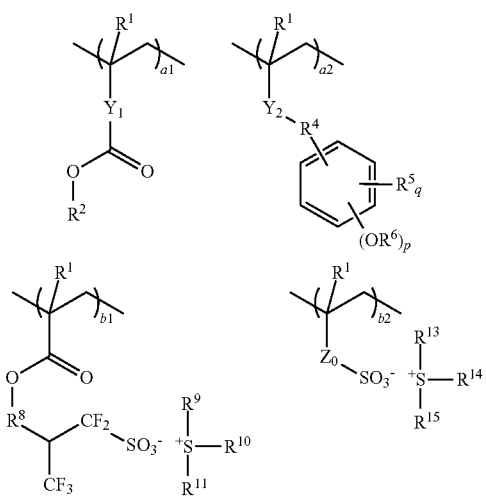

wherein $R^1$, $R^3$, $R^7$, and $R^{12}$ are hydrogen or methyl,
$R^9$, $R^{10}$, $R^{11}$, $R^{13}$, $R^{14}$, and $R^{15}$ are each independently a straight, branched or cyclic $C_1$-$C_{12}$ alkyl group which may contain a carbonyl, ester or ether moiety, or a $C_6$-$C_{12}$ aryl, $C_7$-$C_{20}$ aralkyl or thiophenyl group which may contain $C_1$-$C_{10}$ alkyl, alkoxy, alkoxycarbonyl, acyl, acyloxy, halogen, trifluoromethyl, amino, nitro, or cyano moiety,
$R^2$ and $R^6$ are an acid labile group,
$R^4$ is a single bond, or a straight or branched $C_1$-$C_6$ alkylene group,
$R^5$ is hydrogen, fluorine, trifluoromethyl, cyano or straight, branched or cyclic $C_1$-$C_6$ alkyl,
p is 1 or 2,
q is an integer of 0 to 4,
$Y_1$ is a single bond, or a $C_1$-$C_{12}$ linking group having an ester moiety, ether moiety or lactone ring, phenylene group or naphthylene group,
$Y_2$ is a single bond, —C(=O)—O— or —C(=O)—NH—,
$R^8$ is a single bond or a $C_1$-$C_{12}$ linking group which may contain an ester moiety, ether moiety or lactone ring,
$Z_0$ is a single bond, phenylene, fluorinated phenylene, —O—$R^{16}$—, or —C(=O)—$Z_1$—$R^{16}$—,
$Z_1$ is NH,
$R^{16}$ is a straight, branched or cyclic $C_1$-$C_6$ alkylene, alkenylene or phenylene group, which may contain a carbonyl, ester, ether or hydroxyl moiety, $0 \leq a1 < 1.0$, $0 \leq a2 < 1.0$, $0 < a1+a2 < 1.0$, $0 \leq b1 \leq 0.5$, $0 \leq b2 \leq 0.5$, and $0 < b1+b2 \leq 0.5$, (2)

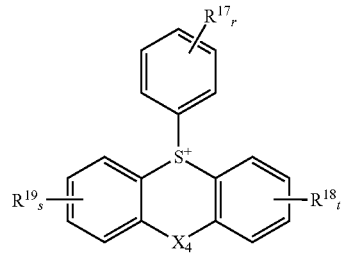

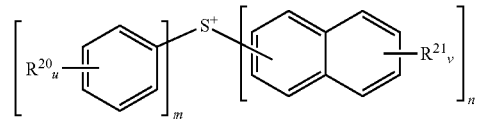

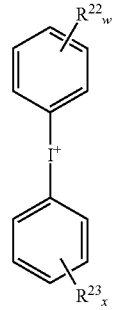

wherein $R^{17}$ is a halogen trifluoromethyl, cyano, nitro, hydroxyl, $C_1$-$C_{10}$ alkyl, acyl, or alkoxycarbonyl, $R^{18}$, $R^{19}$, $R^{20}$, $R^{21}$, $R^{22}$ and $R^{23}$ are each independently halogen, trifluoromethyl, cyano, nitro, hydroxyl, $C_1$-$C_{10}$ alkyl, acyl, alkoxy, or alkoxycarbonyl, $X_4$ is a single bond, or a linking group selected from among methylene, ethylene, —O—, —S—, —NR$^{24}$—, —C(=O)—, and —S(=O2)-, $R^{24}$ is hydrogen or $C_1$-$C_4$ alkyl, r, s, t, u, v, w and x are each independently an integer of 0 to 5, m is an integer of 0 to 2, n is an integer of 1 to 3, wherein the salt capable of generating an acid having a molecular weight of at least 540 is selected from the group consisting of the following formulae:

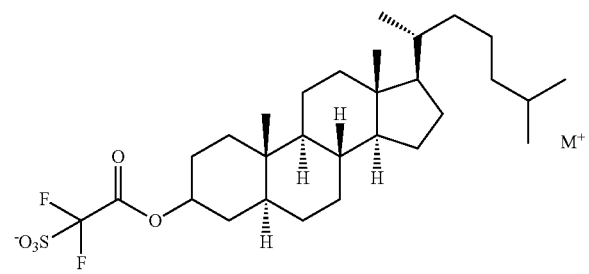

187
-continued
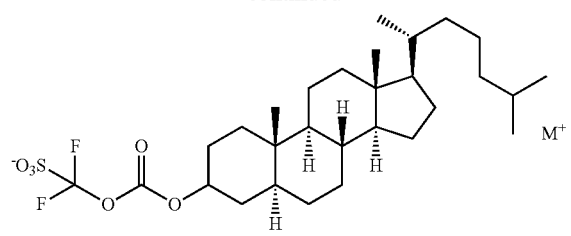
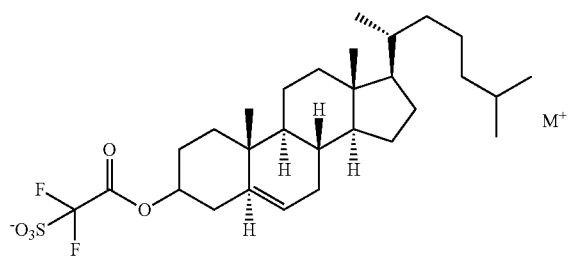
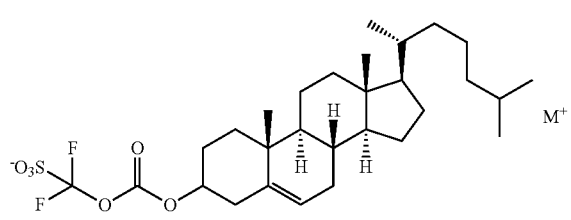
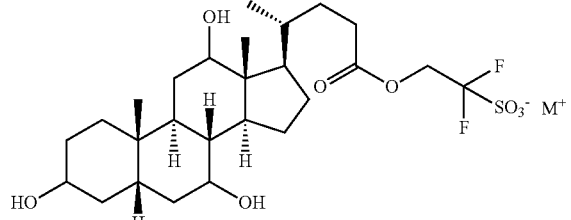
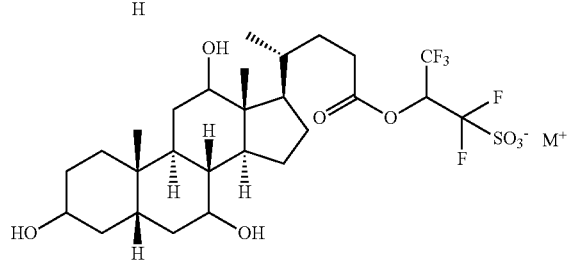
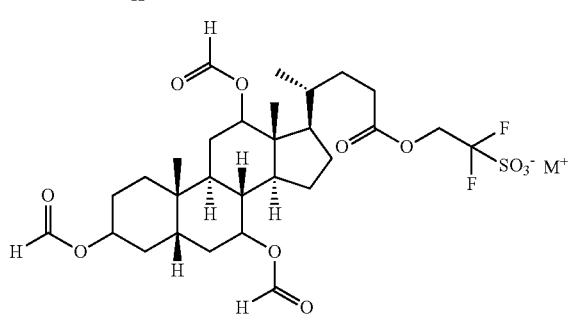
188
-continued
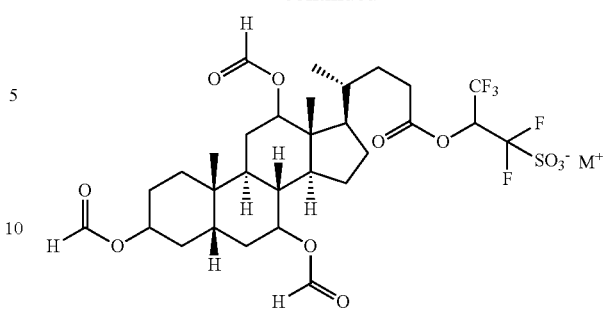
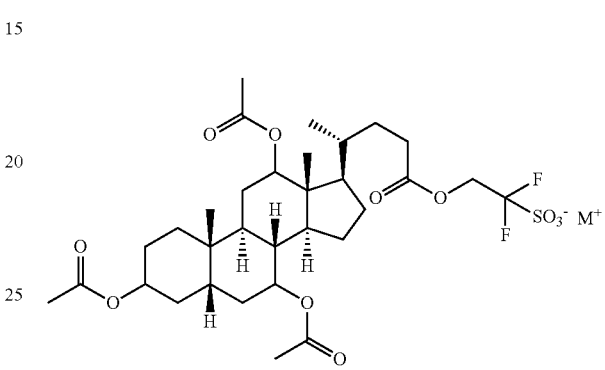
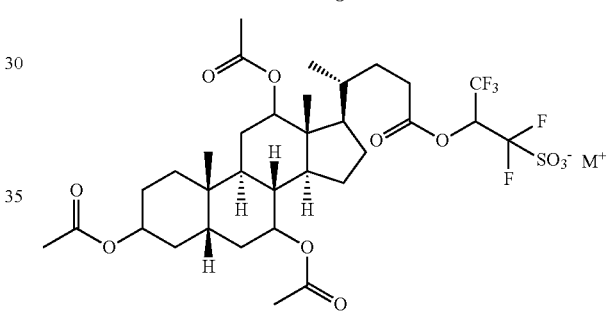
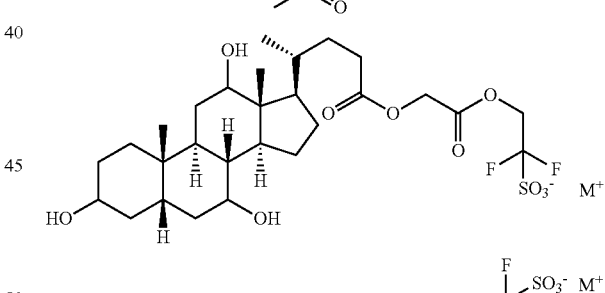
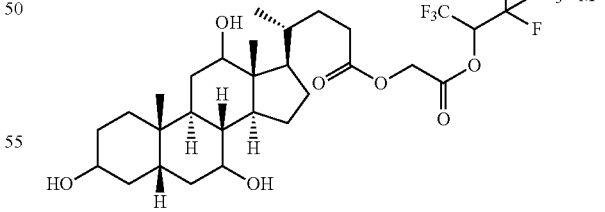
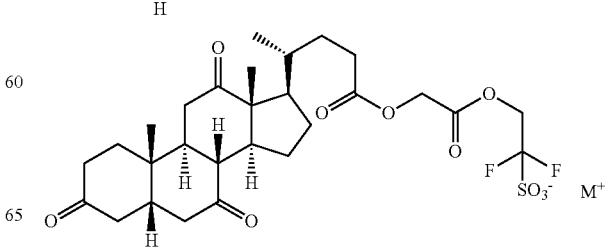

189
-continued
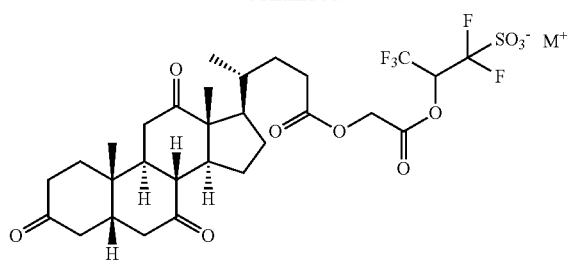
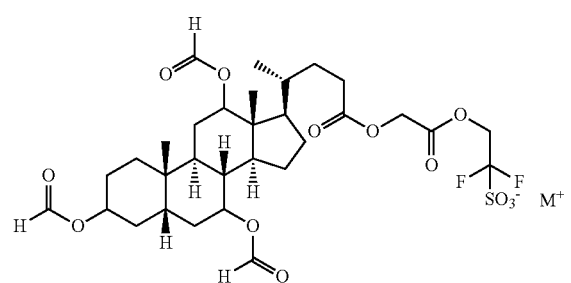
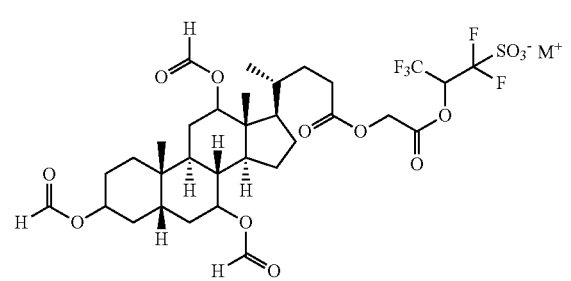
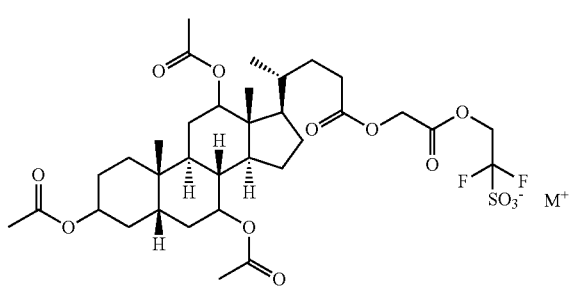
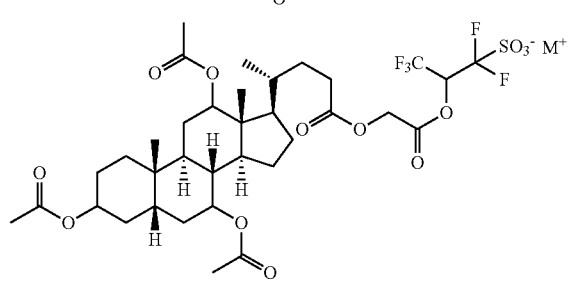
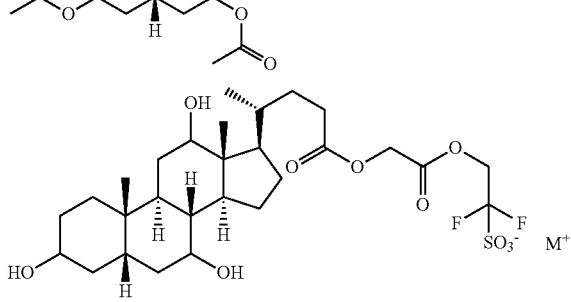
190
-continued
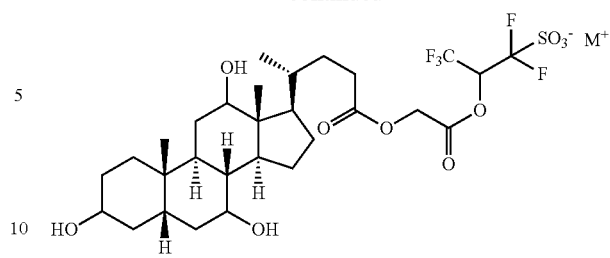
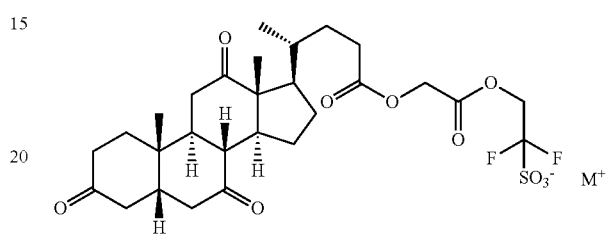
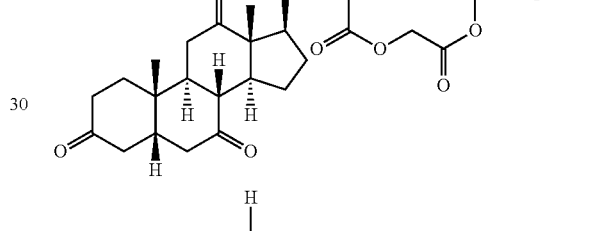
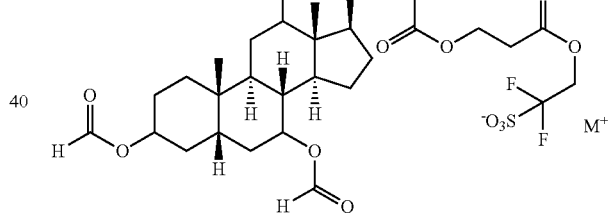
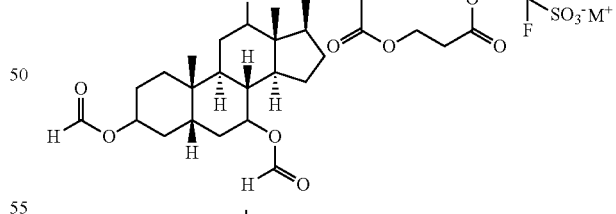
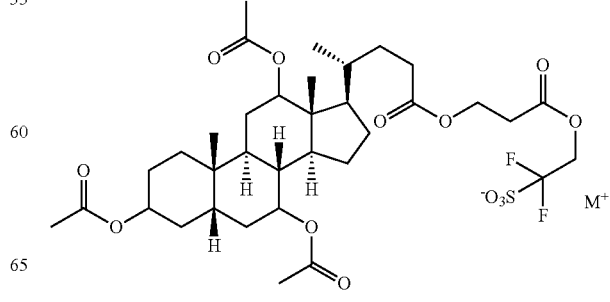

191
-continued
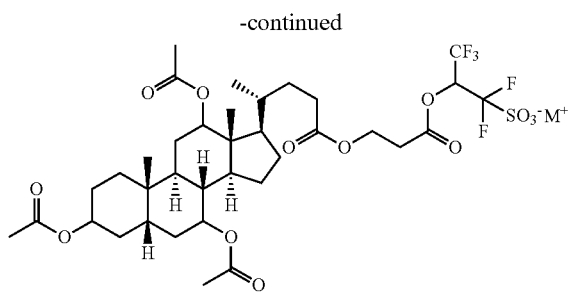
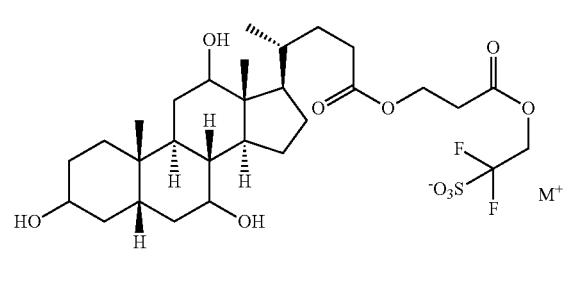
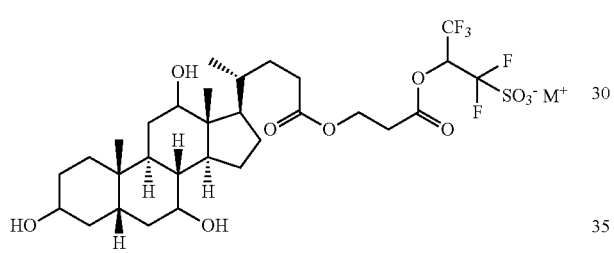
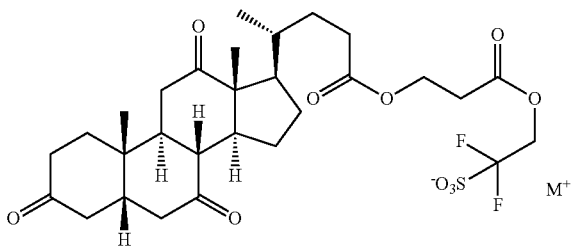
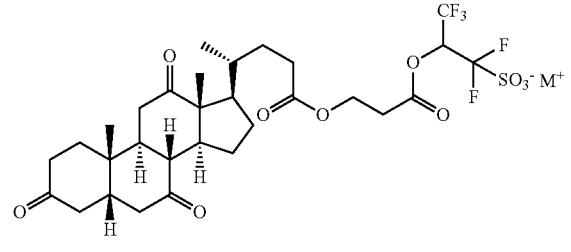
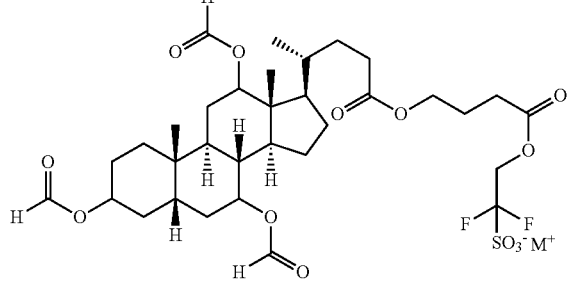
192
-continued
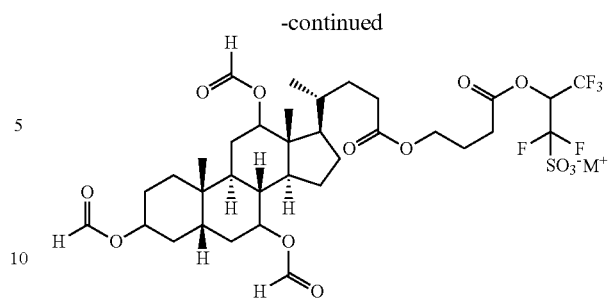
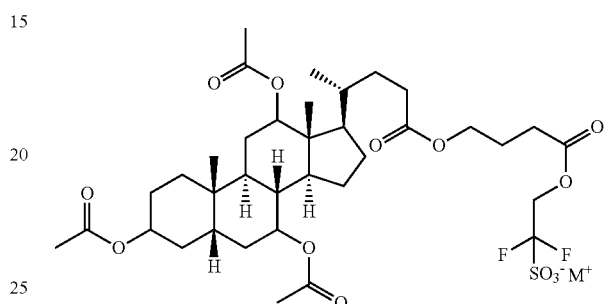
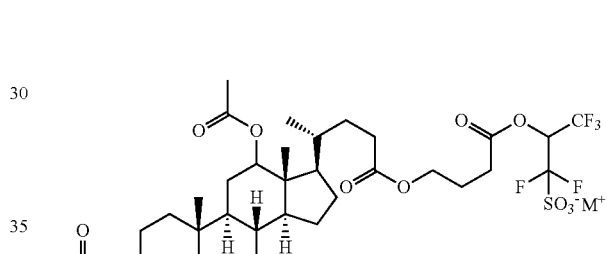
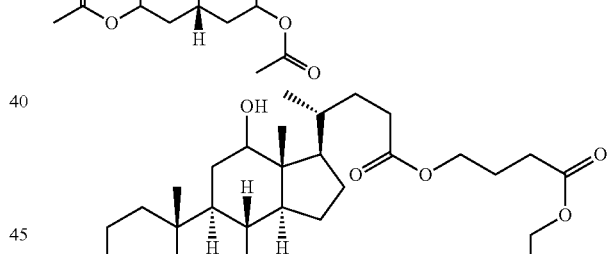
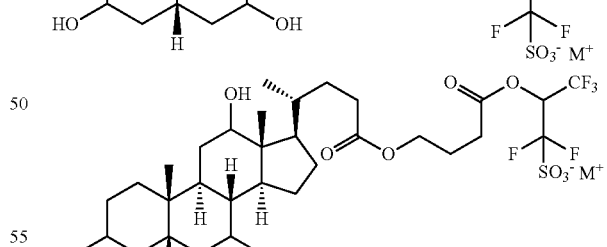
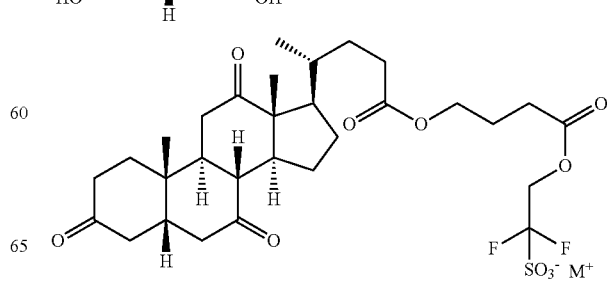

193
-continued
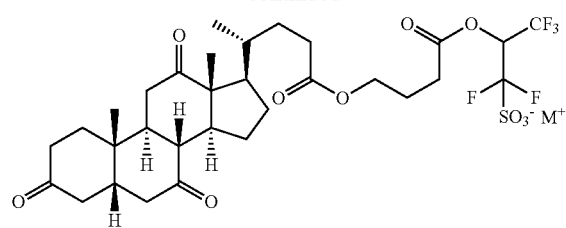
194
-continued
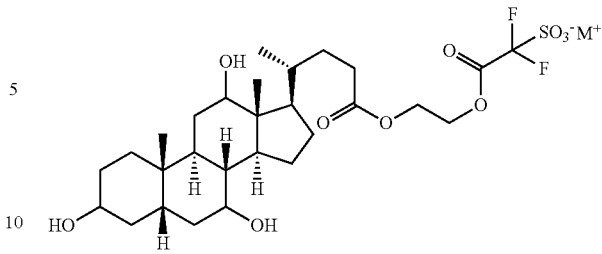
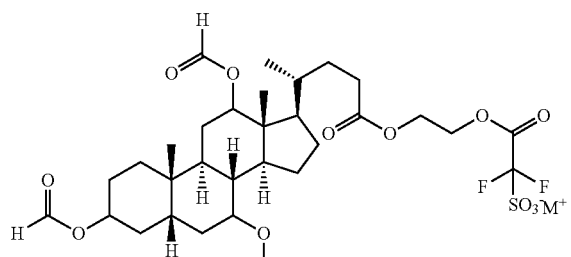
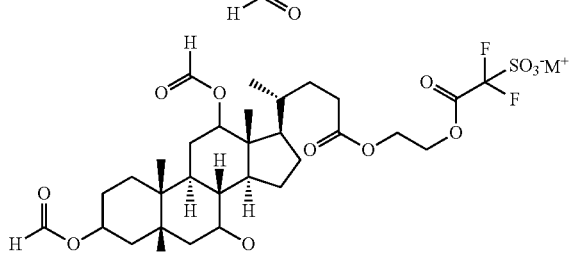
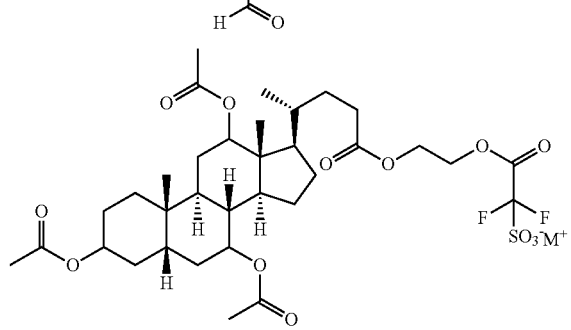
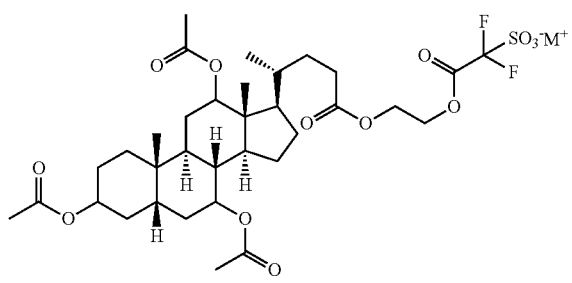
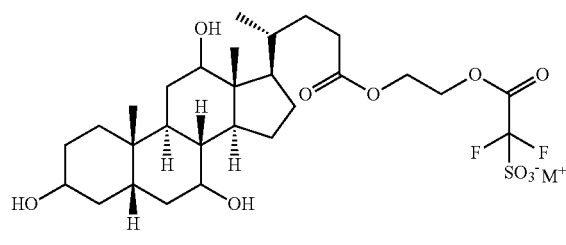
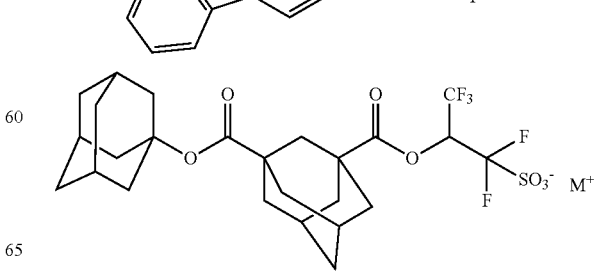

195
-continued
196
-continued
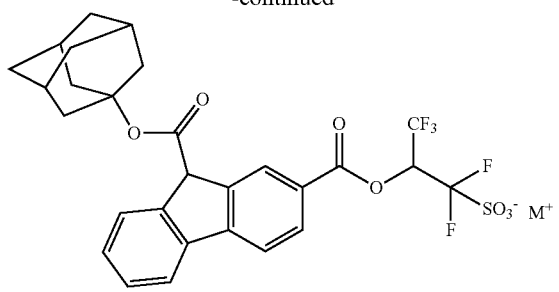
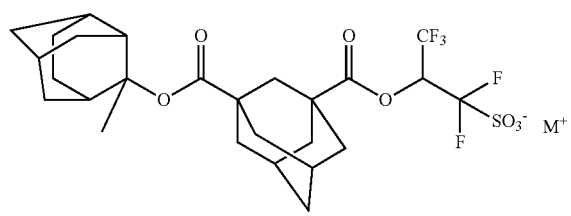
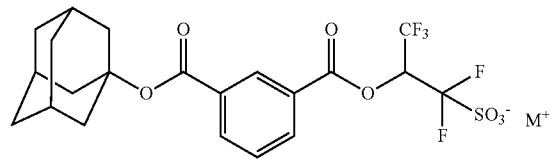
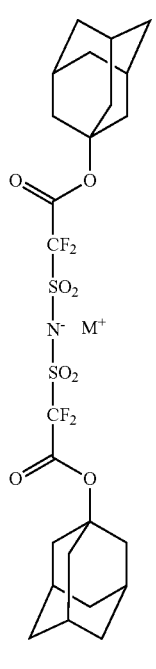
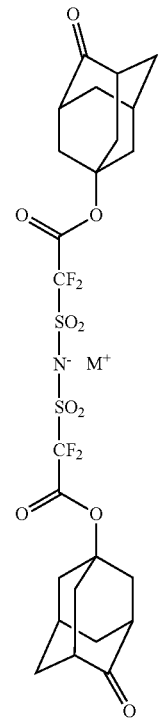
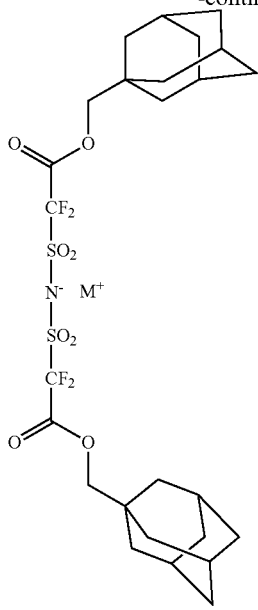
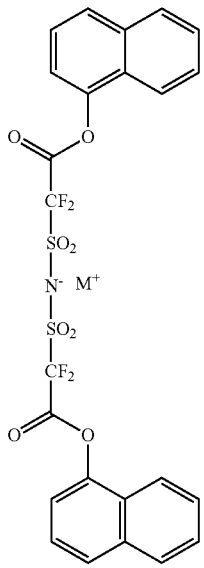
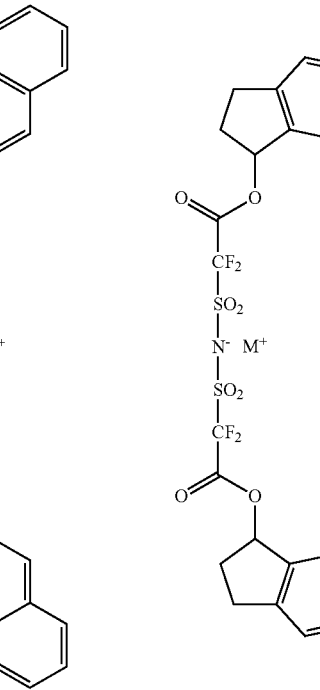

197
-continued
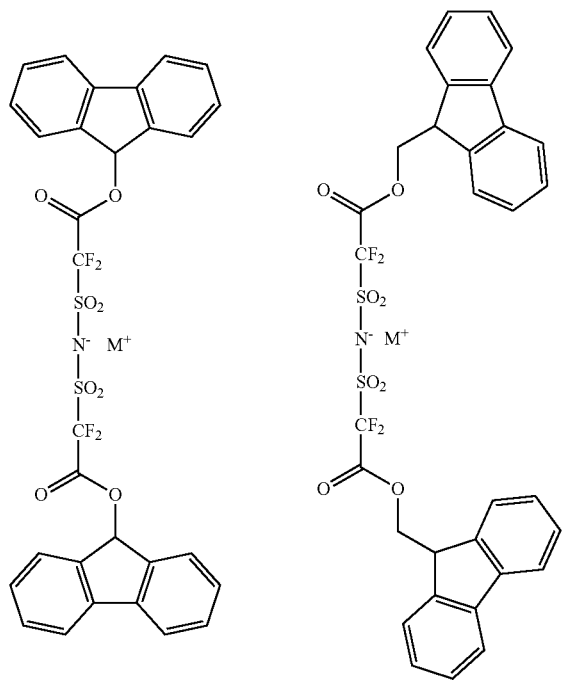
198
-continued
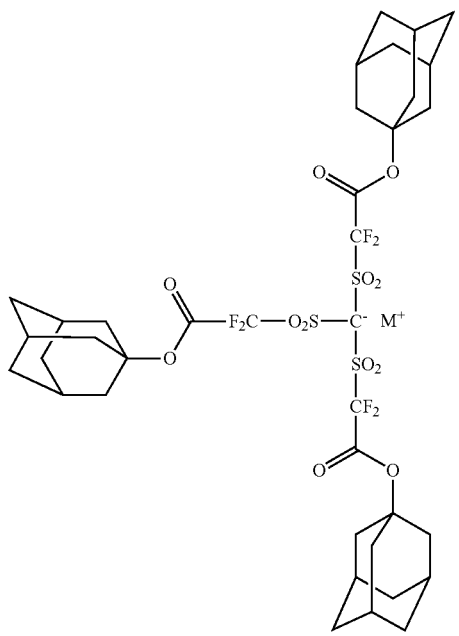
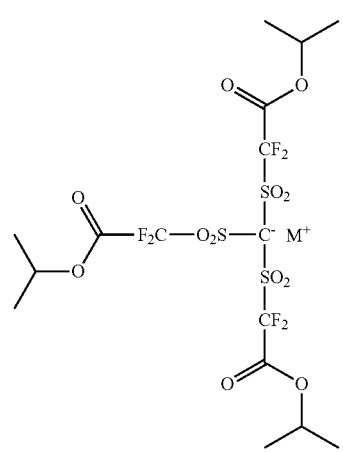
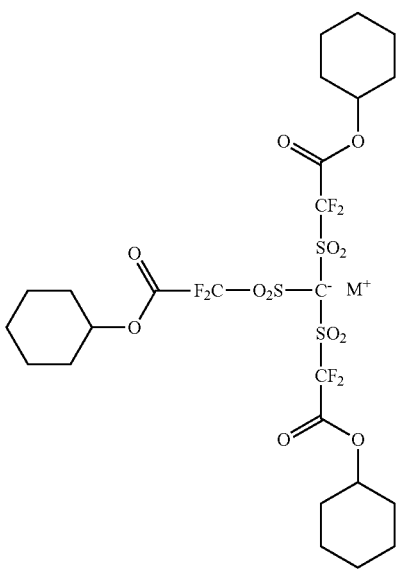

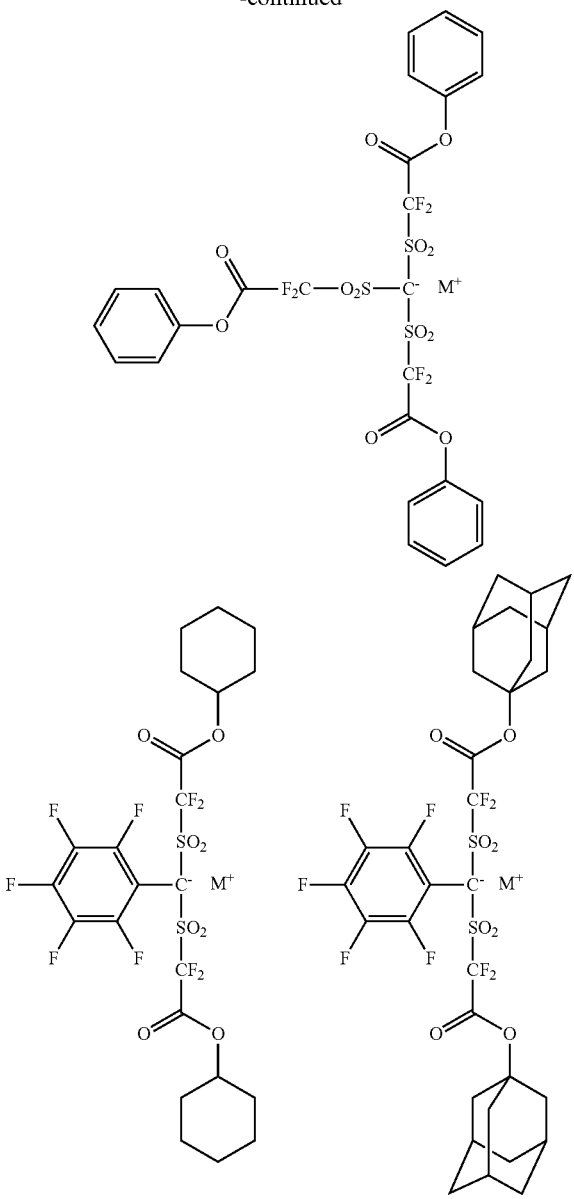

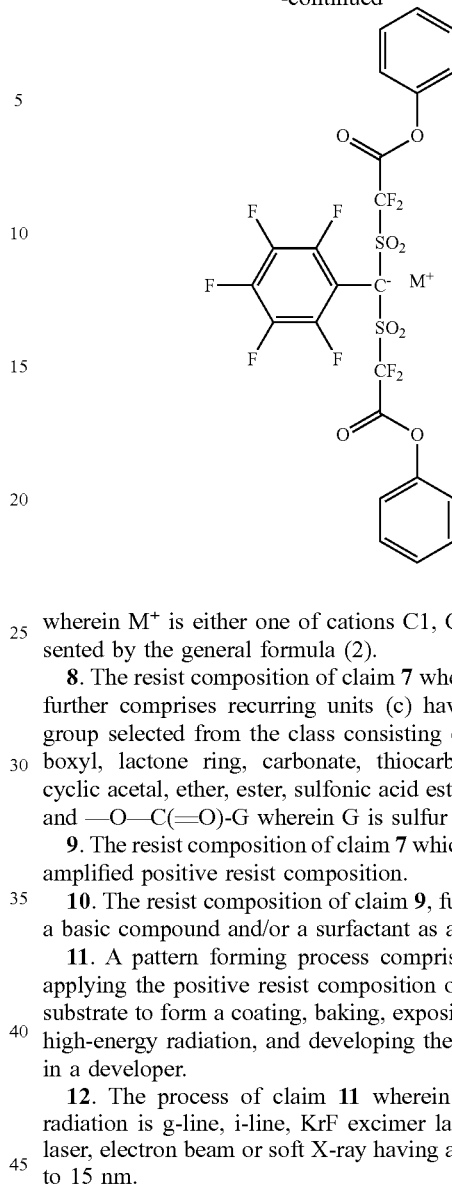

wherein M⁺ is either one of cations C1, C2 and C3 represented by the general formula (2).

8. The resist composition of claim 7 wherein the polymer further comprises recurring units (c) having an adhesive group selected from the class consisting of hydroxyl, carboxyl, lactone ring, carbonate, thiocarbonate, carbonyl, cyclic acetal, ether, ester, sulfonic acid ester, cyano, amide, and —O—C(=O)-G wherein G is sulfur or NH.

9. The resist composition of claim 7 which is a chemically amplified positive resist composition.

10. The resist composition of claim 9, further comprising a basic compound and/or a surfactant as an additive.

11. A pattern forming process comprising the steps of applying the positive resist composition of claim 7 onto a substrate to form a coating, baking, exposing the coating to high-energy radiation, and developing the exposed coating in a developer.

12. The process of claim 11 wherein the high-energy radiation is g-line, i-line, KrF excimer laser, ArF excimer laser, electron beam or soft X-ray having a wavelength of 3 to 15 nm.

* * * * *